(12) United States Patent
Hirota et al.

(10) Patent No.: US 7,596,698 B2
(45) Date of Patent: Sep. 29, 2009

(54) SEMICONDUCTOR MEMORY CARD, PLAYBACK APPARATUS, RECORDING APPARATUS, PLAYBACK METHOD, RECORDING METHOD, AND COMPUTER-READABLE RECORDING MEDIUM

(75) Inventors: Teruto Hirota, Moriguchi (JP); Kenji Tagawa, Katano (JP); Hideki Matsushima, Studio City, CA (US); Tomokazu Ishikawa, Toyonaka (JP); Shinji Inoue, Neyagawa (JP); Masayuki Kozuka, Arcadia, CA (US)

(73) Assignee: Panasonic Corporation, Osaka (JP)

( * ) Notice: Subject to any disclaimer, the term of this patent is extended or adjusted under 35 U.S.C. 154(b) by 788 days.

(21) Appl. No.: 10/984,937

(22) Filed: Nov. 10, 2004

(65) Prior Publication Data

US 2005/0192686 A1      Sep. 1, 2005

Related U.S. Application Data

(62) Division of application No. 09/580,601, filed on May 26, 2000, now Pat. No. 6,865,431.

(30) Foreign Application Priority Data

| May 28, 1999 | (JP) | ................................ 11-149893 |
| Aug. 24, 1999 | (JP) | ................................ 11-236724 |
| Dec. 28, 1999 | (JP) | ................................ 11-372606 |

(51) Int. Cl.
*H04L 9/32* (2006.01)
*G06F 17/00* (2006.01)

(52) U.S. Cl. .................. 713/172; 713/193; 700/94; 386/46; 386/95; 386/126

(58) Field of Classification Search ................ 380/227; 705/65; 386/95, 96
See application file for complete search history.

(56) References Cited

U.S. PATENT DOCUMENTS

| 4,977,594 | A | | 12/1990 | Shear |
| 5,596,639 | A | | 1/1997 | Kikinis |
| 5,727,061 | A | | 3/1998 | Johnson et al. |
| 5,742,569 | A | * | 4/1998 | Yamamoto et al. ........ 369/30.18 |
| 5,857,020 | A | | 1/1999 | Peterson, Jr. |
| 5,870,523 | A | * | 2/1999 | Kikuchi et al. ................ 386/95 |
| 5,895,123 | A | * | 4/1999 | Fujii et al. .................... 386/96 |
| 5,966,352 | A | | 10/1999 | Sawabe et al. |

(Continued)

FOREIGN PATENT DOCUMENTS

| EP | 875894 A2 * | 11/1998 |
| GB | 2351819 A | 1/2001 |

OTHER PUBLICATIONS

U.S. Appl. No. 09/580,909, filed May 2000, Tagawa et al.

*Primary Examiner*—William R Korzuch
*Assistant Examiner*—Sarah Su
(74) *Attorney, Agent, or Firm*—Wenderoth, Lind & Ponack, L.L.P.

(57) ABSTRACT

An audio stream is divided into a plurality of audio object (AOB) files that are recorded having each been encrypted using a different encryption key. At least one piece of track management information (TKI) is provided corresponding to each track. Playlist information (PLI) assigns a playback position in a playback order to each track when a plurality of tracks are to be played back one after the other.

5 Claims, 77 Drawing Sheets

U.S. PATENT DOCUMENTS

| | | |
|---|---|---|
| 6,118,927 A | 9/2000 | Kikuchi et al. |
| 6,212,097 B1 | 4/2001 | Kihara et al. |
| 6,212,330 B1 | 4/2001 | Yamamoto et al. |
| 6,262,915 B1 | 7/2001 | Kihara et al. |
| 6,501,163 B1 | 12/2002 | Utsumi |
| 6,601,140 B1 | 7/2003 | Okaue et al. |
| 6,606,707 B1 | 8/2003 | Hirota et al. |
| 6,647,496 B1 | 11/2003 | Tagawa et al. |
| 6,658,200 B2 | 12/2003 | Ando et al. |
| 6,665,240 B1 * | 12/2003 | Kobayashi et al. ........ 369/47.15 |
| 6,889,136 B2 * | 5/2005 | Herz et al. .................. 701/207 |
| 2002/0044757 A1 | 4/2002 | Kawamura et al. |
| 2004/0250101 A1* | 12/2004 | Kanai ......................... 713/193 |
| 2009/0119514 A1* | 5/2009 | Sawada ...................... 713/189 |

* cited by examiner

USER DATA AREA

— Other Directories
— Other File

PROTECTED AREA

FIG. 11A
MPEG2-AAC format

| format | Audio_Data_Transport_Stream(ADTS) |
|---|---|
| Profile | Low Complexity(LC) profile(mandatory) |
| bitrate per channel** | between 16kbit/s(min.)and 72kbit/s(max.)<br>Other bitrates are optional. |
| sampling_frequency | 48 kHz(mandatory)<br>44.1 kHz(mandatory)<br>32 kHz(mandatory)<br>24 kHz(mandatory)<br>22.05 kHz(mandatory)<br>16 kHz(mandatory) |
| channel_configuration | single_channel_element(mandatory)<br>channel_pair_element(mandatory) |
| number_of_data_blocks_in_frame | 1 header/1 raw_data_block(mandatory) |

FIG. 11B
MPEG layer 3 format

| format | MPEG-1 layer 3<br>MPEG-2 layer 3 low sampling frequency |
|---|---|
| bitrate per channel** | MPEG 1:between 16kbit/s and 96kbit/s<br>MPEG 2 LSF:between 16kbit/s and 80kbit/s<br>Other bitrates and variable bitrate are optional.<br>Bitrate index "0000",i.e. "free format" is not supported. |
| sampling_frequency | 48 kHz<br>44.1 kHz<br>32 kHz<br>24 kHz<br>22.05 kHz<br>16 kHz |
| mode | stereo<br>joint_stereo<br>single_cannel |

FIG. 11C
Windows Media Audio format

| format | Windows Media Audio format |
|---|---|
| bitrate per channel** | between 8kbit/s and 80kbit/s<br>Other bitrates are optional. |
| sampling_frequency | 48 kHz<br>44.1 kHz<br>32 kHz<br>22.05 kHz<br>16 kHz |
| mode | monaural<br>stereo |

FIG. 14

| sampling frequency | FNs_Middle_TMSRTE | | |
|---|---|---|---|
| | AAC | MPEGlayer3 | WMA |
| 48kHz | 47*N | 42*N | ××× |
| 44.1kHz | 43*N | 38*N | ××× |
| 32kHz | 32*N | 28*N | ××× |
| 24kHz | 24*N | 42*N | ××× |
| 22.05kHz | 22*N | 38*N | ××× |
| 16kHz | 16*N | 28*N | ××× |

※ N BEING THE PLAYBACK PERIOD "TIME_LENGTH" OF AN AOB_ELEMENT TO AN ACCURACY OF 1/1000TH OF ONE SECOND

FIG. 23A

| RELATIVE BYTE POSITION | FIELD NAME | CONTENT | NUMBER OF BYTES |
|---|---|---|---|
| 60 to 63 | DATA_OFFSET | FIRST ADDRESS OF AOB_BLOCK | 4 BYTES |
| 64 to 67 | SZ_DATA | DATA LENGTH OF AOB_BLOCK | 4 BYTES |
| 68 to 71 | TMSRTE_Ns | NUMBER OF TMSRT_entries | 4 BYTES |
| 72 to 73 | FNs_1st_TMSRTE | NUMBER OF AOB_FRAMEs IN FIRST AOB_ELEMENT | 2 BYTES |
| 74 to 75 | FNs_Last_TMSRTE | NUMBER OF AOB_FRAMEs IN LAST AOB_ELEMENT | 2 BYTES |
| 76 to 77 | FNs_Middle_TMSRTE | NUMBER OF AOB_FRAMEs IN AOB_ELEMENTS | 2 BYTES |
| 78 to 79 | TIME_LENGTH | PLAYBACK PERIOD OF AOB_ELEMENTS | 2 BYTES |
|  |  | TOTAL | 20 BYTES |

FIG. 23B

| sampling frequency | FNs_Middle_TMSRTE | | | |
|---|---|---|---|---|
|  | AAC | MPEGlayer3 | WMA | |
| 48kHz | 47*N | 42*N | ××× | |
| 44.1kHz | 43*N | 38*N | ××× | |
| 32kHz | 32*N | 28*N | ××× | |
| 24kHz | 24*N | 42*N | ××× | |
| 22.05kHz | 22*N | 38*N | ××× | |
| 16kHz | 16*N | 28*N | ××× | |

※ N BEING THE PLAYBACK PERIOD "TIME_LENGTH" OF AN AOB_ELEMENT TO AN ACCURACY OF 1/1000TH OF ONE SECOND

FIG. 23C

TIME_LENGTH

TIME_LENGTH[15...8]

TIME_LENGTH[7...0]

TIME_LENGTH=2000 FOR AAC.MP3

$\text{Jmp\_Entry(sec)} = (\text{FNs\_1st\_TMSRTE} + \text{FNs\_middle\_TMSRTE} \cdot y + x) \times 20\text{msec}$
FIG. 26B 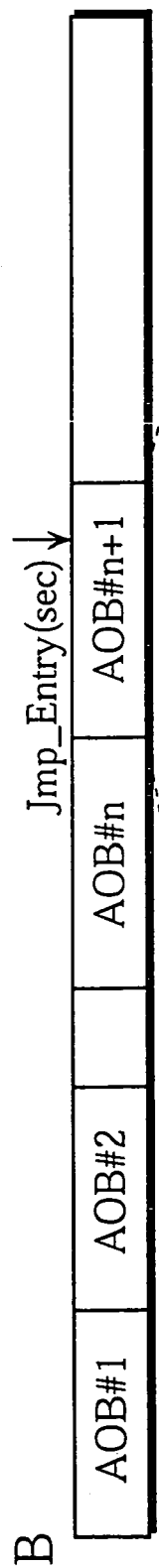 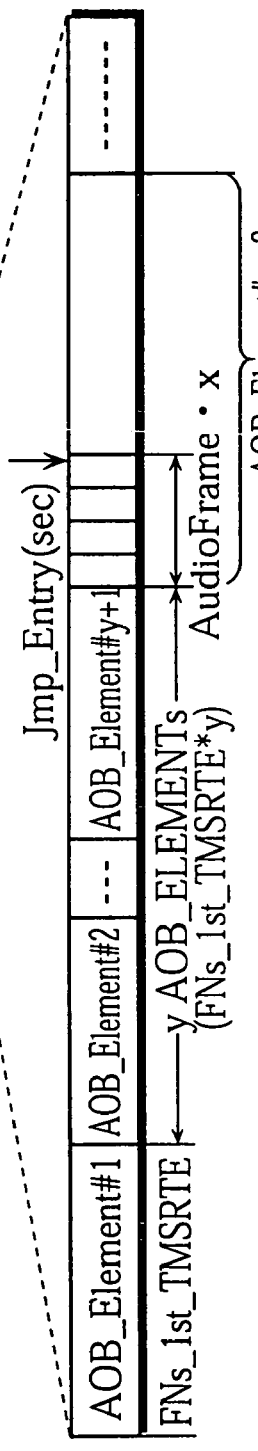
$\text{Jmp\_Entry(sec)} = \text{TOTAL PLAYBACK PERIOD FROM AOB\#1 TO AOB\#n} + \text{FNs\_1st\_TMSRTE}(\#n+1) + \text{FNs\_Middle\_TMSRTE}(\#n+1) \cdot y + x) \times 20\text{msec}$ FIG. 28A UPDATING TrackManager USING UNUSED TKI AT DIFFERENT POSITIONS(case 2)
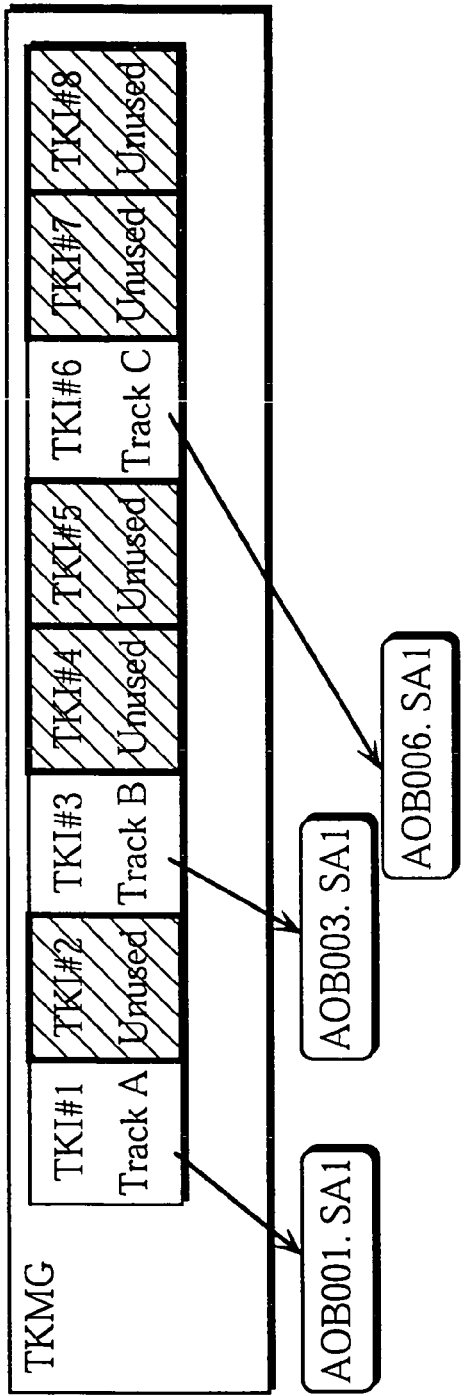
FIG. 28B
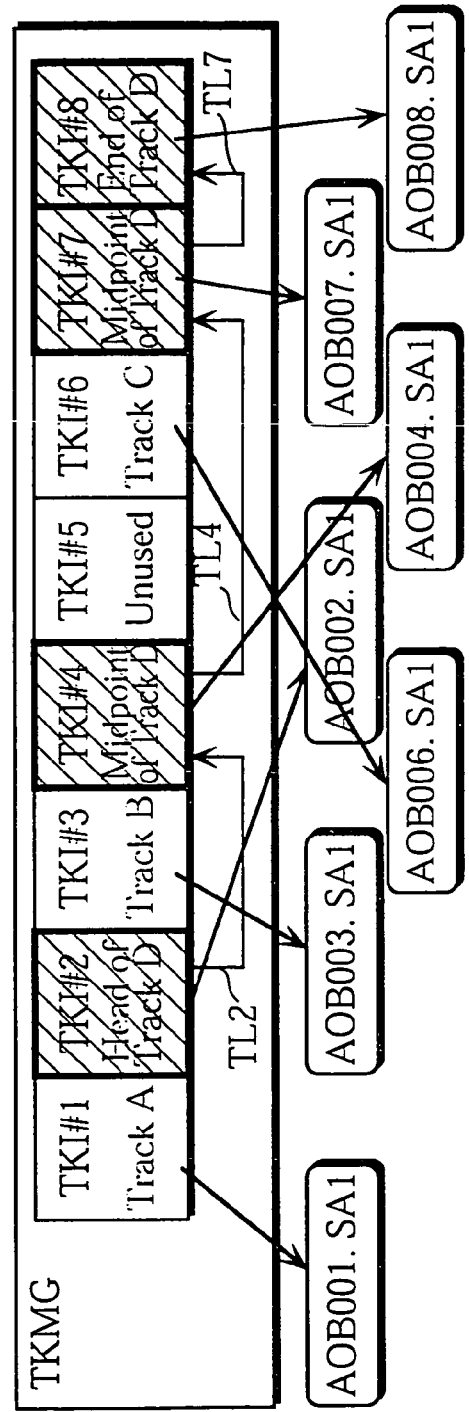

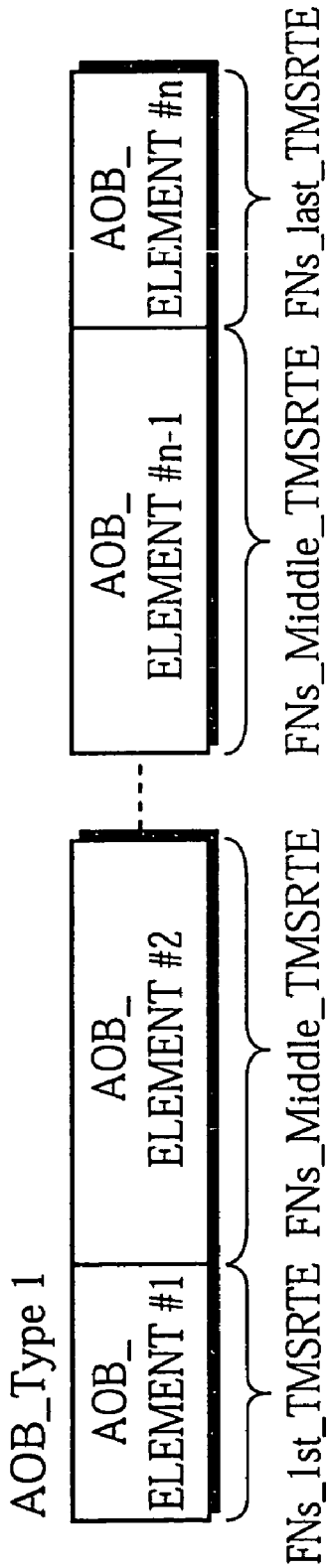
FIG. 30A
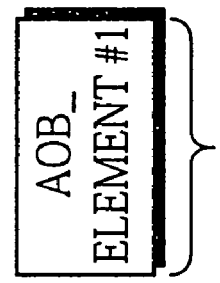
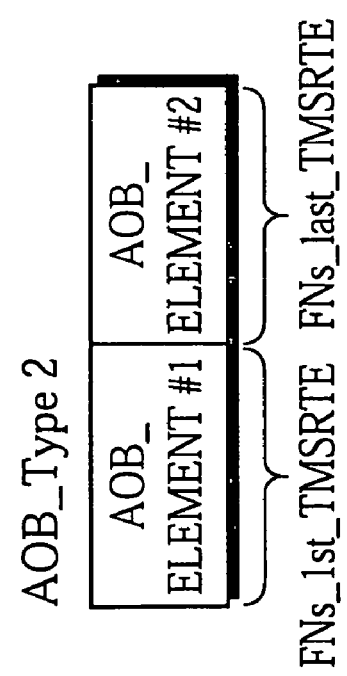
FIG. 30B

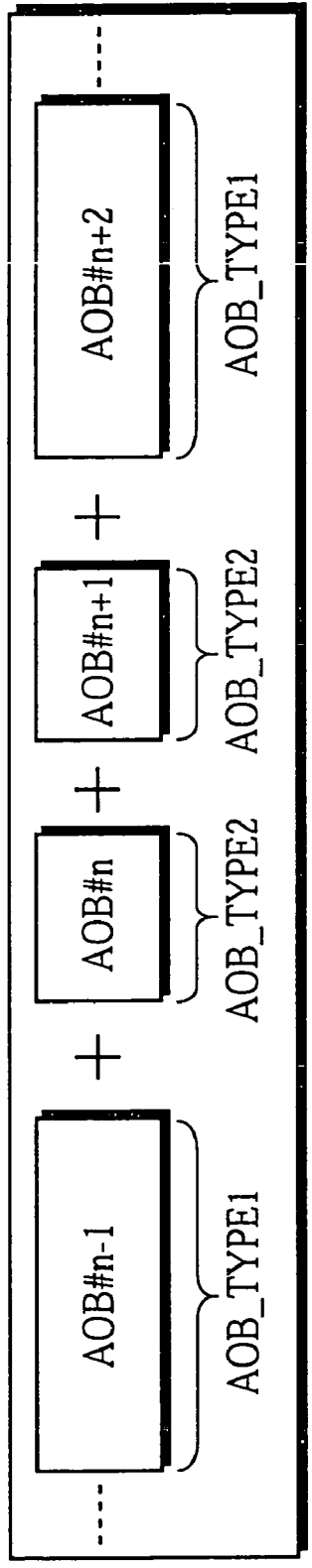
FIG. 31A PATTERN WHERE COMBINING OF AOBs POSSIBLE
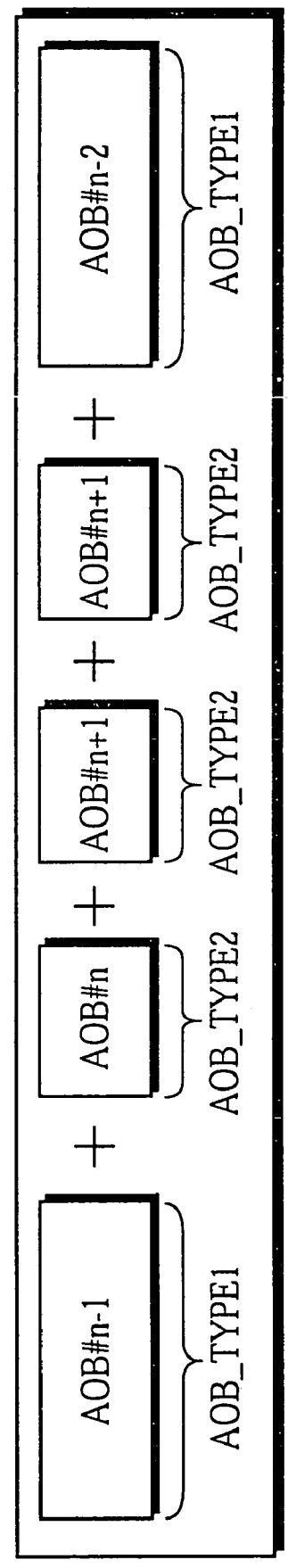
FIG. 31B PATTERN WHERE COMBINING OF AOBs NOT POSSIBLE SD-Audio DIRECTORY ENTRY SD-Audio DIRECTORY ENTRIES FIG. 50A
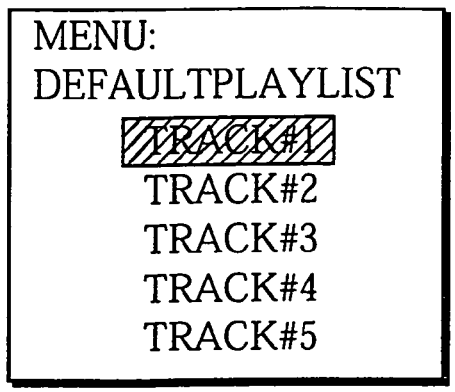
FIG. 50B
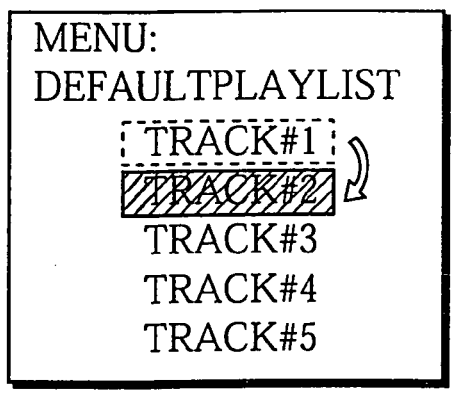
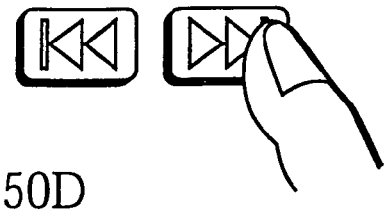
FIG. 50C
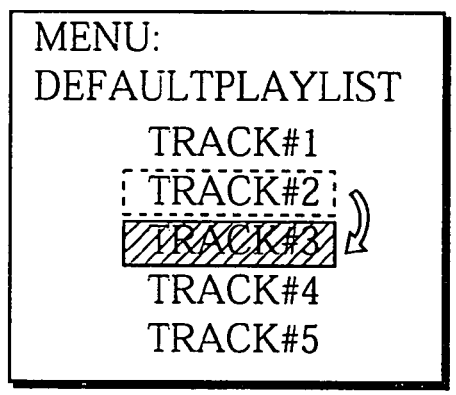
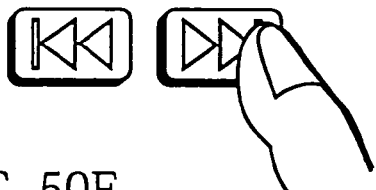
FIG. 50D
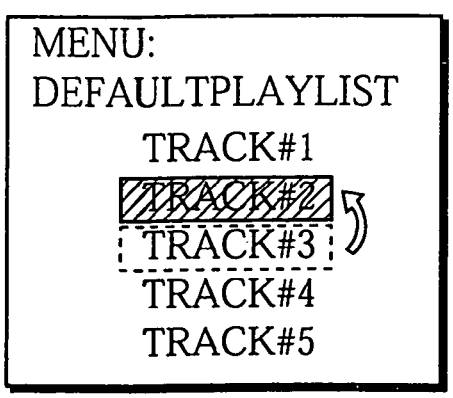
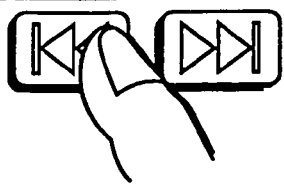
FIG. 50E
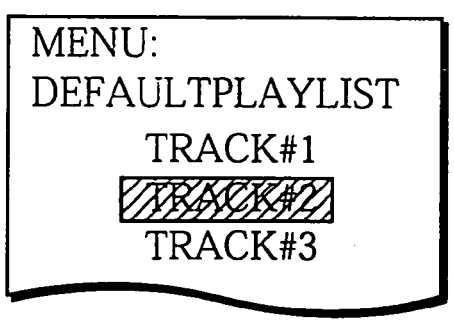
PLAY ··· INDICATES THAT TRACK#2 SHOULD BE PLAYED BACK
Playlist ··· INDICATES THAT TRACK#2 SHOULD BE EDITED

PLAYBACK TIME CODE=00:00:00.000

PLAYBACK TIME CODE=00:00:00.020

PLAYBACK TIME CODE=00:00:00.040

PLAYBACK TIME CODE=00:00:00.120

PLAYBACK TIME CODE=00:00:01.000

PLAYBACK TIME CODE=00:00:01.240

PLAYBACK TIME CODE=00:00:03.240(2.000sec+1.240sec)

PLAYBACK TIME CODE=00:00:03.480

PLAYBACK TIME CODE=00:04:40 (=280sec)
280sec=(80(=FNs_1st_TMSRTE)+148*94
(=FNs_Middle_TMSRTE)+8*20msec

FRAME POSITION
AT WHICH PLAYBACK
SHOULD START

FIG. 63
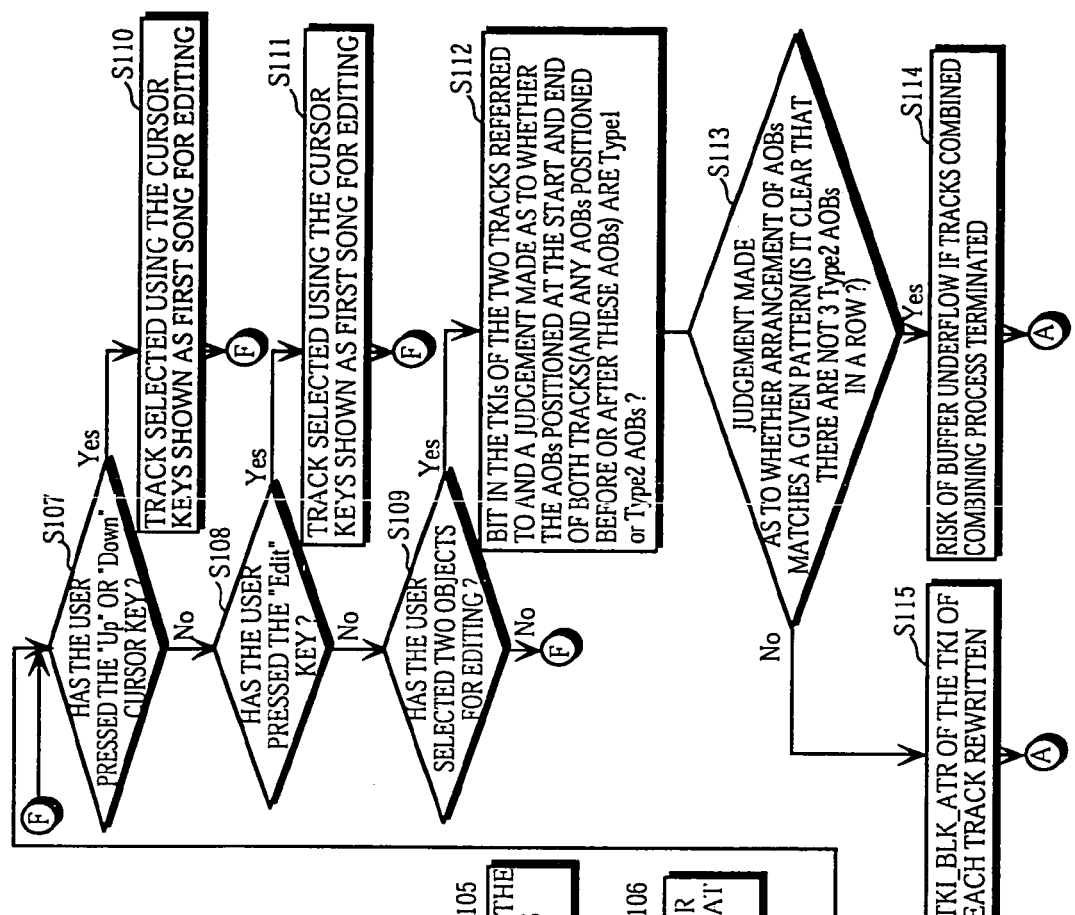
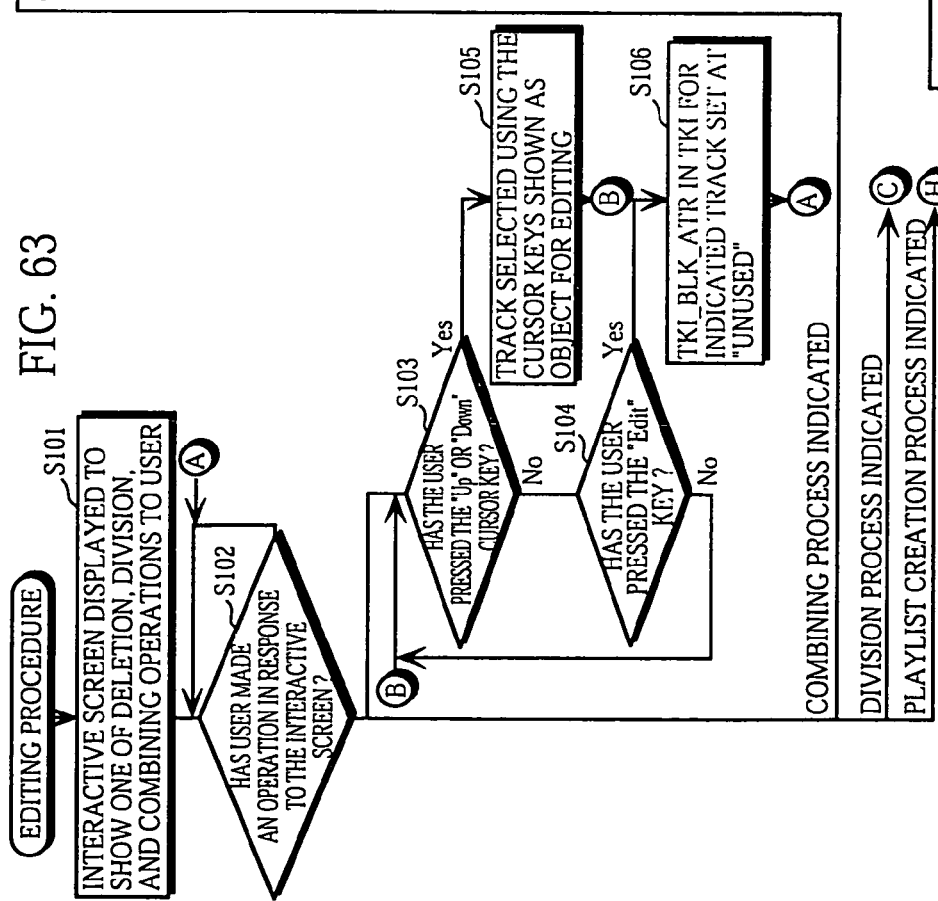

SEMICONDUCTOR MEMORY CARD, PLAYBACK APPARATUS, RECORDING APPARATUS, PLAYBACK METHOD, RECORDING METHOD, AND COMPUTER-READABLE RECORDING MEDIUM

This is a divisional application of U.S. patent application Ser. No. 09/580,601, filed May 26, 2000 now U.S. Pat. No. 6,865,431.

This application is based on application Nos. H11-149893, H11-236724 and H11-372606 filed in Japan, the content of which is hereby incorporated by reference.

BACKGROUND OF THE INVENTION

1. Field of the Invention

The present invention relates to a semiconductor memory card that stores audio data and control data, and to a playback apparatus, recording apparatus, playback method, recording method, and computer-readable recording medium relating to such a semiconductor memory card. In particular, the present invention relates to improved storage of management information and audio data distributed as content by a content distribution service, such as an electronic music distribution service.

2. Description of the Background Art

Recent years have witnessed the gradual introduction of the hardware infrastructure necessary for the electronic distribution of music. This gives rise to the potential for great change in the music industry, where products have been conventionally distributed as packaged software using media such as compact discs (CDs) and cassette tapes.

Electronic music contents (i.e., songs and albums) can be delivered to consumers by having the consumer's personal computer download contents from a server computer operated by a record label. To listen to the downloaded digital music on a portable player, the user needs to store the music data onto a portable recording medium. At present, the most suitable media for storing electronically distributed music data are semiconductor memory cards.

As examples of such, flash ATA cards and COMPACT FLASH cards are already available. Such semiconductor memory cards include a semiconductor device called flash memory (EEPROM—Electrically Erasable Programmable Read-Only Memory). Flash memory is capable of data reads and writes at much higher speeds than MD (MiniDisc) or CD-R (Compact Disc-Recordable). This means that digital music can be transferred in a short time, in spite of its large data size.

As a major disadvantage, semiconductor memory cards carry the risk of allowing users to make illegal copies of copyrighted music that has been downloaded from an electronic music distribution service. Since semiconductor memory cards allow data to be written at higher speeds than CD-R or MD, copying is thought to be a more serious problem for such memory cards. In order to overcome the potential dangers regarding copyright infringement, digital music has to be encrypted using a secure encryption method before being stored in a semiconductor memory card.

One storage method that takes into account the need to prevent unauthorized copying is the title storage method used under DVD-Audio standard. As one example of this method, a "title", which corresponds to a conventional music album, includes a plurality of "contents", which correspond to tracks on the album. The contents that compose a title are encrypted using an encryption key, called the "title key", chosen by the disc producer before being recorded on a DVD-Audio disc. This title key is encrypted using an encryption key (usually called the "disc key") that is unique to each DVD-Audio disc and is stored in a sector header region of a DVD-Audio disc. This disc key is itself encrypted using an encryption key (usually called the "master key") chosen by the manufacturers of content decoding apparatuses and is recorded in the lead-in region of the DVD-Audio disc. The sector header region and lead-in region cannot be accessed by ordinary users, making it extremely difficult for users to illegally obtain the title key recorded on a DVD-Audio disc.

In comparison to magnetic or optical storage media, semiconductor memory cards have a limited storage capacity, so that it is normally necessary to compress digital music with a high compression ratio when storing it onto a semiconductor memory card. One encoding method for achieving a sufficiently high compression ratio for digital music is MPEG2-AAC (Motion Pictures Experts Group 2—Advanced Audio Coding). One characteristic of MPEG2-AAC compression is that it makes use of the limitations of human hearing and so changes the bit length of the data assigned to each audio frame, an audio frame being the smallest playback unit and representing around 20 ms of audio. Data with longer bit lengths is assigned to audio frames that have many frequencies within the range of human hearing, while the shorter bit lengths are assigned to audio frames with fewer of such sounds or frequencies outside the range of human hearing.

Since the amount of data assigned to each audio frame in MPEG2-AAC depends on the number of audible frequencies in the frame (or in other words, because MPEG2-AAC uses variable-bitrate (VBR) encoding), high-quality audio contents can be obtained even at high rates of compression. Such audio contents are suited to distribution on a public network and to storage onto semiconductor memory cards that have a limited storage capacity.

First Problem

When contents are stored according to conventional methods, decoding the title key used to encrypt the music contents will enable the user to decrypt all of the music contents recorded on a recording medium. This gives rise to the first problem of the exposure of a single title key making it easy for users to decrypt all of the tracks stored on a semiconductor memory card.

While title keys will seldom be exposed, such exposure will result in an immeasurable loss to the copyright holder. With the great advancements in the processing power of home computers in recent years, it is becoming increasingly difficult to say that a title key used to encrypt digital music will completely safe from decoding. This gives rise to demands for a data construction that will minimize the damage to copyright holders when a title key is exposed.

Second Problem

As copyright protection is necessary for digital music that is to be distributed by electronic music distribution, such music is usually distributed in an encrypted form. Encryption is also required for digital music stored in a semiconductor memory card. However, this gives rise to a second problem that a user who has paid the proper price to purchase digital music will not be able to freely edit the music when it is stored in an encrypted manner on a semiconductor memory card. If the music contents are stored in an encrypted form, it will be very difficult for the user to change the order of tracks or to partially delete tracks. Considering that the user has paid the proper price, it is not desirable to restrict his/her ability to edit music contents in this way.

MiniDisc (MD) recorders, which can be used for recording music in the same way as a semiconductor memory card, allow a variety of track editing functions through the provision of a TOC (Table of Contents). Such functions include the rearranging of the playback order of tracks, the division of tracks, and the combining of tracks into a single track. If semiconductor memory card recorders are unable to provide the same functions as conventional MD recorders, it is believed that consumers will regard semiconductor memory card players as inferior to MD recorders, thereby damaging the commercial potential of semiconductor memory card products.

Third Problem

To provide special playback functions for digital music that has been subjected to VBR encoding, as under MPEG2-AAC, playback apparatuses need to be equipped with large-capacity memories. This raises the manufacturing cost of such apparatuses, and poses a third problem for the background art.

The special playback functions provided by MD or CD players include the ability to start playback from any track on a disc (specifying the playback position), a music search function that plays back intermittent bursts of music to enable users to skip through tracks forwards or backwards at high speed, and a time search function whereby users can have the playback start from a position inputted as a time measured from the start of the disc. To capture the market currently held by MD or CD players, it is essential for playback apparatuses of semiconductor memory cards to provide the same special playback functions as MD players. When music contents are subjected to constant bitrate (CBR) encoding, playback from a position specified using a time code (such a point one or two minutes from the start of a track) can be performed simply by referring to an address that is offset by an integer multiple of the data size of the unit playback time. However, when music contents are encoded using a VBR method such as MPEG2-AAC, the positions corresponding to one or two minutes ahead of the current position will seldom be offset by an integer multiple of the data size of the unit playback time. As a result, a player will need to refer to a time search table produced in advance to show which addresses correspond to the points one minute and two minutes further ahead.

While a time search table for a short track will not need to include a large number of playback positions, this cannot be said for the time search tables of long tracks, so that the time search tables of long tracks are very large. To provide special playback features, a playback apparatus has to access the time search table having first loaded it into its memory. Since long tracks have large time search tables, this means that a playback apparatus has to be provided with a large memory for storing the time search table. This also increases the manufacturing costs of playback apparatuses.

SUMMARY OF THE INVENTION

It is a first object of the present invention to provide a semiconductor memory card that protects the copyrights of music contents stored therein while allowing users to edit the music contents.

It is a second object of the present invention to provide a playback apparatus that can perform special playback functions such as forward and backward search for music contents recorded on a semiconductor memory card without using a large-capacity memory.

The first object of the present invention can be achieved by a semiconductor memory card that stores at least one audio track, including: a protected area that can be accessed by a device connected to the semiconductor memory card only if the device has been found to be authentic, the protected area storing an encryption key sequence composed of a plurality of encryption keys arranged into a predetermined order; and an unprotected area that can be accessed by any device connected to the semiconductor memory card, the unprotected area storing at least one audio track and management information, the at least one audio track including a plurality of encrypted audio objects, and the management information showing which encryption key, out of the plurality of encryption keys, corresponds to each audio object stored in the unprotected area.

With the stated construction, a plurality of audio objects can be encrypted using a plurality of encryption keys, so that should the encryption key used to encrypt a particular audio object be decoded and exposed, such decoding will only enable that particular audio object to be decrypted and so will have no effect on other audio objects. This means that the present semiconductor memory card minimizes the damage caused by the exposure of one of the encryption keys.

Here, each audio track may further include (1) attribute information and (2) link information for each audio object included in the audio track, the attribute information showing a type, out of type (a), type (b), type (c) and type (d), for each audio object, type (a) being an entire audio track, type (b) being a first part of an audio track, type (c) being a middle part of an audio track, and type (d) being an end part of an audio track, and the link information for each audio object that is type (b) or type (c) showing which audio object follows the audio object.

Use of the stated construction achieves the effects described below. The attribute information shows how the encrypted audio objects compose audio tracks, so that when two audio objects are managed as two separate audio tracks, such tracks can be combined to form a single track by merely changing the attribute information to show that the audio objects correspond to the start and end of a track. Since audio tracks can be combined by changing the attribute information, tracks can be combined at high speed without needing to remove the encryption of the audio tracks.

Here, the plurality of audio objects may include: at least one audio object that only contains valid data that needs to be played back; and at least one audio object that contains (1) valid data and (2) invalid data located at least one of before and after the valid data, the invalid data not needing to be played back, each audio track further including block information for each audio object in the audio track, the block information including: an offset measured from the storage position of the corresponding audio object given in the management information; and length information showing a length of the valid data that starts from a position indicated by the offset, the attribute information for an audio object showing whether the valid data indicated by the offset and the length information (a) corresponds to an entire audio track, (b) corresponds to a first part of an audio track, (c) corresponds to a middle part of an audio track, or (d) corresponds to an end part of an audio track.

When invalid data is present at the start of an audio frame, the length of this invalid data and the length of the valid data in the audio frame can be set in the block information. As a result, when the user records a radio broadcast where the disc jockey talks over the intro of a song, a suitable data offset can be set in the block information to have the song played back without the part of the intro that includes the disc jockey's voice. Such editing operations can be performed by merely indicating what data should not be played back in the block information and are performed with the audio objects in their encrypted state. This means that tracks can be edited at high speed.

The second object of the present invention can be achieved by a recording apparatus for a semiconductor memory card, including: a first generating unit for successively generating audio frames from an input signal received from outside the recording apparatus, an audio frame being a smallest amount of data that can be independently decoded; a writing unit for creating a file on the semiconductor memory card and writing the successively generated audio frames into the file; a second generating unit for generating, whenever the writing unit has written a predetermined number of audio frames into a file, a piece of entry information showing a data length of an audio element that is composed of the audio frames written into the file, wherein whenever the second generating unit has generated a predetermined number of pieces of entry information, the writing unit creates a new file and writes the audio frames successively generated thereafter into the new file.

When an audio stream is for a music album which includes a long track, the long track is divided into a plurality of files to ensure that the number of pieces of entry information for a single file does not exceed a predetermined number. Limiting the number of pieces of entry information in a file suppresses the size of the management information of a file. This management information is used by a playback apparatus as described below. When a playback apparatus reads a file and commences playback of the audio object included in the file, the playback apparatus also reads the management information for the file and stores it in an internal memory. This management information needs to be kept in the memory as long as the playback of the audio object continues. When the playback of this audio object ends, the following audio object is read. When playback commences for this following audio object, the corresponding management information is read and overwritten into internal memory of the playback apparatus to take the place of the management information that was hitherto stored.

The playback apparatus therefore repeatedly performs a process that loads only the management information for the audio object currently being played back into its internal memory. This enables playback apparatuses with limited memory capacity to perform special playback functions such as forward and backward search.

The assignment of the plurality of audio objects to audio tracks and the order to be used when playing back audio tracks is determined by the management information, so that tracks can be freely edited by merely updating the management information.

BRIEF DESCRIPTION OF THE DRAWINGS

These and other objects, advantages and features of the invention will become apparent from the following description thereof taken in conjunction with the accompanying drawings which illustrate a specific embodiment of the invention. In the Drawings:

FIG. 11A shows the parameters stipulated by ISO/IEC 13818-7 standard in tabular form;

FIG. 11B shows the parameters that should be used when encoding a file in MPEG-Layer 3 (MP3) format in tabular form;

FIG. 11C shows the parameters that should be used when encoding a file in Windows Media Audio (WMA) format in tabular form;

FIG. 14 shows the correspondence between the sampling_frequency and the number of AOB_FRAMEs included in an AOB_ELEMENT;

FIGS. 23A and 23B show the composition of the BIT;

FIG. 23C shows the Time_Length field;

FIGS. 26A and 26B show how an AOB, an AOB_ELEMENT, and an AOB_FRAME that correspond to an arbitrary playback time code are specified;

FIG. 28A shows the TrackManager after the deletion of a track has been performed several times;

FIG. 28B shows how a new TKI and AOB file are written when "Unused" TKIs are present in the TrackManager;

FIG. 30A shows a Type1 AOB;

FIG. 30B shows Type2 AOBs;

FIG. 31A shows the combining of a plurality of tracks into a single track for a combination of a Type1+Type2+Type2+Type1+AOB;

FIG. 31B shows the combining of a plurality of tracks into a single track for a combination of a Type1+Type2+Type2+Type2+Type1+AOB;

FIGS. 50A to 50E show examples of the display on the LCD panel when a track is selected;

FIG. 63 is a flowchart showing the processing in the editing control program;

DESCRIPTION OF THE PREFERRED EMBODIMENTS

The following describes a semiconductor memory card (flash memory card) that is an embodiment of the present invention, with reference to the attached figures.

The following paragraphs are arranged into a hierarchy using reference numbers with the notation given below.

{x1-x2_x3-x4}

The length of a reference number shows the level of the topic in the hierarchy. As a specific example, the number x1 is the number of drawing that is being referred to in the explanation. The drawings attached to this specification have been numbered in the order in which they are referred to in the specification, so that the order of the drawings roughly matches the order of the explanation. The explanation of certain drawings has been divided into sections, with the reference number x2 giving the section number of a section in the explanation of a drawing indicated by the reference number x1. The reference number x3 shows the number of an additional drawing that is provided to show the details of the section indicated by the section number x2. Finally, the reference number x4 shows the number of a section in the explanation of this additional drawing.

First Embodiment

{1-1_2} External Appearance of the Flash Memory Card 31

Figure 1:
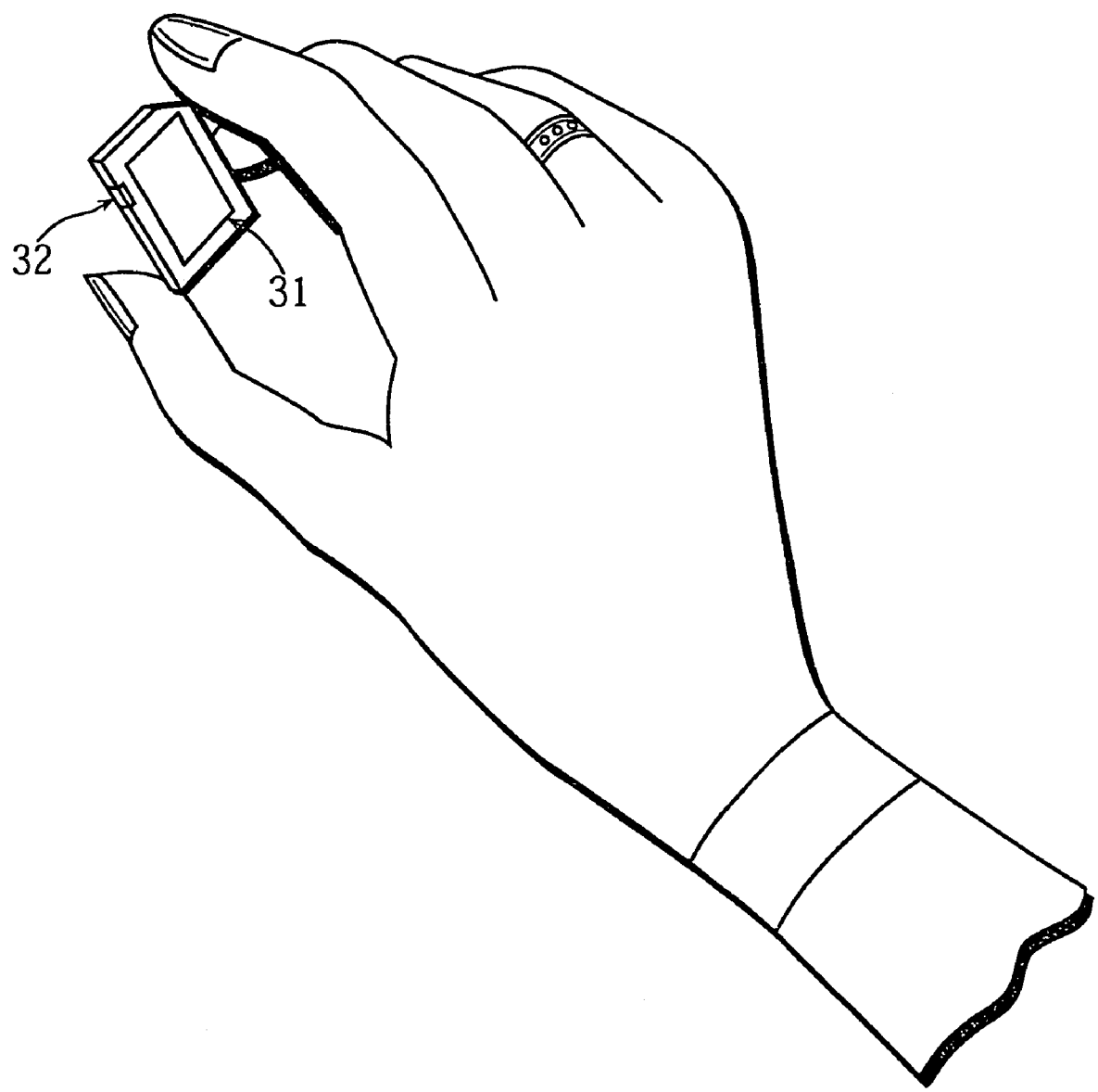
FIG. 1 shows the appearance of a flash memory card 31 when viewed from above.
Figure 2:
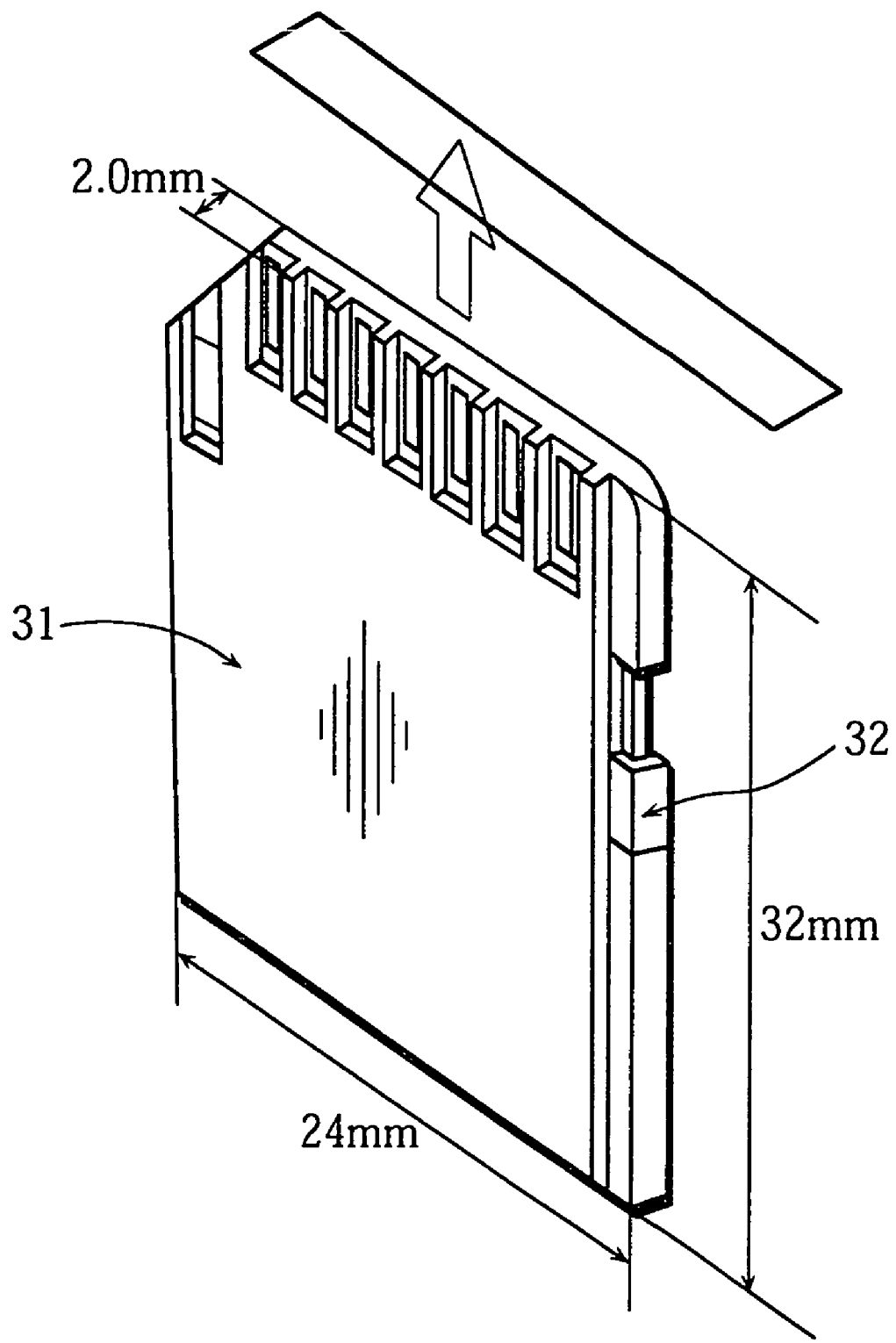
FIG. 2 shows the construction of the flash memory card 31 when viewed from below.

The present explanation starts with the external appearance of the flash memory card 31. FIG. 1 shows the appearance of the flash memory card 31 when viewed from above, while FIG. 2 shows the construction of the flash memory card 31 when viewed from below. As shown in FIGS. 1 and 2, the flash memory card 31 is around the same size as a postage stamp, and so is large enough to be held by hand. Its approximate dimensions are 32.0 mm long, 24.0 mm wide, and 2.0 mm thick.

The flash memory card 31 can be seen to have nine connectors on its bottom edge for connecting the card to a compatible device and a protect switch 32 on one side to enable the user to set whether overwriting of the stored content of the flash memory card 31 is permitted or prohibited.

{3-1} Physical Construction of the Flash Memory Card 31

Figure 3:
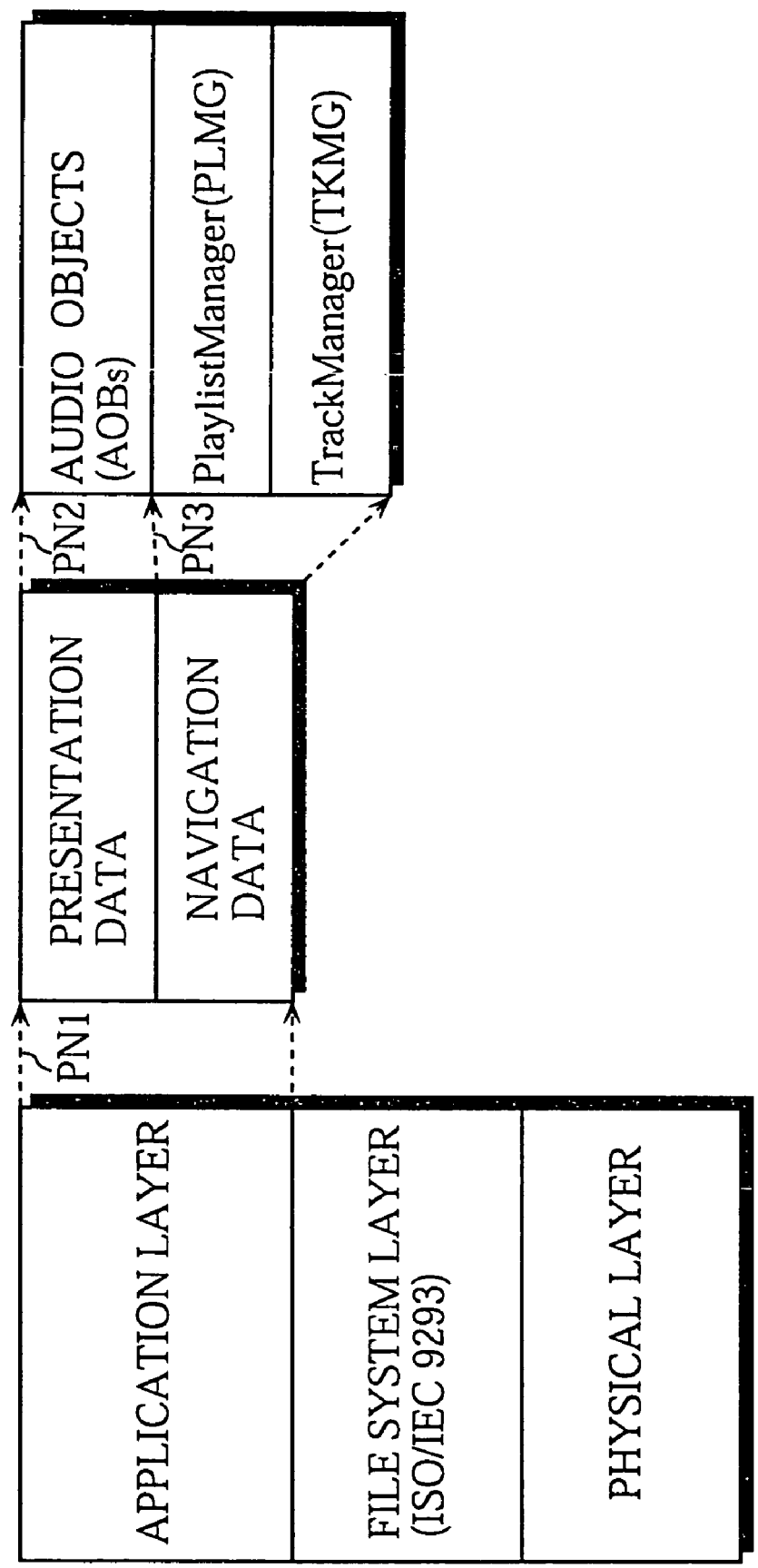
FIG. 3 shows the hierarchical composition of the flash memory card 31 in the embodiments.

FIG. 3 shows the hierarchical structure of the semiconductor memory card (hereafter referred to as the "flash memory card 31") of the present embodiment. As shown in FIG. 3, the flash memory card 31 is constructed with a physical layer, a file system layer and an application layer in the same way as a DVD (Digital Video Disc), though the logical and physical constructions of these layers are very different to those on a DVD.

{3-2} Physical Layer of the Flash Memory Card 31

The following describes the physical layer of the flash memory card 31. The flash memory is composed of a plurality of sectors, each of which stores 512 bytes of digital data. As one example, a 64 MB flash memory card 31 will have a storage capacity of 67,108,864 (=64*1,024*1,024) bytes, so that this card will include 131,072(=67108864/512) valid sectors. Once the number of replacement sectors, which are provided for use in case of errors, is subtracted, the remaining number of valid sectors into which various kinds of data can be written is around 128,000.

{3-2_4A-1} Three Regions in the Physical Layer

Figure 4B:
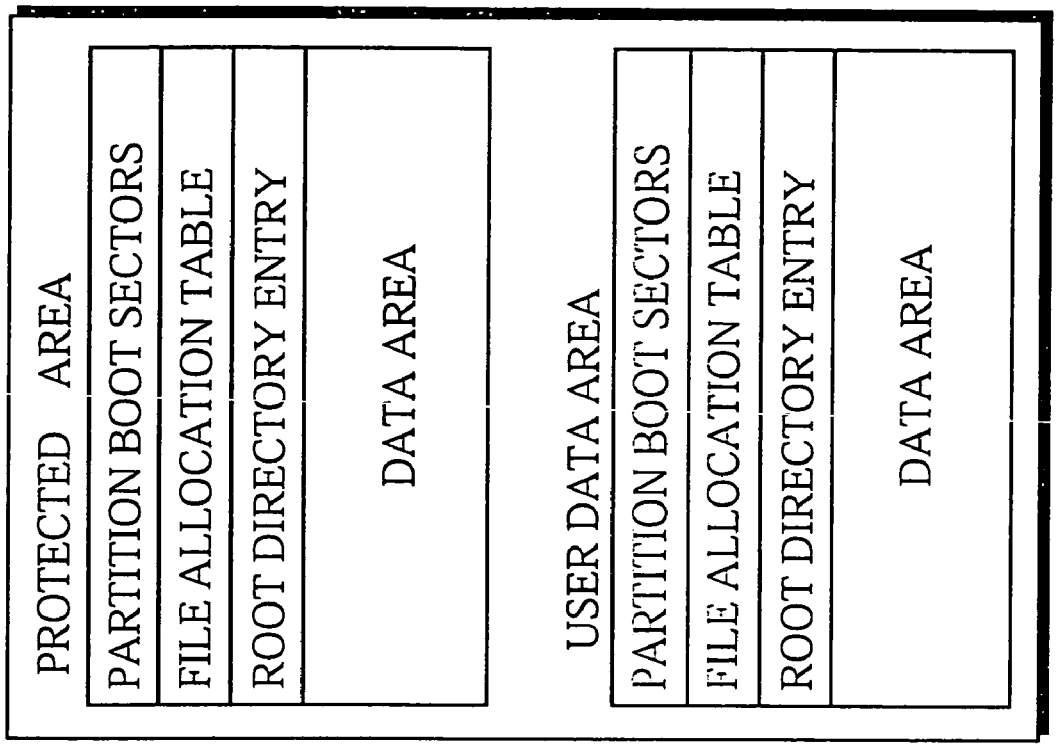
FIG. 4B shows the composition of the authentication region and the user region in the file system layer.
Figure 4A:
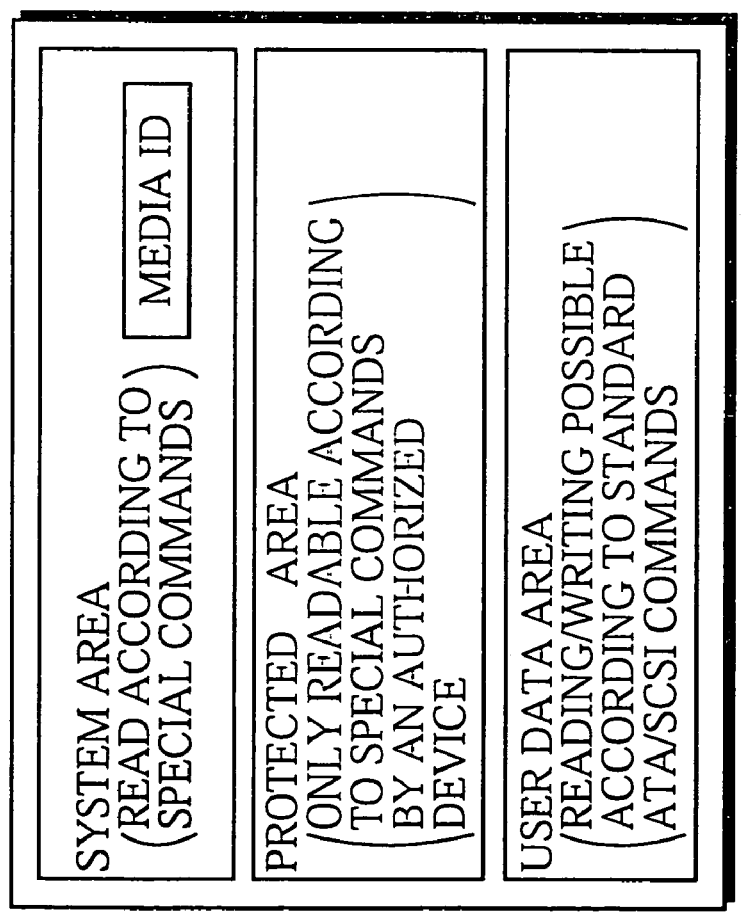
FIG. 4A shows the special region, the authentication region and the user region provided in the physical layer of the flash memory card 31.

The three regions shown in FIG. 4A are provided in the storage area composed of these valid sectors. These regions are the "special region", the "authentication region" and the "user region", and are described in detail below. The user region is characterized in that a device to which the flash memory card 31 is connected can freely read or write various kinds of data from or into this region. Areas within the user region are managed by a file system.

The special region stores a media ID that is a value uniquely assigned to each flash memory card 31. Unlike the user region, this region is read-only, so that the media ID stored in the special region cannot be changed.

The authentication region is a writeable region, like the user region. This region differs from the user region in that a device connected to the flash memory card 31 can access (i.e., read or write data in) the authentication region only if the flash memory card 31 and the device have first confirmed that each other is an authentic device. In other words, data can only be read from or written into the authentication region if mutual authentication has been successfully performed by the flash memory card 31 and the device connected to the flash memory card 31.

{3-2_4A-2} Uses of the Three Regions in the Physical Layer

When the device connected to the flash memory card 31 writes data into the flash memory card 31, the region used to store this data will depend on whether copyright protection is necessary for the data being written. When data that requires copyright protection is written into the flash memory card 31, the data is encrypted using a predetermined encryption key (called a "FileKey") before being written into the user area. This FileKey can be freely set by the copyright holder and, while the use of this FileKey provides some level of copyright protection, the FileKey used for encrypting the written data is itself encrypted to make the copyright protection more secure. Any value obtained by subjecting the media ID stored in the special region into a predetermined calculation can be used to encrypt the FileKey. The encrypted FileKey produced in this way is stored in the authentication region.

Since data that requires copyright protection is subjected to a two-step encryption process where the data is encrypted using a FileKey that is itself encrypted based on the media ID, copyright infringement, such as the production of unauthorized copies of this data, will be extremely difficult.

{3-2_4B-1} Overview of the File System

As can be understood, the construction of the physical layer of the flash memory card 31 strengthens the copyright protection of the data written in the flash memory card 31. The following describes the file system layer present on this physical layer. While the file system layer of a DVD uses a UDF (Universal Disk Format)-type file system, the file system layer of the flash memory card 31 uses a FAT (File Allocation Table)-type file system, as described in ISO/IEC 9293.

Figure 5:
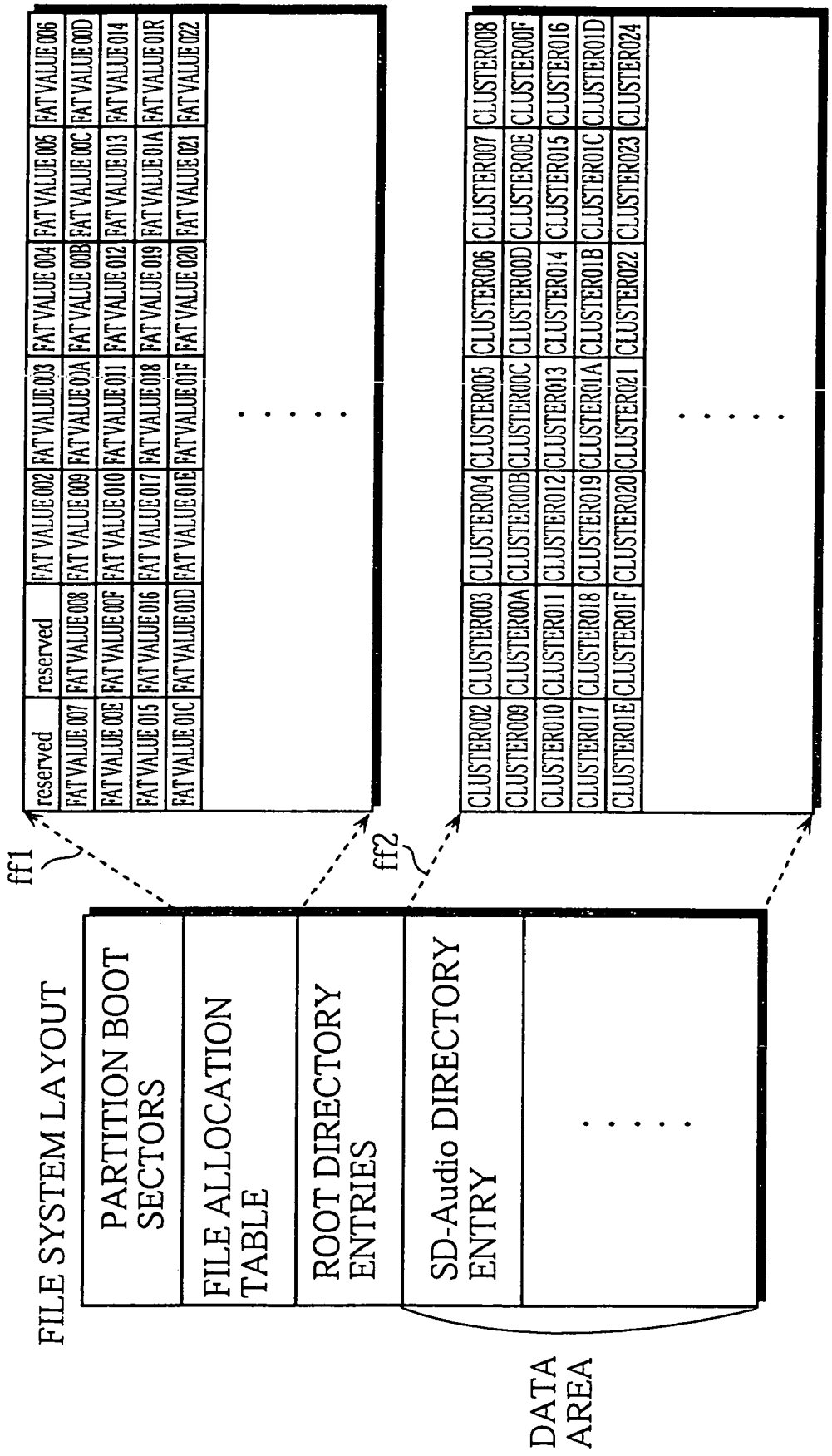
FIG. 5 shows the detailed composition of the file system layer.

FIG. 4B shows the construction of the authentication region and the user region in the file system layer. As shown in FIG. 4B, the authentication region and the user region in the file system each include "partition boot sectors", a "file allocation table (FAT)", a "root directory", and a "data region", meaning that the authentication region and the user region have the same construction. FIG. 5 shows the various parts of these file systems in more detail. The following describes the construction of the user region with reference to FIGS. 4A, 4B and 5.

{3-2_4B-2} Partition Boot Sectors

The partition boot sectors are sectors that store the data that will be referred to by a standard personal computer that is connected to the flash memory card 31 when the flash memory card 31 is set as the boot disk for the operating system (OS) of the personal computer.

{3-2_4B-3_5} Data Region

The data region can be accessed by a device connected to the flash memory card 31 in units no smaller than a "cluster". While each sector in the flash memory card 31 is 512 bytes in size, the cluster size is 16 KB, so that the file system layer reads and writes data in units of 32 sectors.

The reason the cluster size is set at 16 KB is that when data is written onto the flash memory card 31, part of the data stored in the flash memory card 31 first has to be erased before the write can be performed.

The smallest amount of data that can be erased in the flash memory card 31 is 16 KB, so that setting the smallest erasable size as the cluster size means that data writes can be favorably performed. The arrow ff2 drawn using a broken line in FIG. 5 shows the plurality of clusters 002, 003, 004, 005 . . . included in the data region. The numbers 002, 003, 004, 005, 006, 007, 008 . . . used in FIG. 5 are the three-digit hexadecimal cluster numbers that are exclusively assigned to identify each cluster. Since the smallest unit by which access can be performed is one cluster, storage positions within the data region are indicated using cluster numbers.

{3-2_4B-4_5} File Allocation System

The file allocation system has a file system construction in accordance with ISO/IEC 9293 standard, and so is made up of a plurality of FAT values. Each FAT value corresponds to a cluster and shows which cluster should be read after the cluster corresponding to the FAT value. The arrow ff1 shown by a broken line in FIG. 5 shows the plurality of FAT values 002, 003, 004, 005 . . . that are included in the file allocation table. The numbers 002, 003, 004, 005 . . . assigned to each FAT value show which cluster corresponds to each FAT value and therefore are the cluster numbers of the clusters corresponding to the FAT values.

{3-2_4B-5_5-1} Root Directory Entries

The "root directory entries" are information showing what kinds of files are present in the root directory. As specific examples, the "filename" of an existing file, its "filename extension", the "revision time/date" and "number of first cluster in file" showing where the start of the file is stored can be written as the root directory entry of a file.

{3-2_4B-5_5-2} Directory Entries for Subdirectories

Information relating to files in the root directory is written as root directory entries, though information relating to subdirectories is not written as the root directory entries. Directory entries for subdirectories are instead produced in the data region. In FIG. 5, the SD-Audio directory entry given in the data region is one example of a directory entry for a subdirectory. Like a root directory entry, an SD-Audio directory entry includes the "filename" of a file present in this subdirectory, its "filename extension", the "revision time/date" and "number of first cluster in file" showing where the start of the file is stored.

{3-2_4B-5_6-1} Storage Format for AOB Files

Figure 6:
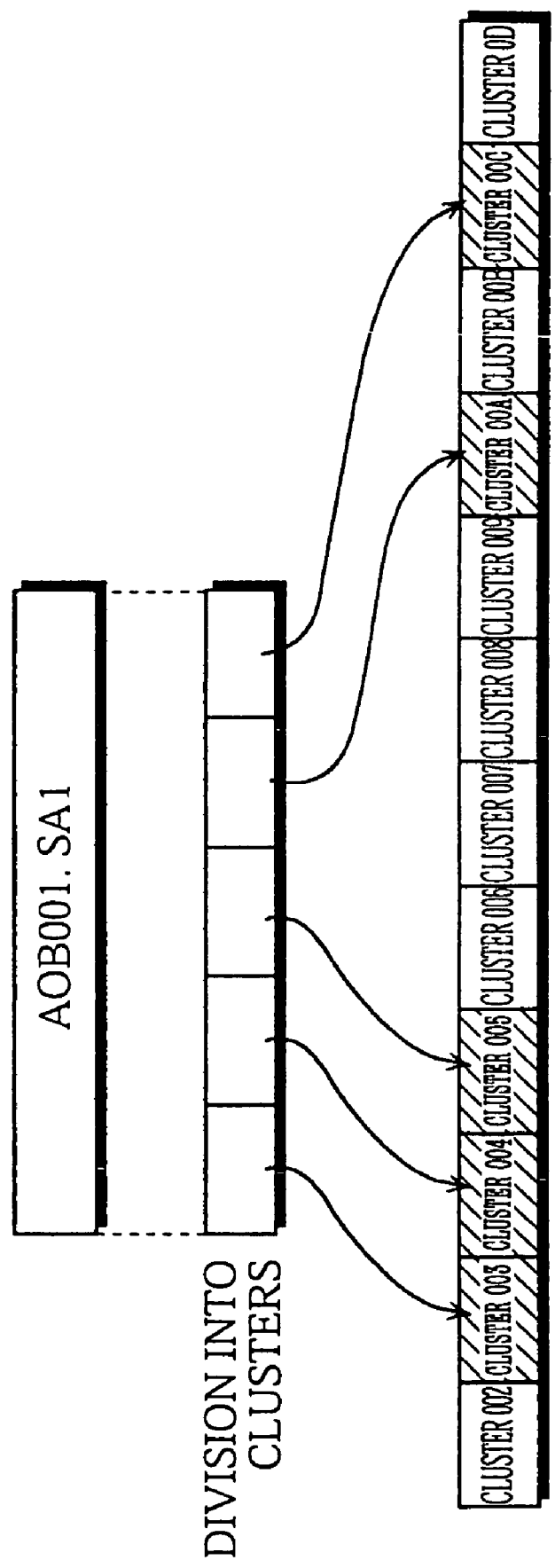
FIG. 6 is a representation of when the AOB file "AOB001.SA1" is divided into five parts that are stored in clusters 003, 004, 005, 00A, and 00C.

The following describes the file storage method by showing how a file named "AOB001.SA1" is stored in the SD-Audio directory, with reference to FIG. 6. Since the smallest unit by which the data region can be accessed is one cluster, the file "AOB001.SA1" needs to be stored in the data region in parts that are no smaller than one cluster. The file "AOB001.SA1" is therefore stored having first been divided into clusters. In FIG. 6, the file "AOB001.SA1" is divided into five parts in keeping with the cluster size, and the resulting parts are stored into the clusters numbered 003, 004, 005, 00A, and 00C.

{3-2_4B-5_7-1} Storage Format for AOB Files

Figure 7:
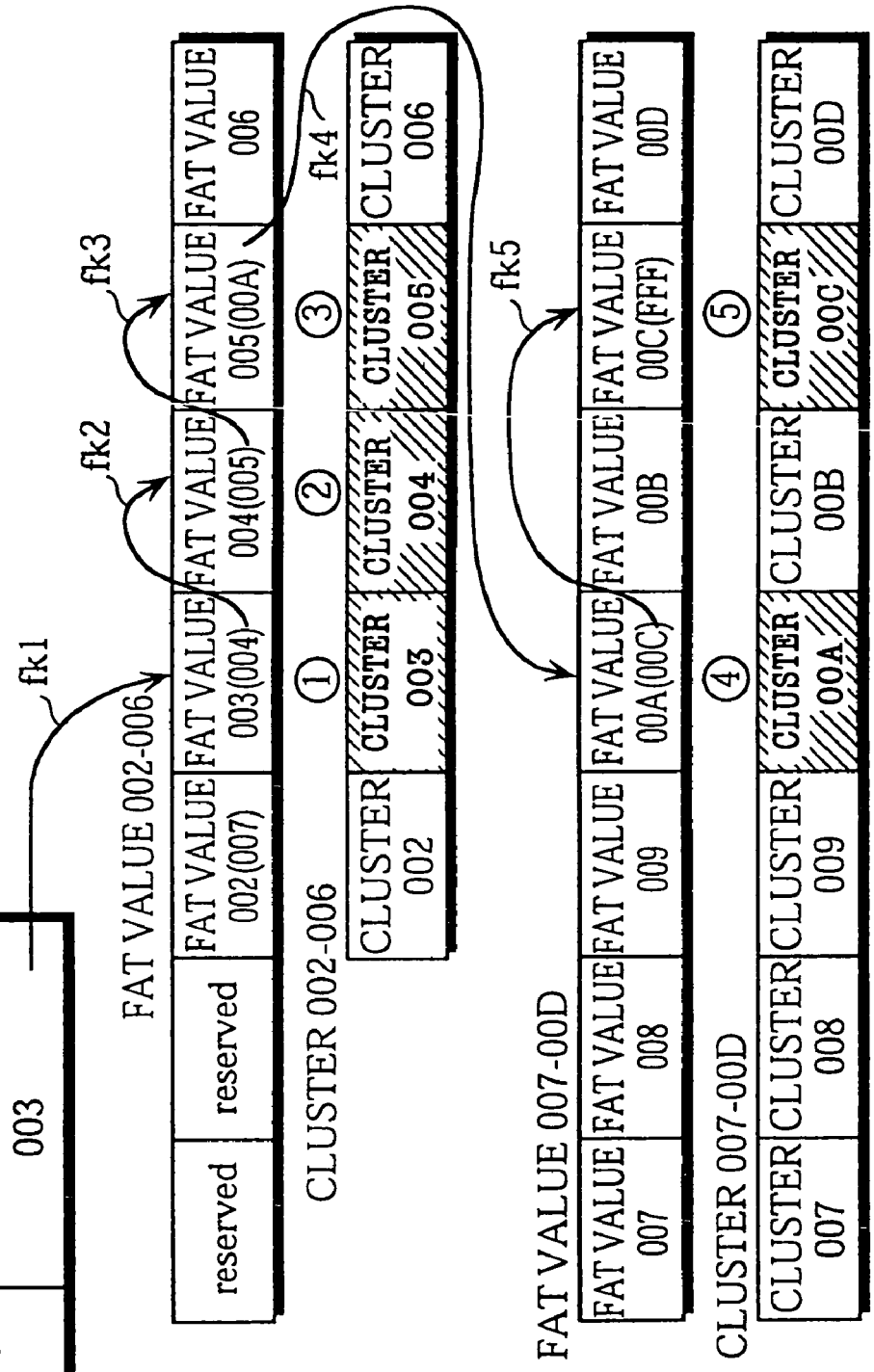
FIG. 7 shows one example of the settings of the directory entries and file allocation table when the AOB file "AOB001.SA1" is recorded in a plurality of clusters.

When the file "AOB001.SA1" is divided up into parts and stored, a directory entry and the file allocation table need to be set as shown in FIG. 7. FIG. 7 shows one example of how the directory entry and file allocation table need to be set when the file "AOB001.SA1" is stored having been divided up into parts and stored. In FIG. 7, the start of the file "AOB001.SA1" is stored in cluster 003, so that cluster number 003 is written into "the number of first cluster in file" in the SD-Audio directory entry to indicate the cluster storing the first part of the file. As shown in FIG. 7, the following parts of the file "AOB001.SA1" are stored in clusters 004 and 005. As a result, while the FAT value 003(004) corresponds to cluster 003 that stores the first part of the file "AOB001.SA1", this value indicates cluster 004 as the cluster storing the next part of the file "AOB001.SA1". In the same way, while the FAT values 004(005) and 005(00A) respectively correspond to clusters 004 and 005 that store the next parts of the file "AOB001.SA1", these values respectively indicate cluster 005 and cluster 00A as the clusters storing the next parts of the file "AOB001.SA1". By reading the clusters with the cluster numbers written into these FAT values in order as shown by the arrows fk1, fk2, fk3, fk4, fk5 . . . in FIG. 7, all of the parts produced by dividing the file "AOB001.SA1" can be read. As explained above, the data region of the flash memory card 31 is accessed in units of clusters, each of which is associated with a FAT value. Note that the FAT value that corresponds to the cluster storing the final part of an AOB file (the cluster 00C in the example shown in FIG. 7) is set the cluster number FFF to show that the corresponding cluster stores the final part of a file.

This completes the explanation of the file system in the flash memory card 31 of the present invention. The following describes the application layer that exists on this file system.

{3-3} Overview of the Application Layer in the Flash Memory Card 31

An overview of the application layer in the flash memory card 31 is shown in FIG. 3. As shown by the arrow PN2 drawn with a broken line in FIG. 3, the application layer in the flash memory card 31 is composed of presentation data and navigation data that is used to control the playback of the presentation data. As shown by the arrow PN2, the presentation data includes sets of audio objects (AOB sets) that are produced by encoding audio data that represents music, for example. The navigation data includes a "PlaylistManager" (PLMG) and a "TrackManager" (TKMG).

{3-3_8A,B-1} Directory Composition

Figure 8A:
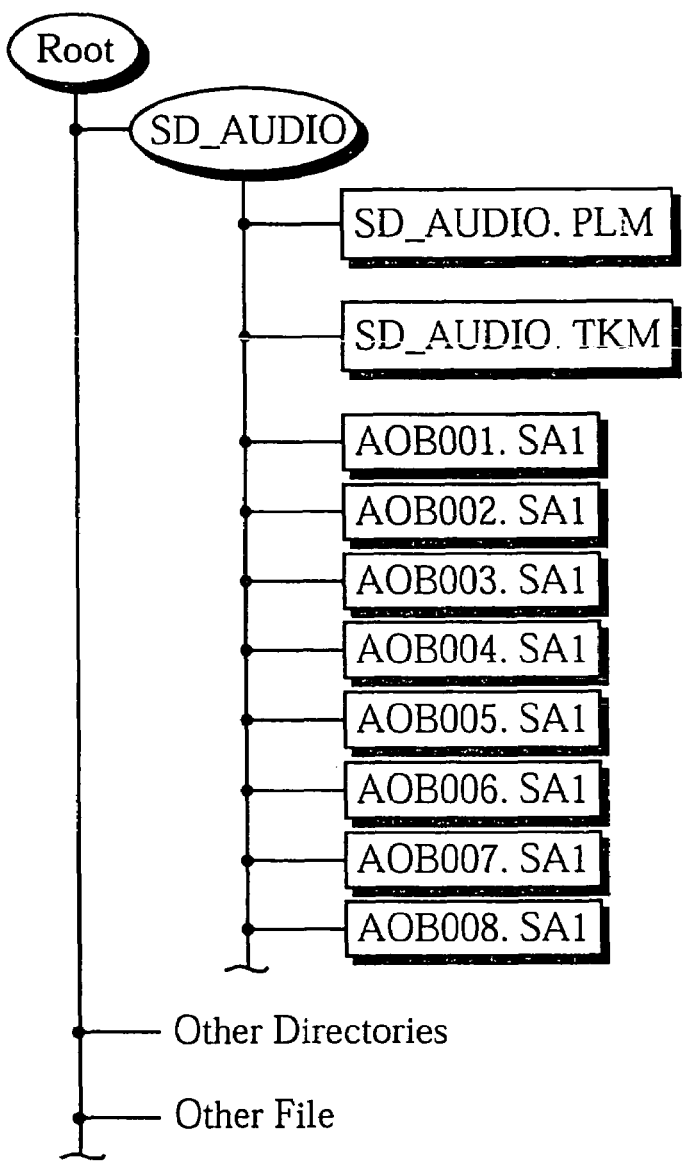
FIGS. 8A and 8B show what directories are provided in the user region and the authentication region in the file system layer when the above two types of data are recorded in the application layer, as well as what kind of files are recorded in which directories.
Figure 8B:
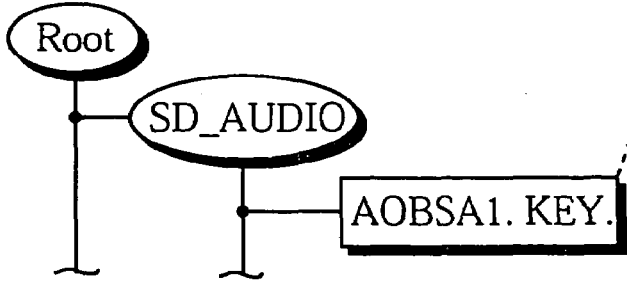

FIGS. 8A and 8B show what kind of directories are present in the user region and the authentication region in the file system layer when these two types of data are stored in the application layer, as well as showing what files are arranged into these directories.

The filenames "SDAUDIO.PLM" and "SD AUDIO.TKM" in FIG. 8A indicate the files in which the PlaylistManager (PLMG) and TrackManager (TKMG) composing the navigation information are stored. Meanwhile, the filenames "AOB001.SA1", "AOB002.SA1", "AOB003.SA1", "AOB004.SA1", . . . indicate the files ("AOB" files) storing the audio objects that are the presentation data. The letters "SA" in the filename extension of the filename "AOB0xx.SA1" are an abbreviation for "Secure Audio", and show that the stored content of this file requires copyright protection. Note that while only eight AOB files are shown in the example in FIG. 8A, a maximum of 999 AOB files can be stored in an SD-Audio directory.

When copyright protection is required for presentation data, a subdirectory called an "SD-Audio directory" is provided in the authentication region and an encryption key storing file "AOBSA1.KEY" is produced in this SD-Audio directory.

FIG. 8B shows the encryption key storing file "AOBSA1.KEY" that is stored under the "SD-Audio" legend (i.e., within the "SD-Audio directory"). This encryption key storing file "AOBSA1.KEY" stores a sequence of encryption keys that is produced by arranging a plurality of encryption keys into a predetermined order.

The SD-Audio directory shown in FIGS. 8A and 8B is stored in a server computer managed by a record label that uses electronic music distribution. When a consumer orders a music content, the corresponding SD-Audio directory is compressed, encrypted and transmitted to the consumer via a public network. The consumer's computer receives this SD-Audio directory, decrypts it, decompresses it and so obtains the original SD-Audio directory. Note that the expression "public network" here refers to any kind of network that can be used by the public, such as a wired communication network, e.g., an ISDN network, or a wireless communication network, e.g., a mobile telephone system. It is also possible for a consumer's computer to download an AOB file from a server computer operated by a record label and then produce an SD-Audio directory, such as that shown in FIGS. 8A and 8B, in the flash memory card 31.

{3-3_9-1} Correspondence between the "AOBSA1.KEY" File and the AOB Files

Figure 9:
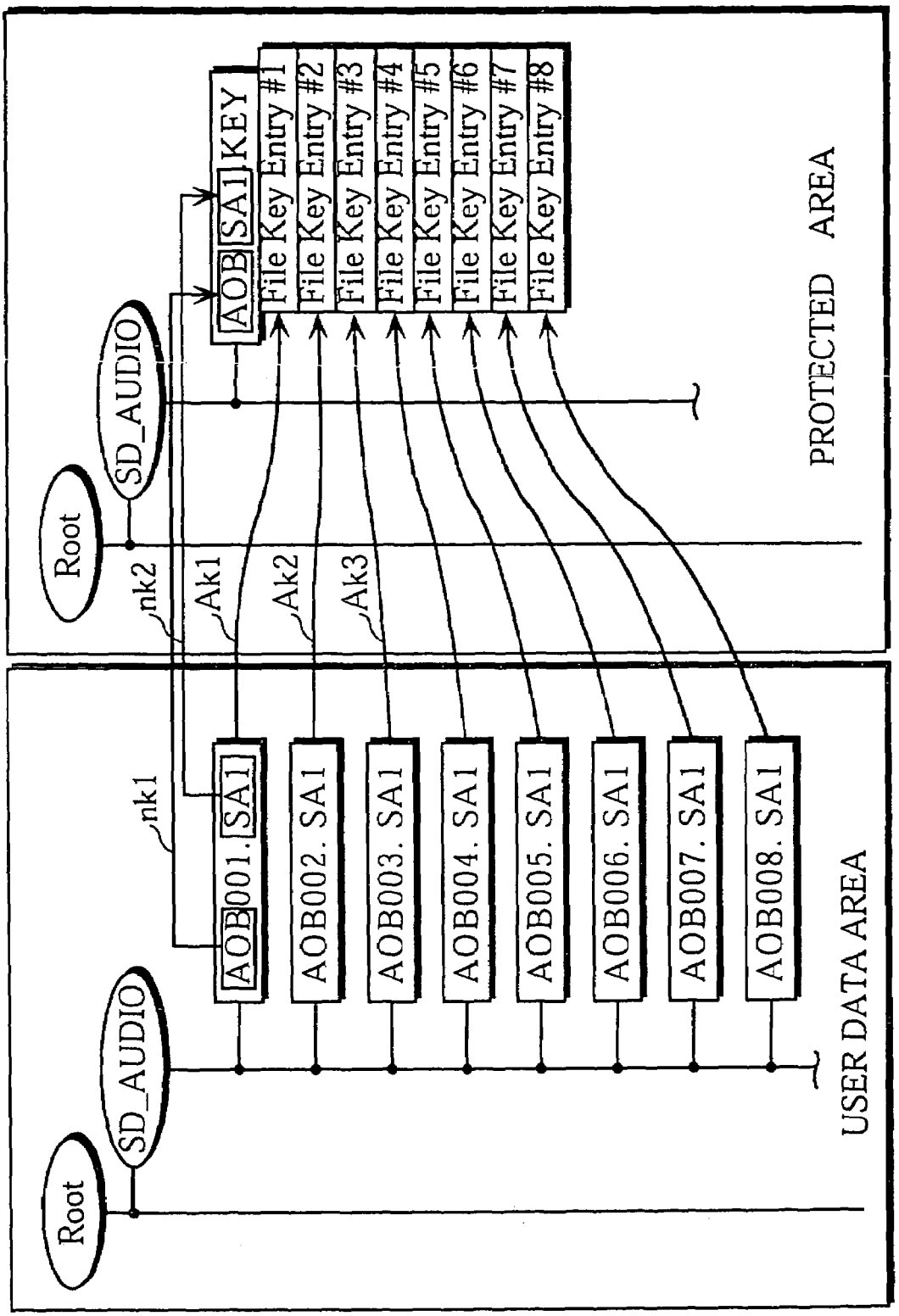
FIG. 9 shows the correspondence between the file "AOBSA1.KEY" and the AOB files in the SD_Audio directories.

FIG. 9 shows the correspondence between the "AOBSA1.KEY" file in the SD-Audio directory and the AOB files. The FileKeys used when encrypting files in the user region shown in FIG. 9 are stored in the corresponding encryption key storing file in the authentication region.

The encrypted AOB files and the encryption key storing file correspond according to the predetermined rules (1), (2), and (3) described below.

The encryption key storing file is arranged into a directory with the same directory name as the directory in which the encrypted file is stored. In FIG. 9, AOB files are arranged into the SD-Audio directory in the user region and the encryption key storing file is arranged into a directory called the SD-Audio directory in the authentication region, in accordance with this rule.

(2) The encryption key storing file is given a filename produced by combining the first three letters of the filename of the AOB files in the data region with the predetermined ".key" extension. When the filename of an AOB file is "AOB001.SA1", the encryption key storing file is given the filename "AOBSA1.KEY" produced by adding the first three characters "AOB", "SA1", and the extension ".key", as shown by the arrows nk1 and nk2 in FIG. 9.

(3) The filename of an AOB file is given a serial number showing the position of the FileKey corresponding to this audio object in the sequence of encryption keys given in the encryption key storing file.

The "File Key Entries #1, #2, #3 . . . #8" show the first positions of the regions in which the respective FileKeys in the encryption key storing file are stored. Meanwhile, the filenames of AOB files are assigned the serial numbers "001", "002", 110031, "004". . . . These serial numbers show the positions of the corresponding FileKeys in the encryption key sequence, so that the FileKey that was used to encrypt each AOB file will be present in the "FileKey Entry" with the same serial number. In FIG. 9, the arrows Ak1, Ak2, Ak3, . . . show the correspondence between AOB files and FileKeys. In other words, the file "AOB001.SA1" corresponds to the FileKey whose storage position is indicated by the "FileKey Entry#1", the file "AOB002.SA1" corresponds to the FileKey whose storage position is indicated by the "FileKey Entry#2", and the file "AOB003.SA1" correspondsto the FileKey whose storage position is indicated by the "FileKey Entry#3". As can be understood from rule (3), different FileKeys are used to encrypt different AOB files, with these FileKeys being stored in "FileKey Entries" with the serial numbers "001", "002", "003", "004" etc., given in the filenames of the corresponding AOB files.

Since each AOB file is encrypted using a different FileKey, the exposure of the encryption key used for one AOB file will not enable users to decrypt other AOB files. This means that when AOB files are stored in an encrypted form on a flash memory card 31, the damage caused by the exposure of one FileKey can be minimized.

{3-3_10-1} Internal Composition of an AOB File

Figure 10:
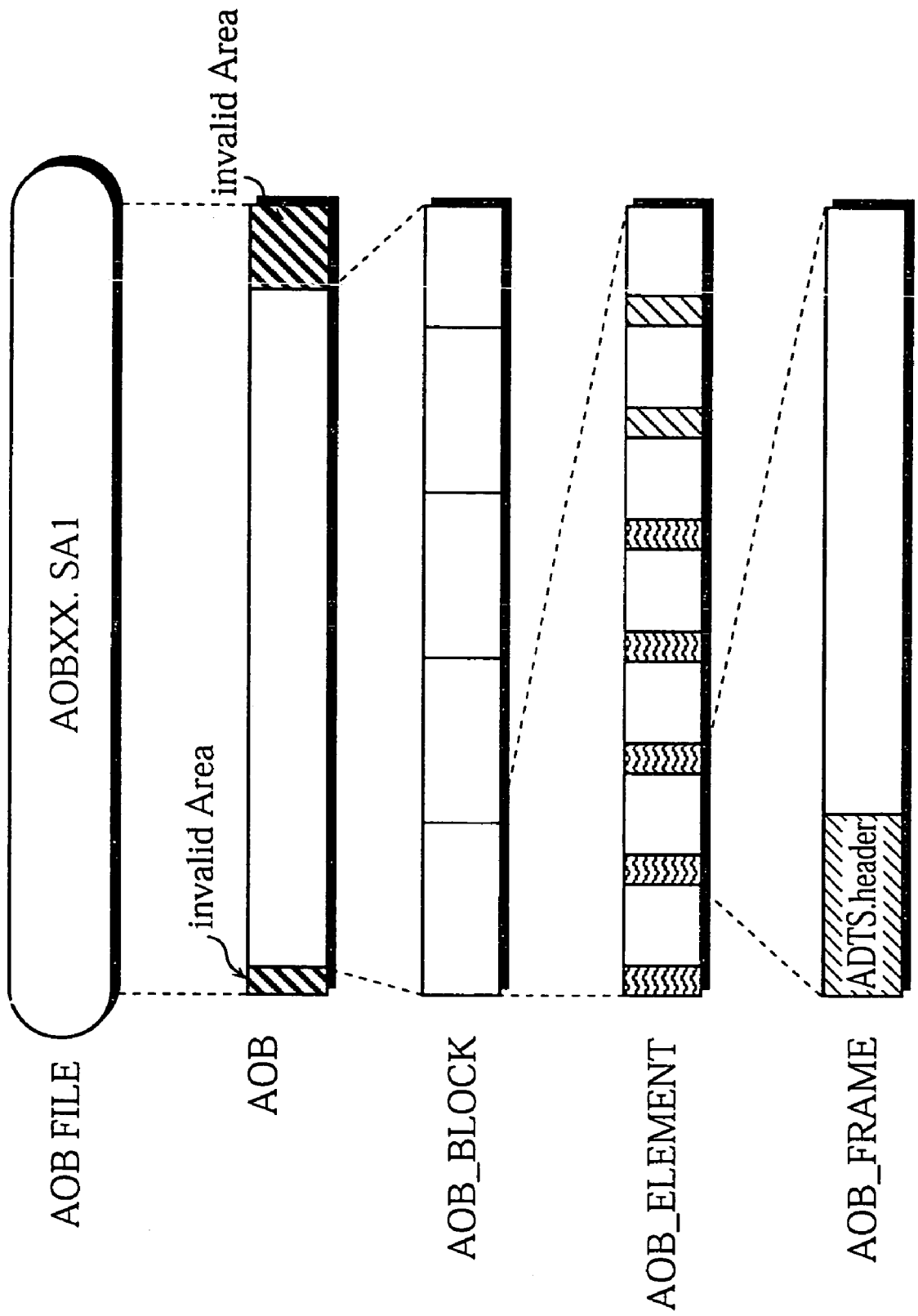
FIG. 10 shows the hierarchical composition of the data in an AOB file.

The following describes the internal composition of an AOB file. FIG. 10 shows the hierarchical data structure of an AOB file. The first level in FIG. 10 shows the AOB, file, while the second level shows the audio object (AOB) itself. The third level shows the AOB_BLOCKs, the fourth level an AOB_ELEMENT, and the fifth level an AOB_FRAME.

The AOB_FRAME on the fifth level in FIG. 10 is the smallest unit composing the AOB, and is composed of audio data in ADTS (Audio Data Transport Stream) format and an ADTS header. Audio data in ADTS format is encrypted according to MPEG2-AAC (Low Complexity Profile) format and is stream data that can be played back at a transfer rate of 16 Kbps to 144 Kbps. Note that the transfer rate for PCM (Pulse Code Modulation) that is recorded on a conventional compact disc is 1.5 Mbps, so that data in ADTS format generally uses a lower transfer rate than PCM. The data construction of a sequence of AOB_FRAMEs is the same as the sequence of audio frames included in an audio data transport stream distributed by an electronic music distribution service. This means that the audio data transport stream to be stored as AOB_FRAME sequence is encoded according to MPEG2-ACC standard, encrypted, and transmitted on a public network to the consumer. AOB files are produced by dividing the transmitted audio data transport stream into a sequence of AOB_FRAMEs and storing these AOB_FRAMEs.

{3-3_10-1_11} MPEG2-AAC

MPEG2-AAC is described in detail in ISO/IEC 13818-7: 1997(E) "Information Technology—Generic Coding of Moving Pictures and Associated Audio Information—Part7 Advanced Audio Coding (AAC)".

It should be noted that audio objects can only be compressed according to MPEG2-AAC using the parameters shown in the parameter table shown in FIG. 11A that is defined in ISO/IEC13818-7. This parameter table is composed of "Parameter" column, a "Value" column, and a "Comment" column.

The legend "profile" in the Parameter column shows the only LC-profile can be used, as stipulated under ISO/IEC 13838-7. The legend "sampling_frequency#index" in the Parameter column shows that the sampling frequencies "48 kHz, 44.1 kHz, 32 kHz, 24 kHz, 22.05 kHZ, and 16 kHz" can be used.

The legend "number_of_data_block_in_frame" in the Parameter column shows that the ratio of one header to one raw_data_block is used.

Note that while this explanation describes the case where AOB_FRAMEs are encoded according to MPEG-AAC format, AOB_FRAMEs may instead be encoded according to another format, such as MPEG-Layer3 (MP3) format or Windows Media Audio (WMA). When doing so, the parameters shown in the parameter tables of FIG. 11B or FIG. 11C must be used.

{3-3_10-2_12} Composition of an AOB_FRAME

While each AOB_FRAME includes audio data that is encoded according to the restrictions described above, the data length of the audio data in each AOB_FRAME is restricted to a playback time of only 20 ms. However, since MPEG2-AAC is a variable bitrate (VBR) encoding method, the data length of the audio data in each AOB_FRAME will vary. The following describes the composition of an AOB_FRAME, with reference to FIG. 12.

Figure 12:
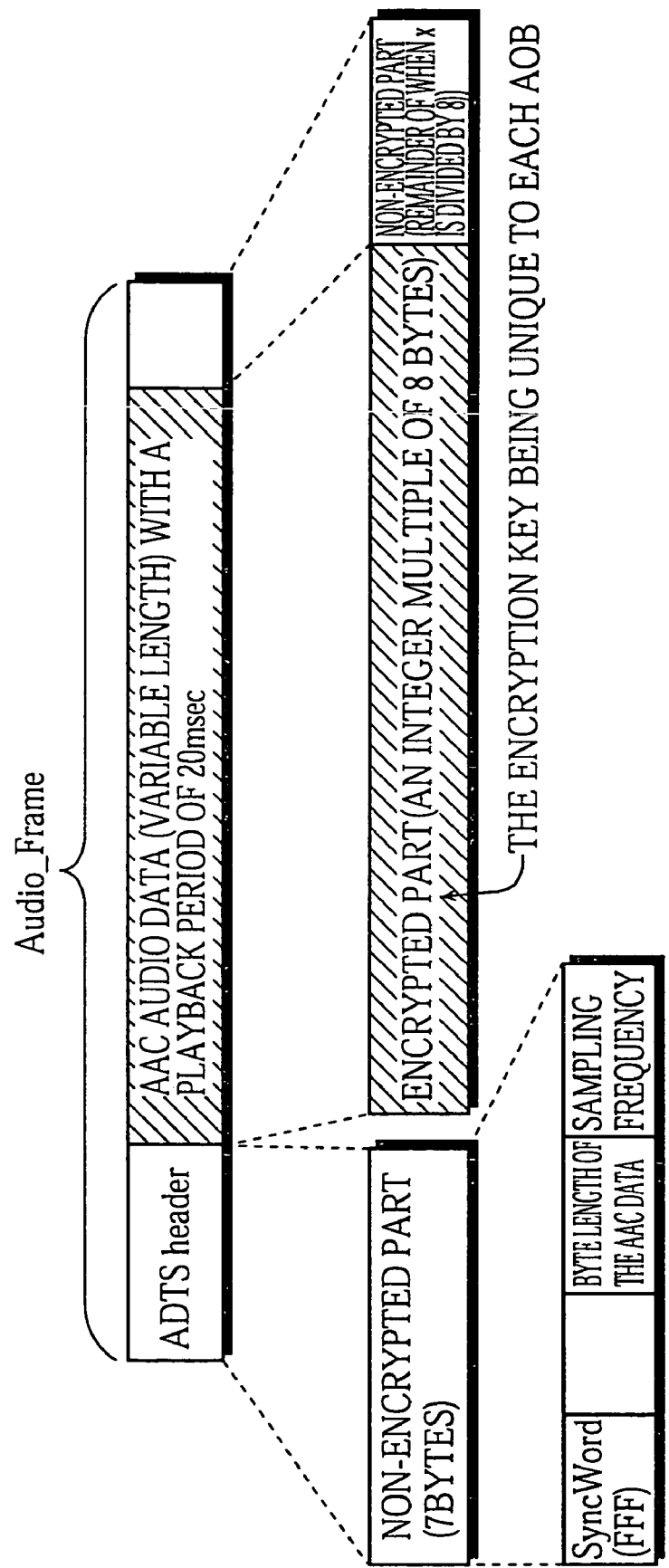
FIG. 12 shows the detailed construction of an AOB_FRAME.

The first level in FIG. 12 shows the overall composition, while the second level shows how each part of an AOB_FRAME is encrypted. As can be seen from the drawing, the ADTS header corresponds to a non-encrypted part. The audio data includes both an encrypted part and a non-encrypted part. The encrypted part of the audio data is composed of a plurality of eight-byte pieces of encrypted data, each of which is produced by encrypting an eight-byte piece of audio data using a 56-bit FileKey. When encryption is performed on 64-bit pieces of audio data, the non-encrypted part of the audio data is simply a final part of the data that cannot be encrypted due to it being shorter than 64 bits.

The third level in FIG. 12 shows the content of the ADTS header that is in the non-encrypted part of the AOB_FRAME. The ADTS header is seven bytes long, and includes a 12-bit synch word (set at FFF), the data length of the audio data in this AOB_FRAME, and the sampling frequency used when the audio data was encoded.

Figure 13:
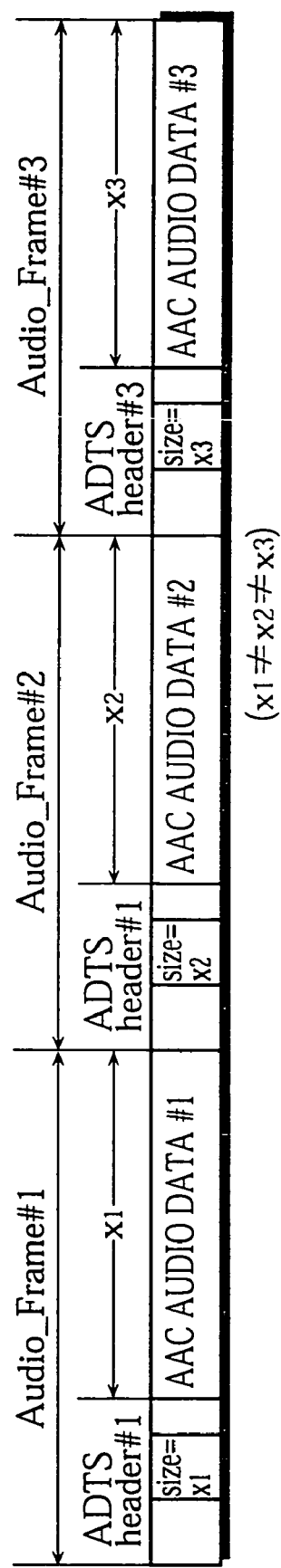
FIG. 13 shows how the byte length of the audio data in each of three AOB_FRAMEs is set.

{3-3_10-3_13} Setting of the Byte Length of an AOB_FRAME FIG. 13 shows how the byte length of the audio data in each of three AOB FRAMEs is set. In FIG. 13, the data length of audio data#1 included in AOB_FRAME#1 is x1, the data length of audio data#1 included in AOB_FRAME#2 is x2, and the data length of audio data#1 included in AOB_FRAME#3 is x3. When the data lengths x1, x2, and x3 are all different, the data length x1 will be written in the ADTS header of AOB_FRAME#1, the data length x2 will be written in the ADTS header of AOB_FRAME#2, and the data length x3 will be written in the ADTS header of AOB_FRAME#3.

Although the audio data is encrypted, the ADTS header is not, so that a playback device can know the data length of the audio data in an AOB_FRAME by reading the data length given in the ADTS header of the AOB_FRAME.

This completes the explanation of an AOB_FRAME.

{3-3_10-4} AOB_ELEMENT

The following describes the AOB_ELEMENT shown on the fourth level in FIG. 10.

An "AOB_ELEMENT" is a group of consecutive AOB_FRAMEs. The number of AOB_FRAMEs in an AOB_ELEMENT depends on the value set as the sampling_frequency_index shown in FIG. 11A and the encoding method used. The number of AOB_FRAMEs in an AOB_ELEMENT is set so that the total playback time of the included AOB_FRAMEs will be around two seconds, with this number depending on the sampling frequency and encoding method used.

{3-3_10-5_14} Number of AOB_FRAMEs in an AOB_ELEMENT

FIG. 14 shows the correspondence between the sampling frequency and the number of AOB_FRAMEs included in an AOB_ELEMENT. The number N given in FIG. 14 represents the playback period of an AOB_ELEMENT in seconds. When MPEG-ACC is used as the encoding method, the value of N is "2".

When the sampling_frequency is 48 kHz, the number of AOB_FRAMEs included in an AOB_ELEMENT is given as 94(=47*2), while when the sampling_frequency is 44.1 kHz, the number of AOB_FRAMEs included in an AOB_ELEMENT is given as 86(=43*2). When the sampling_frequency is 32 kHz, the number of AOB_FRAMEs is given as 64(=32*2), when the sampling_frequency is 24 kHz, the number of AOB_FRAMEs is given as 48(=24*2), when the sampling_frequency is 22.05 kHz, the number of AOB_FRAMEs is given as 44(=22*2), and when the sampling_frequency is 16 kHz, the number of AOB_FRAMEs included in an AOB_ELEMENT is given as 32(=16*2). However, when an editing operation, such as the division of an AOB, has been performed, the number of AOB_FRAMEs included in an AOB_ELEMENT at the start or end of an AOB may be less than a number calculated in this way.

While no header or other special information is provided for each AOB_ELEMENT, the data length of each AOB_ELEMENT is instead shown by a time search table.

Figure 15:
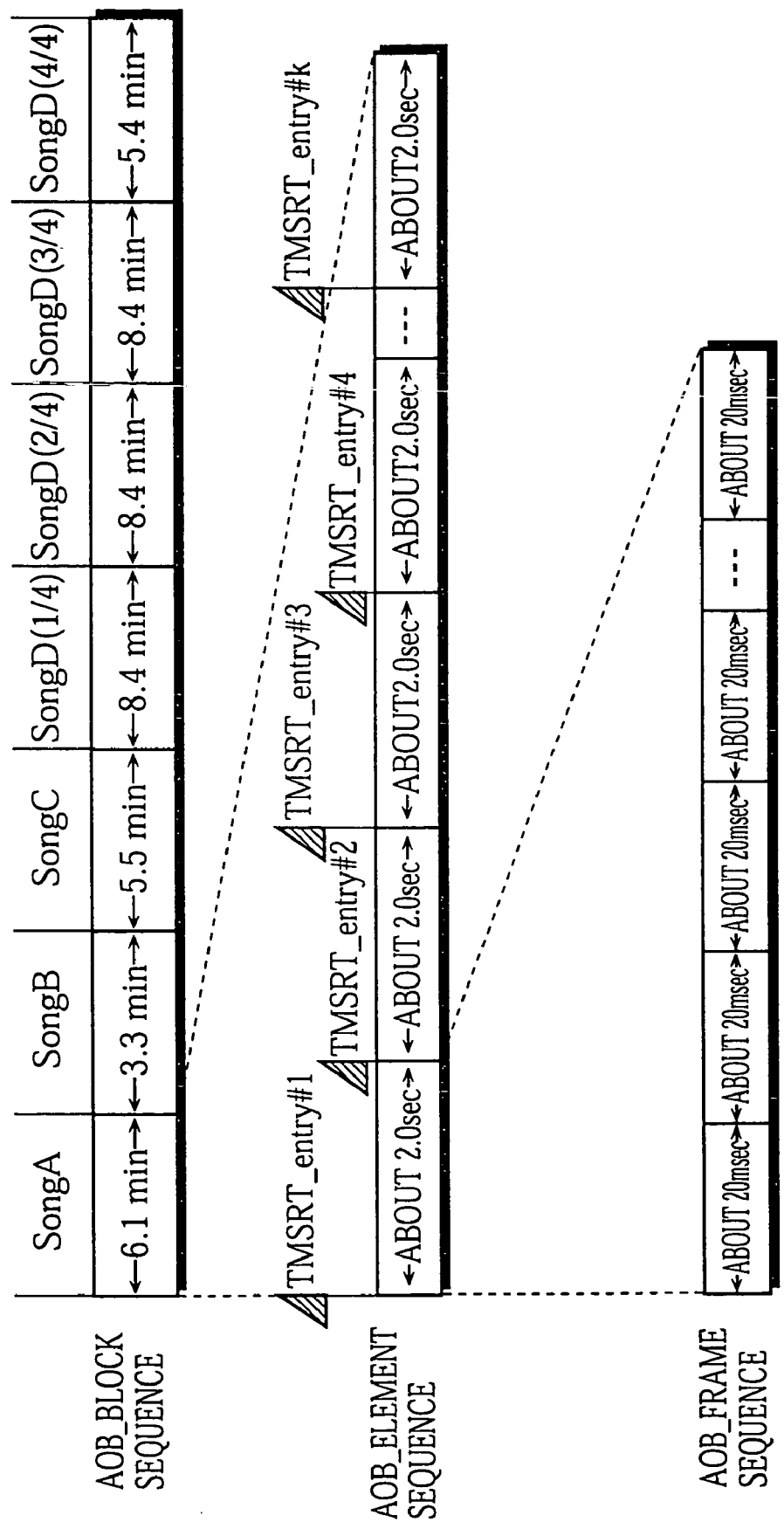
FIG. 15 shows examples of the playback periods of AOB_ELEMENTs and the playback periods of AOB_FRAMEs.

{3-3_10-6_15} One Example of the Playback Periods of AOB_ELEMENTs and AOB_FRAMEs FIG. 15 shows one example of the playback periods of AOB_ELEMENTs and AOB_FRAMEs. The first level in FIG. 15 shows a plurality of AOB_BLOCKs, while the second level shows a plurality of AOB_ELEMENTs. The third level shows a plurality of AOB_FRAMEs.

As shown in FIG. 15, an AOB_ELEMENT has a playback period of around 2.0 seconds, while an AOB_FRAME has a playback period of 20 milliseconds. The "TMSRT_entry" given to each AOB_ELEMENT shows that the data length of each AOB_ELEMENT is given in the time search table. By referring to the TMSRT_entries, a playback apparatus can perform a forward or backward search where, for example, intermittent bursts of music are played back by repeatedly playing back 240 milliseconds of audio data and then skipping two seconds of audio data in the desired direction.

{3-3_10-7) AOB_BLOCK}

This completes the explanation of an AOB_ELEMENT. The following describes the concept of the AOB_BLOCKs shown on the third level of the data construction of an AOB file given in FIG. 10.

Each "AOB_BLOCK" is composed of valid AOB_ELEMENTs. Only one AOB_BLOCK exists in each AOB_FILE. While an AOB_ELEMENT has a playback period of around two seconds, an AOB_BLOCK has a maximum playback period of 8.4 minutes. The 8.4 minute limitation is imposed to restrict the size of the time search table to 504 bytes or less.

{3-3_10-8} Restriction of the Time Search Table

The following describes in detail why the size of the time search table is restricted by limiting the playback period.

When a playback apparatus performs a forward or backward search, the playback apparatus skips the reading of two seconds of audio data before playing back 240 milliseconds. When skipping two seconds of data, the playback apparatus could in theory refer to the data lengths shown in the ADTS headers of AOB_FRAMEs, though this would mean that the playback apparatus would have to consecutively detect 100 (2 seconds/20 milliseconds) AOB_FRAMEs just to skip two seconds of audio data. This would amount to an excessive processing load for the playback apparatus.

To reduce the processing load of a playback apparatus, the read addresses for data at two-second intervals can be written into a time search table that is then referred to by the playback apparatus when performing a forward or backward search. By writing information that enables read addresses that are two or four seconds ahead or behind to be found quickly into the time search table (such information being the data sizes of AOB_ELEMENTs), a playback apparatus will only need to refer to this information when performing a forward or backward search. The data size of audio data with a playback period of two seconds will depend on the bitrate used when playing back the audio data. As stated earlier, a bitrate in the range of 16 Kbps to 144 Kbps is used, so that the amount of data played back in two seconds will be in a range from 4 KB(=16 Kbps×2/8) to 36 KB(=144 Kbps×2/8). Since the amount of data played back in two seconds will be in a range from 4 KB to 36 KB, the data length of each entry in the time search table for writing the data length of audio data needs to be two bytes (=16 bits) long. This is because a 16-bit value is capable of expressing a number in the range 0-64 KB.

On the other hand, if the total data size of the time search table needs to be restricted to 504 bytes (this being the data size of the TKTMSRT described later), for example, the maximum number of entries in the time search table can be calculated as 504/2=252.

Since an entry is provided every two seconds, the playback time corresponding to this maximum of 252 entries is 504 seconds (=2 s*252), or, in other words, 8 minutes and 24 seconds (=8.4 minutes). This means that setting the maximum playback period for an AOB_BLOCK at 8.4 minutes limits the data size of the time search table to 504 bytes.

{3-3_10-9} Regarding AOBs

This concludes the description of AOB_BLOCKs. The following describes AOBs.

The AOBs shown on the second level of FIG. 10 are regions that have invalid areas at either end. Only one AOB is present in each AOB file.

The invalid areas are regions that are read and written along with the AOB_BLOCKs and are stored in the same clusters as the AOB_BLOCKs. The start and end position of the AOB_BLOCKs within an AOB are shown by BITs included in the navigation data. These BITs are described in detail later in this specification.

This completes the explanation of what data is stored in an AOB file. The following describes what kind of content is played back when the eight AOBs and AOB_BLOCKs shown in the AOB file in FIG. 9 are successively read.

{3-3_10$^{-10}$_16}

Figure 16:
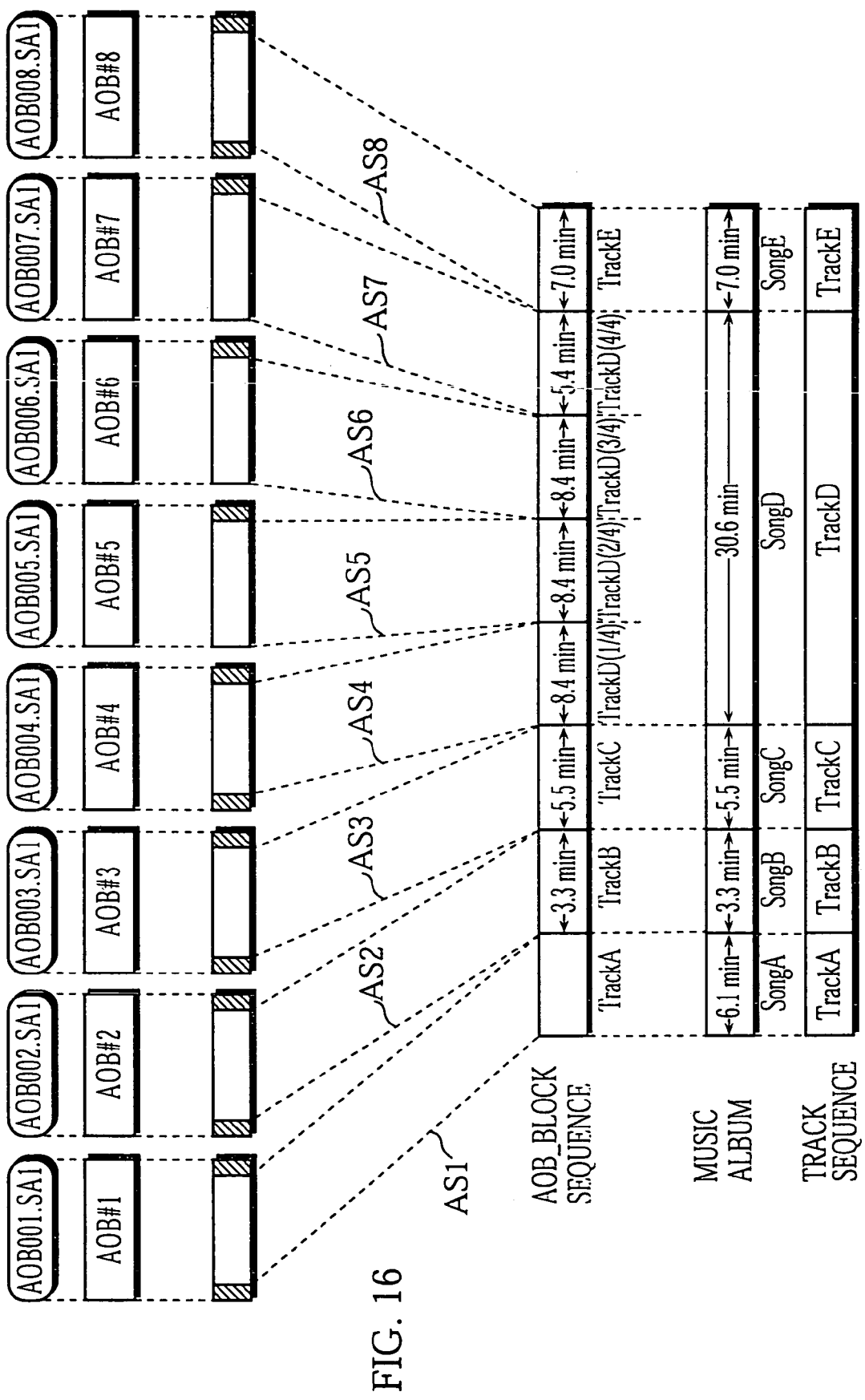
FIG. 16 shows what is reproduced when the AOBs and AOB_BLOCKs recorded in an AOB file are consecutively played back.

FIG. 16 shows the playback content when the AOBs and AOB_BLOCKs in this AOB file are successively read. The first level in FIG. 16 shows the eight AOB files in the user region, while the second level shows the eight AOBs recorded in these AOB files. The third level shows the eight AOB_BLOCKs included in these AOBs.

The fifth level shows the titles of five contents composed by these AOB files. In this example, the "contents" are the five songs SongA, SongB, SongC, SongD, and SongE, while the "title" is a music album composed of these five songs. The broken lines AS1, AS1, AS3, . . . AS7, and AS8 show the correspondence between the AOB_BLOCKs and the parts into which the album is divided, so that the fourth level in FIG. 16 shows the units used to divide the music album shown on the fifth level.

By referring to the broken lines, it can be seen that the AOB_BLOCK included in AOB#1 is a song (SongA) with a playback period of 6.1 minutes. The AOB_BLOCK included in AOB#2 is a song (SongB) with a playback period of 3.3 minutes. The AOB_BLOCK included in AOB#3 is a song (SongC) with a playback period of 5.5 minutes. In this way, "AOB001.SA1" to "AOB003.SA1" each correspond to a different song. The sixth level of FIG. 16 is a track sequence composed of tracks TrackA to TrackE. These tracks TrackA-TrackE correspond to the five songs SongA, SongB, SongC, SongD, and SongE, and are each treated as a separate playback unit.

On the other hand, AOB#4 has a playback period of 8.4 minutes and is the first (or "head") part of the song SongD that has a playback period of 30.6 minutes. The AOB_BLOCKs included in AOB#5 and AOB#6 are middle parts of the song SongD and also have playback periods of 8.4 minutes. The AOB_BLOCK included in AOB#7 is the end part of the song SongD and has a playback period of 5.4 minutes. In this way, a song that has a total playback period of 30.6 minutes is divided into (8.4+8.4+8.4+5.4-minute) parts that are each included in a different AOB. As can be seen from FIG. 16, every song included in an AOB file is subjected to a maximum playback period of 8.4 minutes.

This explanation clearly shows that limiting the playback periods of AOBs as described above restricts the data size of the time search table corresponding to each AOB. The following describes the navigation data included in each time search table.

{3-3_8A,B-2}

The navigation data is composed of the two files "SD_Audio.PLM" and "SD_Audio.TKM" mentioned earlier. The file "SD_Audio.PLM" includes the PlaylistManager, while the file "SD_Audio.TKM" includes the TrackManager.

As mentioned as part of the explanation of the presentation data, a plurality of AOB files store encoded AOBs, though no other information, such as the playback period of the AOBs, the names of the songs represented by the AOBs, or credits for the songwriter(s), is given. While a plurality of AOBs are recorded in a plurality of AOB files, no indication as to the playback order of the AOBs is provided. To inform a playback apparatus of such information, the TrackManager and PlaylistManager are provided.

The TrackManager shows the correspondence between the AOBs recorded in AOB files and tracks, and includes a plurality of pieces of track management information that each give a variety of information, such as the playback period of AOBs and the song names and songwriters of the various AOBs.

In this specification, the term "track" refers to a meaningful playback unit for users, so that when copyrighted music is stored on a flash memory card 31, each song is a separate track. Conversely, when an "audio book" (i.e., copyrighted literature stored as recorded audio) is recorded on a flash memory card 31, each chapter or paragraph can be set as a separate track. The TrackManager is provided to manage a plurality of AOBs recorded in a plurality of AOB files as a group of tracks.

A Playlist sets the playback order of a plurality of tracks. A plurality of Playlists can be included in the PlaylistManager.

The following describes the TrackManager with reference to the drawings.

{17-1_18} Detailed Composition of the PlaylistManager and TrackManager

Figure 17:
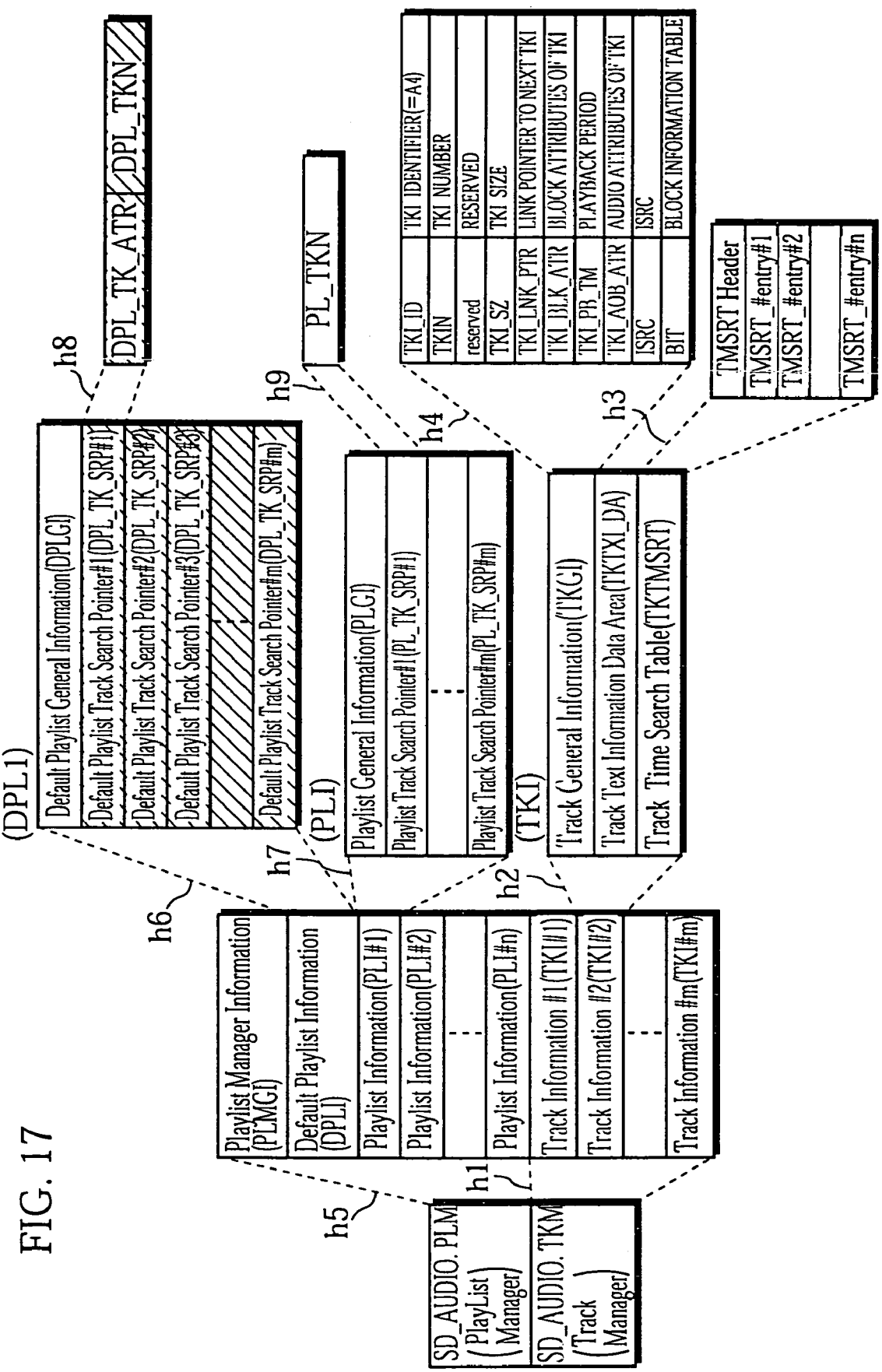
FIG. 17 shows the hierarchical composition of the Playlist-Manager and TrackManager used in the embodiments in detail.
Figure 18:
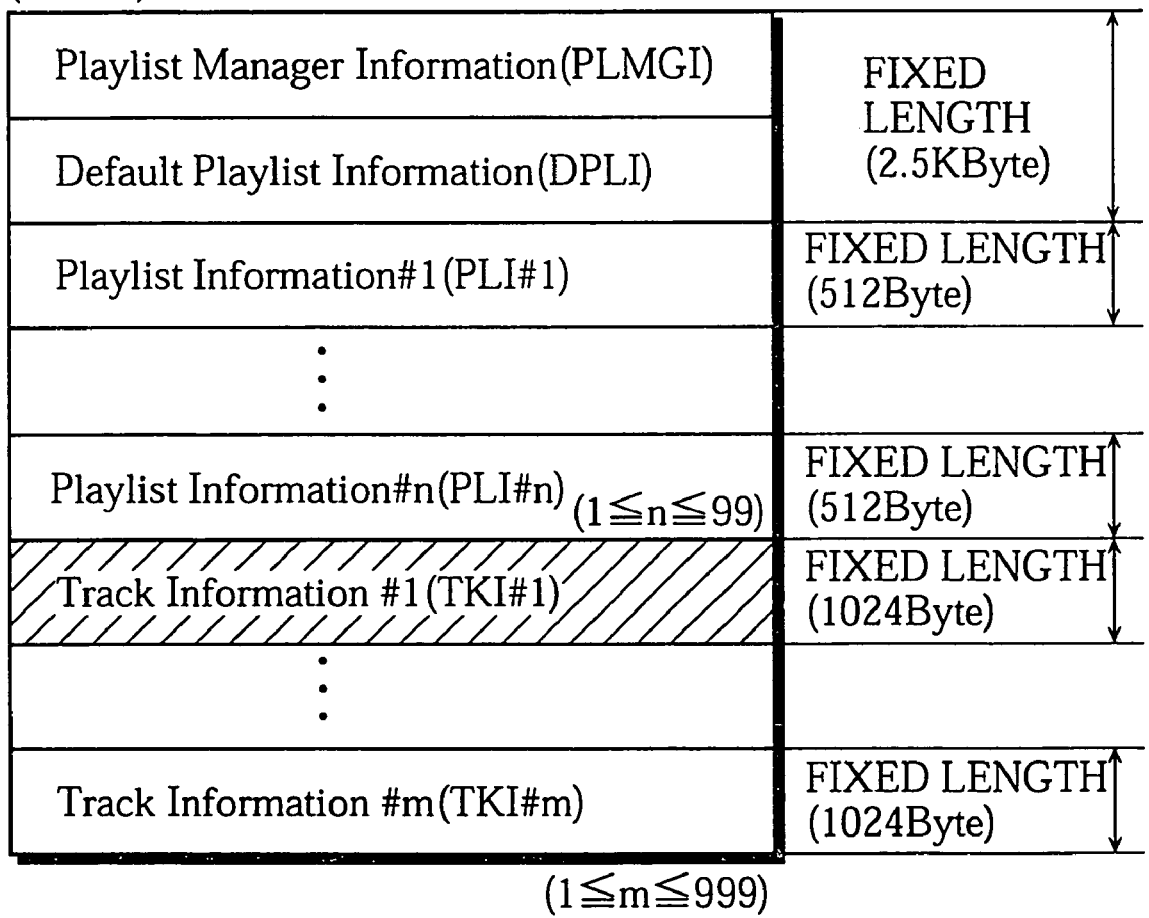
FIG. 18 shows the sizes of the PlaylistManager and the TrackManager.

FIG. 17 shows the detailed composition of the PlaylistManager and TrackManager in this embodiment as a hierarchy. FIG. 18 shows the sizes of the PlaylistManager and the TrackManager. The right side of FIG. 17 shows the items on the left side in more detail, with the broken lines indicating which items are being shown in more detail.

As shown in FIG. 17, the TrackManager is composed of the Track Information (TKI) #1, #2, #3, #4 . . . #n, as shown by the broken line h1. These TKIs are information for managing the AOBs recorded in AOB files as tracks, and each correspond to a different AOB file. From FIG. 17, it can be seen that each TM is composed of Track_General_Information (TKGI), Track_Text_Information (TKTXI_DA) in which text information exclusive to a track can be written, and a Track_Time_Search_Table (TKTMSRT) that serves as a time search table.

From FIG. 18, it can be seen that each TKI has a fixed size of 1,024 bytes, which means that total size of the TKGI and the TKTXI_DA is fixed at 512 bytes due to the size of the TKTMSRT being fixed at 512 bytes. In the TrackManager, a total of 999 TKJs can be set.

As shown by the broken line h3, the TKTMSRT is composed of a TMSRT_Header and TMSRT_entries #1, #2, #3 ... #n.

{17-2_19} Correspondence of TKI with AOB Files and AOBs

Figure 19:
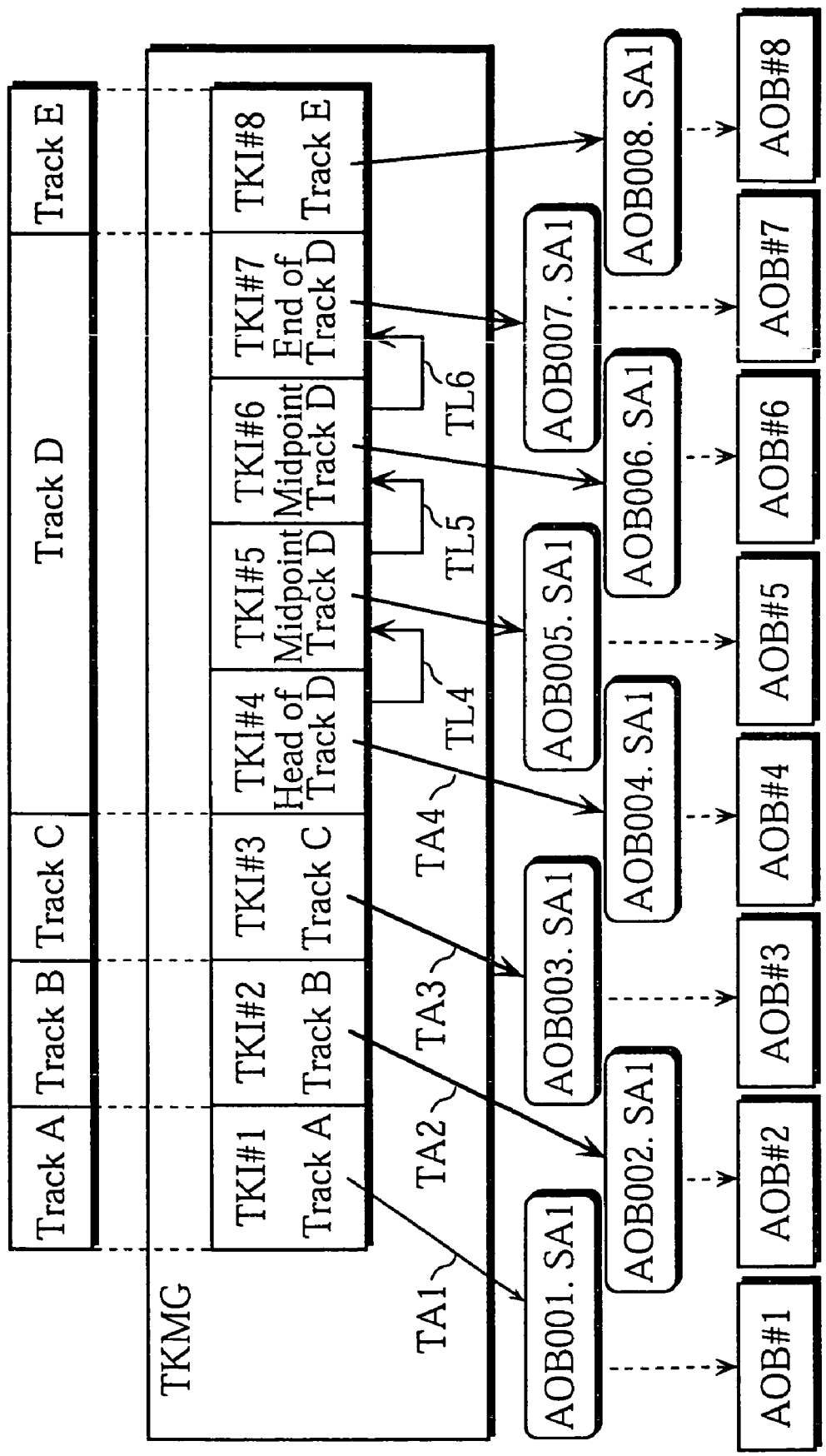
FIG. 19 shows the correspondence between the TKIs shown in FIG. 17 and the AOBs and AOB files shown in FIG. 16.

FIG. 19 shows how the TKIs shown in FIG. 17 correspond to the AOB files and AOBs shown in FIG. 16. The boxes on the first level in FIG. 19 show a sequence of tracks composed of tracks TrackA to TrackE, the large frame on the second level shows the TrackManager, while the third and fourth levels show the eight AOB files given in FIG. 16. The eight AOB files are recorded in the eight AOBs shown in FIG. 16, and compose a music album including tracks TrackA, TrackB, TrackC, TrackD, and TrackE. The second level shows the eight TKIS. The numbers "1", "2", "3", "4" assigned to each TKI are the serial numbers used to identify each TKI, with each TKI corresponding to the AOB file that has been given the same serial number 001, 002, 003, 004, 005.

With this in mind, it can be seen from FIG. 19 that TKI#1 corresponds to the file "AOB001.SA1", that TKI#2 corresponds to the file "AOB002.SA1", TKI#3 corresponds to the file "AOB003.SA1"; and TKI#4 corresponds to the file "AOB004.SA1". The correspondence between TKIs and AOB_FRAMEs is shown by the arrows TA1, TA2, TA3, TA4 ... in FIG. 19.

In this way, each TKI corresponds to a different AOB recorded in an AOB file and gives detailed information that applies only to the corresponding AOB.

Figure 20:
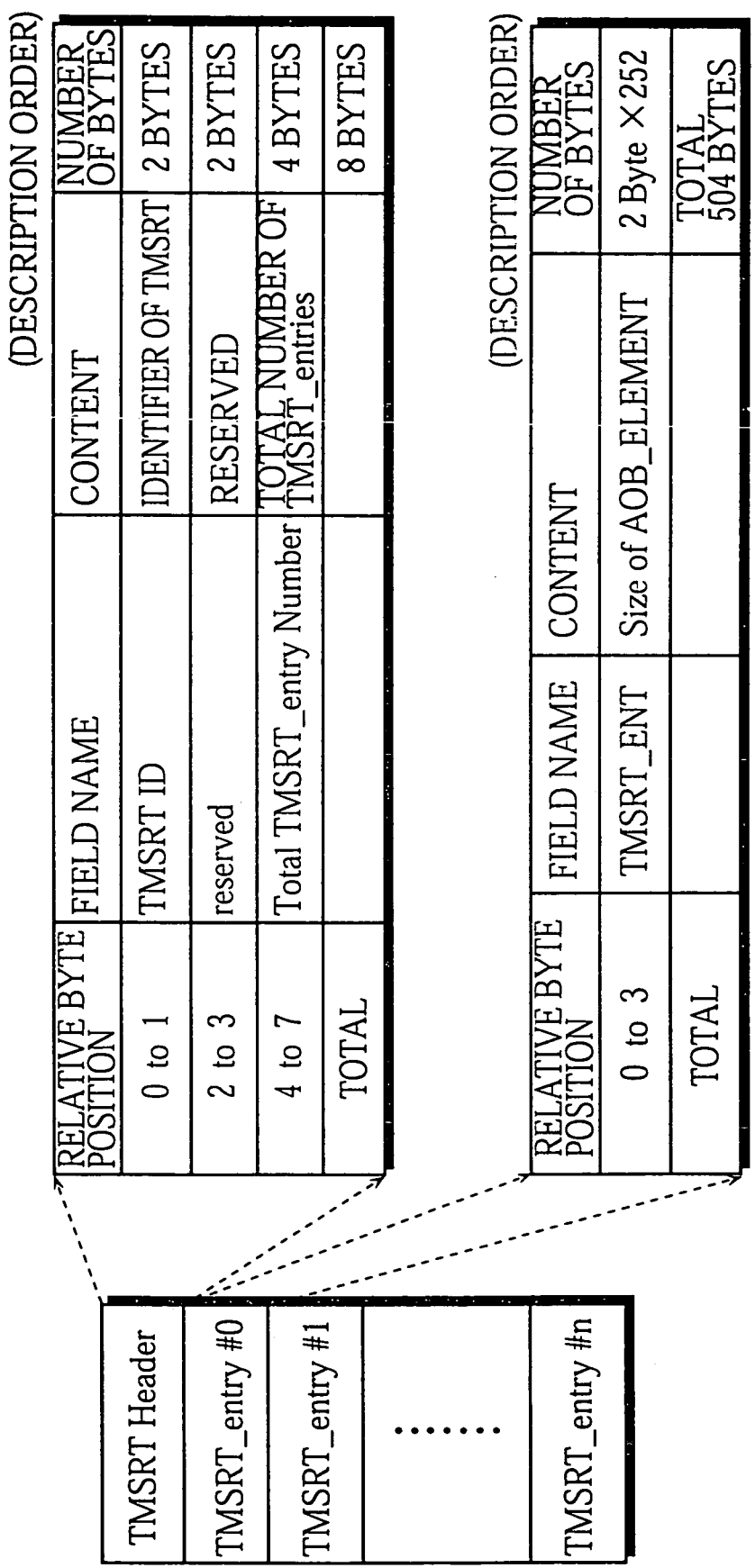
FIG. 20 shows the detailed data composition of the TKTMSRT shown in FIG. 17.

{17-3_20} Data Composition of a TKTMSRT The following describes the information that applies to single AOBs recorded in AOB files, starting with the TKTMSRT. FIG. 20 shows the data composition of the TKTMSRT in detail.

The right side of FIG. 20 shows the detailed data composition of the time search table header (TMSRT_Header) In FIG. 20, the TMSRT_Header has a data size of eight bytes, and is made up of three fields. The first two bytes are a TMSRT_ID, the next two bytes are reserved, and the final four bytes are a Total TMSRT_entry_Number.

A unique ID for identifying the TMSRT is recorded in the TMSRT_ID". The total number of TMSRT_entries in the present TMSRT is recorded in the "Total TMSRT_entry Number".

{17-3_21-1} Specific Example of the TKTMSRT

Figure 21:
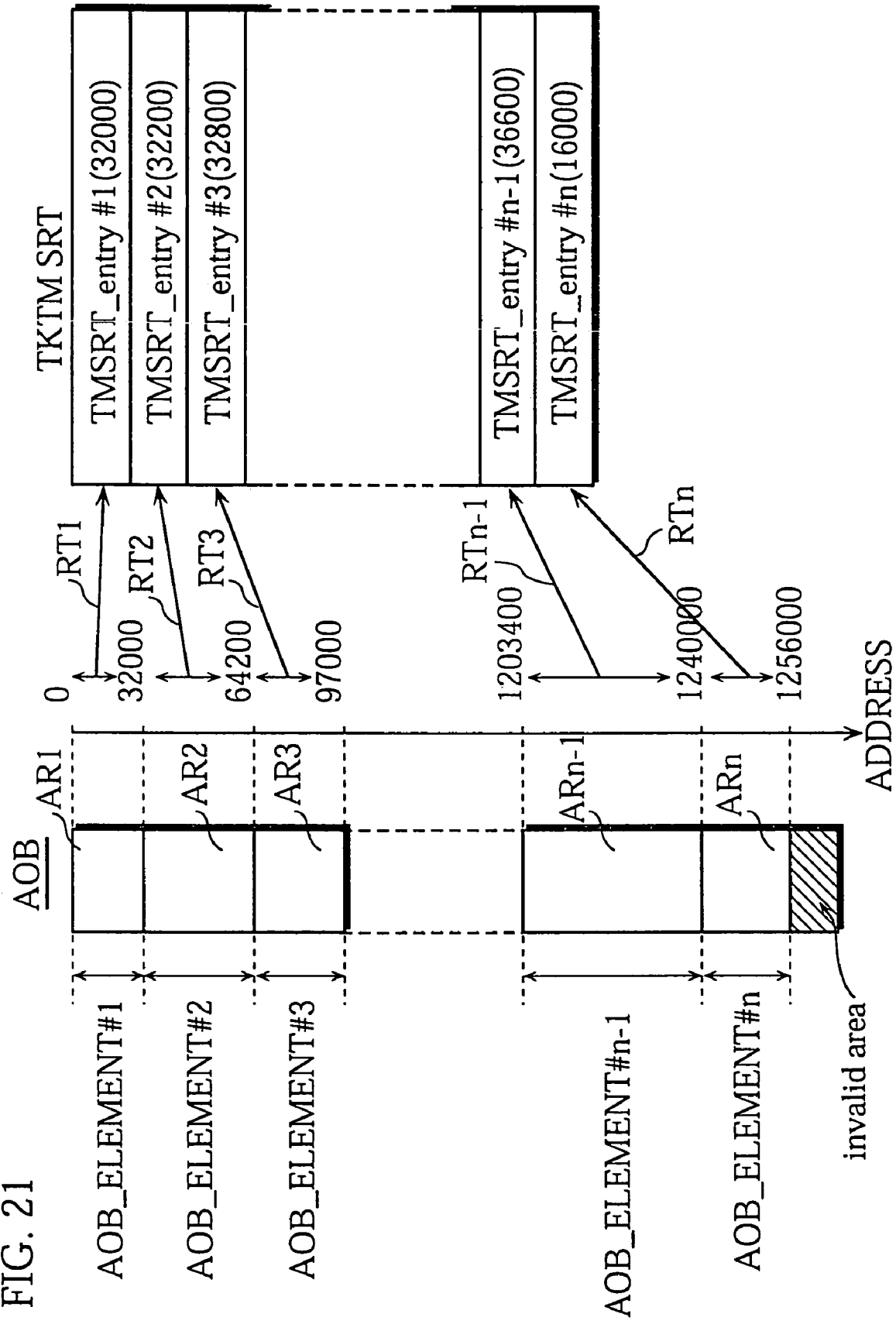
FIG. 21 shows one example of the TKTMSRT.

The following describes a TKTMSRT in detail. FIG. 21 shows one example of a TKTMSRT. The left side of FIG. 21 shows an AOB, while the right side shows the corresponding TKTMSRT. The AOB on the left side of FIG. 21 is composed of a plurality of AOB_ELEMENTs numbered #1, #2, #3 ... #n that occupy the regions numbered AR1, AR2, AR3 ARn to the right.

The numbers such as "0", "32000", "64200", "97000", "1203400", and "1240000" show the relative addresses of areas AR1, AR2, AR3, ARn-1, ARn occupied by the AOB_ELEMENTs with respect to the start of the AOB_BLOCK. As examples, AOB_ELEMENT#2 is recorded at a position that is at a distance "32000" from the start of the AOB_BLOCK, while AOB_ELEMENT#3 is recorded at a position that is at a distance "64200" from the start of the AOB_BLOCK and AOB_ELEMENT#n-1 is recorded at a position that is at a distance "1203400" from the start of the AOB_BLOCK.

It should be noted that the distance between each occupied region and the start of the AOB_BLOCK is not a multiple of a certain value, meaning that the regions occupied by AOB_ELEMENTs are not of the same size. The reason the occupied regions have different sizes is that the varying amounts of data are used to encode each AOB_FRAME.

Since the size of the region occupied by each AOB_ELEMENT differs, it is necessary to inform a playback apparatus in advance of the position of each AOB_ELEMENT in an AOB when performing a jump to the start of an AOB_ELEMENT. For this purpose, a plurality of TMSRT_entries are given in the TKTMSRT. The arrows RT1, RT2, RT3 ... RTn-1, RTn show the correspondence between the regions AR1, AR2, AR3 ... ARn-1, ARn occupied by each AOB_ELEMENT and TMSRT_entry#1, TMSRT_entry#2, TMSRT_entry#3. TMSRT_entry#n-1, TMSRT_entry#n. In other words, the size of the region AR1 occupied by AOB_ELEMENT#1 is written in the TMSRT_entry#1, while the sizes of the regions AR2 and AR3 occupied by AOB_ELEMENT#2 and AOB_ELEMENT#3 are written in the TMSRT_entries #2 and #3.

Since the occupied area AR1 takes up the region from the start of the AOB to the start of the AOB_ELEMENT#2 "32000", the size "32000" (=32000−0) is written in the TMSRT_entry#1. The occupied area AR2 takes up the region from the start of the AOB_ELEMENT#2 "32000" to the start of the AOB_ELEMENT#3 "64200", so that the size "32200" (=64200-32000) is written in the TMSRT_entry#2. The occupied area AR3 takes up the region from the start of the AOB_ELEMENT#3 "64200" to the start of the AOB_ELEMENT#4 "97000", so that the size "32800" (=97000-64200) is written in the TMSRT_entry#3. In the same way, the occupied area ARn-1 takes up the region from the start of the AOB_ELEMENT#n-1 "1203400" to the start of the AOB_ELEMENT#n "1240000", the size "36600" (=1240000-1203400) is written in the TMSRT_entry#n-1.

{17-3_21-2} How the TKTMSRT is Read

In this way, the data sizes of AOB_ELEMENTs are written in a time search table. However, since the data length of each AOB_BLOCK is restricted to a maximum of 8.4 minutes, the total number of AOB ELEMENTs included in a single AOB is limited to a predetermined number ("252" as shown in FIG. 20) or less. Since the number of AOB_ELEMENTs is restricted, the number of TMSRT_entries corresponding to AOB_ELEMENTs is also restricted, which restricts the size of the TKTMSRT including these TMSRT_entries to within a predetermined size. Since the size of the TKTMSRT is restricted, a playback apparatus can read and use TKIs in the following way.

The playback apparatus reads a certain AOB and on commencing playback of the AOB, reads the corresponding TKI and stores it in a memory. This corresponding TKI is kept in the memory while the playback of this AOB continues. Once the playback of the AOB ends, the following AOB is read, and when the playback of this AOB commences, the playback apparatus overwrites the TKI corresponding to this following AOB into the memory in place of the old TKI. This next TKI is kept in the memory while the playback of this following AOB continues.

By reading and storing TKIs in this way, the necessary capacity of the memory in the playback apparatus can be minimized while still enabling special playback functions such as forward and backward search to be realized. While the present embodiment describes the case where the data length from the first address of an AOB_ELEMENT to the first address of the next AOB_ELEMENT is written in the TMSRT_entry, relative addresses from the start of the AOB_BLOCK to the first addresses of AOB ELEMENTs may be written in there instead.

{17-3_21-3} Specifying a Cluster Including an AOB_ELEMENT

The following describes how an AOB_ELEMENT may be read using the TKTMSRT. The TKTMSRT includes the size of each AOB_ELEMENT, so that when AOB_ELEMENT#y, which is the $y^{th}$ AOB_ELEMENT from the start of an AOB, is to be read, the cluster u that satisfies Equation 1 given below is calculated, and data positioned with the offset v from the start of the cluster u is read.

Cluster $u$=(Total of the TMSRT_entries from AOB_ELEMENT#1 to AOB_ELEMENT#y−1+ DATA_Offset)/Cluster size      Equation 1

Offset v=(Total of the TMSRT_entries from AOB_ELEMENT#1 to AOB_ELEMENT#y−1+ DATA_Offset) mod Cluster size where c=a mod b indicates that c is the remainder produced when a is divided by b The DATA_Offset is written in the BIT and is described later in this specification.

{17-4} TKTXI_DA

This completes the explanation of the time search table (TKTMSRT). The following describes the Track_Text_Information Data Area (TKTXI_DA) recorded in the upper part of the TKTMSRT.

The Track_Text_Information Data Area (TKTXTI_DA) is used to store text information showing the artist name, album name, mixer, producer, and other such information. This area is provided even when such text information does not exist.

{17-5} TKGI

The following describes the TKGI recorded in the upper part of the TKTXI_DA. In FIG. 17, several sets of information shown as the identifier "TKI_ID" of the TKI, the TKI number "TKIN", the TKI size "TKI_SZ", a link pointer to the next TKI "TKI_LNK_PTR", block attributes "TKI_BLK_ATR", a playback period "TKIPB_TM", the audio attributes "TKI_AOB_ATR", an "ISRC", and block information "BIT". Note that only some of this information has been shown in FIG. 17 to simplify the representation.

{17-5_22-1}TKGI

Figure 22:
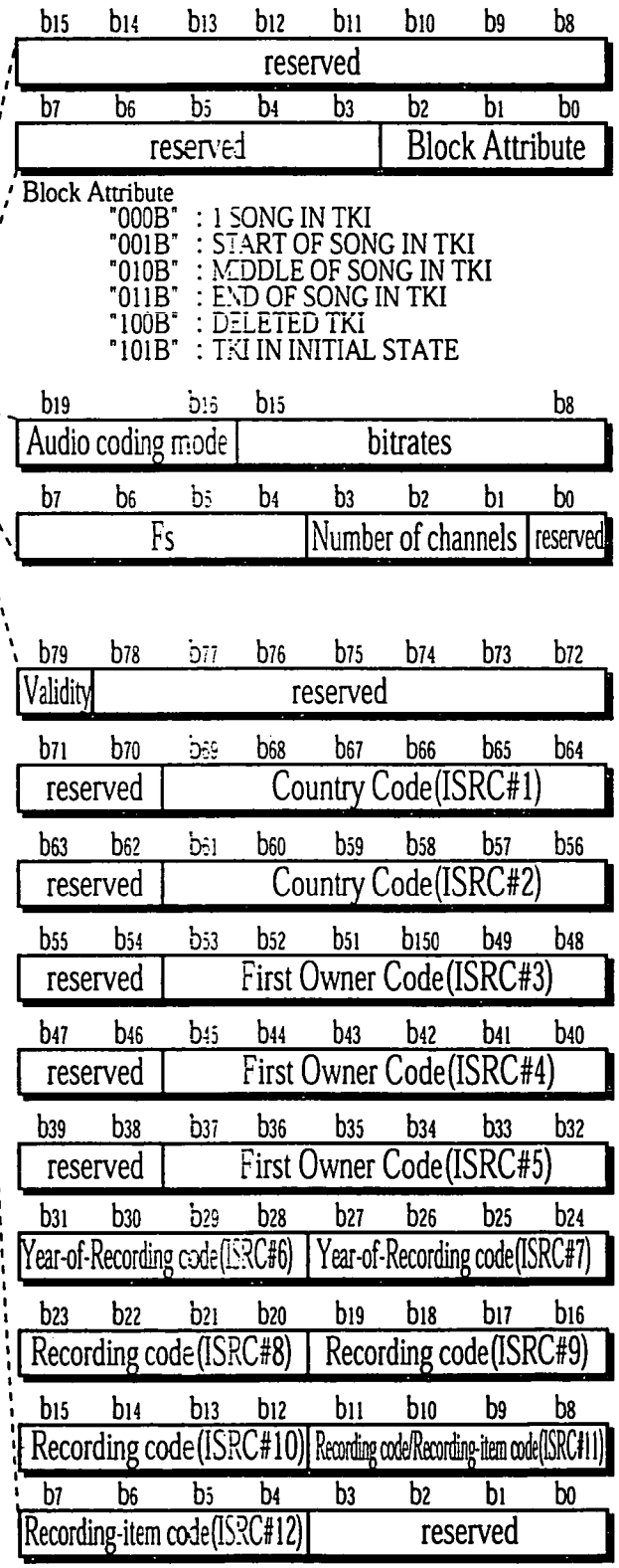
FIG. 22 shows the detailed composition of the TKGI.

The following describes the composition of a TKGI in detail, with reference to FIG. 22. The difference between FIG. 17 and FIG. 22 is that the data composition of the TKGI that was shown in FIG. 17 is arranged on the left side of this drawing, and that the bit compositions of "TKI_BLK_ATR", "TKI_AOB_ATR" and "ISRC" are clearly shown.

{17-5_22-2} TKI_ID

A unique ID for a TKI is written in the "TKI_ID". In the present embodiment, a two-byte "A4" code is used.

{17-5_22-3} TKIN

A TKI number in the range of 1 to 999 is written in the "TKIN". Note that the TKIN of each TKI is unique. In the present embodiment, the position of each TKI in the TrackManager is used as the TKIN. This means that "1" is written as the TKI number of TKI#1, "2" is written as the TKI number of TKI#2, and "3" is written as the TKI number of TKI#3.

{17-5_22-4} TKI_SZ

The data size of the TKI in byte units is written in the "TKI_SZ". In FIG. 22, 1,024 bytes is given as the data size of the TKI so that each TKI in the present embodiment is 1,024 bytes long.

{17-5_22-5} TKI_LNK_PTR

The TKIN of the TKI to which the present TKI is linked is written in the "TKI_LNK_PTR". The following describes such links between TKIs.

When a track is composed of a plurality of AOBs which are recorded in a plurality of AOB files, these AOB files will be managed as a single track by linking the plurality of TKIs that correspond to these AOB files. To link a plurality of TKIs, it is necessary to show the TKI of the AOB file that follows after the AOB file of the present TKI. Accordingly, the TKIN of the TKI that follows the present TKI is written in TKI_LNK_PTR.

{17-5_22-6_19} TKI_LNK_PTR

The following describes the settings made for the TKI_LNK_PTR in the eight TKIs shown in FIG. 19. The track information numbered #1 to #3 and #8 each correspond to separate tracks, so no information is set in their TKI_LNK_PTR. The track information TKI#4,TKI#5, TKI#6,TKI#7 correspond to the four AOB files that compose TrackD, so that the next track information is indicated in the TKI_LNK_PTR of these TKIs. As shown by the arrows TL4, TL5, and TL6 in FIG. 19, "TKI#5" is set in the TKI_LNK_PTR of TKI#4, TKI#6" is set in the TKI_LNK_PTR of TKI#5, and "TKI#7" is set in the TKI_LNK_PTR of TKI#6.

As a result, a playback apparatus can refer to the TKI_LNK_PTRs given in the TKIs corresponding to these four AOB files and so find out that the four TKIs TKI#4 to TKI#7 and the four AOB files "AOB004.SA1" to "AOB007.SA1" compose a single track, TrackD.

{17-5_22-7} TKI_BLK_ATR

The attributes of present TKI are written in the "TKI_BLK_ATR". In FIG. 22, the information shown within the broken lines extending form the TKI_BLK_ATR shows the bit composition of the TKI_BLK_ATR. In FIG. 22, the TKI_BLK_ATR is shown as being 16 bits long, with the bits from b3 to b15 being reserved for future use. The three bits from bit b2 to b0 are used to show the attributes of the TKI.

When one TKI corresponds to a complete track, the value "00b" is written in the TKI_BLK_ATR (this setting is hereafter referred to as "Track"). When several TKIs correspond to the same track, the value "001b" is written in the TKI_BLK_ATR of the first TKI (this setting is hereafter referred to as "Head_of_Track"), the value "010b" is written in the TKI_BLK_ATRs of the TKIs that correspond to AOBs in the middle of the track (this setting is hereafter is written in the TKI_BLK_ATR of the TKI that corresponds to the AOB at the end of the track (this setting is hereafter referred to as "End_of_Track"). When a TKI is unused but a TKI region exists, which is to say, when there is a deleted TKI, the value "100b" is written in the TKI_BLK_ATR (this setting is hereafter referred to as "Unused"). When a TKI is unused and no TKI region exists, the value "101b" is written in the TKI_BLK_ATR.

{17-5_22-8_19} Example Setting, of the TKI_BLK_ATR

The following describes the settings of the TKI_BLK_ATR for each TKI in the example shown in FIG. 19.

By referring to the TKI_BLK_ATR of each TKI, it can be seen that the four pairs TKI#1 ("AOB001.SA1"), TKI#2 ("AOB002.SA1"), TKI#3 ("AOB003.5A1"), and TKI#8 ("AOB008.SA1") each correspond to separate tracks since the TKI_BLK_ATR of each of TKI#1, TKI#2, TKI#3, and TKI#8 is set as "Track".

The TLK_BLK_ATR of TKI#4 is set at "Head_of_Track", the TLK_BLK_ATR of TKI#7 is set at "End_of_Track", and the TLK_BLK_ATR of TKI#5 and TKI#6 is set at "Midpoint of_Track". This means that the AOB file ("AOB004.SA1") corresponding to TKI#4 is the start of a track, the AOB files ("AOB005.SA1") and ("AOB006.SA1") corresponding to TKI#5 and TKI#6 are midpoints of the track, and the AOB file ("AOBA007.SA1") corresponding to TKI47 is the end of a track.

By classifying the combinations of TKI and corresponding AOB file in accordance with the settings of the TKI_BLK_ATR in the TKI, it can be seen that the combination of TKI#1 and "AOB001.SA1" composes a first track (TrackA). Likewise, the combination of TKI#2 and "AOB002.SA1" composes a second track (TrackB) and the combination of TKI#3 and "AOB003.SA1" composes a third track (TrackC). The combination of TKI#4 and "AOB004.SA1" composes the first part of the fourth track (TrackD), the combinations of TKI#5 with "AOB005.SA1" and TKI#6 with "AOB006.SA1" compose central parts of TrackD, and the combination of TKI#7 and "AOB007. SA1" composes the end part of TrackD. Finally, the combination of TKI#8 and "AOB008.SA1" composes a fifth track (TrackE).

{17-5_22-9} TKI_PB_TM

The playback period of the track (song) composed of the AOB recorded in the AOB file corresponding to a TKI is written in the "TKI_PB$_{13}$ TM" in the TKI.

When a track is composed of a plurality of TKIs, the entire playback period of the track is written in the TKI_PB_TM of the first TKI corresponding to the track, while the playback period of the corresponding AOB is written into the second and following TKIs for the track.

{17-5_22-10} TKI_AOB_ATR

The encoding conditions used when producing an AOB, which is to say information such as (1) the sampling frequency at which the AOB recorded in the corresponding AOB file was sampled, (2) the transfer bitrate, and (3) the number of channels, is written in the "TKI_AOB_ATR" in a TKI. The bit composition of the TKI_AOB_ATR is shown within the broken lines that extend from the "TKI_AOB_ATR" in FIG. 22.

In FIG. 22, the TKI_AOB_ATR is composed of 32 bits, with the coding mode being written in the four-bit field from bit b16 to bit b19. When the AOB is encoded according to MPEG-2 AAC (with ADTS header), the value "0000b" is written into this field, while when the AOB is encoded according to MPEG-layer 3 (MP3), the value "0001b" is written. When the AOB is encoded according to Windows Media Audio (WMA), the value "0010b" is written in this field.

The bitrate used when encoding the AOB is written in the eight-bit field between bit b15 and bit b8. When the AOB is encoded according to MPEG-2 AAC (with ADTS header), a value between "16" and "72" is written into this field, while when the AOB is encoded according to MPEG1-layer 3 (MP3), a value between "16" and "1961" is written. When the AOB is encoded according to MPEG1-layer 3 (MP3) LSF, a value between "16" and "80" is written into this field, while when the AOB is encoded according to Windows Media Audio (WMA), a value between "8" and "16" is written.

The sampling frequency used when encoding the AOB is written in the four-bit field between bit b7 and bit b4. When the sampling frequency is 48 kHz, the value "0000b" is written in this field. When the sampling frequency is 44.1 kHz, the value is "0001b", when the sampling frequency is 32 kHz, the value "0010b", when the sampling frequency is 24 kHz, the value "0011b", when the sampling frequency is 22.05 kHz, the value "001b", and when the sampling frequency is 16 kHz, the value "0101b".

The number of channels is written in the three-bit field from bit b3 to bit b1. When one channel (i.e., monoaural) is used, the value "000b" is written in this field, while when two channels (i.e., stereo) is used, the value "001b" is written in this field.

The twelve-bit field from bit b31 to bit 20 is reserved for future use, as is the bit b0.

{17-5_22-11} ISRC

An ISRC (International Standard Recording Code) is written in the TKGI. In FIG. 22, the broken lines extending from the "ISRC" box show the content of the ISRC. As shown in the drawing, the ISRC is composed of ten bytes, with a Recording-item code (#12) being written into the four-bit field between bit b4 and bit b7. A Recording code/Recording-item code (#11) is written in the four-bit field between bit b8 and bit b11.

A Recording Code (ISRC#10, #9, #8) is written in the twelve-bit field between bit b12 and bit b23. A Year-of-Recording code (ISRC#6, #7) is written in the eight-bit field b24 and bit b31.

The First Owner Code (ISRC #3, #4, #5) is written in the six-bit field between bit b32 and bit b37, the six-bit field between bit b40 and bit b45, and the six-bit field between bit b48 and bit b53. The Country Code (ISRC #1, #2, #3) is written in the six-bit field between bit b56 and bit b61 and the six-bit field between bit b64 and bit b69. A one-bit Validity flag is written in a one-bit field composed of bit b79. A detailed description of ISRC can be found in IS03901:1986 "Documentation-International Standard Recording Code (ISRC)".

{17-5_22-12_23A-1} BIT

The "Block Information Table (BIT)" is a table for managing an AOB_BLOCK, and has the detailed composition shown in FIGS. 23A and 23B.

As shown in FIG. 23A, aBIT is composed of a DATA_OFFSET field that occupies a region from the 60th byte to the 63rd byte, an SZ_DATA field that occupies a region from the 64th byte to the 67th byte, a TMSRTE_Ns field that occupies a region from the 68th byte to the 71st byte, an FNs__1st_TMSRTE field that occupies a region from the 72nd byte to the 73rd byte, an FNs_Last_TMSRTE that occupies a region from the 74th byte to the 75th byte, an FNs_Middle_TMSRTE field that occupies a region from the 76th byte to the 77th byte, and a TIME_LENGTH field that occupies a region from the 78th byte to the 79th byte.

Each of these fields is described in detail below.

{17-5_22-12_23A-2} DATA_Offset

The relative address of the start of an AOB_BLOCK from the boundary between clusters is written in the "DATA_OFFSET" as a value given in byte units. This expresses the size of an invalid area between an AOB and the AOB_BLOCK. As one example, when a user records a radio broadcast on a flash memory card 31 as AOBs and wishes to delete an intro part of a track over which a DJ has spoken, the DATA_OFFSET in the BIT can be set to have the track played back without the part including the DJ's voice.

{17-5_22-12_23A-3} SZ_DATA

The data length of an AOB_BLOCK expressed in byte units is written in "SZ_DATA". By subtracting a value produced by adding the SZ_DATA to the DATA_Offset from the file size (an integer multiple of the cluster size), the size of the invalid area that follows the AOB_BLOCK can be found.

{17-5_22-12_23A-4} TMSRTE_Ns

The total number of TMSRT_Entries included in an AOB_BLOCK is written in "TMSRTE_Ns".

{17-5_22-12_23A-5} "FNs_1st_TMSRTE", "FNs_Last_TMSRTE", "FNs_Middle_TMSRTE"

The number of AOB_FRAMEs included in the AOB_ELEMENT positioned at the start of a present AOB_BLOCK is written in "FNs_1st_TMSRTE".

The number of AOB_FRAMEs included in the AOB_ELEMENT positioned at the end of the present AOB_BLOCK is written in "FNs_Last_TMSRTE".

The number of AOB_FRAMEs included in each AOB_ELEMENT apart from those at the start and the end of the present AOB_BLOCK, which is to say AOB_ELEMENTs in the middle of the AOB_BLOCK, is written in "FNs_Middle_TMSRTE".

The playback period of an AOB_ELEMENT is written in the format shown in FIG. 23C in the "TIME_LENGTH" field to an accuracy in the order of milliseconds. As shown in FIG. 23C, the "TIME_LENGTH" field is 16-bits long. When the encoding method used in MPEG-ACC or MPEG-Layer3, the playback period of an AOB_ELEMENT is two seconds, so that the value "2000" is written in the "TIME_LENGTH" field.

{17-5_22-13_23B}

FIG. 23B shows the number of AOB_FRAMEs indicated by "FNs_Middle_TMRTE". In the same way as FIG. 14, FIG. 23B shows the relationship between the sampling_frequency and the number of AOB_FRAMEs included in an AOB_ELEMENT in the middle of an AOB_BLOCK.

The relationship between the sampling_frequency and the number of frames included in the AOB_ELEMENT shown in FIG. 23B is the same as that shown in FIG. 14, which is to say, the number of frames in an AOB_ELEMENT depends on the sampling frequency used. The number of frames written in "FNs_1st_TMSRTE" and "FNs_Last_TMSRTE" will fundamentally be the same as the number written in "FNs_Middle_TMSRTE", though when an invalid area is present in the AOB_ELEMENTs at the start and/or end of an AOB_BLOCK, the values given in "FNs_1st_TMSRTE" and/or "FNs_Last_TMSRTE" will differ from the value in "FNs_Middle_TMSRTE".

{17-5_22-14_24} Example of a Stored AOB_ELEMENT

Figure 24:
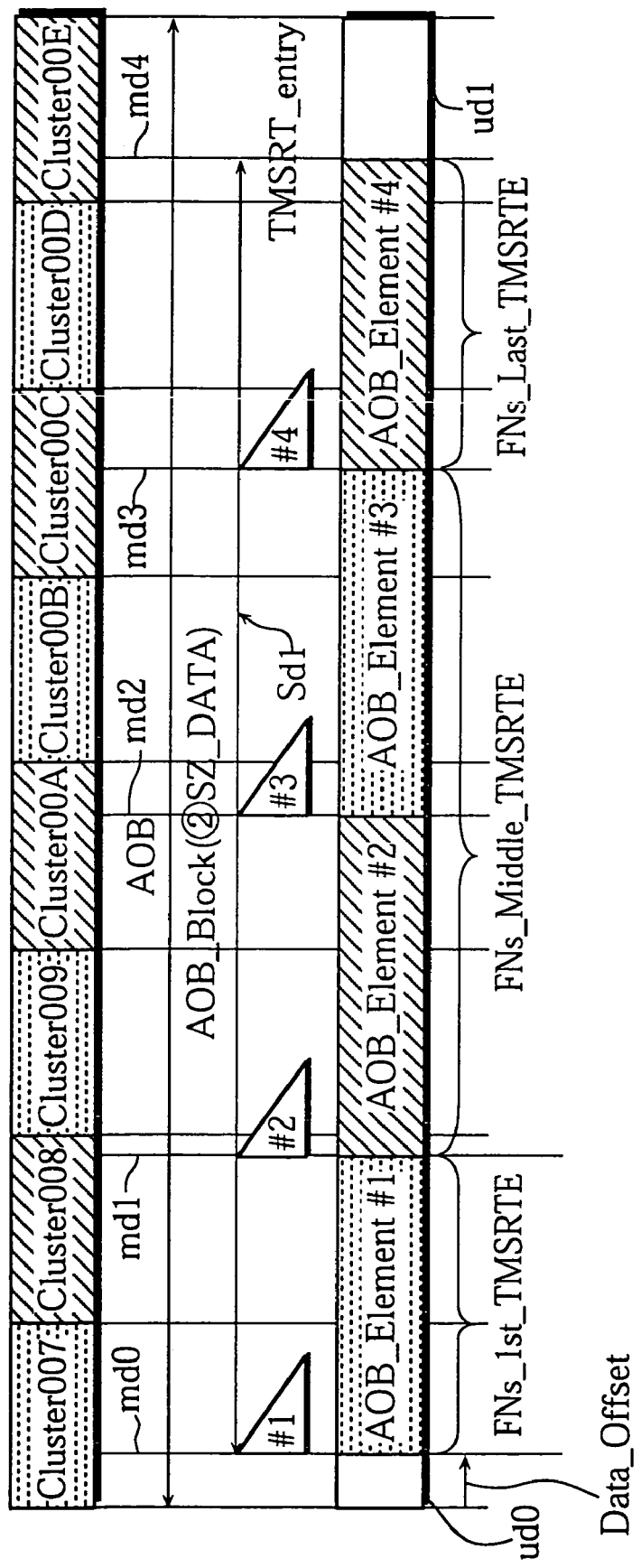
FIG. 24 shows cluster 007 to 00E into which the AOB composed of AOB_ELEMENT#1 to AOB_ELEMENT#4 are stored.

FIG. 24 shows the clusters 007 to 00E that store the AOB composed of AOB_ELEMENT#1 to AOB_ELEMENT#4. The following describes the settings in the BIT when an AOB is stored as shown in FIG. 24. AOB_ELEMENT#1 to AOB_ELEMENT#4 that are stored in cluster 007 to cluster 00E are indicated in FIG. 24 by the triangular flags, with TMSRT_entries being set in the TKI for each of AOB_ELEMENT#1 to AOB_ELEMENT#4.

In this example, the first part of AOB_ELEMENT#1 at the start of the AOB is stored in cluster 007, while the last part of AOB_ELEMENT#4 at the end of the AOB is stored in cluster 00E. The AOB_ELEMENTs #1 to #4 occupy the region between md0 in cluster 007 to md4 in cluster 00E. As shown by arrow sd1 in FIG. 24, the SZ_DATA in the BIT indicates that AOB_ELEMENTs #1 to #4 occupy a region from the start of cluster 007 to the end of cluster 00E, and so does not indicate that there are the invalid areas ud0 and ud1 in clusters 007 and 00E that are not occupied by an AOB_ELEMENT.

On the other hand, the AOB also includes the parts ud0 and ud1 that are present in clusters 007 and 00E but are not occupied by AOB_ELEMENT#1 or AOB-ELEMENT#4. The DATA_Offset given in the BIT gives the length of the unoccupied region ud0, which is to say, a position value for the start of the AOB_ELEMENT#1 relative to the start of cluster 007.

In FIG. 24, the AOB_ELEMENT#1 occupies a region from md0 in cluster 007 to md1 in cluster 008.

This AOB_ELEMENT#1 does not occupy all of cluster 008, with the remaining part of the cluster being occupied by AOB_ELEMENT#2. AOB_ELEMENT#4 occupies a region from md3 midway through cluster 00C to md4 midway through cluster 00E. In this way, AOB_ELEMENTs may be stored across cluster boundaries, or in other words, AOB_ELEMENTs can be recorded without regard for the boundaries between clusters. The "FNs_1st_TMSRTE" in the BIT shows the number of frames in AOB_ELEMENT#1 that is located in clusters 007 and 008, while the "FNs_Last_TMSRTE" in the BIT shows the number of frames in AOB_ELEMENT#4 that is located in clusters 00C to 00E.

In this way, AOB_ELEMENTs can be freely positioned without regard for the boundaries between clusters. The BIT provides information showing the offset from a cluster boundary to an AOB_ELEMENT and the number of frames in each AOB_ELEMENT.

{17-5_22-14_25} Use of the Number of Frames given in each AOB_ELEMENT (Part 1)

The following describes how the number of frames in each AOB_ELEMENT given in the BIT is used. This number of frames given in the BIT is used when forward or backward search is performed. As mentioned earlier, such operations play back 240 milliseconds of data after first skipping data with a playback period of two seconds.

Figure 25:
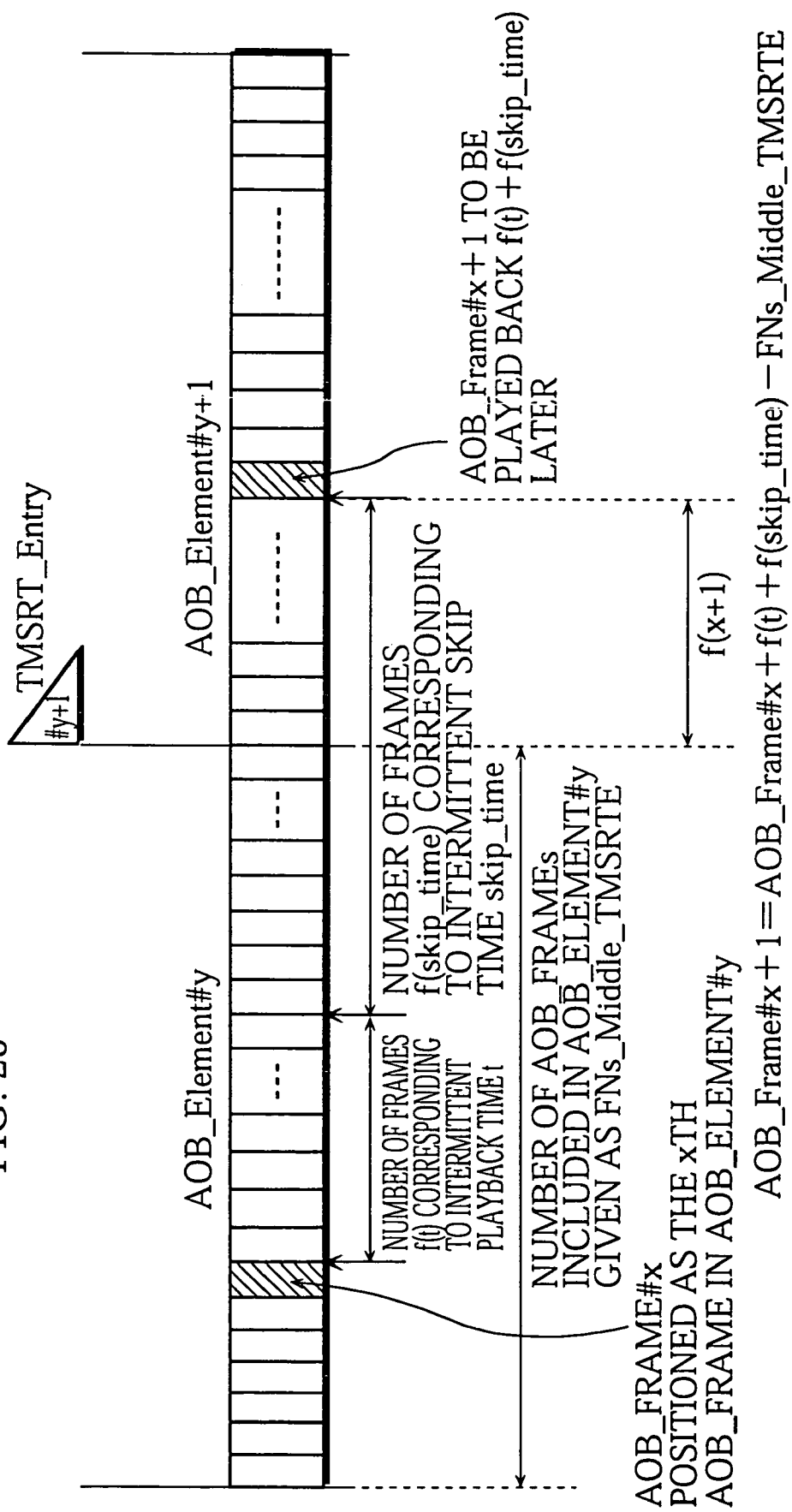
FIG. 25 shows how the next AOB_FRAME#x+1 to be played back is set when forward search is performed starting from the AOB_FRAME#x in an arbitrary AOB_ELEMENT#y in an AOB.

FIG. 25 shows how AOB_FRAME#x+1, which should be played back next, is set when performing forward search starting from an AOB_FRAME#x in an AOB_ELEMENT#y in an AOB.

FIG. 25 shows the case when a user selects forward search during the playback of AOB_FRAME#x included in AOB_ELEMENT#y. In FIG. 25, "t" represents the intermittent playback period (here, 240 milliseconds), "f (t)" shows the number of frames that correspond to this intermittent playback period, "skip_time $^1$" shows the length of the period that should be skipped between intermittent playback periods (here, two seconds), "f(skip_time)" shows the number of frames that correspond to this skip time. Intermittent playback is achieved by repeating the three procedures (1), (2), and (3) described below.

(1) The playback apparatus refers to the TMSRT_entry in the TKTMSRT and jumps to the start of the flag symbol (AOB_ELEMENT).

(2) The playback apparatus performs playback for 240 milliseconds.

(3) The playback apparatus jumps to the start of the next flag symbol (AOB_ELEMENT).

The AOB_FRAME#x+1 that exists 2 s+240 ms from the AOB_FRAME#x included in the AOB_ELEMENT#y will definitely be present in the AOB_ELEMENT#y+1. When specifying the AOB_FRAME#x+1 that is 2 s+240 ms from the AOB-FRAME#x, the first address of the next AOB_ELEMENT#y+1 can be immediately calculated by reading a TMSRT_entry from the TKTMSRT, though a playback apparatus cannot know the number of AOB_FRAMEs from the start address of the AOB_ELEMENT#y+1 to the AOB_FRAME#x+1 from the TMSRT_entry alone.

To calculate this number of AOB_FRAMEs, it is necessary to subtract the total number of frames included in the AOB_ELEMENT#y from the total of (1) the number#x showing the position of the AOB_FRAME#x relative to the start of the AOB_ELEMENT#y, (2) f(t) and (3) f(skip_time). To simplify the calculation of the relative frame position of AOB_FRAME#x+1 in AOB_ELEMENT#y+1, the "FNs_1st_TMSRTE", "FNs_Middle_TMSRTE", and "FNs_Last_TMSRTE" for each AOB_ELEMENT are written in the BIT, as mentioned above.

{17-5_22-15_26A} Use of the Number of Frames given in each AOB_ELEMENT (part 2)

Figure 26A:
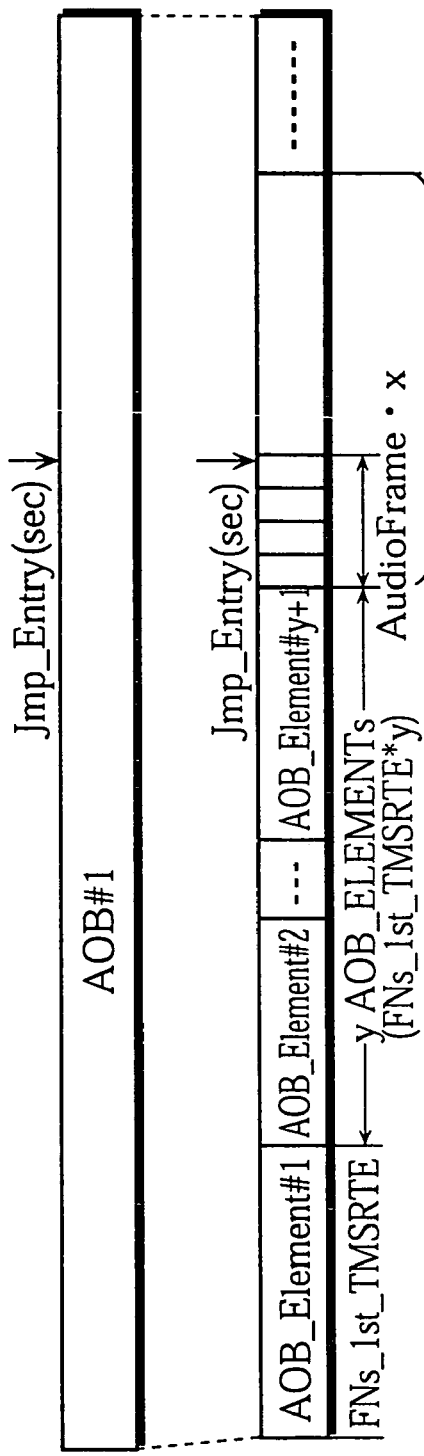

The number of frames written in the BIT is also used when the playback apparatus performs a time search function where playback starts at a point indicated using a time code. In FIG. 26A, shows how a playback apparatus can specify the AOB_ELEMENT and AOB_FRAME corresponding to the playback start time indicated by the user. When playback is to commence from a time indicated by the user, the indicated time (in seconds) is set in the Jmp_Entry field, and playback should begin from an AOB_ELEMENT#y and an AOB_FRAME position x that satisfy Equation 2 given below.

$$Jmp\_Entry(sec) = (FNs\_1st\_TMSRTE + FNs\_middle\_TMSRTE * y + x) * 20 \text{ msec} \quad \text{Equation 2}$$

Since the "FNs_1st_TMSRTE" and "FNs_Middle_TMSRTE" are provided in the BIT, these can be substituted into Equation 2 to calculate the AOB_ELEMENT#y and AOB_FRAME#x. Having done this, a playback apparatus can refer to the TKTMSRT of the AOB, calculate the first address of the AOB_ELEMENT#y+2 (which is the (y+2)th AOB_ELEMENT in this AOB), and start the search for AOB_FRAME#x from this first address. On finding the $x^{th}$ AOB_FRAME, the playback apparatus starts the playback from this frame. In this way, the playback apparatus can start the playback of data from the time indicated by Jmp_Entry (in seconds).

In this way, a playback apparatus does not have to search for the ADTS header parts of AOB_FRAMEs, and only needs to perform the search in AOB_ELEMENTs that are given in the TMSRT_entries in the TKTMSRT. This means that the playback apparatus can find a playback position corresponding to an indicated playback time at high speed.

In the same way, when the Jmp_Entry is set and the time search function is used on a track that is composed of a plurality of AOBs, the playback apparatus only needs to calculate an AOB_ELEMENT#y and AOB_FRAME#x that satisfy Equation 3 below.

$$Jmp\_Entry \text{ (in seconds)} = \text{Playback period from AOB\#1 to AOB\#n} + (FNs\_1st\_TMSRTE(\#n+1) + FNs\_middle\_TMSRTE(\#n+1) * y + x) * 20 \text{ m sec} \quad \text{Equation 3}$$

The total playback period of the AOBs from AOB#1 to AOB#n is as follows.

Total Playback Period from AOB#1 to AOB#n=
["FNs_1st_TMSRTE"(#1)+"FNs_Middle_TMSRTE" (#1)*(Number of TMSRT_entries(#1)−2)+"FNs_Last_TMSRTE"(#1)+"FNs_1st_TMSRTE" (#2)+("FNs_Middle_TMSRTE"(#2)*Number of TMSRT_entries(#2)−2)+ "FNs_Last_TMSRTE"(#2)+"FNs_1st_TMSRTE"(#3)+ ("FNs_Middle_TMSRTE"(#3)*Number of TMSRT_entries (#3)−2)+"FNs_Last_TMSRTE"(#3) . . . +"FNs_1st_TMSRTE"(#n)+("FNs_Middle_TMSRTE"(#n)* Number of TMSRT_entries(#n)−2)+"FNs_Last_TMSRTE" (#n)]*20 msec Having calculated an AOB#n, an AOB_ELEMENT#y, and AOB_FRAME#x that satisfy Equation 3, the playback apparatus refers to the TKTMSRT corresponding to the AOB#n+1, searches for the $x^{th}$ AOB_FRAME from the address at which the (y+2) th AOB_ELEMENT (i.e., AOB_ELEMENT#y+2) is positioned, and starts the playback from this $x^{th}$ AOB_FRAME.

{17-5_22-16_27A,B} Deletion of an AOB File and a TKI

This completes the explanation of all of the information included in the TKI. The following describes how the TKI is updated in the following four cases. In the first case (case1), a track is deleted. In the second case (case2) a track is deleted and a new track is recorded. In the third case (case3) two out of a plurality of tracks are selected and combined into a single track. Finally, in the fourth case (case4), one track is divided to produce two tracks.

The following describes case1 where a track is deleted.

Figure 27A:
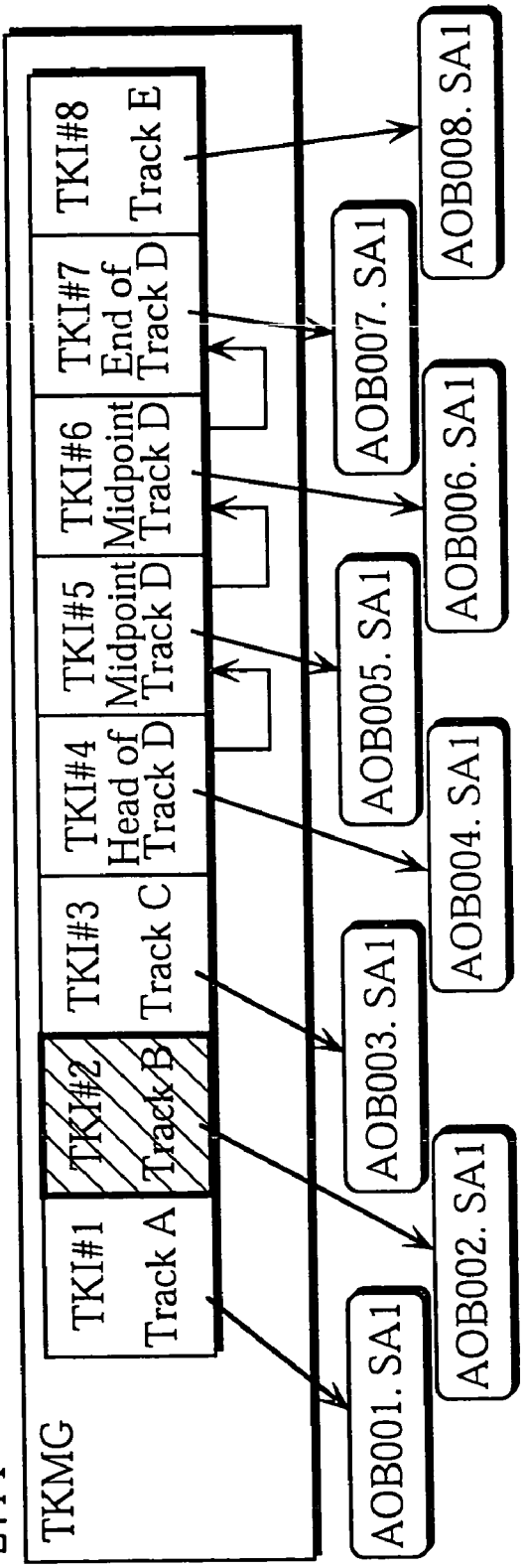
FIGS. 27A and 27B show the deletion of a track.
Figure 27B:
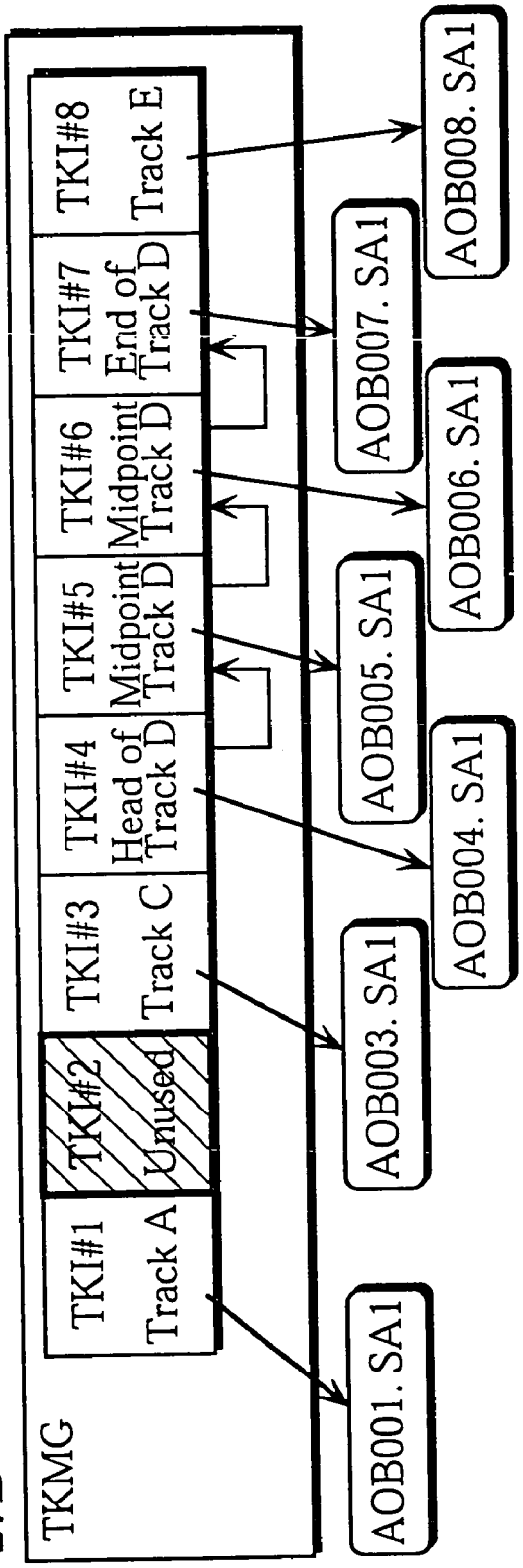

FIGS. 27A and 27B show the partial deletion of a track. The example in FIGS. 27A and 27B corresponds to the TrackManager shown in FIG. 19, and assumes that the user has indicated the partial deletion of Track B. The AOB corresponding to TrackB is recorded in "AOB002.SA1", which is associated with TKI#2. This means that the deletion of "AOB$_{002}$.SA1" is accompanied by the setting of "Unused" into the TKI_BLK_ATR of TKI#2. This state where "AOB002.SA1" has been deleted and "Unused" has been set into the TKI_BLK_ATR of TKI#2 is shown in FIG. 27B. Since "AOB002.SA1" has been deleted, the region that was formerly occupied by "AOB002.SA1" is freed to become an unused region. As mentioned above, the other change is that "Unused" is set in the TK_BLK_ATR of TKI#2.

{17-5_22-17_28A,B} Assignment of TKIs when a New AOB is Recorded

The following describes case2 where a new track is recorded after the deletion of a track.

FIG. 28A shows the TrackManager after the deletion of tracks has been performed several times. As shown in FIG. 28A, if the tracks corresponding to TKI#2, TKI#4, TKI#7, and TKI#8 have been deleted, then "Unused" is set in the TKI_BLK_ATR of these TKI. While AOB files are deleted in the same way as conventional data files, the TrackManager is updated by merely setting "Unused" in the TKI_BLK_ATR of the corresponding TKI. These means that TKIs whose TKI_BLK_ATRs are set at "Unused" can appear at different places in the TrackManager.

FIG. 28B shows how a new TKI and AOB file are written when a TKI whose TKI_BLK ATR is "Unused" is present in the TrackManager. Like in FIG. 28A, the TKI#2, TKI#4, TKI#5, TKI#7, and TKI#8 in FIG. 28B are set as "Unused".

In FIG. 28B, the new track to be written is composed of four AOBs. The unused TKIs used to record these AOBs are determined according to the DPL_TK_SRPs or can be freely chosen. In the present example, the unused TKIs numbered TKI#2, TKI#4, TKI#7, and TKI#8 are used to record the TKIs for the new track.

Since these four AOBs compose one track, "Head_of_Track" is set in the TKI_BLK_ATR of TKI#2, "Middle_of_Track" is set in the TKI_BLK_ATR of TKI#4 and TKI#7, and "End_of_Track" is set in the TKI_BLK_ATR of TKI#8. The TKI_LNK_PTR in each of the four TKIs, TKI#2, TKI#4, TKI#7, and TKI#8, used to compose the new TrackD is set so as to show the TKI forming the next part of TrackD, so that as shown by the arrows TL2, TL4, and TL7, TKI#4 is set in the TKI_LNK_PTR of TKI#2, TKI#7 is set in the TKI_LNK_PTR of TKI#4, and TKI#8 is set in the TKI_LNK_PTR of TKI#7.

After this, the files "AOB002.SA1", "AOB004.SA1", "AOB007.SA1", and "AOB008.SA1" having the same numbers as TKI#2, TKI#4, TKI#7, TKI#8 are produced, and the four AOBs composing TrackD are stored in these four files.

By appropriately setting the TKI_LNK_PTRs and TKI_BLK_ATRs, this fourth track TrackD can be managed using TKI#2, TKI#4, TKI#7, and TKI#8.

As described above, when a new track is written onto the flash memory card 31, TKIs in the TrackManager that are set as "Unused" are assigned as the TKIs to be used for tracks that are to be newly recorded.

{17-5_22-18_29A,B} Setting of TKI when Combining Two Tracks

The following describes the updating of the TKI when combining tracks (case3).

Figure 29A:
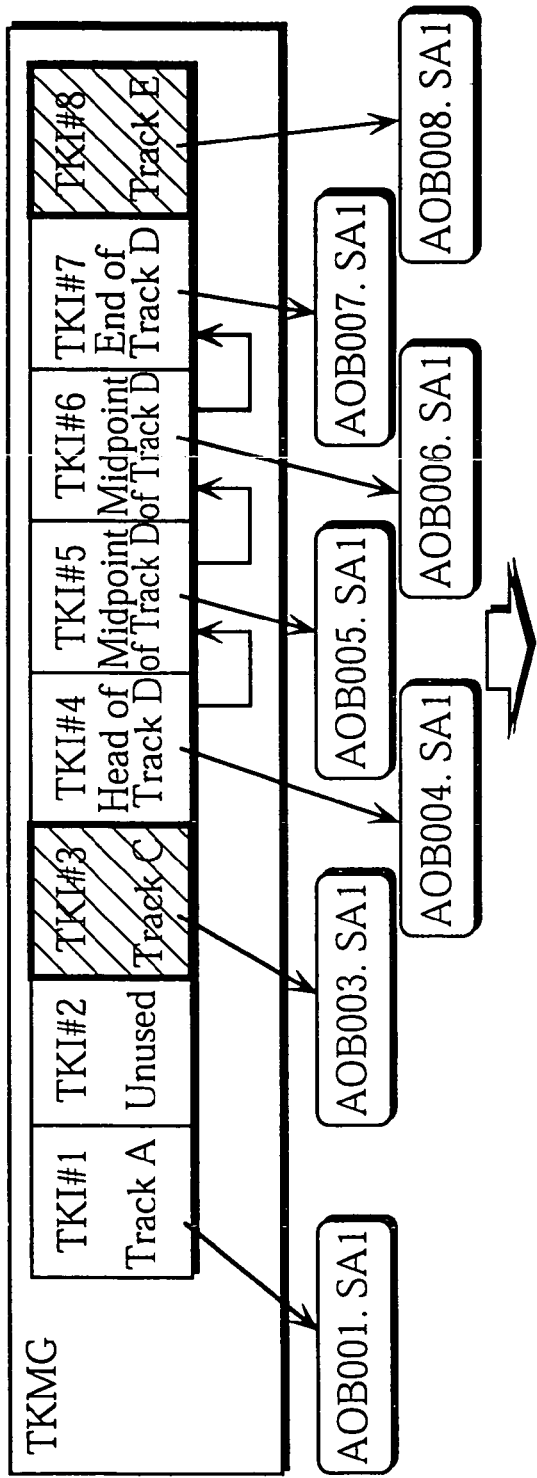
FIGS. 29A and 29B show the TKIs are set when two tracks are combined to produce a new track.
Figure 29B:
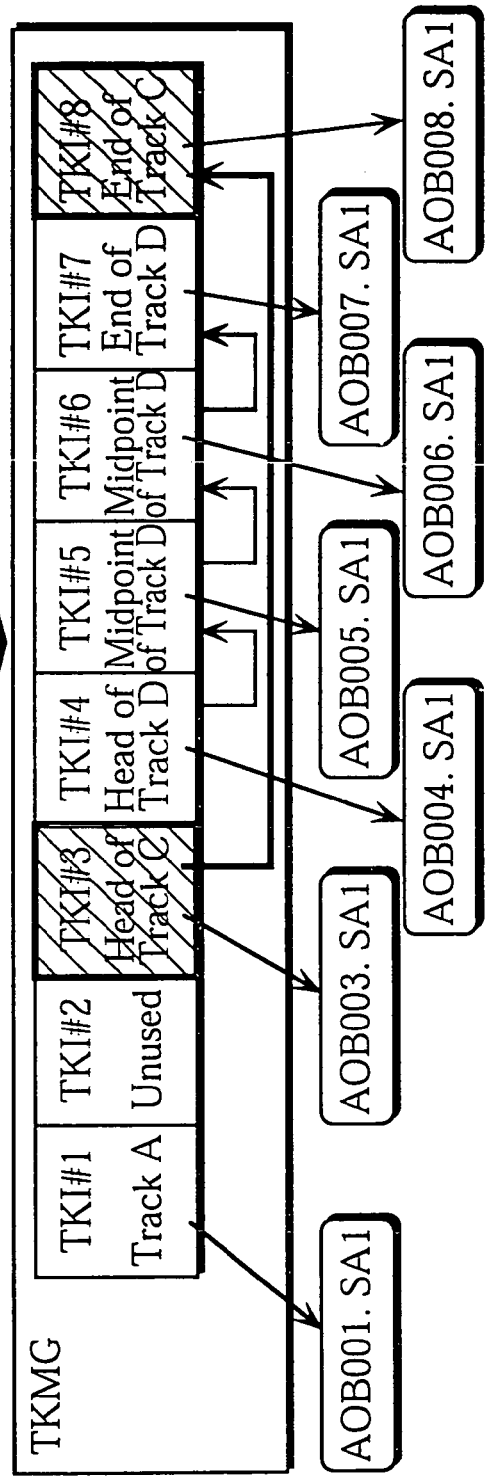

FIGS. 29A and 29B show how the TKIs are set when two tracks are combined to produce a new track. The example in FIG. 29A uses the same TrackManager as FIG. 19 and shows the case when the user performs an editing operation to combine TrackC and TrackE into a single track.

In this case, the AOBs that correspond to TrackC and TrackE are recorded in the AOB files "AOB003.SA1" and "AOB008.SA1" which correspond to TKI#3 and TKI#8, so that the TKI_BLK_ATRs of TKI#3 and TKI#8 are rewritten. FIG. 29B shows the TKI_BLK_ATR of these TKIs after rewriting. In FIG. 29A, the TKI_BLK_ATRs of TKI#3 and TKI#8 is written as "Track", but in FIG. 29B the TKI_BLK_ATR of TKI#3 is rewritten to "Head_of_Track" and the TKI_BLK_ATR of TKI#8 is rewritten as "End_of_Track". By rewriting the TKI_BLK_ATRs in this way, the AOB files "AOB003.SA1" and "AOB008.SA1" which correspond to TKI#3 and TKI#8 end up being treated as parts of a single track, the new TrackC. This operation is accompanied by the TKI_LNK_PTR of TKI#3 being rewritten to indicate TKI#8.

It should be particularly noted here that while the TKI_BLK_ATRs in the TKI are rewritten, no processing is performed to physically combine the AOB files "AOB003.SA1" and "AOB008.SA1". This is because AOB files are each encrypted using different FileKeys, so that when combining AOB files, it would be necessary to perform two processes for each AOB file to first decrypt the encrypted AOB file and then to re-encrypt the result, resulting in an excessive processing load. Also, an AOB file combined in this way would be encrypted using a single FileKey, which would make the combined track less secure that the tracks used to produce it.

The TKI is originally designed so as to suppress the size of the TKTMSRT, so that the physical combining of AOB files by an editing operation would also carry the risk of the TKI becoming too large.

For the reasons given above, editing operations that combine tracks leave the AOB files in their encrypted state and are achieved by merely changing the attributes given by the TKI_BLK_ATRs.

{17-5_22-18_29A,B-1_30, 31} Conditions That Should be Satisfied When Combining Tracks The combining of tracks is performed by changing the TKI_BLK_ATR attributes as described above, but the AOBs that are included in the combined tracks should satisfy the conditions given below.

A first condition is that the AOB that is to compose a latter part of a new track needs to have the same audio attributes (audio coding mode, bitrate, sampling frequency, number of channels, etc.) as the AOB that is to compose the first part of the new track. If an AOB has different audio attributes to the preceding or succeeding AOB, the playback apparatus will have to reset the operation of the decoder, which makes seamless (i.e., uninterrupted) playback of consecutive AOBs difficult.

The second condition is that in the track produced by the combining, three or more AOBs made up of only AOB_ELEMENTs whose number of AOB_FRAMEs is below the required number for an "FNs_Middle_TMSRTE" cannot be linked.

AOBs are classified into two types depending on whether at least one AOB_ELEMENT includes a same number of AOB_FRAMEs as the number of frames stipulated for an "FNs_Middle_TMSRTE". The Type1 AOB includes at least one AOB_ELEMENT having this number of AOB_FRAMEs, while the Type2 AOB includes no AOB_ELEMENT having this number of AOB_FRAMEs.

In other words, AOB_ELEMENTs in a Type2 AOB have fewer AOB_FRAMEs than "FNs_Middle_TMSRTE", and the second condition stipulates that three Type2 AOBs cannot be linked together.

The reason for the second condition is as follows. When the playback apparatus reads AOBs successively, it is preferable for a sufficient number of AOB FRAMEs to accumulate in the buffer of the playback apparatus, though this cannot be achieved when there are consecutive Type2 AOBs. In such case, an underflow is likely to occur in the buffer of the playback apparatus, so that uninterrupted playback by the playback apparatus can no longer be guaranteed. Therefore, in order to avoid such underflows, the second condition stipulating that three or more Type2 AOBs cannot be linked continuously is used.

FIG. 30A shows a Type1 AOB, while FIG. 30B shows two examples of Type2 AOBs. In FIG. 30B, both AOBs are composed of less than two AOB_ELEMENTs, with none of the AOB_ELEMENTs including a number of AOB_FRAMEs that is set for an "FNs_Middle_TMSRTE". Since the absence of an AOB_ELEMENT with the number of AOB_FRAMEs set for an "FNs_Middle_TMSRTE" is the condition by which an AOB is classified as a Type2 AOB, this means that all of the AOBs shown in this drawing are classified as Type2 AOBs.

In FIG. 31A, a combining of Type1+Type2+Type2+Type1 AOBs into a single track is shown. As this combining does not involve the linking of three Type2 AOBs, these AOBs may be linked to form a single track.

FIG. 31B shows the linking of Type1+Type2+Type2+Type2+Type1 AOBs into a single track. This combining would result in there being three consecutive Type2 AOBS, and so is prohibited.

Figure 32A:
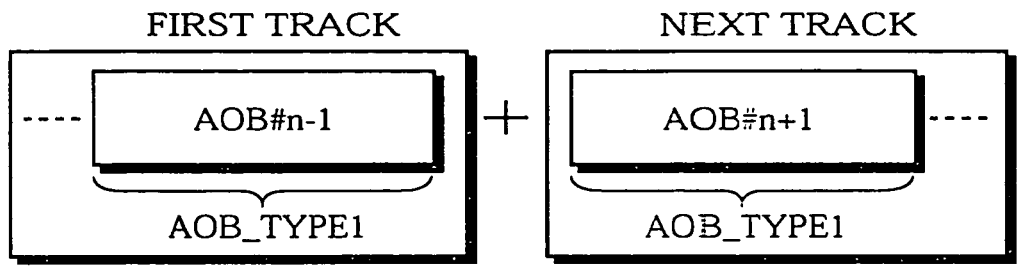
FIG. 32A shows a pattern where a Type1 AOB is present at the end of a preceding track and a Type1 AOB is present at the start of a next track.
Figure 32B:
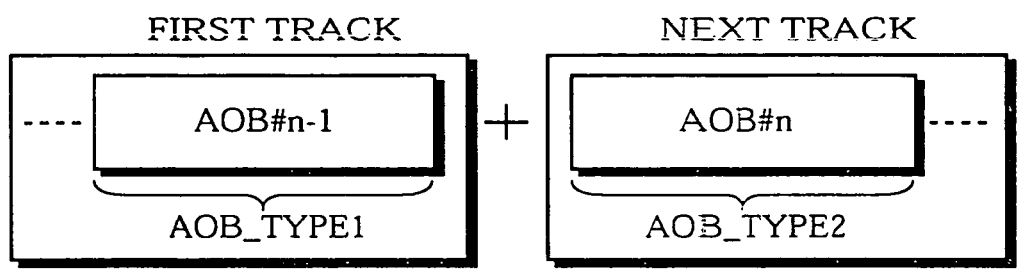
FIG. 32B shows a pattern where a Type1 AOB is present at the end of a first track and a Type2 AOB is present at the start of a next track.

{17-5_22-18_29A,B-1_32} Combining of Tracks with Respect to Combinations of Type1 and Type2 AOBS In the combining of AOBs into a single track shown in FIG. 31A, if the last AOB in the first track is a Type1 AOB, the combining can be performed regardless of whether the first part of this track is a Type1 AOB or a Type2 AOB. FIG. 32A shows the case where the last AOB in the first track is a Type1 AOB and the first AOB in the next track is also a Type1 AOB. FIG. 32B shows the case where the last AOB in the first track is a Type1 AOB and the first AOB in the next track is a Type2 AOB. As the second condition is satisfied in both of these cases, the illustrated tracks can be combined into a single track.

When the last AOB in the first track is a Type2 AOB and the preceding AOB in the first track is a Type 1 AOB, this first track can be combined with a following track that starts with a Type1 AOB regardless of whether the first AOB in the first track is a Type1 AOB or a Type2 AOB.

Figure 32C:
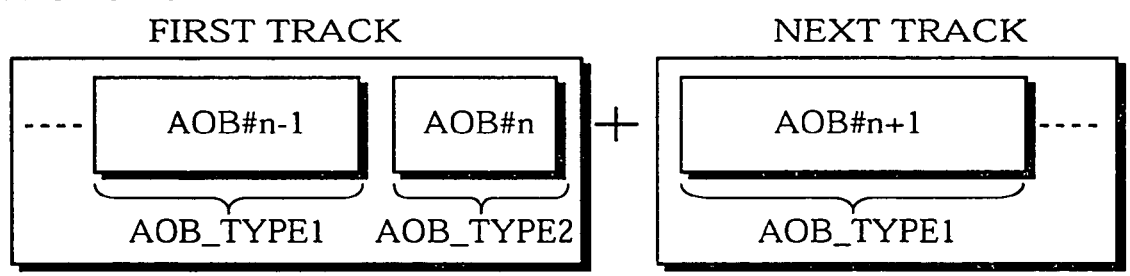
FIG. 32C shows a pattern where a Type1 and Type2 AOB are present at the end of a first track and a Type1 AOB is present at the start of a next track.
Figure 32D:
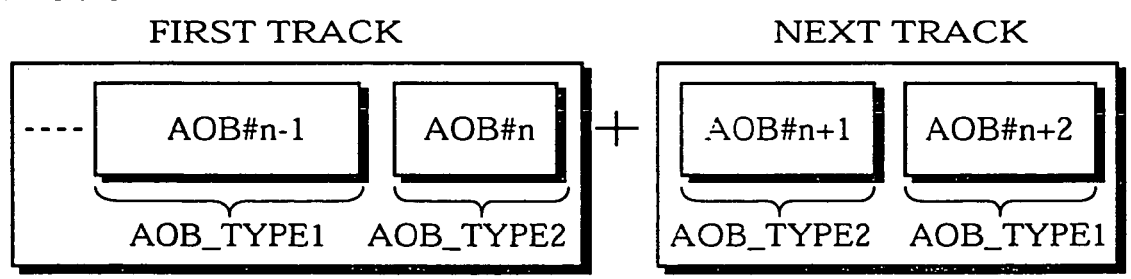
FIG. 32D shows a pattern where a Type1 and Type2 AOB are present at the end of a first track and a Type2 and a Type1 AOB is present at the start of a next track.

FIG. 32C shows the case where the first track ends with a Type1 AOB and a Type2 AOB in that order and the second track starts with a Type1 AOB. FIG. 32D shows the case where the first track ends with a Type1 AOB and a Type2 AOB in that order and the second track starts with a Type2 AOB and a Type1 AOB in that order. As the second condition is satisfied in both of these cases, the illustrated tracks can be combined into a single track.

Figure 32E:
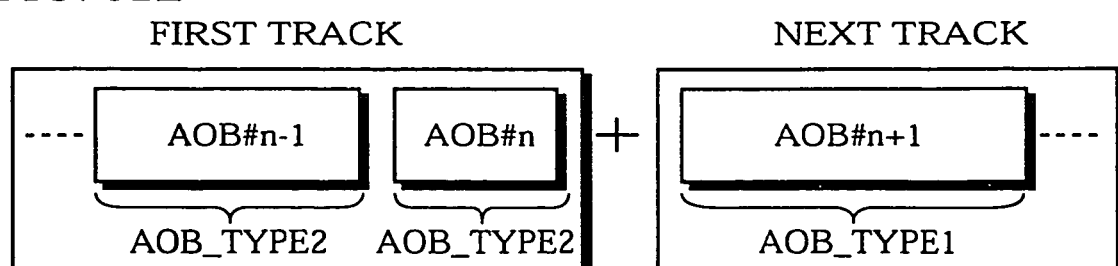
FIG. 32E shows a pattern where two Type2 AOBs are present at the end of a first track and a Type1 is present at the start of a next track.

When the first track ends with a Type2 AOB and the immediately preceding AOB is also a Type2 AOB, this first track can be combined with a following track that starts with a Type1 AOB. FIG. 32E shows the case where the first track ends with two Type2 AOBs and the second track starts with a Type1 AOB. As the second condition is satisfied in this case, the illustrated tracks can be combined into a single track. In this way, when two tracks are to be combined, an investigation is performed to see whether the two tracks satisfy the first and second conditions and the two tracks are only combined if they are judged to satisfy these conditions.

The following describes the updating of the TKI for case4 where a track is divided.

{17-5_22-19_33A,B} Settings for the TKI When a Track is Divided

Figure 33A:
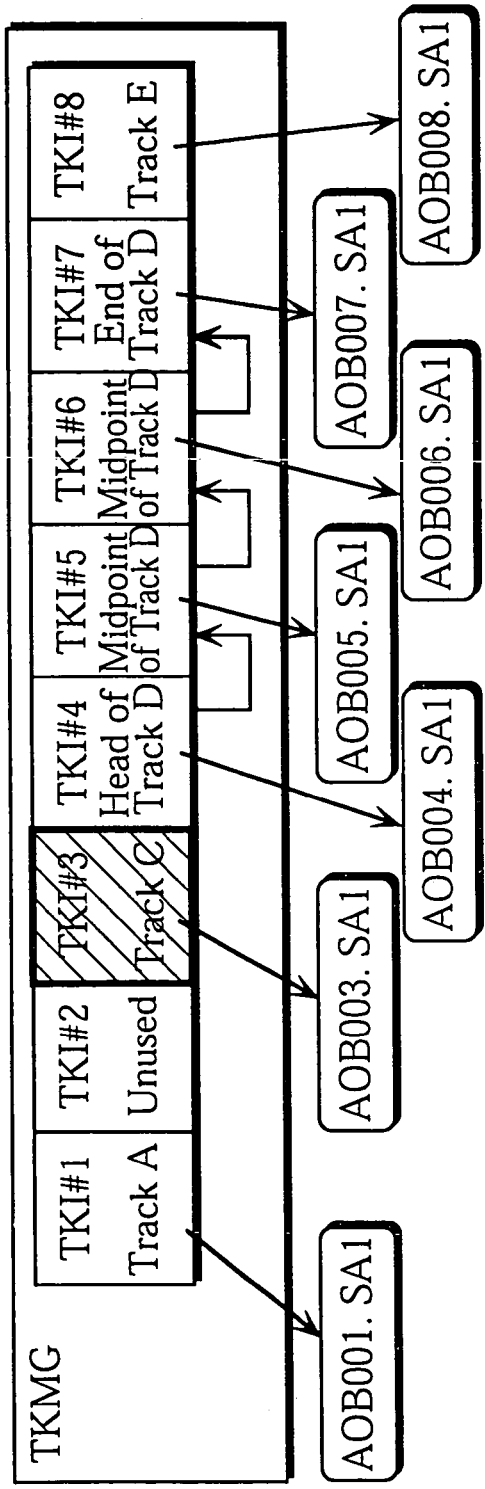
FIGS. 33A and 33B show the division of a track to produce two tracks.
Figure 33B:
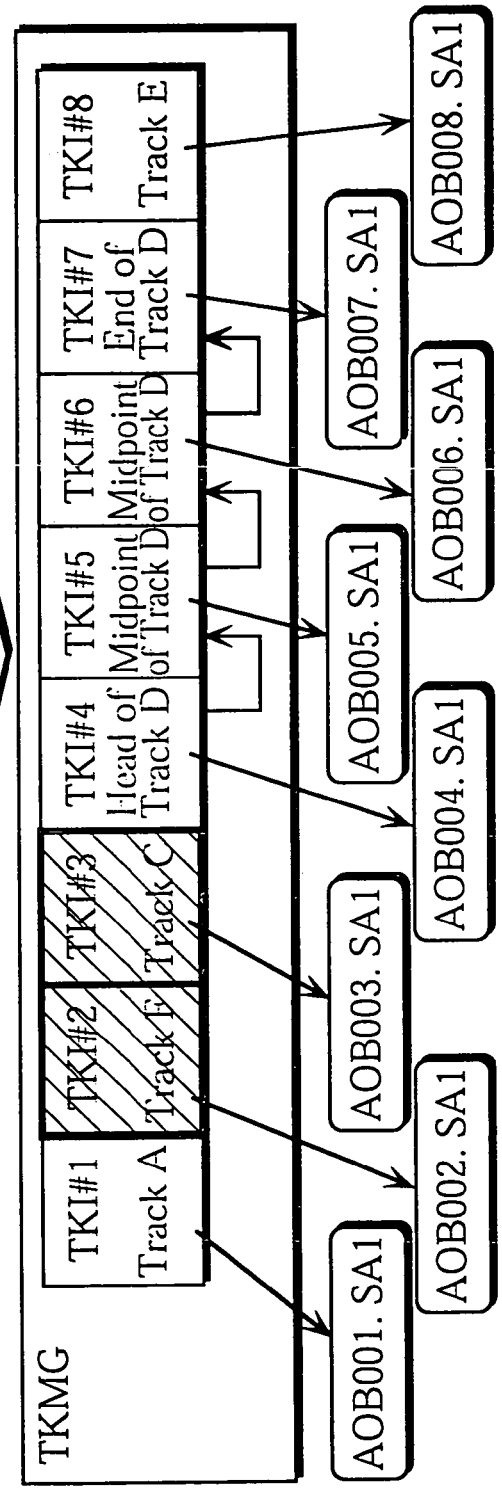

FIGS. 33A and 33B show examples of when a single track is to be divided to produce two new tracks. For these examples, the content of the TrackManager is the same as in FIG. 27, with the user being assumed to have performed an editing operation that divides TrackC into two new tracks, TrackC and TrackF. When TrackC is to be divided into a new TrackC and TrackF, the AOB file "AOB002.SA1" is generated corresponding to TrackF. FIG. 33A shows that TKI#2 is set as "Unused", with this TKI#2 being assigned to the newly generated AOB file "AOB002.SA1".

{17-5_22-19_33A,B-1_34A,B} Updating of the Directory Entries and the FAT Values

Figure 34A:
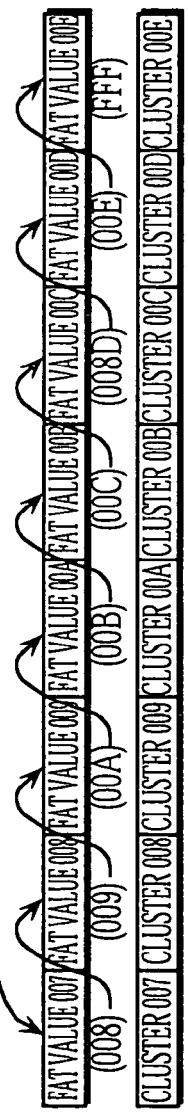
FIGS. 34A and 34B show the content of the SD_Audio directory entries in the SD_Audio directory including the AOB file "AOB003.SA1" before and after the division of the track.

When the AOB file "AOB003.5SA1" is divided to produce "AOB002.SA1" the directory entries and FAT values have to be updated. This updating is explained below. FIG. 34A shows how the SD-Audio Directory Entry in the SD-Audio Directory to which the AOB file "AOB003.SA1" belongs is written before the file is divided.

The AOB file "AOB003.SA1" is divided into a plurality of parts that are stored in clusters 007, 008, 009, 00A . . . 00D, 00E. In this case, the first cluster number for the AOB file "AOB003.SA1" given in the directory entry is written as "007". The values (008), (009), (00A) . . . (00D), (00E) are also written in the FAT values 007, 008, 009, 00A . . . 00D corresponding to the clusters 007, 008, 009, 0A . . . 00D.

Figure 34B:
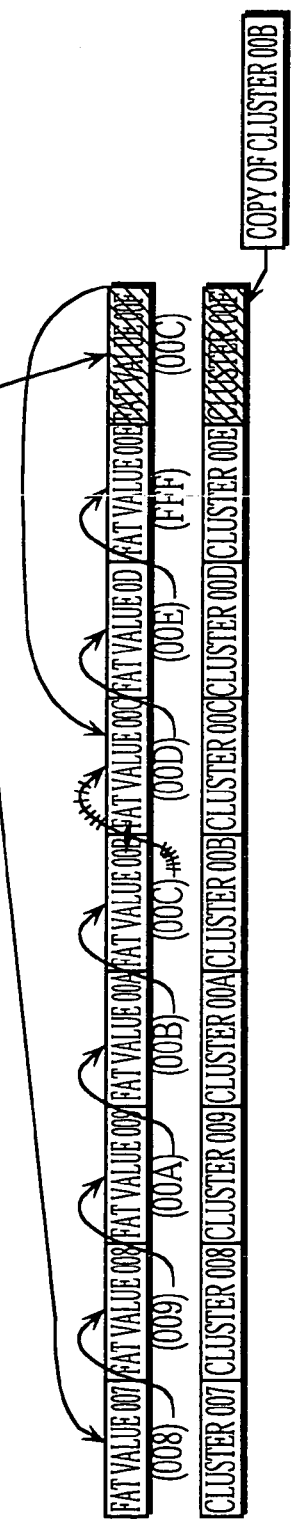

When the AOB file "AOB003.SA1" is divided so that its latter part becomes the new AOB file "AOB002.SA1", a "filename", a "filename extension" and a "number of first clusters in file" for the new AOB file "AOB002.SA1" are added to the SD-Audio directory entry. FIG. 34B shows how the SD-Audio Directory Entry in the SD-Audio Directory to which the AOB file "AOB003.SA1" belongs is written after the AOB file "AOB003.SA1[11]" has been divided.

In FIG. 34B, the cluster 00F stores a copy of cluster 00B that includes the boundary indicated by the user when dividing the file. The parts of the AOB file "AOB002.SA1" that follow the part included in the cluster 00B are stored in the clusters 00C, 00D, 00E as before. Since the first part of the AOB file "AOB002.SA1" is stored in the cluster 00F and the remaining parts are stored in the clusters 00C, 00D, 00E, "00F" is written into the "number of first cluster in file" for the new AOB file "AOB002.SA1", while (00C), (00D), (00E) are written into the FAT values 00F, 00C, 00D, 00E corresponding to the clusters 00F, 00C, 00D, and 00E.

{17-5_22-19_33A,B-2_35A,B}

Setting of the Information Fields in the TKI

The following describes how the information fields in the TKI are set for the AOB file "AOB002.SA1" once this file has been obtained by updating the directory entries and the FAT values. When generating a TKI for a divided track, there are two kinds of information fields in the TKI. These are (1) information that can be copied from the original TKI and (2) information obtained by updating the information in the original TRI. The TKTXI_DA and ISRC are the former type, while the BIT, the TKTMSRT and other information fields are the latter type. Since both types of information exist, the present embodiment generates a TKI for a divided track by copying the original TKI to produce a template for the new TKI, and then dividing/updating the TKTMSRT and BIT in this template and updating the remaining information fields.

Figures 35A, 35B:
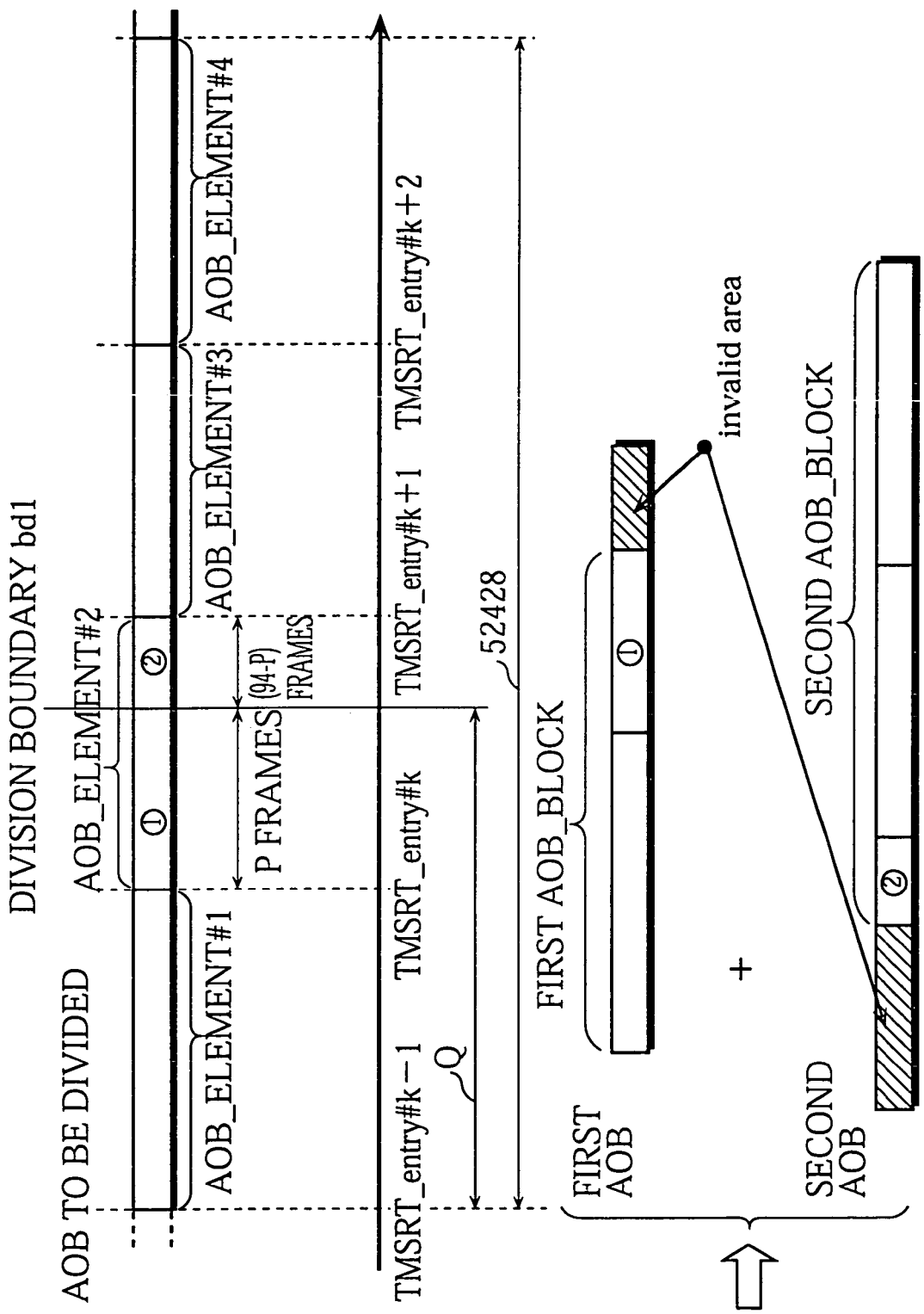
FIG. 35A shows the division of an AOB midway through AOB_ELEMENT#2.
FIG. 35B shows the two AOBs, AOB#1 and AOB#2, obtained by dividing an AOB midway through AOB_ELEMENT#2.

FIG. 35A shows the case where an AOB_FRAME in an AOB is divided. The first level in FIG. 35A shows the four AOB_ELEMENTs, AOB_ELEMENT#1, AOB_ELEMENT#2, AOB_ELEMENT#3, and AOB_ELEMENT#4. The data lengths of these AOB_ELEMENTs are set in the TKTMSRT as the four TMSRT_entries #1, #2, #3, and #4. If the boundary bd1 for the division is set in AOB_ELEMENT#2 in FIG. 35A, AOB_ELEMENT#2 is divided into a first region (1) made up of the frames located before the boundary bd1 and a second region (2) composed of the frames located after the boundary bd1. FIG. 35B shows the two AOBs AOB#1 and AOB#2 obtained by dividing the AOB midway though AOB-ELEMENT#2.

{17-5_22-19_33A,B-3_36} Setting of the BIT

Figure 36:
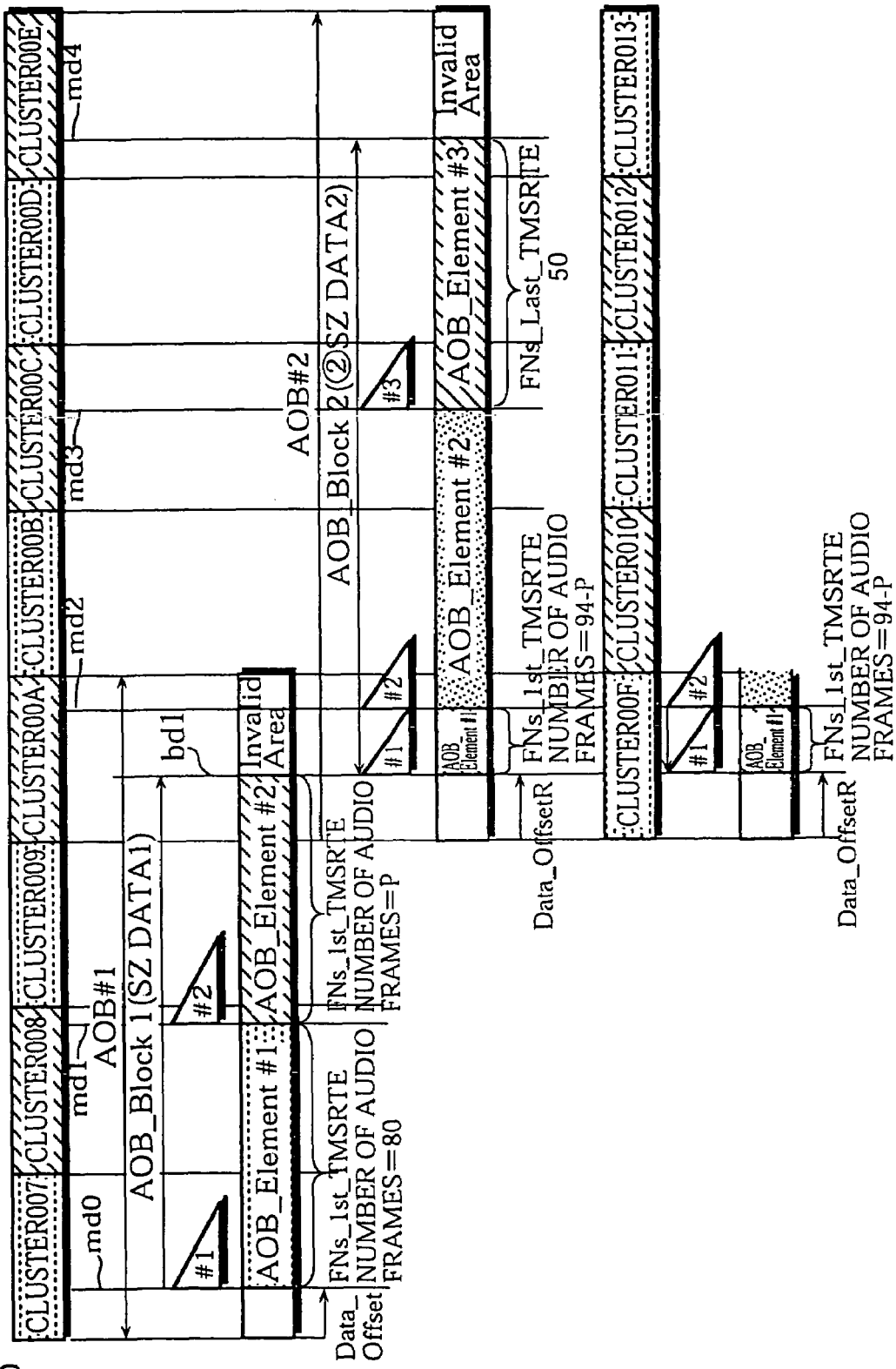
FIG. 36 shows how the BIT is set when an AOB is divided as shown in FIG. 35.

FIG. 36 shows how the BIT is set when an AOB is divided as shown in FIG. 35. The AOB shown in FIG. 35 is divided at the boundary bd1. The AOB#1 produced by this division includes the two AOB_ELEMENTs AOB_ELEMENT#1 and AOB_ELEMENT#2, while the other AOB#2 produced by this division includes the three AOB_ELEMENTs, AOB_ELEMENT#1, AOB_ELEMENT#2, and AOB_ELEMENT#3.

In FIG. 36, these AOB_ELEMENTs have also been given the triangular flags to shows the settings of the TMSRT_entries included in the TKIs corresponding to these AOBs. The explanation will first focus on AOB#1 which is obtained by this division. AOB_ELEMENT#1 and AOB_ELEMENT#2 that are included in AOB#1 occupy cluster 007 to cluster 00A, so that AOB#1 is handled as being the composite of cluster 007 to cluster 00A. AOB_ELEMENT#2 in AOB#1 has a data length that ends not at the end of cluster 00A, but at the boundary bd1 that is present within cluster 00A, so that the SZ_DATA for AOB#1 is given as the amount of data from the region md0 to the boundary bd1 in cluster 00A. The "FNs_1st_TMSRTE" for AOB#1 is the same as before division, while the "FNs Last_TMSRTE" for AOB#1 differs from the value used before division in that it now indicates the number of frames from the start of AOB_ELEMENT#2 before division to the boundary bd1.

The following describes AOB#2 which is obtained by this division. AOB_ELEMENT#1, AOB_ELEMENT#2, and AOB_ELEMENT#3 that are included in AOB#2 occupy cluster 00B to cluster 007. Cluster 00F includes a copy of the content of cluster 00A. The reason cluster 00F stores a copy of cluster 00A is that cluster 00A is occupied by AOB_ELEMENT#2 in AOB#1, so that it is necessary to assign a different cluster to AOB_ELEMENT#1 in AOB#2.

AOB_ELEMENT#1 in AOB#2 has a data length that starts not at the beginning of cluster 00F, but at the boundary bd1 that is present within cluster 00F, so that the SZ_DATA for AOB#2 is given as the amount of data from the start of cluster 00B to a point midway through cluster 00E plus the data length of the part of cluster 00F occupied by AOB_ELEMENT#1.

The part of AOB_ELEMENT#2 in AOB#1 that is included in the copy of cluster 00A stored in cluster 00F needs to be excluded from AOB#2, so that the DATA_Offset field in the BIT of AOB#2 is set at the size of the part of AOB_ELEMENT#2 in AOB#1 included in cluster 00F.

As can be seen from FIG. 36, the division of the AOB result in only the AOB_ELEMENT that includes the boundary for the division being divided into two and in the other AOB_ELEMENTs positioned before and after the divided AOB_ELEMENT remaining unchanged. As a result, the "FN_Last_TMSRTE" of AOB#2 is set at the same value for the "AOB_ELEMENT#3" before the division, and the "FNs_1st_TMSRTE" of AOB#2 is set at AOB_ELEMENT#1 of AOB#2, which is to say, the number of frames included in the part that follows the boundary once AOB_ELEMENT#2 has been divided.

{17-5_22-19_33A,B-4_37} Setting of the BIT

Figure 37:
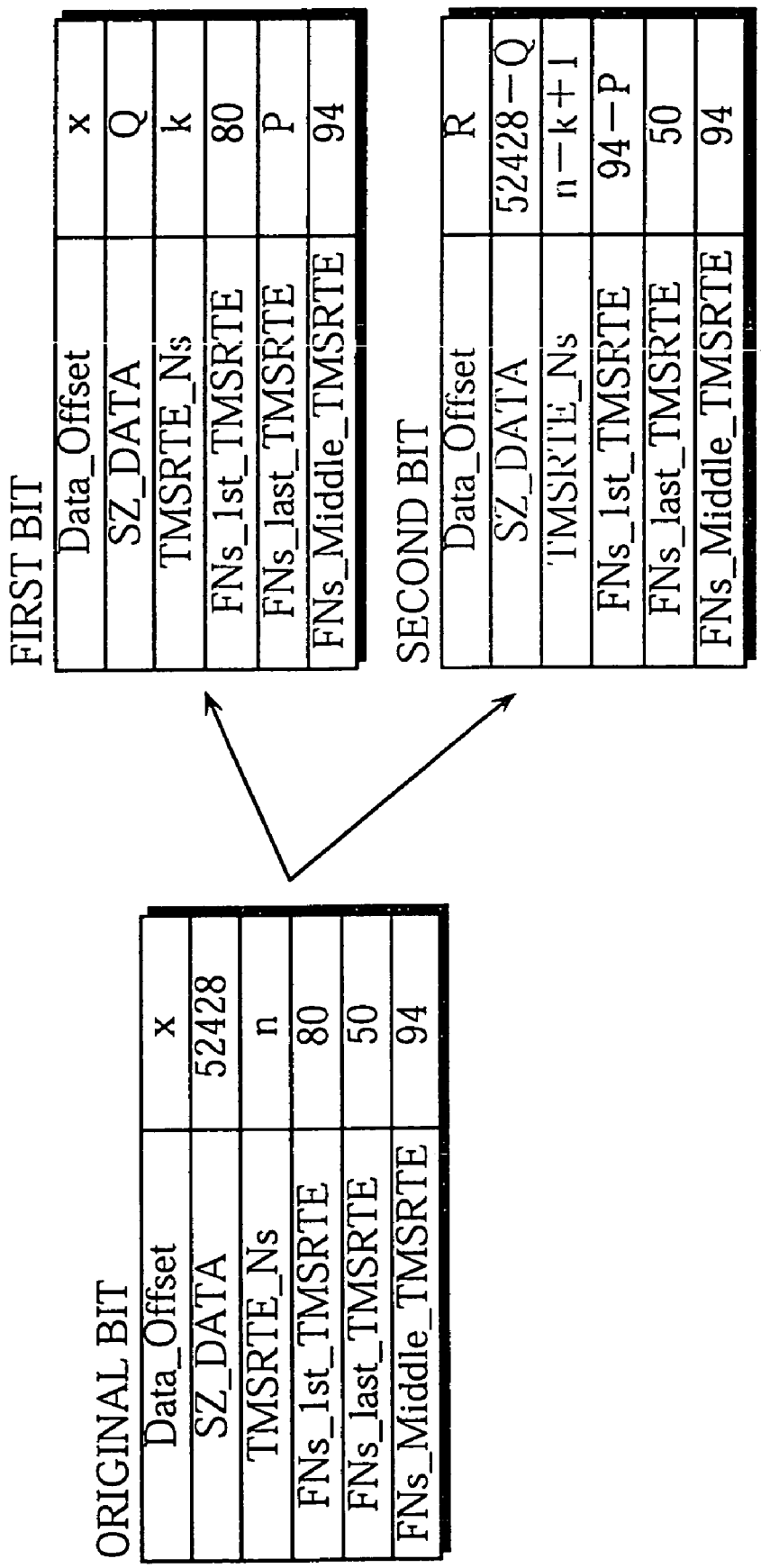
FIG. 37 shows a specific example of changes in the BIT before and after division.

FIG. 37 shows a more specific example of changes in the BITs as a result of the division of a track. The left side of FIG. 37 shows an example of the settings of the BIT before division. In this BIT, the Data_Offset is set as "X", the SZ_DATA is set at "52428", and the TMSRTE_Ns is set at "n". The FNs_1st_TMSRTE is set at "80 frames", the FNs_Middle_TMSRTE is set at "94 frames", and the FNs_Last_TMSRTE is set at "50 frames".

The right side of FIG. 37 shows the settings of two BITs produced by the division of a track. When the AOB corresponding to the BIT on the left side of FIG. 37 is divided as shown in FIG. 35A, the Data_Offset in the BIT of the first track produced by the division is set at "X" like the track before division", the "SZ_DATA" is updated to the data length "Q" from the start to the division point Q, and the TMSRTE_Ns is set at "k" which shows the number of TMSRT_entries from the first TMSRT_entry to the $k^{th}$ TMSRT_entry. The FNs_1st_TMSRTE and FNs_Middle_TMSRTE are respectively set at "80" and "94" frames in the same way as the BIT before division, but since the final AOB_ELEMENT in the AOB of the first track produced by the division includes "p" AOB_FRAMES, the FNs_Last_TMSRTE is set at "p frames."

In the BIT of the second track produced by the division, the "Data_Offset" is set at "R", the "SZ_DATA" is set at (original SZ#DATA "52428"-data length up to division point Q),and the TMSRTE_Ns is set at "n−k+1" produced by adding one (for the $k^{th}$ TMSRT_entry that is newly added as a result of the division) to the number of TMSRT_entries from the $k^{th}$ TMSRT_entry to the $n^{th}$ TMSRT_entry.

The FNs_Middle_TMSRTE and FNs_Last_TMSRTE are set at the same values as the BIT before division, which is to say, "94 frames" and "50 frames" respectively.

The first AOB_ELEMENT in the AOB of this second track includes "94-p" AOB_FRAMEs, so that "94-p" is set in the FNs_1st_TMSRTE of the BIT corresponding to this track.

{17-5_22-19_33A,B-5_38} Setting of the BIT

Figure 38:
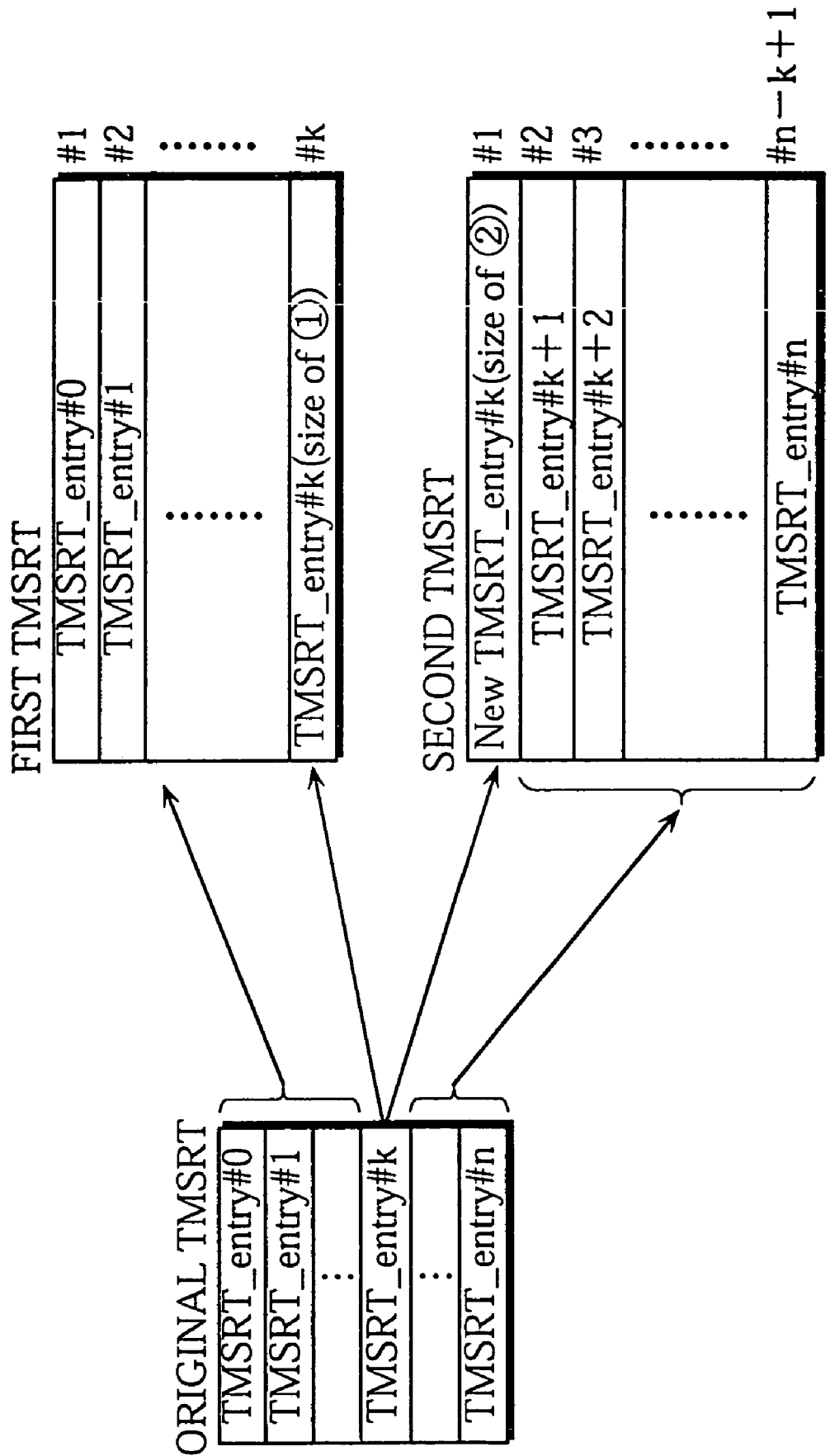
FIG. 38 shows a specific example of changes in the TKTMSRT before and after division.

FIG. 38 shows the TKTMSRT after division. The following explains the settings of the TMSRT first. The TMSRT of the first track includes the TMSRT_entries from the first TMSRT_entry of the AOB before division to the kth TMSRT_entry, which is to say, the TMSRT_entries #1 to #k.

It should be noted here that the AOB_ELEMENT#k that includes the boundary for the division only includes region (1), so that the $k^{th}$ TMSRT_entry only includes a data size corresponding to this region (1). The TMSRT of the second track includes the TMSRT_entries from the $k^{th}$ TMSRT_entry of the AOB before division to the $n^{th}$ TMSRT_entry, which is to say, the TMSRT_entries #k to #n. It should be noted here that the AOB_ELEMENT#k that includes the boundary for the division only includes region (2), so that the $k^{th}$ TMSRT_entry only includes a data size corresponding to this region (2).

The copying of the TKI is accompanied by the division and updating of the TKTMSRT and the BIT, and once the remaining information has been updated, the TKIs for the new tracks produced by the division will be complete. In the same way as when combining tracks, the AOB files are not decrypted, so that two tracks can be produced by dividing an AOB file in its encrypted state. Since the division of an AOB file does not involve decryption and re-encryption, the processing load of dividing a track can be suppressed. This means that tracks can be edited even by a playback apparatus with limited processing power.

This completes the explanation of the TKI. The following describes the Playlists.

{17-6} PlaylistManager

As shown by the broken lines h5 in FIG. 17, the PlaylistManager shown is made up of PlaylistManager_Information (PLMGI) for managing the Playlists stored in the flash memory card 31, Default_Playlist_Information (DPLI) for managing all of the track stored in the flash memory card 31, and PlaylistInformation (PLI) #1, #2, #3, #4 . . . #m. Each PLI is information for a user-defined Playlist. As shown by the broken lines h6, the DPLI is composed of Default_Playlist_General_Information (DPLGI) and Default_Playlist_Track_Search_Pointers (DPL_TK_SRP) #1, #2, #3, #4 . . . #m. As shown by the broken lines h7, each PLI is composed of Playlist_General_Information (PLGI), and Playlist_Track_Search_Pointers (PL_TK_SRP) #1, #2, #3, #4 . . . #m.

The DPLI referred to here differs from each PLI in the following way. While the DPLI has to indicate all of the tracks stored in the flash memory card 52, a PLI does not have this restriction and can indicate any number of the tracks. This opens up various possibilities for the user. As representative examples, the user can generate Playlist_Information indicating only his (her) favorite tracks and store this Playlist_Information in the flash memory card 31, or can have a playback apparatus automatically generate Playlist_Information that only indicates tracks of a certain genre, out of a plurality of tracks stored in the flash memory card 31, and store the resulting Playlist_Information in the flash memory card 31.

{17-7_18} Number of Playlists and Their Data Sizes

Figure 39:
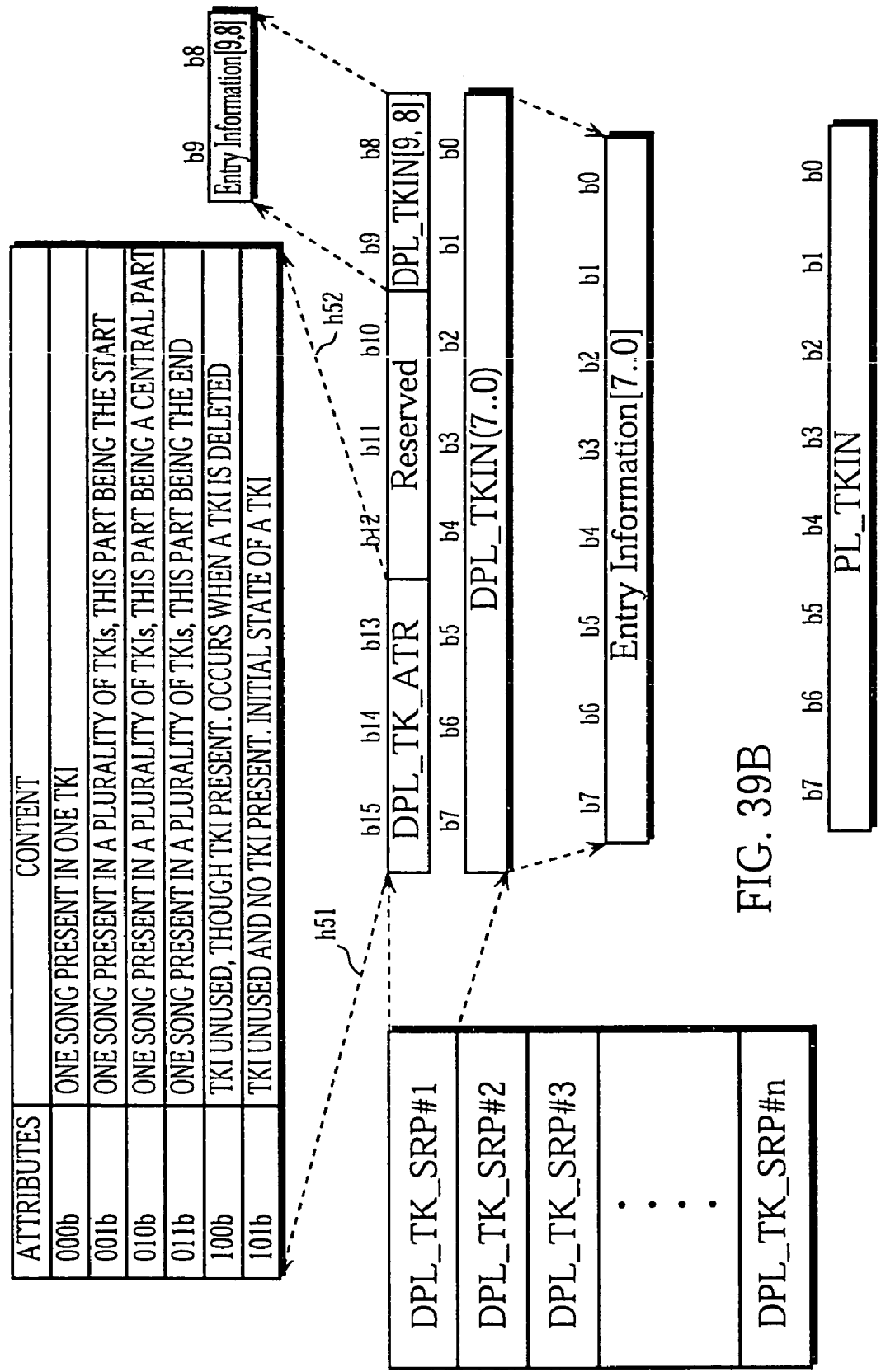
FIG. 39A shows the format of a DPL_TK_SRP.
FIG. 39B shows the format of a PL_TK_SRP.

As shown in FIG. 18, a maximum of 99 Playlists can be stored on one flash memory card 31. The combined data size of the PlaylistManager_Information (PLMGI) and the Default Playlist Information (DPLI) is also fixed at 2,560 bytes. Each PLI has a fixed length of 512 bytes. The "DPL_TK_SRP" included in the Default Playlist Information includes a "DPL_TK ATR" and a "DPL TKIN". On the other hand, the "PL_TK_SRP" field included in a PLI includes only a "PL_TK_SRP". The format of the DPL_TK_ATR, DPL_TKIN, and PL_TKIN fields is shown in FIG. 39.

{17-8_39-1} Format of DPL_TK_SRP

FIG. 39A shows the format of the DPL_TK_SRP. In FIG. 39A, the DPL_TKIN is written in the 0th to 9th bits in the DPL_TK_SRP, while the DPL_TK_ATR is written in the 13th to 15th bits. The 10th to 12th bits in the DPL_TK_SRP are reserved for future use.

The TKI number is written in the DPL_TKIN that occupies the 0th to 9th bits in the DPL_TK_SRP. This enables a TKI to be specified.

{17-9_39B} Format of the PL_TK_SRP

FIG. 39B shows the format of the PL_TK_SRP. This is a ten-bit field in which PL_TKIN, which is to say, a TKI number, is written.

{17-8_39A-2} Composition of DPL_TK_ATR The broken lines h51 and h52 that extend from the DPL_TK_ATR in FIG. 39A show an example setting of the DPL_TK_ATR. As can be seen from this drawing, the DPL_TK_ATR is set for a DPL_TK_SRP in the same way as TKI_BLK_ATR is set for a TKI, which is to say, the DPL_TK_ATR is set at one of "Track", "Head_of_Track" "Midpoint_of_Track", and "End_of_Track".

In more detail, when the TKI indicated by the TKIN is used and an Audio Object (AOB) corresponding to one complete track is recorded in the AOB file corresponding to the indicated TKI (i.e., when the TKI_BLK_ATR of the TKI is "Track"), the value "00b" is set in the "DPL_TK_ATR".

When the TKI indicated by the TKIN is used and an Audio Object (AOB) corresponding to only the start of a track is recorded in the AOB file corresponding to the indicated TKI (i.e., when the TKI_BLK_ATR of the TKI is "Head_of Track"), the value "001b" is set in the "DPL_TK_ATR". When the TKI indicated by the TKIN is used and an Audio Object (AOB) corresponding to a midway part track is recorded in the AOB file corresponding to the indicated TKI (i.e., when the TKI_BLK_ATR of the TKI is "Midpoint_of_Track"), the value "010b" is set in the "DPL_T-K_ATR". When the TKI indicated by the TKIN is used and an Audio Object (AOB) corresponding to an end part of a track is recorded in the AOB file corresponding to the indicated TKI (i.e., when the TKI_BLK_ATR of the TKI is "End_ of_Track"), the value "011b" is set in the "DPL_TK_ATR".

Conversely, when the TKI indicated by the TKIN is unused and the TKI region is merely established, which corresponds to when a TKI has been deleted (i.e., when the TKI_BLK_ ATR of the TKI is "Unused"), the value "100b" is set in the DPL_TK_ATR.

When the TKI indicated by the TKIN is unused and no TKI region has been established, which is to say, when a TKI is in an initial state, the value "101b" is set in the "DPL_T-K_ATR".

Since the number of a TKI is written in the DPL_TKIN, it is clear which of the plurality of TKI corresponds to each DPL_TK_SRP. The position of the DPL_TK_SRP in the Default_Playlist_Information shows when the AOB corresponding to the TKI that in turn corresponds to the DPL_TK_ SRP will be played back, i.e., the ordinal position of the AOB in the Default_Playlist. As a result, the order of the DPL_TK_ SRP items in the Default_Playlist denotes the order in which a plurality of tracks will be played, or in other words, determines the playback order of tracks.

Figure 40:
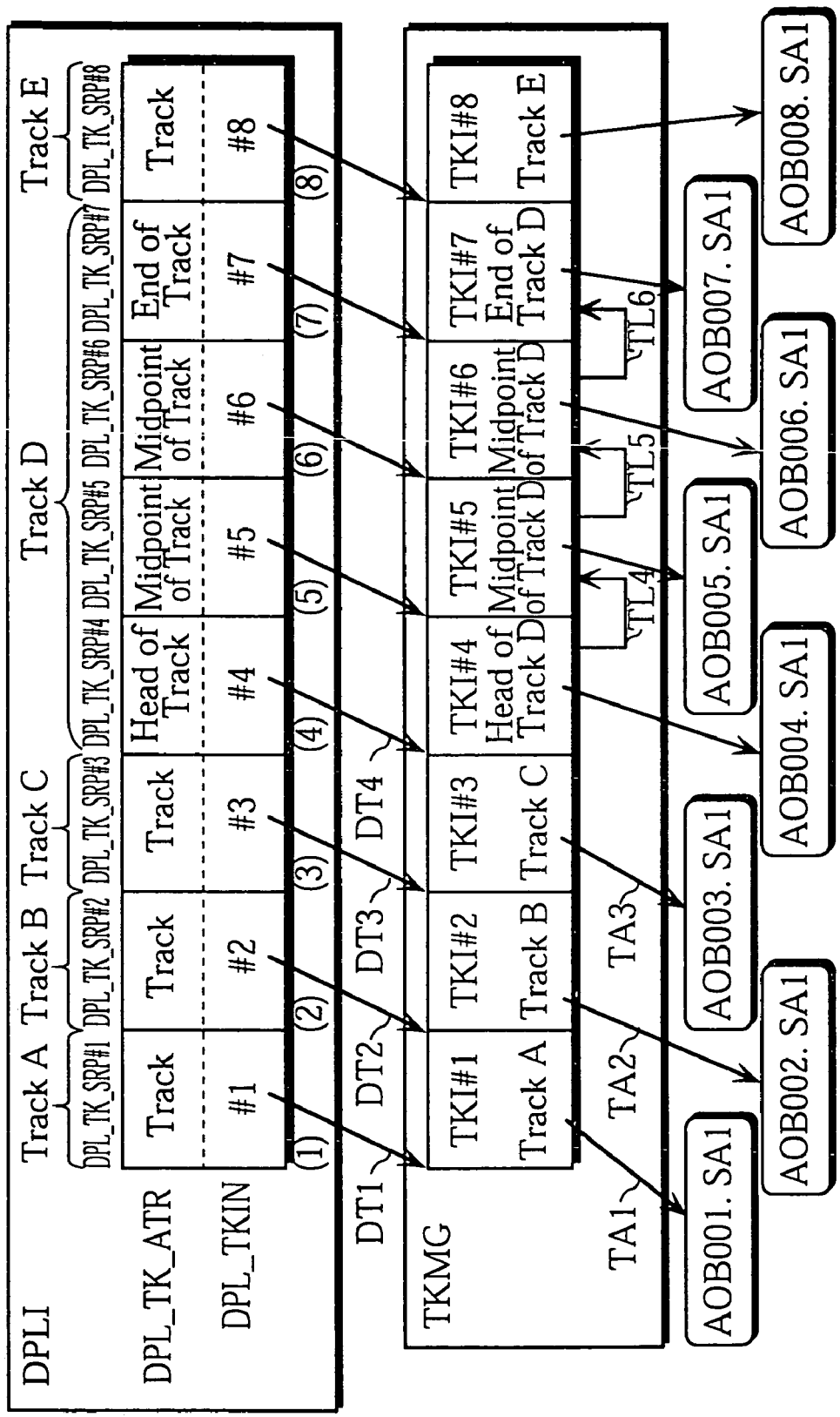
FIG. 40 shows the interrelation between the Default_Playlist_Information, the TKIs, and the AOB files.

{17-9_40-1} Interrelationship between the Default_Playlist Information, TKI, and AOB files FIG. 40 shows the interrelationship between the Default_ Playlist_Information, the TKI, and the AOB files. The second, third, and fourth levels in this drawing are the same as the first, second, and third levels in FIG. 19, and so show a TrackManager including eight TKI and eight AOB files. FIG. 40 differs from FIG. 19 in that a box showing the Default_Playlist_Information is given on the first level. The eight small divisions shown in this box show the eight DPL_TK_SRP included in the Default_Playlist_Information. The upper part of each division shows the DPL_TK_ATR, while the lower part shows the DPL_TKIN.

As shown by the arrows DT1, DT2, DT3, DT4 . . . in FIG. 40, DPL_TK_SRP#1 and TKI#1 are related, as are DPL_TK_SRP#2 and TKI#2, DPL_TK_SRP#3 and TKI#3, and DPL_TK_SRP#4 and TKI#4.

Looking at the DPL_TK_ATR fields in the DPL_TK_SRP, it can be seen that "Track" has been set for each of DPL_TK_ SRP#1, DPL_TK_SRP#2, DPL_TK_SRP#3, and DPL_TK_ SRP#8. In other words, the four combinations DPL_TK_SRP#1→TKI#1("AOB001.SA1"), DPL_TK_SRP#2→TKI#2 ("AOB002.SA1"), DPL_TK_SRP#3→TKI#3("AOB003.SA1"), DPL_TK_→SRP#8→TKI#8("AOB008.SA1") correspond to four separate tracks.

Meanwhile, none of DPL_TK_SRP#4, DPL_TK_SRP#5, DPL_TK_SRP#6, and DPL_TK_SRP#7 has a DPL_T-K_ATR set as "Track". Instead, the DPL_TK_SRP#4 of DPL_TK_ATR is set at "Head_of_Track", the DPL_T-K_ATR of DPL_TK_SRP#7 is set at "End_of_Track" and the DPL_TK_ATRs of DPL_TK_SRP#5 and DPL_TK_SRP#6 are set at "Midpoint_of_Track".

This means that TKI#4 ("AOB004.SA1"), which is related to DPL_TK_SRP#4, is the start of a track, TKI#5 ("AOB005.SA1") and TKI#6("AOB006.SA1"), which are respectively related to DPL_TK_SRP#5 and DPL_TK_ SRP#6, are middle parts of a track, and TKI#7 (("AOB007.SA1"), which is related to DPL_TK_SRP#7, is the end of a track.

The DPL_TK_SRP entries in the DefaultPlaylist show in what order the AOBs corresponding to each TKI are to be played back. The DPL_TKINs of DPL_TK_SRP#1, #2, #3, #4 . . . #8 in the DefaultPlaylist of FIG. 40 indicate TKI#1, #2, #3, #4 . . . #8. As shown by the arrows (1) (2) (3) (4) . . . (8), the AOB file "AOB001.SA1" corresponding to TKI#1 will be played back first, "AOB002.SA1" corresponding to TKI#2 will be played back second, "AOB003.SA1" corresponding to TKI#3 will be played back third, and "AOB004.SA1" corresponding to TKI#4 will be played back fourth.

{17-10_41} Example Settings for the DefaultPlaylist and Playlist_Information

Figure 41:
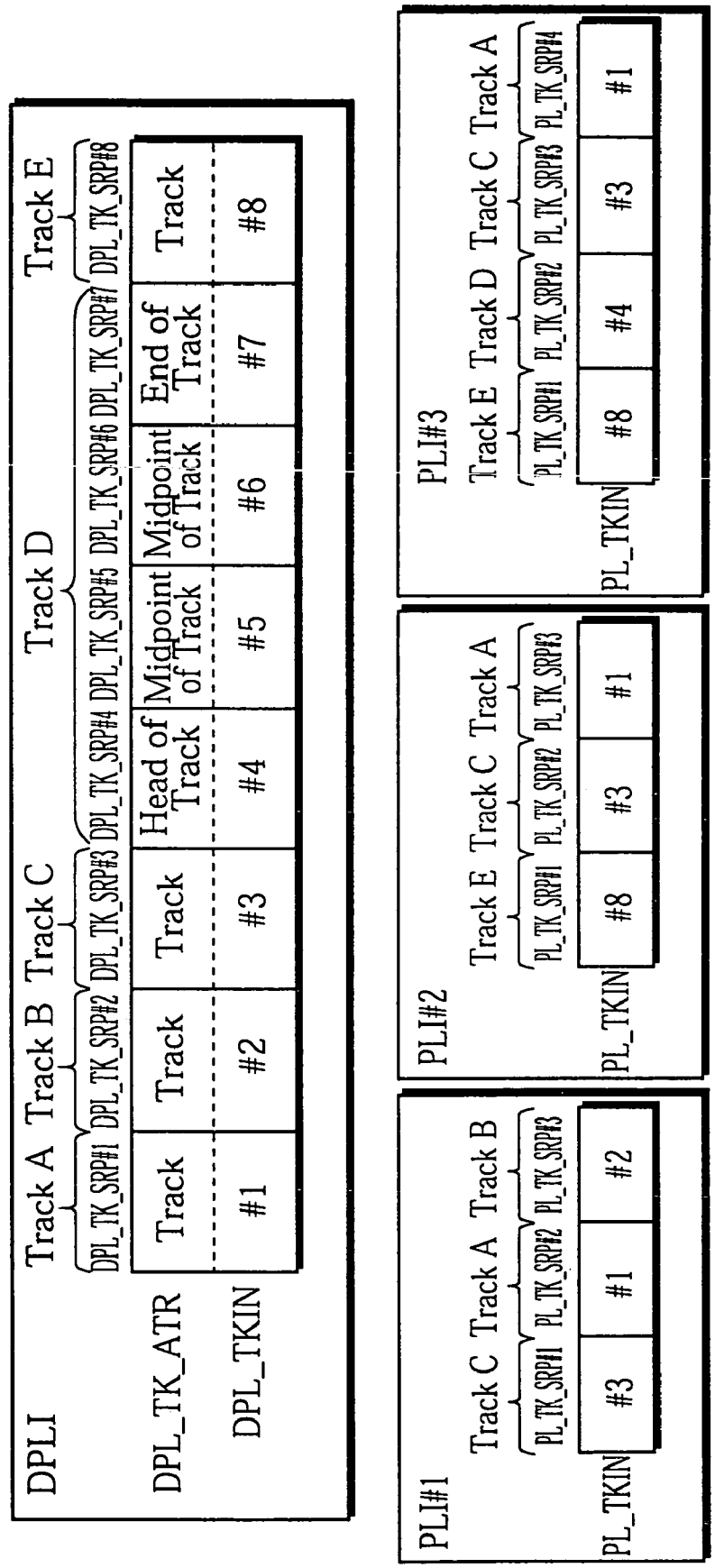
FIG. 41 shows example settings for the Default_Playlist and several PLIs.

FIG. 41 shows example settings for the Default_Playlist and the Playlist_Information using the same notation as FIG. 40. In FIG. 41, the box on the first level shows the Default_ Playlist, while the three boxes on the second level show the PLIs.

The small divisions in the box showing the Default_Playlist shows the eight DPL_TK_SRP values included in the Default_Playlist, while the small divisions in the boxes illustrating each PLI show three or four PL_TK_SRP values. The setting of the TKIN of each DPL_TK_SRP included in the Default_Playlist_Information is the same as in FIG. 40. However, the settings of the TKIN of the PL_TK SRP included in each PLI are completely different to those in the DPL_TK_ SRP.

{17-10_42} Correspondence between the DPL_TK_SRP and the TKI

Figure 42:
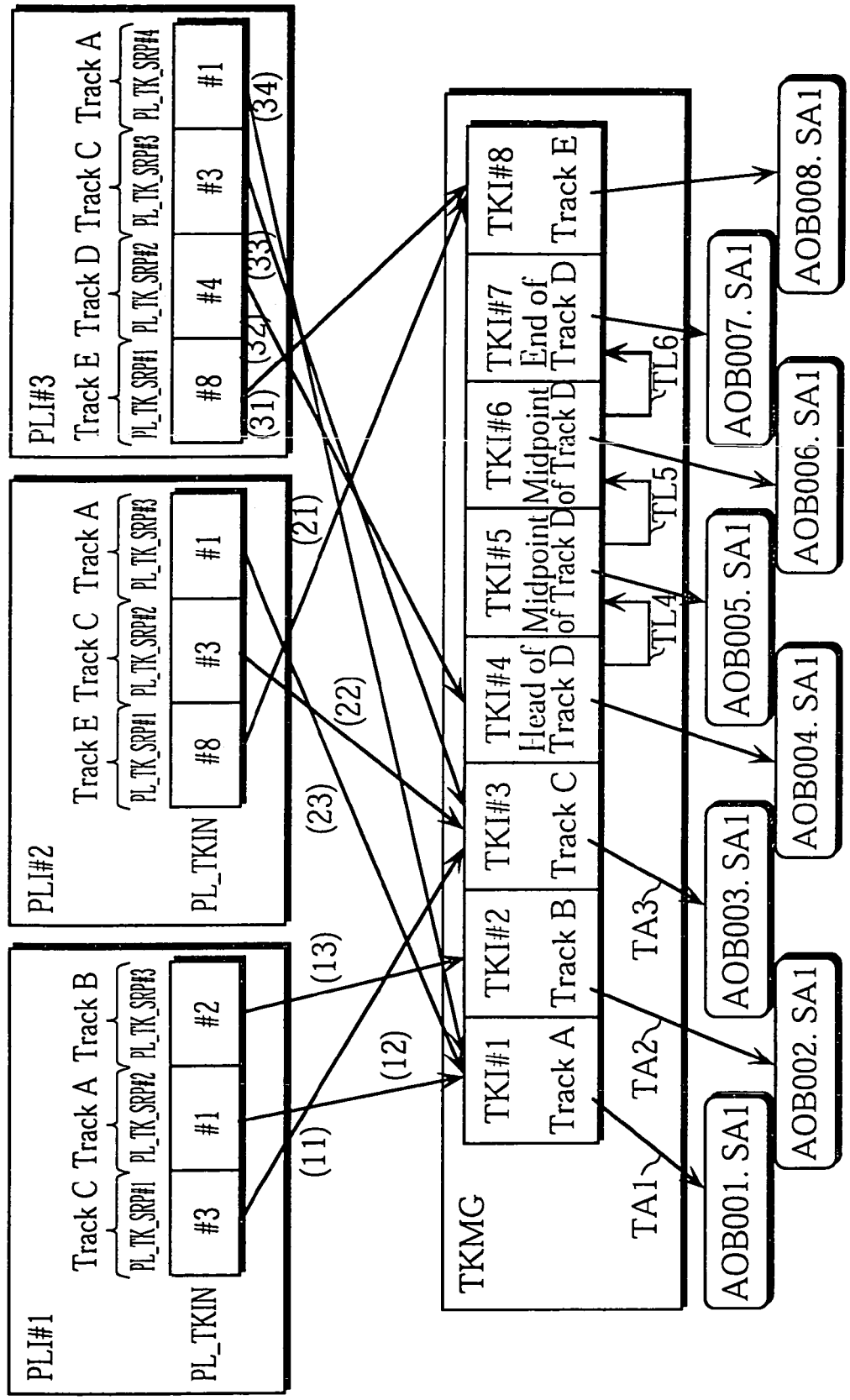
FIG. 42 shows how the DPL_TK_SRPs correspond to TKIs using the same notation as FIG. 40.

FIG. 42 shows the correspondence between the DPL_TK SRP and the TKI using the same notation as in FIG. 40. In FIG. 42, Playlist#1 is composed of PL_TK_SRP#1, #2,#3. Of these, #3 is written as the PL_TKIN of PL_TK_SRP#1, while #1 is written as the PL_TKIN of PL_TK_SRP#2 and #2 as the PL_TKIN of PL_TK_SRP#3. This means that when tracks are played back according to Playlist#1, a plurality of AOBs will be played back as shown by the arrows (11) (12) (13) in the order AOB#3, AOB#1, AOB#2.

Playlist#2 is composed of PL_TK_SRP#1, #2, #3. Of these, #8 is written as the PL_TKIN of PL_TK_SRP#1, while #3 is written as the PL_TKIN of PL_TK_SRP#2 and #1 as the PL_TKIN of PL_TK SRP#3. This means that when tracks are played back according to Playlist#2, a plurality of AOBs will be played back, as shown by the arrows (21) (22) (23) in the order AOB#8, AOB#3, AOB#1, which is to say, in a completely different order to Playlist#1.

Playlist#3 is composed of PL_TK_SRP#1, #2, #3, #4. the PL_TKIN of these PL_TK_SRP#1 to #4 are respectively set as #8, #4, #3, and #1. This means that when tracks are played back according to Playlist#3, a plurality of AOBs will be played back as follows. First, AOB#8 that composes TrackE is played back as shown by the arrow (31). Next, AOB#4, AOB#5, AOB#6, and AOB#7 that compose TrackD are played back as shown by the arrow (32). After this, AOB#3 and AOB#1 that respectively compose TrackC and TrackA are played back as shown by the arrows (33) and (34).

Of special note here is that when a track is composed of a plurality of TKI, only the TKI number of the start of the track is written into the PL_TK_SRP entry. In more detail, while the DPL_TK_SRP values given in the Default_Playlist_Information specifies the four TKIs (TKI#4,TKI#5,TKI#6, TKI#7) that compose TrackD, the PL_TK_SRP given in a set of Playlist_Information does not need to indicate all four TKIS. For this reason, PL_TK_SRP#2 in Playlist#3 only indicates TKI#4 out of TKI#4 to TKI#7.

On the other hand, a DPLI including a plurality of DK_TK_SRP has a data size that is no greater than one sector and is always loaded into the RAM of a playback apparatus. When tracks are played back according to a Playlist, the playback apparatus refers to the DK_TK_SRPs that are loaded into its RAM and so can search for TKIs at high speed. To play back TKIs (AOBs) using a PL_TK_SRP that only indicates the TKI number of the first TKI, a playback apparatus searches the DPL_TK_SRP loaded in its RAM based on the TKI indicated by the PL_TK_SRP and judges whether the current track is composed of a plurality of TKI. If so, the playback apparatus executes the appropriate procedure for playing back all of the corresponding TKIs (AOBs).

As described above, the Default_Playlist and a plurality of PLIs are written in the Playlist_Manager. If different playback orders are written in the DPL_TKINs and PL_TKINs of the DPL_TK_SRPs and PL_TK_SRPs composing such playlists, it becomes possible to play back AOBs in different orders. By offering a variety of playback orders to the user in this way, the user can be given the impression of there being a number of music albums stored in the flash memory card 31.

Of special note here is that the data size of the DPL_TK_SRP corresponding to an AOB file is small (at no more than two bytes), while the data size of the TKI corresponding to an AOB file is large (at up to 1,024 bytes) When reordering the TKI in the TrackManager, a large number of accesses need to be made to the flash memory card 31, but when the DPL_TK_SRPs are reordered in the Default_Playlist_Information or a PLI, this can be performed with fewer accesses to the flash memory card 31.

In view of this, when the navigation data is edited, the order of the DPL_TK_SRPs in the Default_Playlist is actively changed in accordance with the editing operation, while the order of the TKI in the TrackManager is left unchanged in spite of the editing operation.

{17-9_40-2_43A,B} Reordering of the DPL_TK_SRP

Figure 43A:
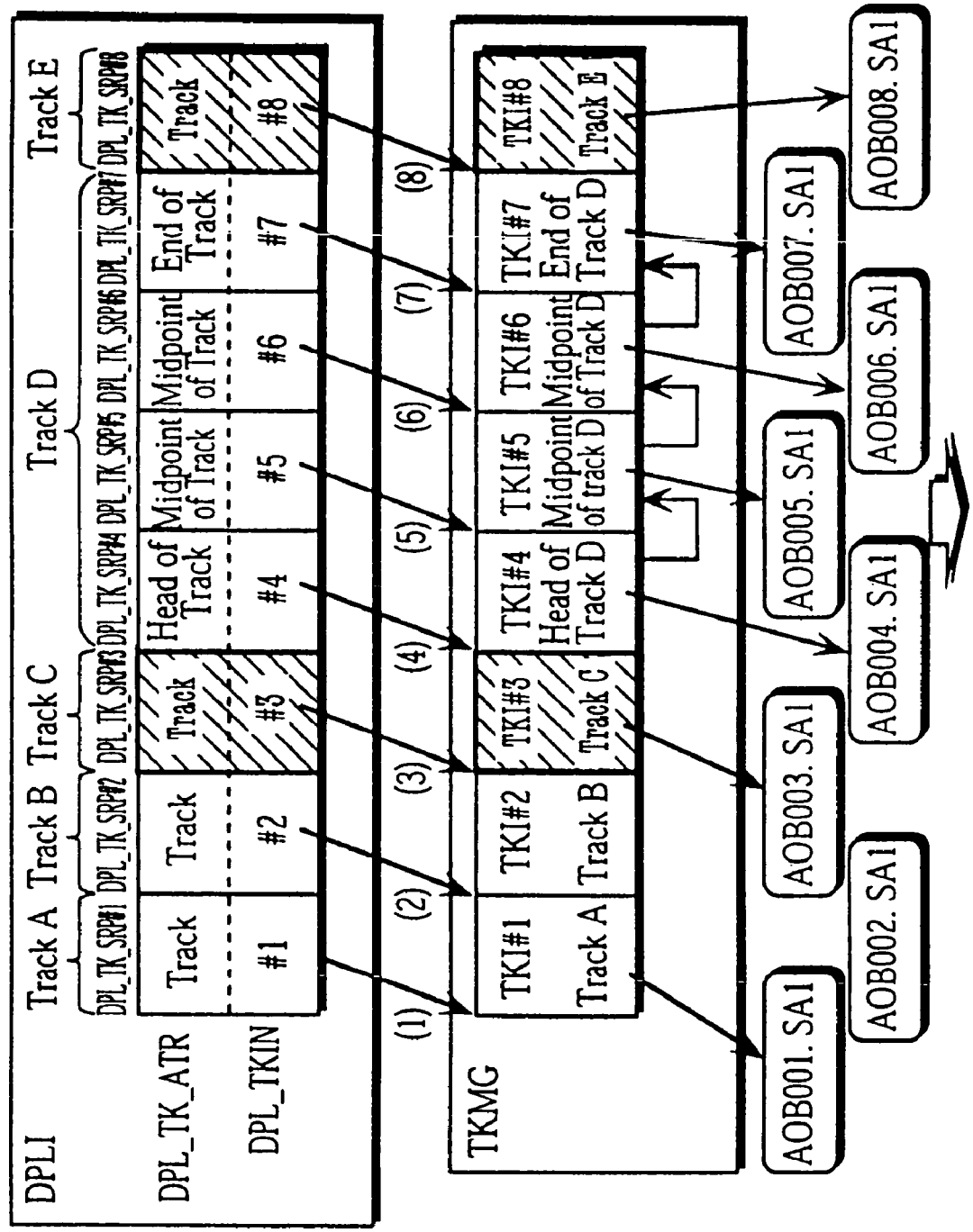
FIGS. 43A and 43B show how the order of tracks is rearranged.
Figure 43B:
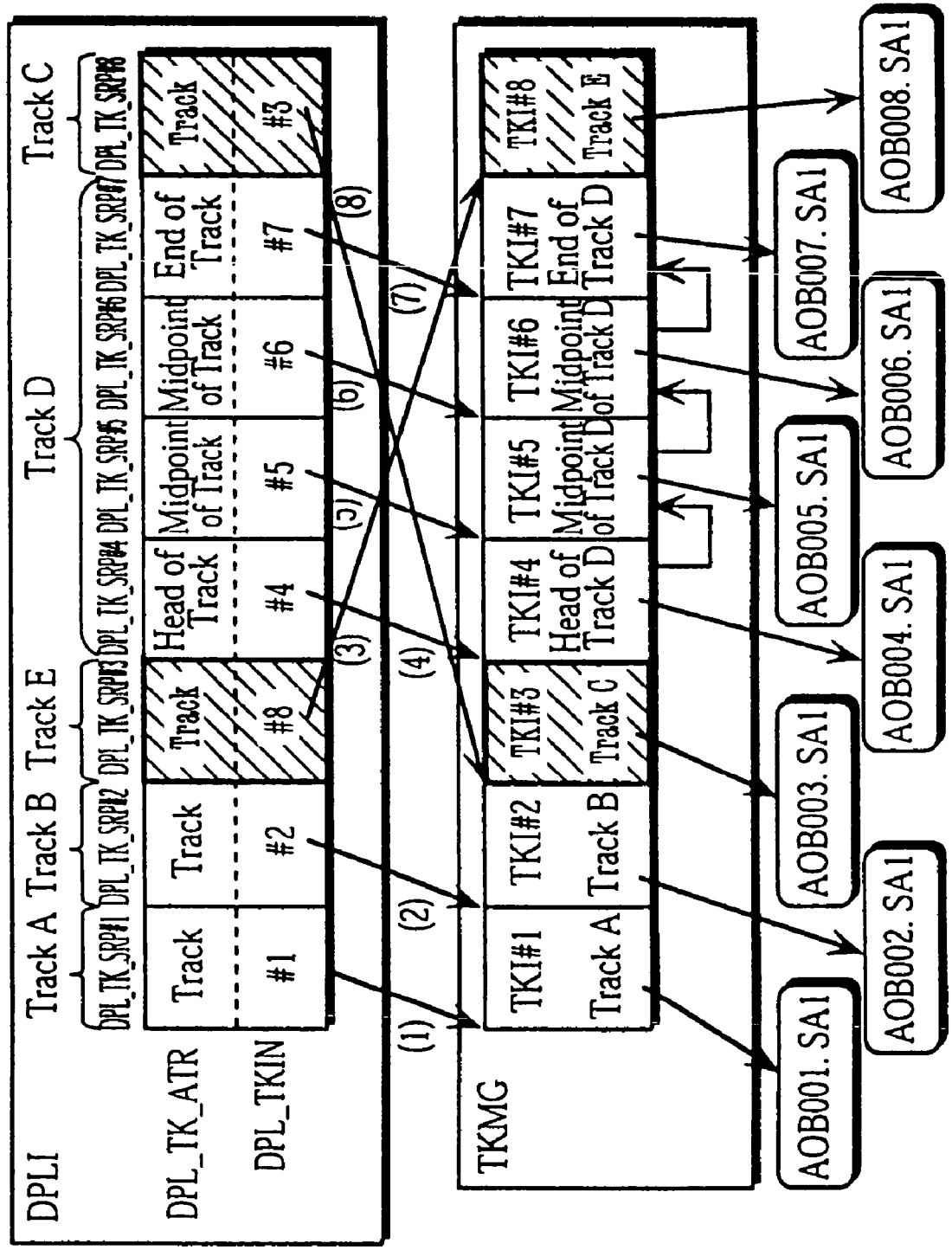

The following describes an editing operation that changes the playback order of tracks by reordering the DPL_TK SRPs in the Default_Playlist_Information. FIGS. 43A and 43B show one example of the reordering of tracks. The settings of the DPL_TK_SRPs and TKIs in FIG. 43A are the same as in FIG. 40.

In FIG. 40A, the DPL_TKIN in DPL_TK_SRP#3 is set at TKI#3, while the DPL_TKIN in DPL_TK_SRP#8 is set at TKI#8. The following describes the case when these DPL_TK_SRPs with the thick outlines in FIG. 40A are interchanged.

The numbers (1) (2) (3) (4) (5) (6) (7) (8) in FIG. 43B show the playback order of tracks after this editing operation. It should be noted here that while the playback order shown in FIG. 43A is TrackA, TrackB, TrackC, TrackD, TrackE, in FIG. 43B the DPL_TKINs of DPL_TK_SRP#3 and DPL_TK_SRP#8 are interchanged in the Default_Playlist_Information, so that the tracks will be played back in the order TrackA, TrackB, TrackE, TrackD, TrackC. In this way, the playback order of tracks can be easily changed by changing the order of the DPL_TK SRPs in the Default_Playlist_Information.

While the above explanation deals with an editing operation that changes the order of tracks, the following will describe the following four operations that were explained with respect to the changes in the TKIs. These operations are a first case (case1) where a track is deleted, a second case (case2) where a new track is recorded, a third case (case3) where two freely selected tracks are combined to produce a new track, and a fourth case (case4) where a track is divided to produce two new tracks.

{17-9_40-3_44A,B} Deletion of a Track

The following describes case1 where a track is deleted.

Figure 44A:
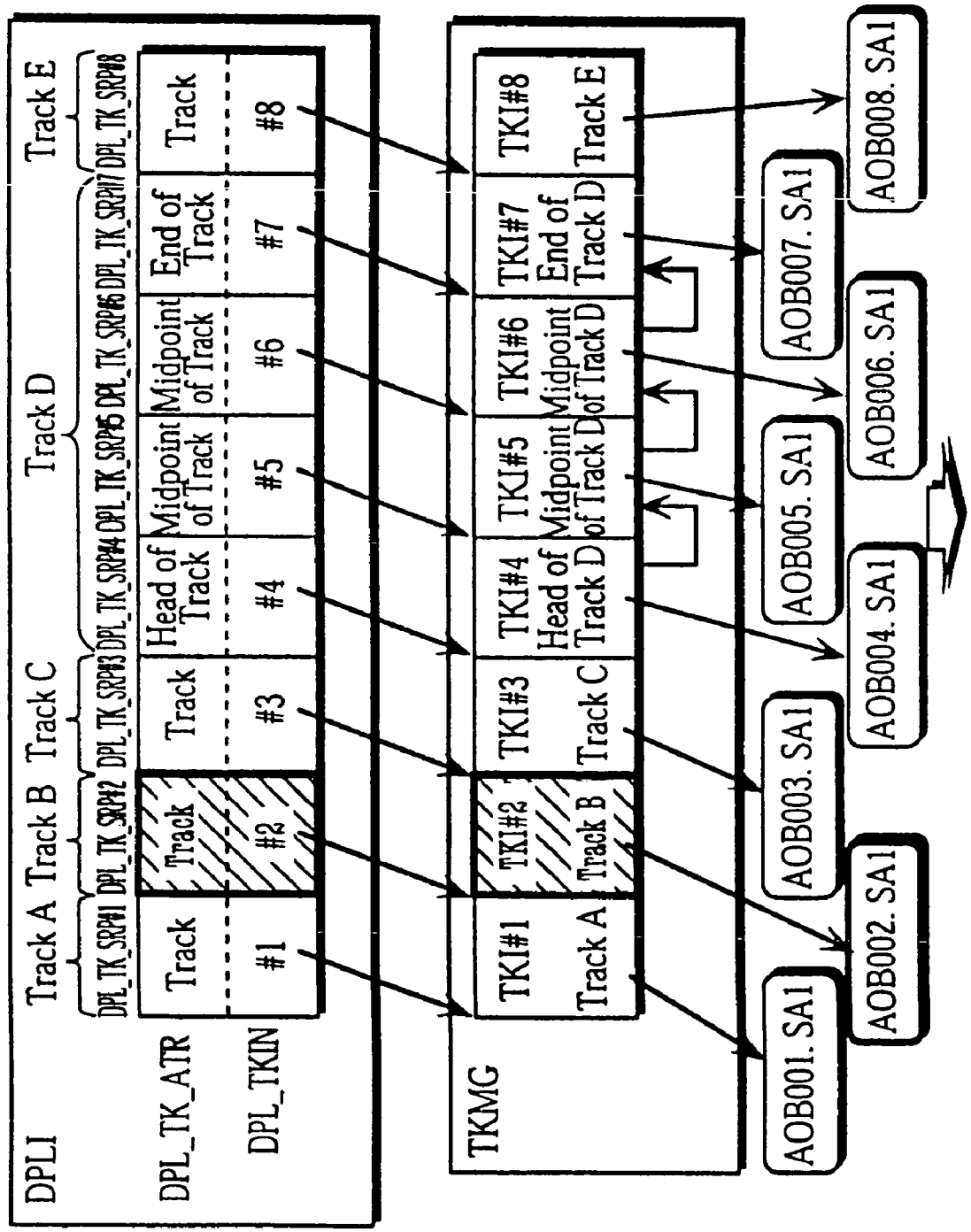
FIGS. 44A and 44B show how the Default_Playlist, TrackManager, and AOB files will be updated when DPL_TK_SRP#2 and TKI#2 are deleted from the Default_Playlist shown in FIG. 40.
Figure 44B:
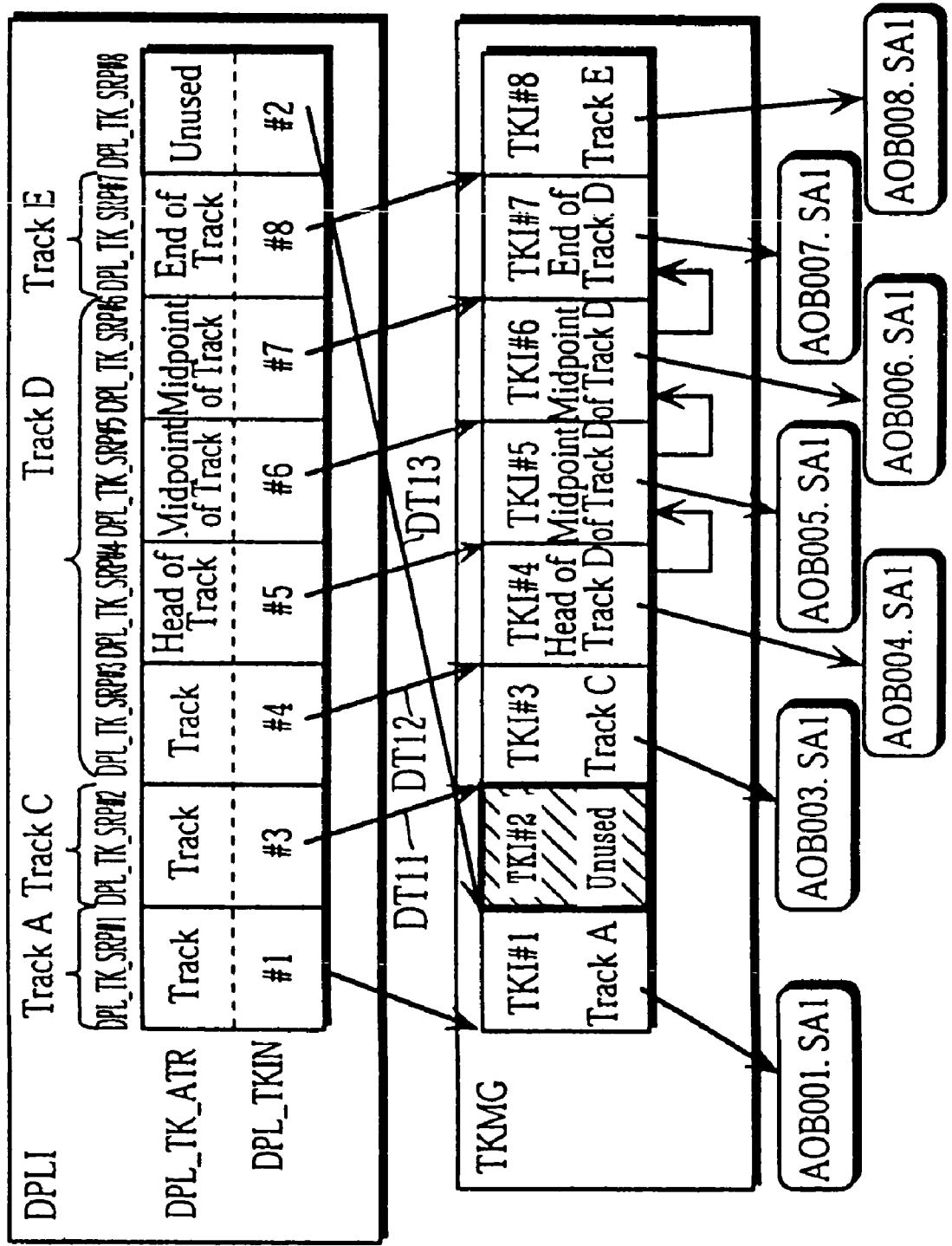

FIGS. 44A and 44B show how the Default_Playlist, TrackManager, and AOB files are updated when, out of the DefaultPlaylist shown in FIG. 40, DPL_TK_SRP#2 and TKI#2 are deleted. In these drawings, the same part of an AOB is deleted as in FIG. 27 that was used to describe the deletion of a TKI. As a result, the second, third, and fourth levels in FIGS. 44A and 44B are the same as in FIG. 27. The difference with FIG. 27 is that Default_Playlist Information including a plurality of DPL_TK_SRPs is given on the first level, in the same way as FIG. 40.

The present example deals with the case when the user deletes TrackB composed of DPL_TK_SRP#2_TKI#2 ("AOB002.SA1") that is shown with the thick outline in FIG. 44A. In this case, DPL_TK_SRP#2 is deleted from Default_Playlist_Information and DPL_TK_SRP#3 to DPL_TK_SRP#8 are each moved up by one place in the playback order so as to fill the place in the order freed by the deletion of DPL_TK_SRP#2.

When the DPL_TK_SRPs are moved up in this way, the final DPL_TK_SRP#8 is set as "Unused". On the other hand, the TKI corresponding to the deleted part is set as "Unused" as shown in FIGS. 27A and 27B without other TKIs being moved to fill the gap created by the deletion. Deletion of the TKI is also accompanied by the deletion of the AOB file "AOB002.SA1".

In this way, DPL_TK_SRPs are moved up in the playback order but TKIs are not moved, so that in FIG. 44B only the DPL_TKINs in the DPL_TK_SRPs are updated. For this example, the DPL_TKIN in DPL_TK_SRP#2 is set so as to indicate TKI#3 as shown by the arrow DT11, the DPL_TKIN in DPL_TK_SRP#3 is set so as to indicate TKI#4 as shown by the arrow DT12, the DPL_TKIN in DPL_TK_SRP#4 is set so as to indicate TKI#5, and the DPL_TKIN in DPL_TK_SRP#5 is set so as to indicate TKI#6. The DPL_TKIN in DPL_TK_SRP#8 that has been set at "Unused" is set so as to indicate TKI#2, as shown by the arrow DT13.

When a track is deleted, the DPL_TK_SRP used for following tracks in the playback order are moved up, while the TKI corresponding to the deleted track is set at "Unused" while remaining in its present position. In this way, an editing operation is not accompanied by movement of TKIs, which suppresses the processing load when editing tracks.

{17-9_40-4_45A,B} Assignment of TKIs when Recording Tracks

Figure 45A:
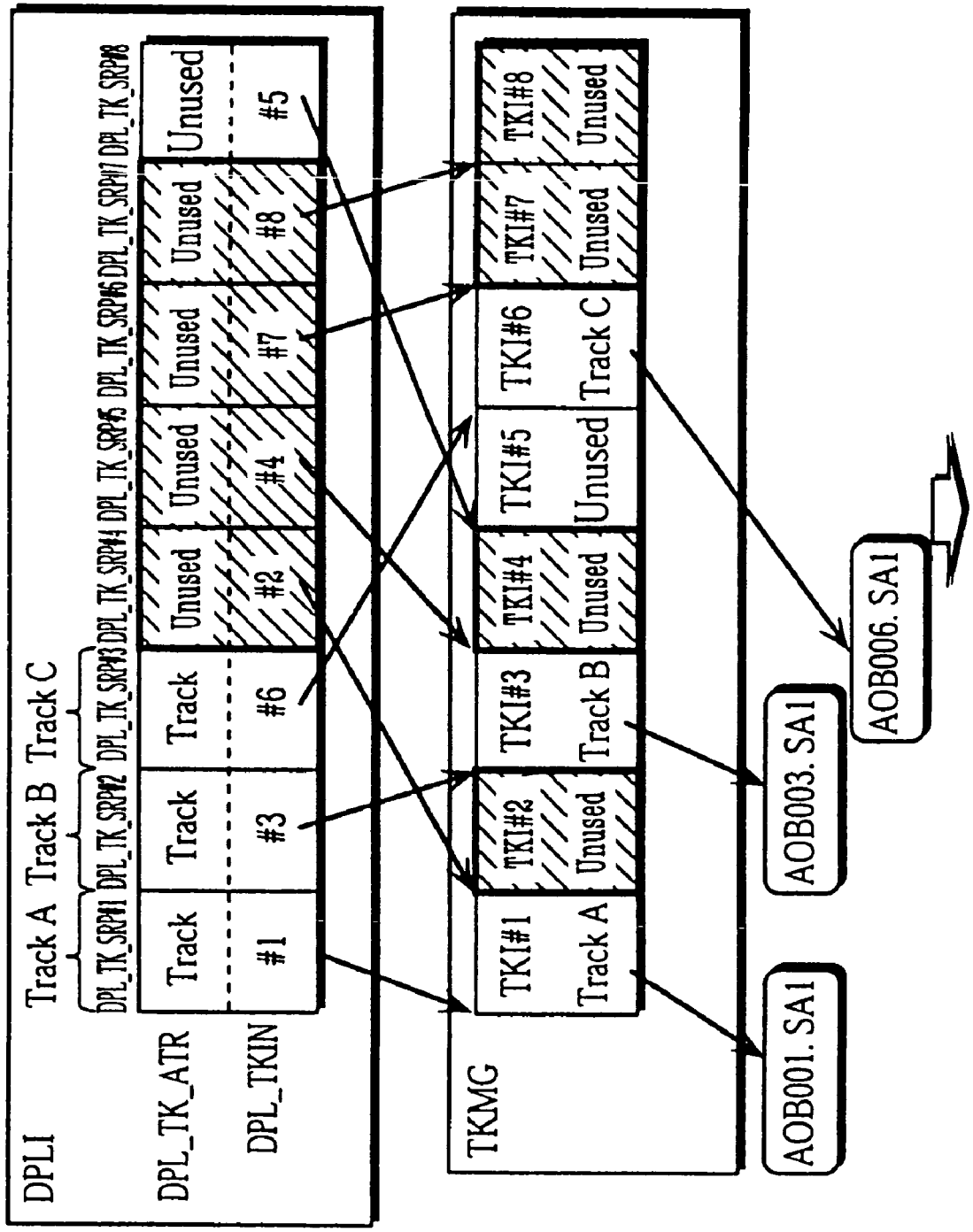
FIGS. 45A and 45B show how a new TKI and DPL_TK_SRP are written when an "Unused" TKI and DPL_TK_SRP are present.
Figure 45B:
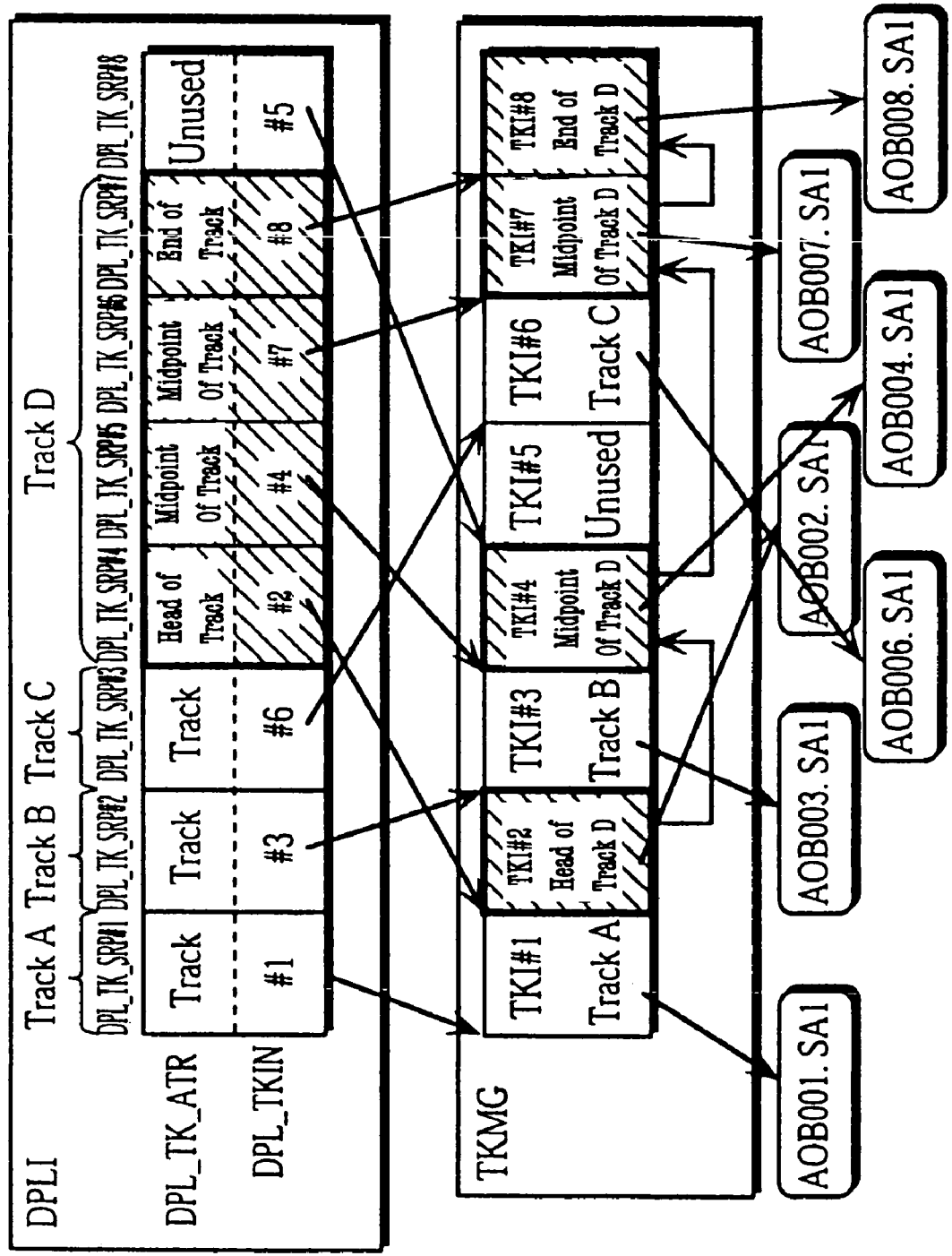

The following describes case2 when a new track is recorded following the partial deletion of a track. FIGS. 45A and 45B show how an operation that writes a new TKI and DPL_TK_SRP is performed when an "Unused" TKI and DPL_TK_SRP are present.

These drawings are largely the same as FIGS. 28A and 28B that were used to explain the assignment of a new TKI to a TKI set at "Unused". The second, third, and fourth levels in FIGS. 45A and 45B are the same as the first three levels in FIGS. 28A and 28B. The difference between these drawings is that the first levels in FIGS. 45A and 45B show the Default_Playlist_Information composed of a plurality of DPL_TK_SRP. In FIG. 45A, the DPL_TK_SRP#4 to DPL_TK_SRP#8 are set as "Unused". On the other hand, in FIG. 28 the TKI#2, TKI#4, TKI#5, TKI#7, TKI#8 are set as "Unused".

While TKIs set at "Unused" are present here and there in the TrackManager, the "Unused" DPL_TK_SRPs are positioned next to one another in the Default_Playlist_Information. This results from the used DPL_TK_SRPs being moved up in the Default_Playlist_Information as described above, while no such moving up is performed for TKIs.

The following explanation describes the case when TrackD composed of four AOBs is written. The TKIs for these four AOBs are respectively written into the following "Unused" TKIs in the TrackManager: TKI#2; TKI#4; TKI#7; and TKI#8.

The DPL_TK_SRPs for these four AOBs are written in DPL_TK_SRP#4 to DPL_TK_SRP#7 in the Default_Playlist_Information. Since these four AOBs compose a single track, the DPL_TK_ATR of DPL_TK_SRP#4 is set at "Head_of_Track", the DPL_TK_ATRs of DPL_TK_SRP#5 and DPL_TK_SRP#6 are set at "Middle_of_Track", and the DPL_TK_ATR of DPL_TK_SRP#7 is set at "End_of_Track".

The DPL_TKIN of DPL_TK_SRP#4 is set at TKI#2, the DPL_TKIN of DPL_TK_SRP#5 at TKI#4, the DPL_TKIN of DPL_TK_SRP#6 at TKI#7, and the DPL_TKIN of DPL_TK_SRP#7 at TKI#8.

By setting the DPL_TKINs and DPL_TK_ATRs in this way, TKI#2, TKI#4, TKI#7 and TKI#8 are managed as the fourth track TrackD.

In the above processing, a write is performed for "Unused" TKIs, though this has no effect on the other TKIs TKI#1, TKI#2, TKI#3, and TKI#4, as was also the case in FIGS. 28A and 28B.

{17-9_40-5_46A,B} Case3: Combining Tracks

Figure 46A:
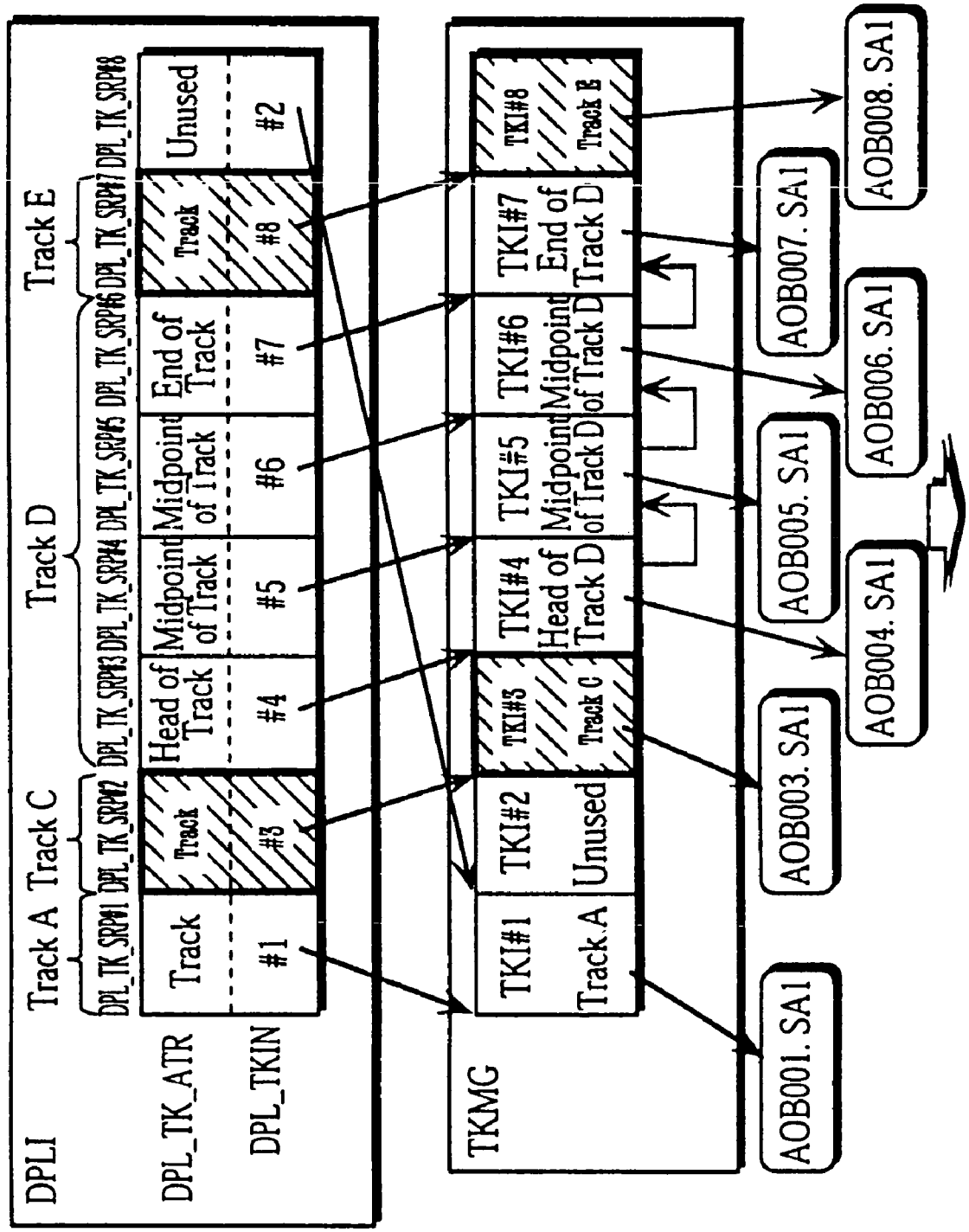
FIGS. 46A and 46B show how tracks are combined.
Figure 46B:
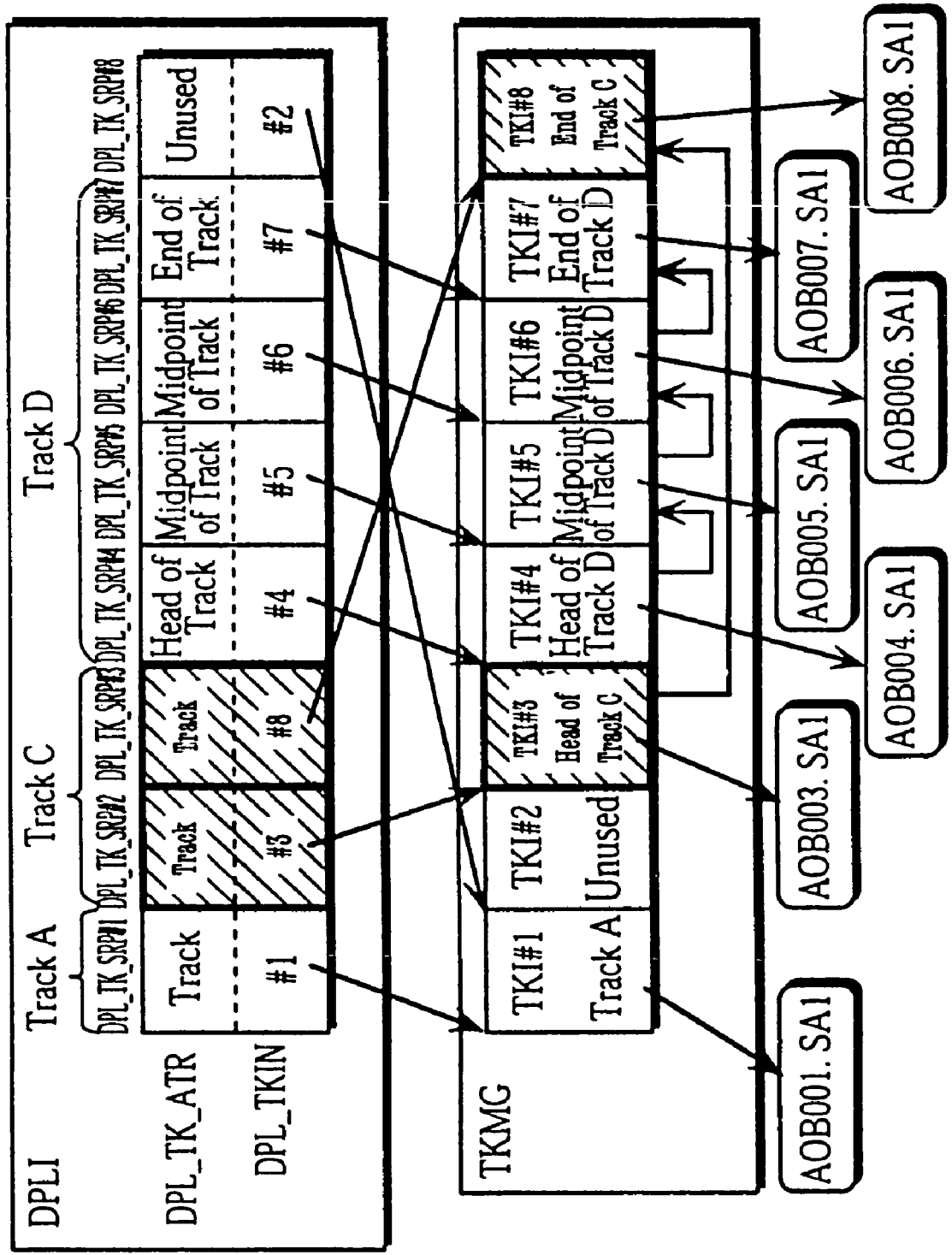

The following describes the updating of the Default_Playlist_Information when tracks are combined (i.e., in case3). FIGS. 46A and 46B show one example of the combining of tracks.

These drawings are largely the same as FIGS. 29A and 29B that were used to explain the combining of TKIs. The second, third, and fourth levels in FIGS. 46A and 46B are the same as the first two levels in FIGS. 29A and 29B. The difference between these figures is that the first levels in FIGS. 46A and 46B show Default_Playlist_Information, in which DPL_TK_SRP#8 is set at "Unused" and is related to TKI#2 that is also set at "Unused". When an editing operation combining tracks is performed for AOB files and TKIs as shown in FIGS. 29A and 29B, the contents of DPL_TK_SRP#3 to DPL_TK_SRP#6 are each moved down by one and the content of DPL_TK_SRP#7 that is shown with the thick outline is copied into DPL_TK_SRP#3 as shown in FIGS. 46A and 46B. The TKIs are also updated, as shown in FIGS. 29A and 29B.

{17-9_40-6_47A,B} Case4: Division of a Track

The following describes the updating of the Default_Playlist_Information when a track is divided (case4).

Figure 47A:
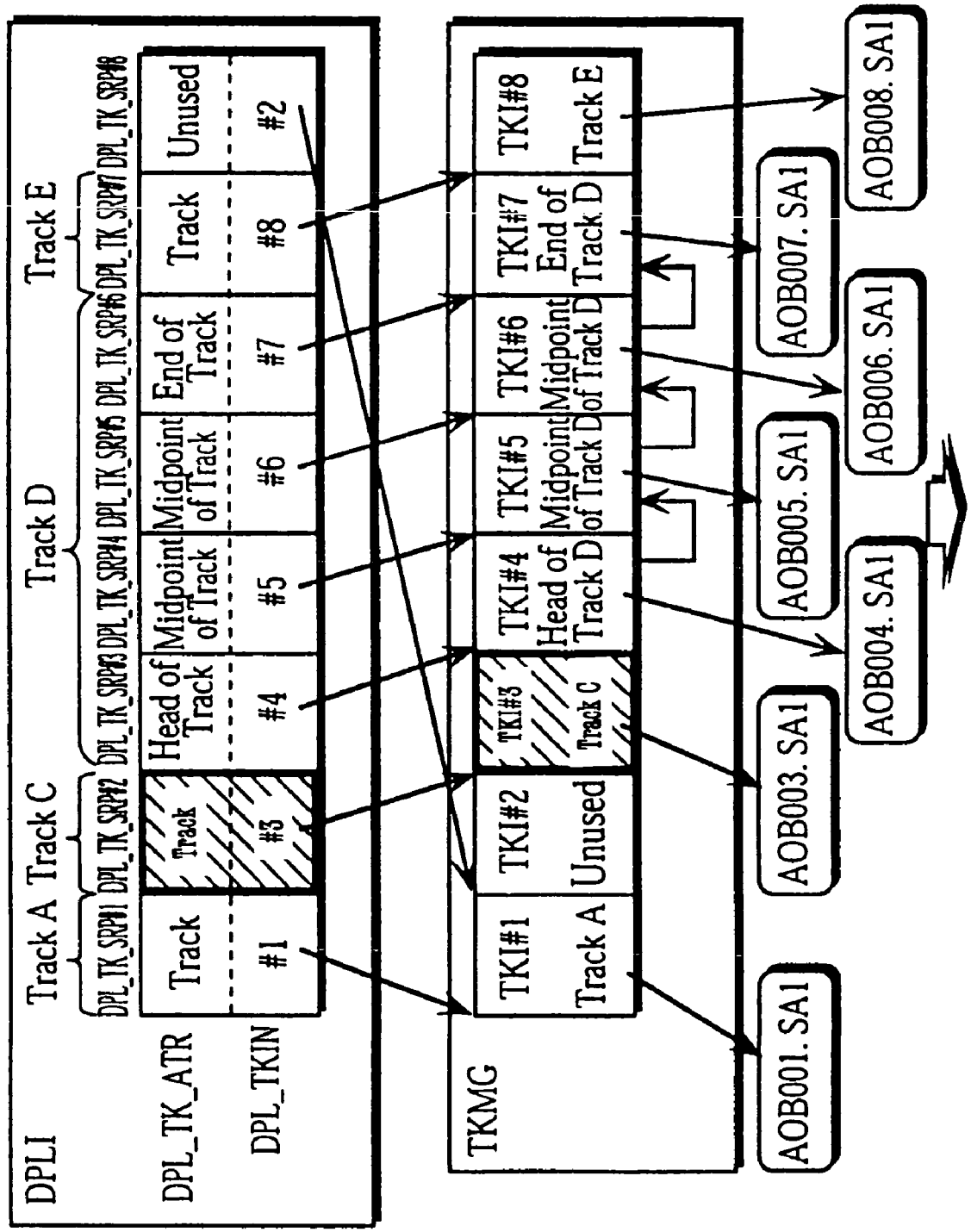
FIGS. 47A and 47B show how a track is divided.
Figure 47B:
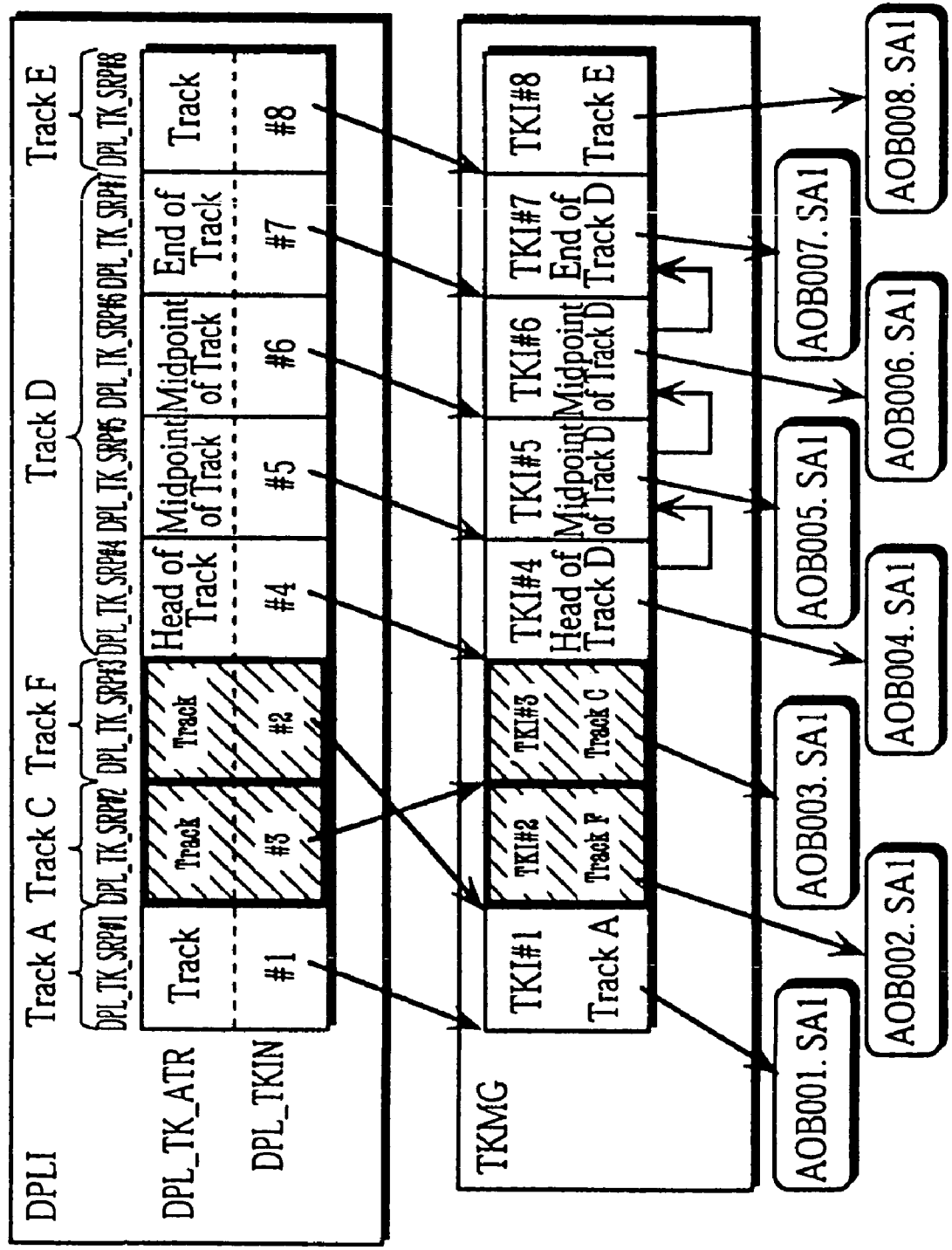

FIGS. 47A and 47B show one example of the division of a track. These drawings are largely the same as FIGS. 33A and 33B that were used to explain the division of TKIs. The second and third levels in FIGS. 47A and 47B are the same as the first two levels in FIGS. 33A and 33B. The difference between these figures is that the first level in FIGS. 47A and 47B shows Default_Playlist_Information, in which DPL_TK_SRP#8 is set at "Unused" and is related to TKI#2 that is also set at "Unused".

If, as in FIGS. 33A and 33B, the user indicates the division of TKI#3 ("AOB003.SA1") shown with the thick outline into two, the positions of DPL_TK_SRP#3 to DPL_TK_SRP#7 are each moved down by one in the order, and a DPL_TK_SRP set at "Unused" is moved within the Default_Playlist_Information to the former position of DPL_TK_SRP#3.

This new DPL_TK_SRP#3 is associated with the TKI, TKI#2, newly produced by the division. The AOB file "AOB002.SA1" associated with TKI#2 stores what was originally the latter part of the AOB file "AOB003.SA1". DPL_TK_SRP#2 is present before the DPL_TK_SRP#3 that is associated with TKI#2 and is associated with TKI#2 and "AOB002.SA1".

This is to say, "$AOB_{002}$.SA1" and "AOB003.SA1" respectively store the latter and former parts of the original "AOB003.SA1", with the DPL_TK_SRP#2 and DPL_TK_SRP#3 corresponding to these files indicating that these AOBs are to be played back in the order "AOB003.SA1" and "AOB002.SA1". As a result, the latter and former parts of the original "AOB003.SA1" will be played back in the order former part, latter part in accordance with the playback order given in the DPL_TK_SRP.

{17-9_40-8} Application of the Editing Processing

By combining the above four editing processes, a user can perform a great variety of editing operations. When, for example, a recorded track has an intro over which a disc jockey has talked, the user can first divide the track to separate the part including the disc jockey's voice. The user can then delete this track to leave the part of the track that does not include the disc jockey.

This completes the explanation of the navigation data. The following describes a playback apparatus with a suitable composition for playing back the navigation data and presentation data described above.

{48-1} External Appearance of the Playback Apparatus

Figure 48:
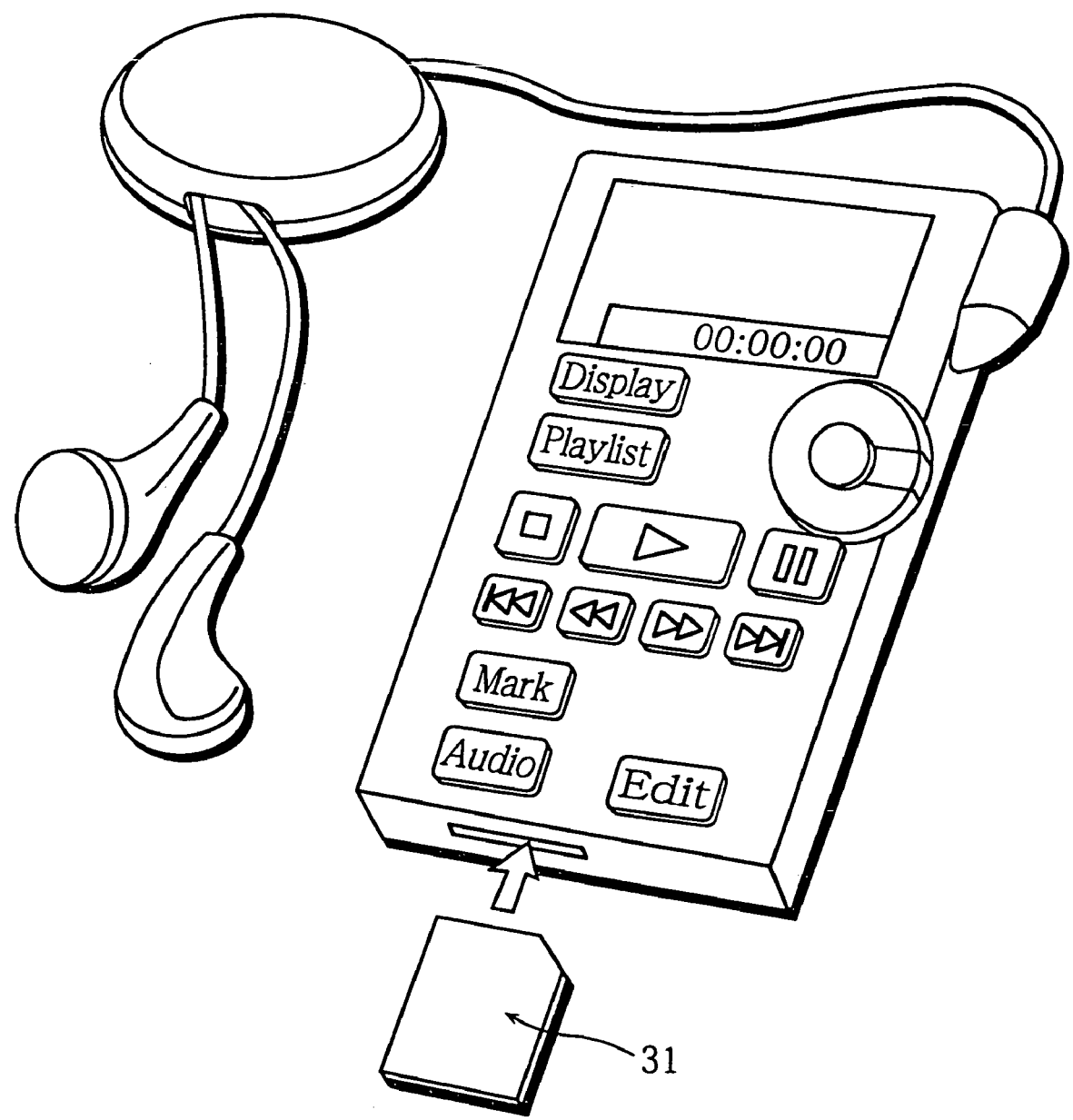
FIG. 48 shows the appearance of a portable playback apparatus for the flash memory card 31 of the present embodiments.

FIG. 48 shows a portable playback apparatus for the flash memory card 31 of the present invention. The playback apparatus shown in FIG. 48 has an insertion slot for inserting the flash memory card 31, a key panel for receiving user indications for operations such as playback, forward search, backward search, fast forward, rewind, stop etc., and an LCD (liquid crystal display) panel. In terms of appearance, this playback apparatus resembles other kinds of portable music players.

The key panel includes:
a "Playlist" key that receives the selection of a playlist or a track;

a "|<<" key that receives a skip operation that moves the playback position to a start of the current track;

a ">>|" key that receives a skip operation that moves the playback position to a start of the next track;

a "<<" key and a ">" key that respectively receive a backward search operation and a forward search operation enable the user to have the playback move quickly through the current track;

a "Display" key that receives an operation to have still images stored on the flash memory card 31 displayed;

a "Rec" key that receives a recording operation;

an "Audio" key for receiving user selections of the sampling frequency or of stereo or monoaural is to be used;

a "Mark" key that receives user indications that mark positions in tracks; and an "Edit" key that receives user indications for the editing of tracks or for the input of track titles.

{48-2} Improvements Made in This Portable Playback Apparatus for the Flash Memory Card 31

The differences between this portable playback apparatus of the flash memory card 31 and a conventional portable music player lie in the following four improvements (1) to (4).

(1) A list of playlist and tracks is shown on the LCD panel to allow the user to indicate the Default_Playlist_Information, a PLI, or separate tracks.

(2) Keys on the key panel are assigned to the playlists and/or tracks displayed on the LCD panel to allow the user to select a track or playlist that is to be played back or edited.

(3) A time code showing a position in a track is displayed on the LCD panel 5 when a track is played back.

(4) A jog dial is provided to enable the user to set a time code for use as playback start time when using the time search function or as a division boundary when dividing a track.

{48-2_49_50} Improvement (2)

Figure 49:
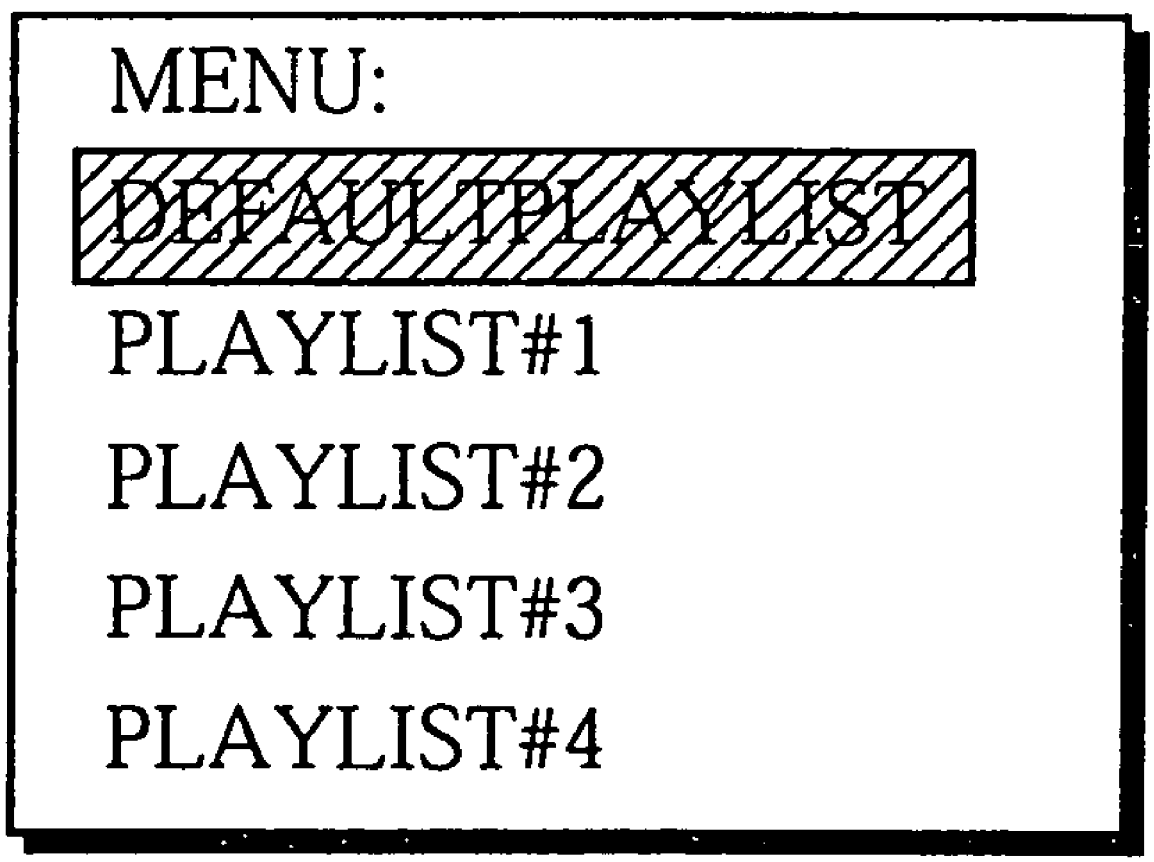
FIG. 49 shows one example of the display on the LCD panel when a playlist is selected.

The following describes improvement (2) in detail. FIG. 49 shows one example of a display screen shown on the LCD panel when the user selects a playlist, while FIGS. 50A to 50E show examples of the displayed content when the user selects a track.

In FIG. 49, the ASCII character strings "DEFAULTPLAYLIST", "PLAYLIST#1", "PLAYLIST#2", "PLAYLIST#3", and "PLAYLIST#4" represent the default playlist and the four playlists stored in the flash memory card 31.

Meanwhile, the ASCII character strings "Track#1", "Track#2", "Track#3", "Track#4", "Track#5" represent the five tracks that are indicated in the playback order given by the default playlist stored in the flash memory card 31. In FIGS. 49 and 50A, the highlighted Playlist and track show the track or Playlist that is currently indicated for playback or editing.

If the user presses the ">>" key when Track#1 is indicated for playback within a playback order given by the default Playlist displayed on the LCD panel, Track#2 will be indicated for playback within the list of tracks, as shown in FIG. 50B. If the user presses the ">>" key again, Track#3 will be indicated for playback within the list of tracks, as shown in FIG. 50C.

If the user presses the "<<" key when Track#3 is indicated for playback within a playback order given by the default Playlist displayed on the LCD panel, Track#2 will be indicated for playback within the list of tracks, as shown in FIG. 50D. As shown in FIG. 50E, if the user presses the "Play" key when any of the tracks is indicated, the playback of the indicated track will begin, while if the user presses the "Edit" key, the indicated track will be selected for editing.

{48-3_51} Improvement (4)

Figure 51A:
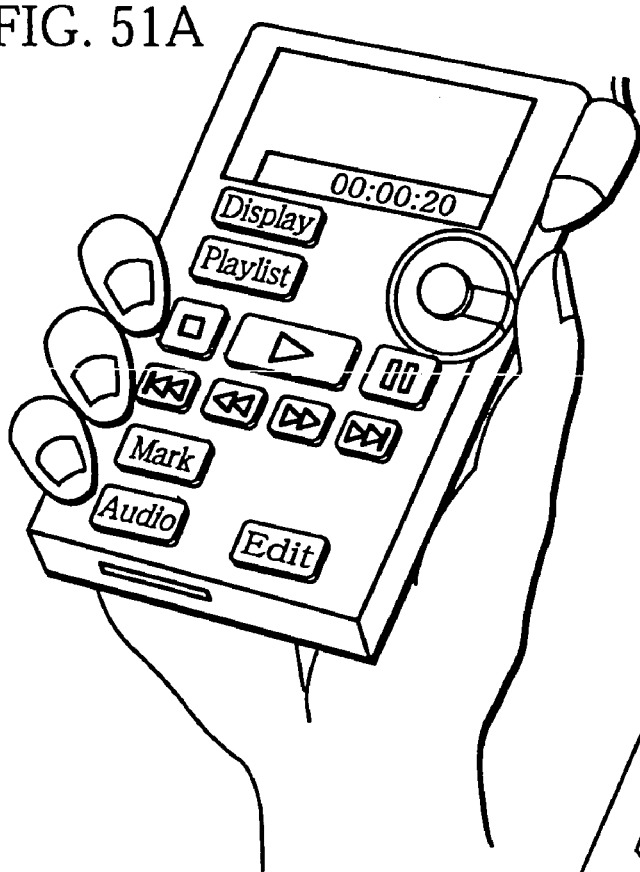
FIGS. 51A to 51C show example operations of the jog dial.
Figure 51C:
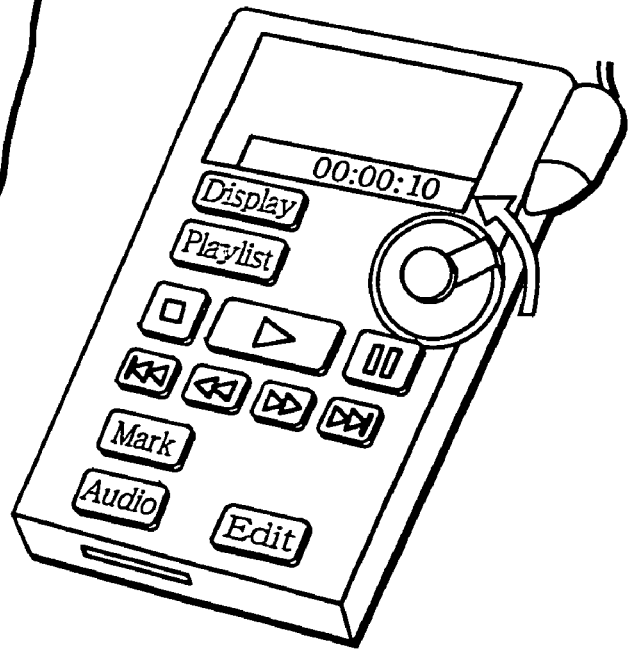
Figure 51B:
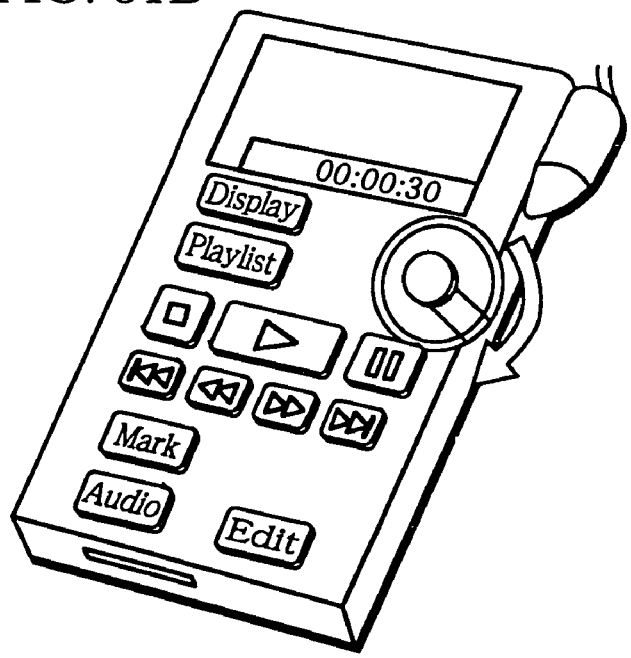

The following describes improvement (4) in detail. FIGS. 51A to 51C show an example operation of the jog dial. When the user rotates the jog dial by a certain amount, the playback time code displayed on the LCD panel will be increased or decreased in accordance with this certain amount. The example in FIG. 51A shows the case where the playback time code that is initially displayed on the LCD panel is "00:00:20".

When the user rotates the jog dial counterclockwise as shown in FIG. 51C, the playback time code is reduced to "0:00:10" in keeping with the amount by which the jog dial was rotated. Conversely, when the user rotates the jog dial clockwise as shown in FIG. 51B, the playback time code is increased to "0:00:30" in keeping with the amount by which the jog dial was rotated.

By allowing the user to change the playback time code in this way, the playback apparatus enables the user to indicate any playback time code in a track by merely rotating the jog dial. If the user then presses the "Play" key, AOBs will be played back starting from a position found according to Equation 2 and Equation 3.

By using the jog dial during a track dividing operation, the user can make fine adjustments to the playback time code used as the division boundary.

{52-1} Internal Construction of the Playback Apparatus

The following describes the internal construction of the playback apparatus. This internal construction is shown in FIG. 52.

Figure 52:
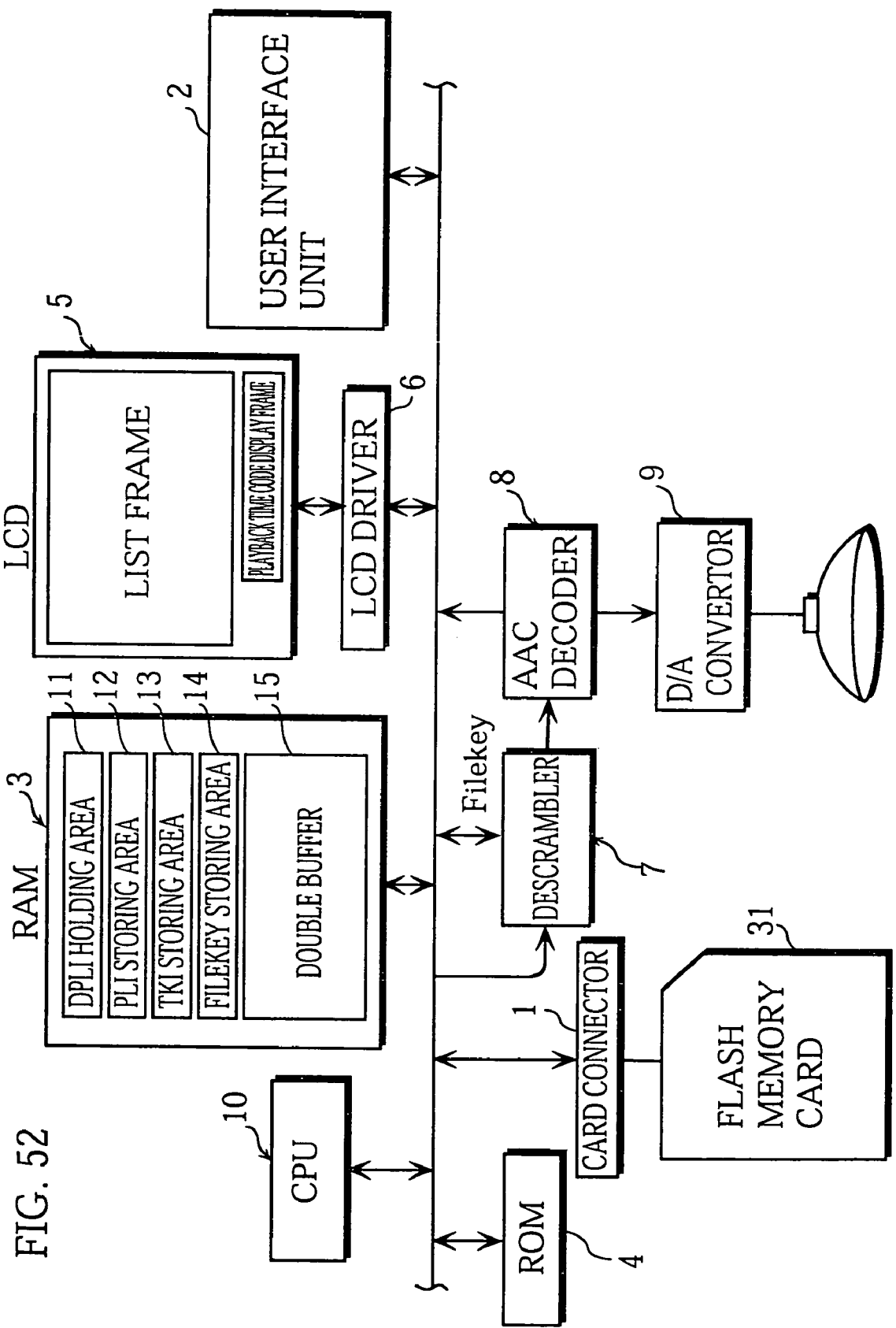
FIG. 52 shows the internal construction of the reproduction apparatus.

As shown in FIG. 52, the playback apparatus includes a card connector 1 for connecting the playback apparatus to the flash memory card 31, a user interface unit 2 that is connected to the key panel and the jog dial, a RAM 3, a ROM 4, a LCD panel 5 having a list frame for displaying a list of tracks or playlists and a playback time code frame for displaying a playback time code, an LCD driver 6 for driving the first LCD panel 5, a descrambler 7 for decrypting AOB_FRAMEs using a different FileKey for each AOB file, an AAC decoder 8 for referring to the ADTS of an AOB_FRAME descrambled by the descrambler 7 and decoding the AOB_FRAME to obtain PCM data, a D/A converter 9 for D/A converting the PCM data and outputting the resulting analog signals to a speaker or headphone jack, and a CPU 10 for performing overall control over the playback apparatus.

As can be understood from this hardware construction, the present playback apparatus has no special hardware elements for processing the TrackManager and Default_Playlist_Information. To process the TrackManager and Default_Playlist_Information, a DPLI holding area 11, a PLI storing area 12, a TKI storing area 13, a FileKey storing area 14, and a double buffer 15 are provided in the RAM 3, while a playback control program and an editing control program are stored in the ROM 4.

{52-2} DPLI Holding Area 11

The DPLI holding area 11 is an area for continuously holding Default_Playlist_Information that has been read from a flash memory card 31 connected to the card connector 1.

{52_12} PLI Storing Area 12

The PLI storing area 12 is an area that is reserved for storing Playlist_Information that has been selected for playback by the user.

{52-3} TKI Storing Area 13

The TKI storing area 13 is an area that is reserved for storing only the TKI corresponding to the AOB file that is currently indicated for playback, out of the plurality of TKI included in the TrackManager. For this reason, the capacity of the TKI storing area 13 is equal to the data size of one TKI.

{52-4} FileKey Storing Area 14

The FileKey storing area 14 is an area that is reserved for storing only the FileKey corresponding to the AOB file that is currently indicated for playback, out of the plurality of File-Keys included in "AOBSA1.KEY" in the authentication region.

{52-5} Double Buffer 15

The double buffer 15 is an input/output buffer that is used when an input process, which successively inputs cluster data (data that is stored in one cluster) read from the flash memory card 31, and an output process, which reads AOB_FRAMEs from cluster data and successively outputs the AOB_FRAMEs to the descrambler 7, are performed in parallel.

The double buffer 15 successively frees the regions that were occupied by cluster data that has been outputted as AOB_FRAMEs and so secures regions for storing the next clusters to be read. This is to say, regions in the double buffer 15 are cyclically secured for storing cluster data using ring pointers.

{52-5_53_54A,B} Input and Output by the Double Buffer 15

Figure 53:
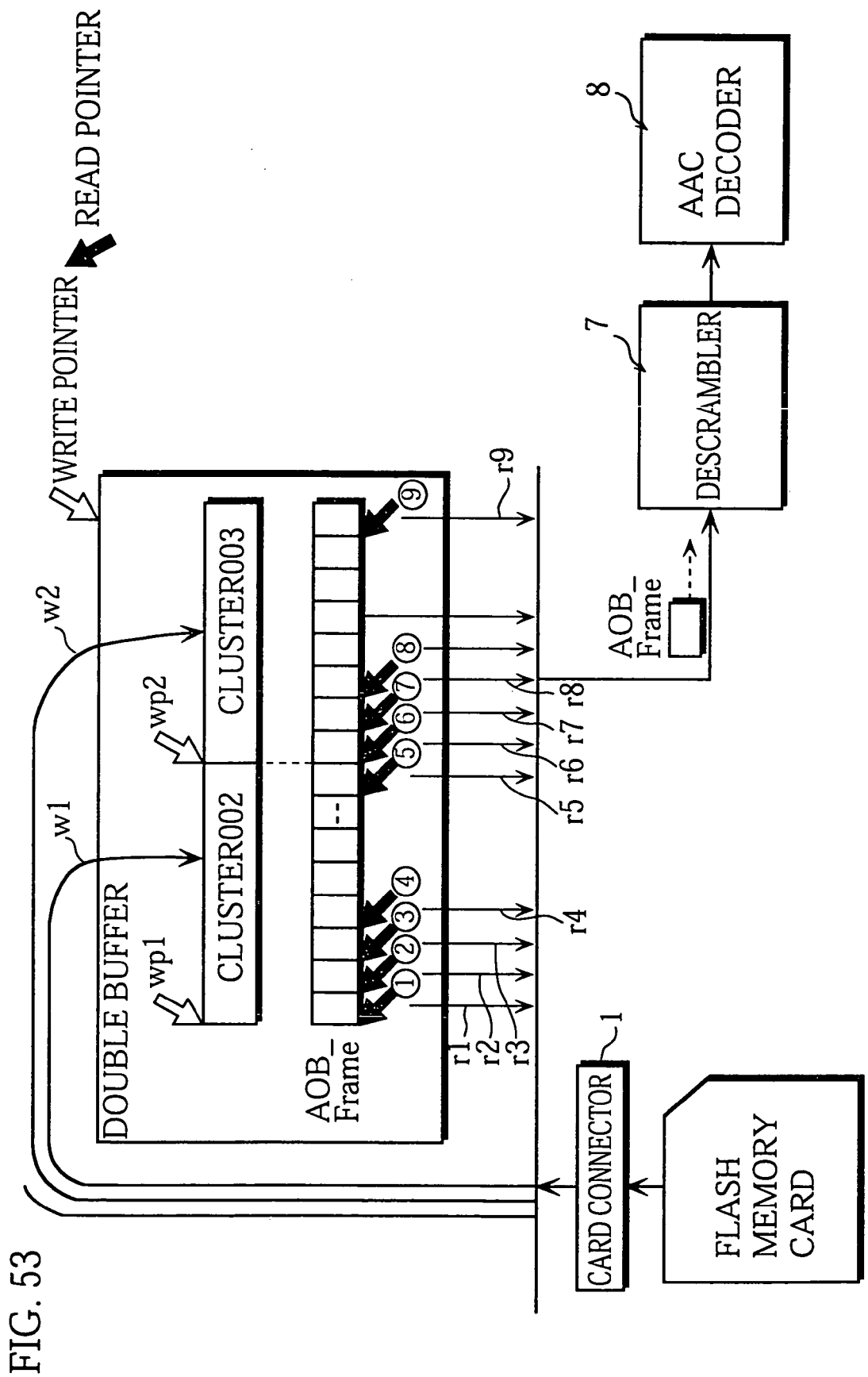
FIG. 53 shows how data is transferred in and out of the double buffer 15.
Figure 54A:
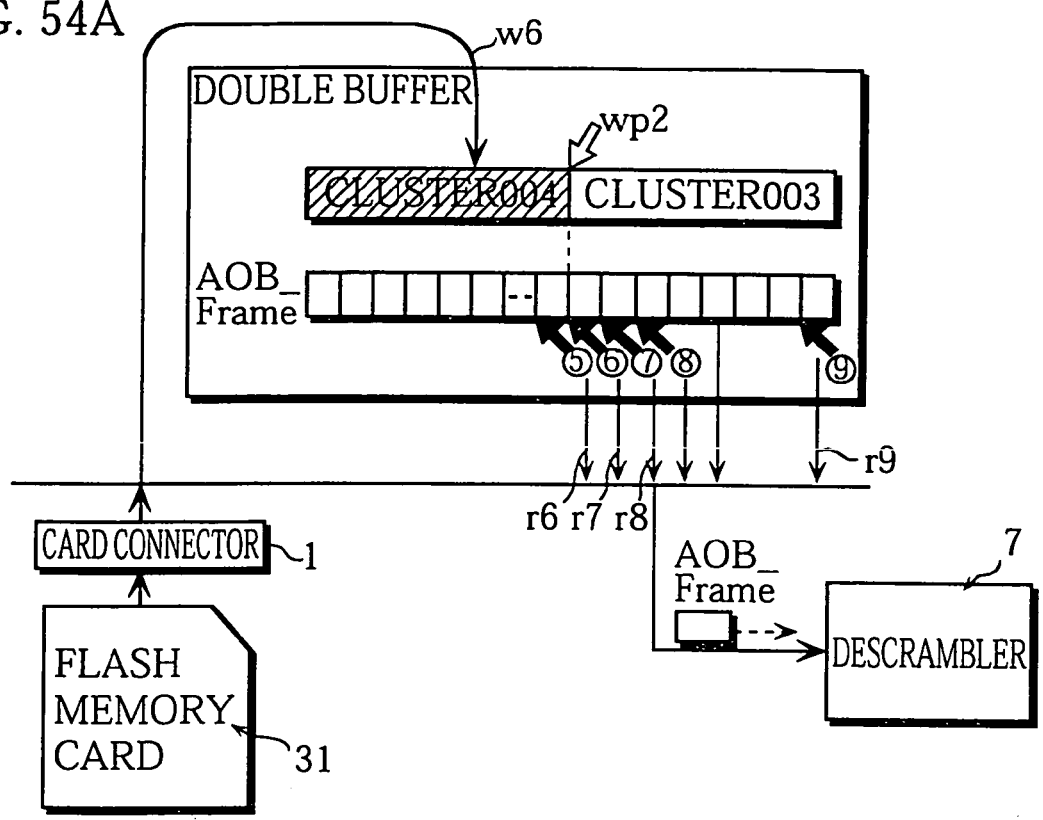
FIGS. 54A and 54B show how areas in the double buffer 15 are cyclically allocated using ring pointers.
Figure 54B:
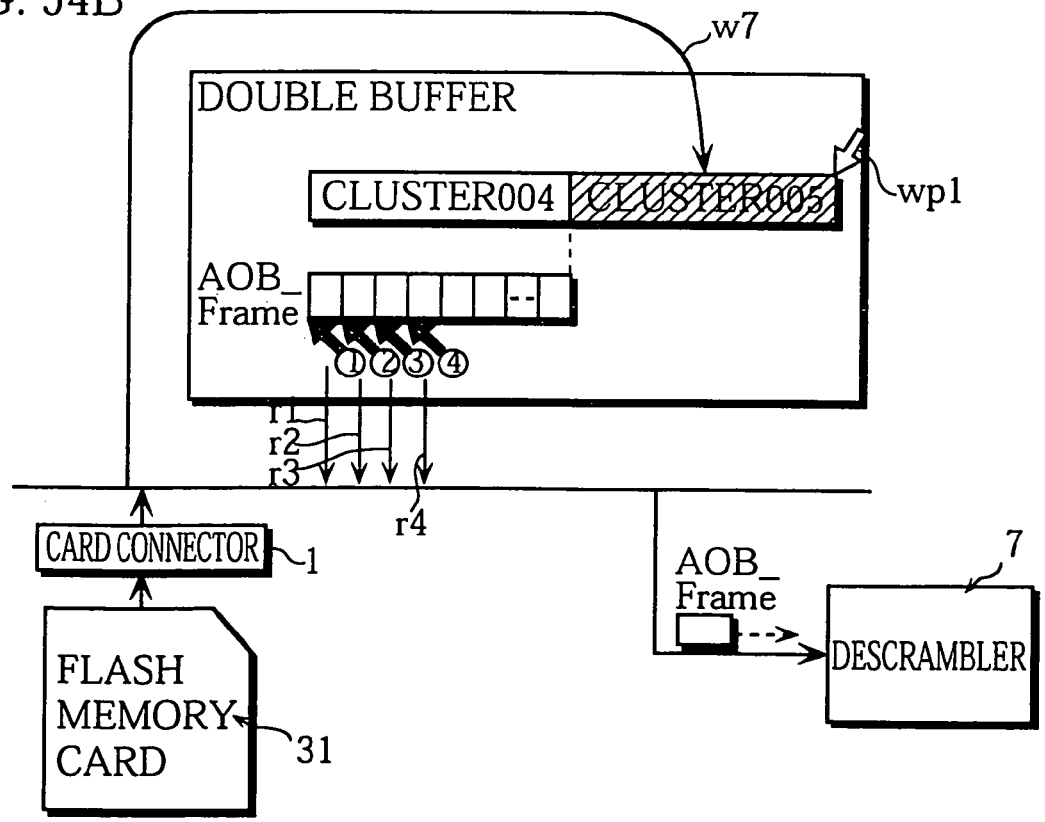

FIG. 53 shows how input and output are performed for the double buffer 15. FIGS. 54A and 54B show how regions in the double buffer 15 are cyclically secured for storing cluster data using a ring pointers.

The arrows pointing downward and to the left are pointers to write addresses for cluster data, which is to say, the write pointer. The arrows pointing upward and to the left are pointers to read addresses for cluster data, which is to say, the read pointer. These pointers are used as the ring pointer.

{54-6_53}

When a flash memory card 31 is connected to the card connector 1, cluster data in the user region of the flash memory card 31 is read out and stored in the double buffer 15 as shown by the arrows w1 and w2.

The read cluster data is successively stored into the positions in the double buffer 15 shown by the write pointers wp1 and wp2.

{52-7_54A}

Of the AOB_Frames included in the cluster data stored in this way, the AOB_Frames present at the positions ①②③④⑤⑥⑦⑧⑨ that are successively indicated by the read pointer are outputted one at a time to the descrambler 7 as shown by the arrows r1, r2, r3, r4, r5 . . .

In the present case, the cluster data 002 and 003 is stored in the double buffer 15 and the read positions ①②③④ are successively indicated by the read pointer, as shown in FIG. 53. When the read pointer reaches the read position ⑤, all of the AOB_FRAMEs included in cluster 002 will have been read, so that cluster 004 is read and, as shown by the arrow w6 in FIG. 54A, is overwritten into the region that was previously occupied by cluster 002.

{52-8_54B}

The read pointer then advances to the read positions ⑥ and ⑦, and eventually reaches the read position ⑨, at which point all of the AOB_FRAMEs included in cluster 003 will have been read, so that cluster 005 is read and, as shown by the arrow w7 in FIG. 54B, is overwritten into the region that was previously occupied by cluster 003.

The output of an AOB_FRAME and the overwriting of cluster data are repeatedly performed as described above, so that the AOB_FRAMEs included in an AOB file are all successively outputted to the descrambler 7 and AAC decoder 8.

{52-9_55-58} Playback Control Program Stored in the ROM 4

The following describes the playback control program stored in the ROM 4.

Figure 55:
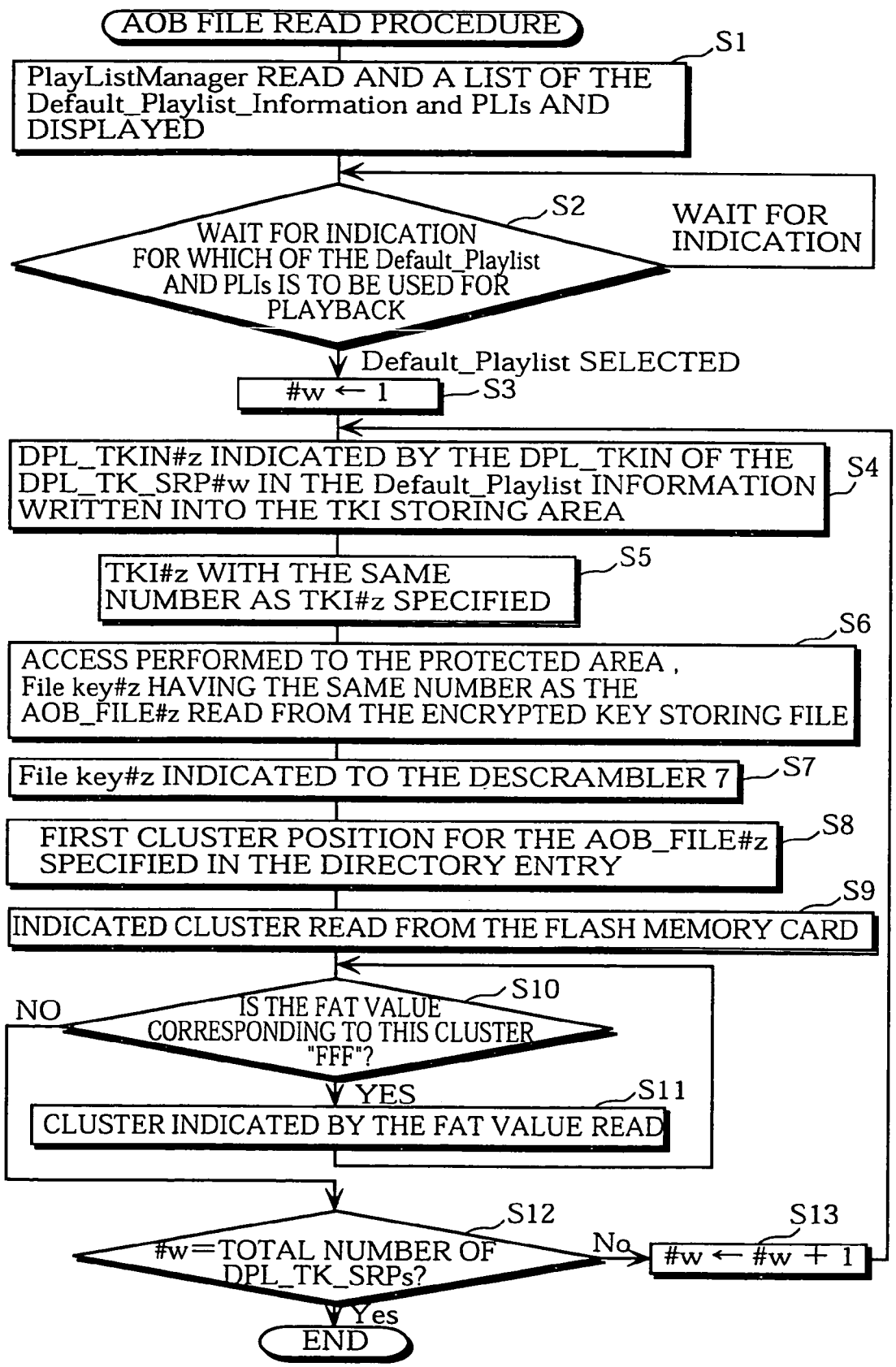
FIG. 55 is a flowchart showing the AOB file read procedure.
Figure 56:
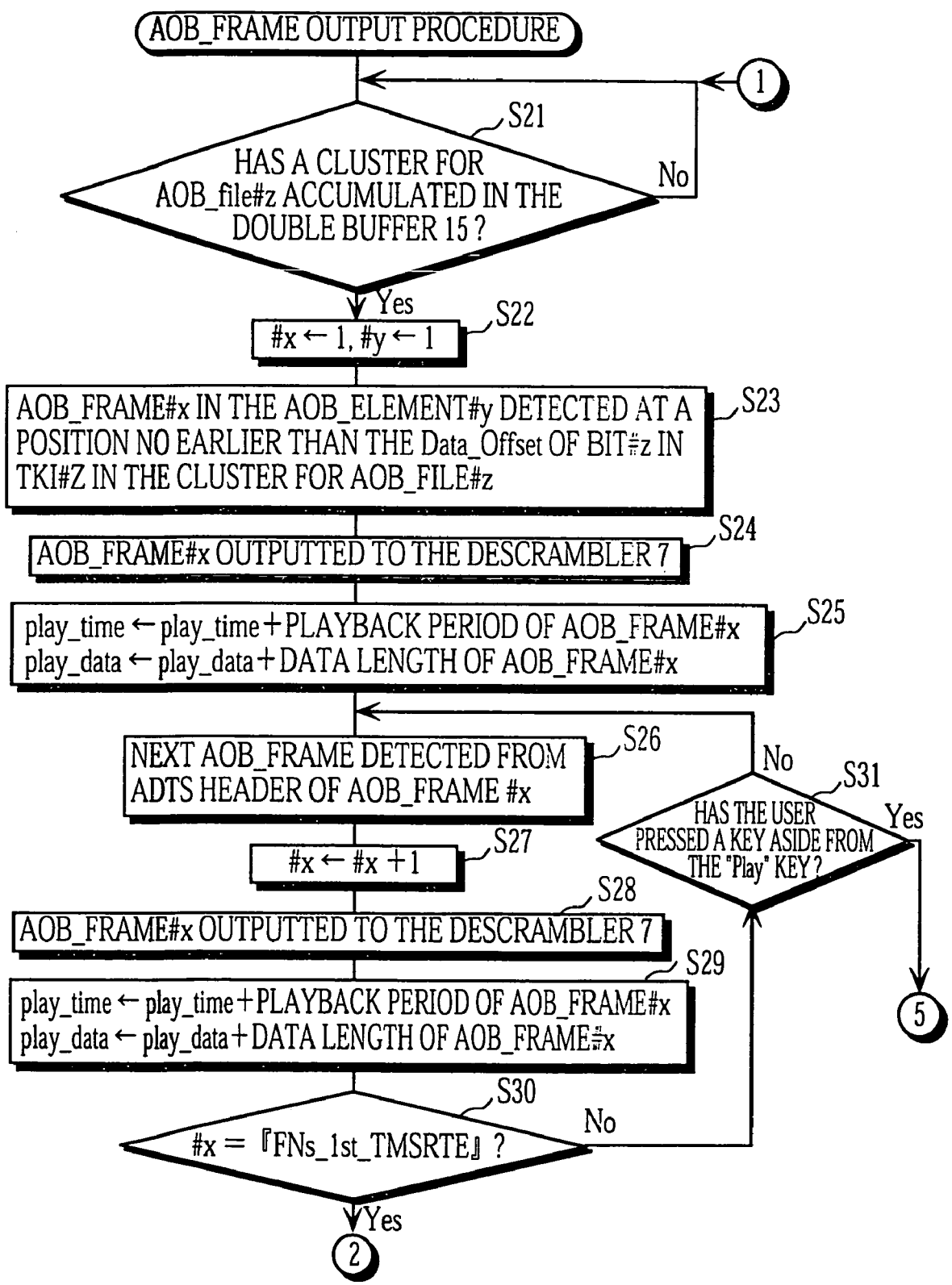
FIG. 56 is a flowchart showing the AOB file output procedure.
Figure 57:
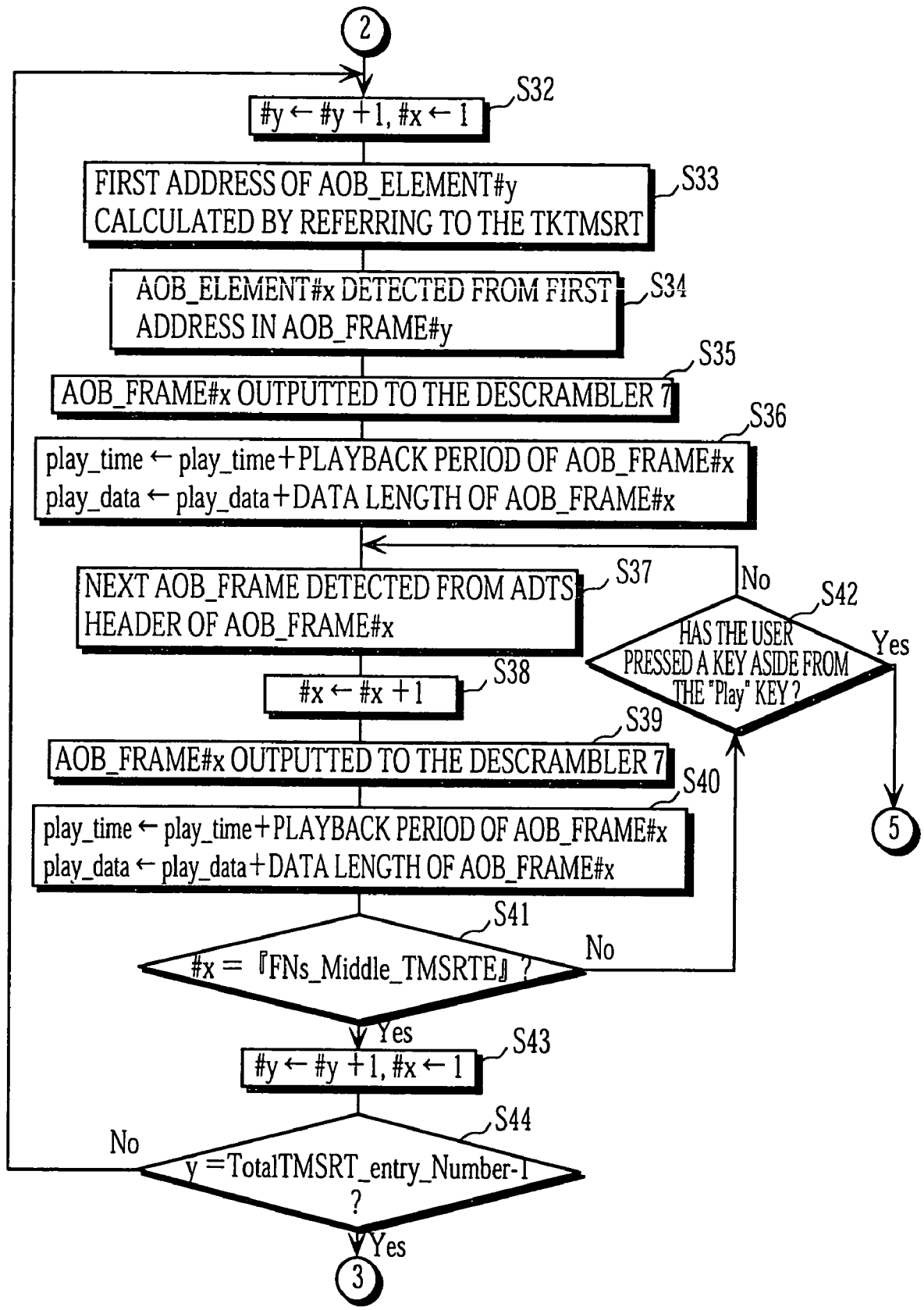
FIG. 57 is a flowchart showing the AOB file output procedure.
Figure 58:
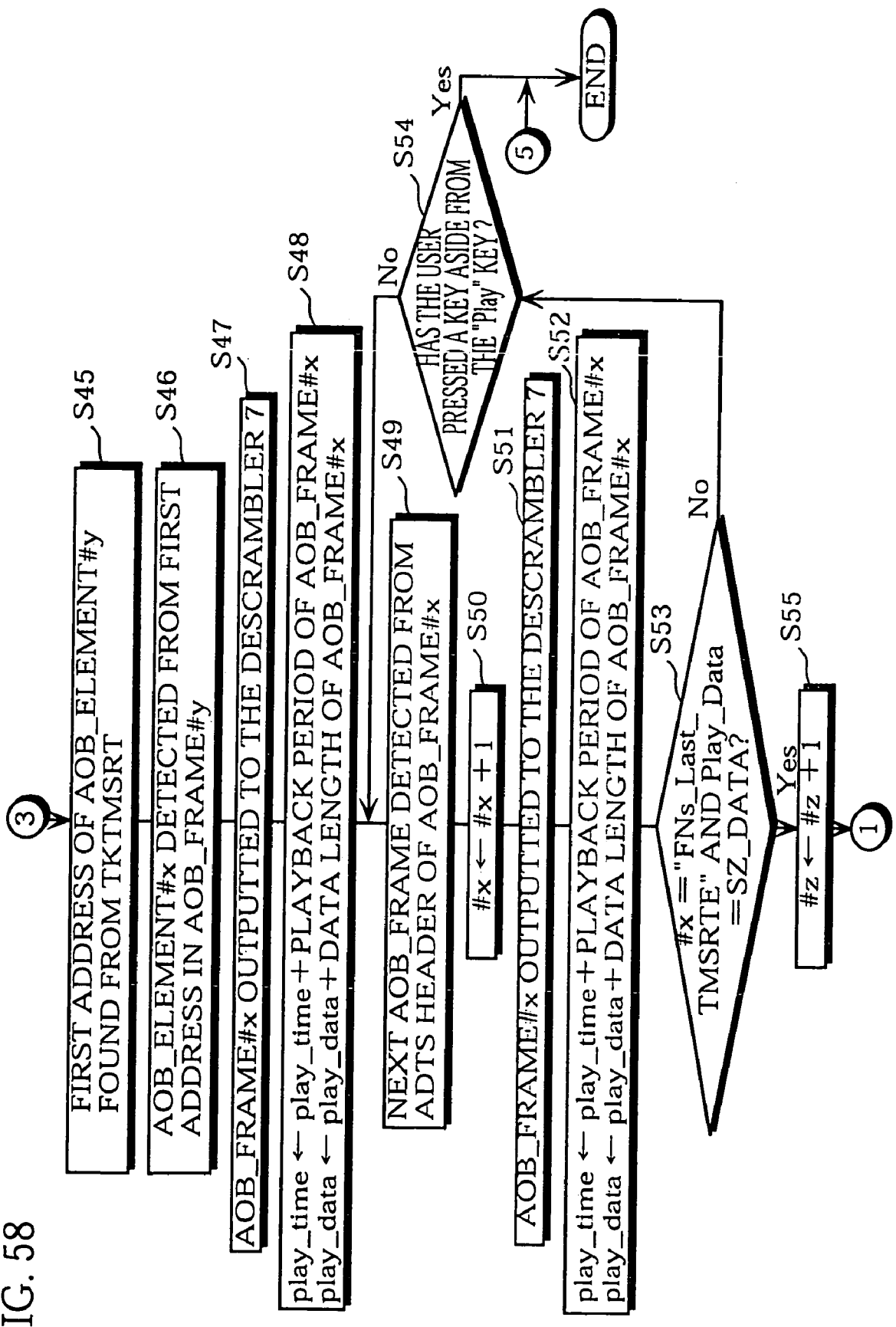
FIG. 58 is a flowchart showing the AOB file output procedure.

FIG. 55 is a flowchart showing the processing in the AOB file reading procedure. FIGS. 56, 57, and 58 are flowcharts showing the processing in the AOB_FRAME output procedure.

{52-9_55-1}

These flowcharts use the variables w, z, y, and x.

The variable w indicates one of the plurality of DPL_TL_SRPs. The variable z indicates an AOB file recorded in the user region, the TKI corresponding to this AOB file, and the AOB included in this AOB file. The variable y indicates an AOB_ELEMENT included in the AOB#z indicated by the variable z. The variable x indicates an AOB_FRAME included in the AOB_ELEMENT#y indicated by the variable y. The following first explains the processing in the AOB file read procedure, with reference to FIG. 55. {52-9_55-2}

In step S1, the CPU 10 reads the PlaylistManager and displays a list including the Default_Playlist_Information and the PLIs.

In step S2, the CPU 10 waits for an indication to play back AOBs in accordance with either the Default_Playlist_Information or one of the PLIS.

When the Default_Playlist_Information is indicated, the processing moves from step S2 to step S3 where the variable w is initialized (#w←1) and then to step S4 where the TKI#z indicated by the DPL_TKIN corresponding to DPL_TK_SRP#w in the Default_Playlist_Information is specified and only this TKI#z is read from the flash memory card 31 and stored into the TKI storing area 13.

In step S5, an AOB file#z with the same number as TKI#z is specified. In this way, the AOB file that is to be played back is finally specified.

The specified AOB file is in an encrypted state and needs to be decrypted, so that steps S6 and S7 are performed. In step S6, the playback apparatus accesses the authentication region and reads the FileKey#z that is stored in a FileKey_Entry#z in the encryption key storing file, the FileKey_Entry#z having the same number as the specified AOB file. In step S7, the CPU 10 sets the FileKey#z in the descrambler 7. This operation results in the FileKey being set in the descrambler 7, so that by successively inputting AOB_FRAMEs included in the AOB file into the descrambler 7, the AOB_FRAMEs can be successively played back.

{52-9_55-3}

After this, the playback apparatus successively reads the clusters that store the AOB file. In step S8, the "first cluster number in the file" is specified for the AOB_file#z in the directory entry. In step S9, the CPU 10 reads the data stored in this cluster from the flash memory card 31. In step S10, the CPU 10 judges whether the cluster number in the FAT value is "FFF". If not, in step S11 the CPU reads the data stored in the cluster indicated by the FAT value, before returning to step S10.

When the playback apparatus reads the data stored in any of the clusters and refers to the FAT value corresponding to this cluster, the processing in steps S10 and S11 will be repeated so long as the FAT value is not set at "FFF". This results in the playback apparatus successively reading clusters indicated by the FAT values. When the cluster number given by a FAT value is "FFF", this means that all of the clusters composing the AOB file#z have been read, so that the processing advances from step S10 to step S12.

{52-9_55-4}

In step S12, the CPU 10 judges whether the variable#w matches the total number of DPL_TK_SRPs. If not, the processing advances to step S13, where the variable#w is incremented (#w←#w+1) before the processing returns to step S4. In step S4, the playback apparatus specifies TKI#z which is indicated by the DPL_TKIN#w of DPL_TK_SRP#w in the Default_Playlist_Information, and writes only TKI#z into the TKI storing area 13. The TKI that was used up to this point will be still stored in the TKI storing area 13, though this current TKI will be overwritten by TKI#z that is newly read by the CPU 10.

This overwriting results in only the latest TKI being stored in the TKI storing area 13. Once the TKI has been overwritten, the processing in steps S5 to S12 is repeated for the AOB file#z. Once this processing has read all of the TKI and AOB files corresponding to all of the DPL_TK_SRPs included in the Default_Playlist_Information, the variable #z will match the total number of DPL_TK_SRP so that the judgement "Yes" is given in step S12 and the processing in this flowchart ends.

{52-9_56_57_58} Output Processing for an AOB_Frame

In parallel with the AOB file reading procedure, the CPU 10 performs the AOB_FRAME output procedure in accordance with the flowcharts shown in FIGS. 56, 57, and 58. In these flowcharts, the variable "play_time" shows how long playback has been performed for a current track, which is to say, the playback time code. The time displayed in the playback time code frame on the LCD panel 5 is updated in accordance with changes to this playback time code. Meanwhile, the variable "play_data" represents the length of the data has been played back for the current track.

{52-9_56-1}

In step S21, the CPU 10 monitors whether cluster data for the AOB file#z has accumulated in the double buffer 15. This step S21 will be repeatedly performed until cluster data has accumulated, at which point the processing advances to step S22 where the variables x and y are initialized (#x←1, #y←1). After this, in step S23 the CPU 10 searches the clusters for AOB file #z and detects the AOB_FRAME#x in the AOB_ELEMENT#y that is positioned no earlier than the Data_Offset given in the BIT#z included in TKI#z. In this example, it is assumed that the seven bytes starting from the SZ_DATA are occupied by the ADTS header. By referring to the ADTS header, the data length indicated by the ADTS header can be recognized as audio data. The audio data and ADTS header are read together and are outputted to the descrambler 7. The descrambler 7 decrypts the AOB_FRAMEs, which are then decoded by the AAC decoder 8 and reproduced as audio.

{52-9_56-2}

After this detection, in step S24 the AOB_FRAME#x is outputted to the descrambler 7, and in step S25 the variable play_time is incremented by the playback period of the AOB_FRAME#x and the variable play_data is incremented the amount of data corresponding the AOB_FRAME#x. Since the playback time of AOB_FRAME is 20 msec in the present case, 20 msec is added to the variable "play_time".

Once the first AOB_FRAME has been outputted to the descrambler 7, in step S26 the playback apparatus refers to the ADTS header of AOB_FRAME#x and specifies where the next AOB_FRAME is located. In step S27, the playback apparatus increments the variable#x (#x←#x+1) and sets AOB_FRAME#x as the next AOB_FRAME. In step S28, AOB_FRAME#x is inputted into the descrambler 7. After this, in step S29, the variable play_time is incremented by the playback period of the AOB_FRAME#x and the variable play_data is incremented the amount of data corresponding the AOB_FRAME#x. After incrementing AOB_FRAME#x, in step S30 the CPU 10 judges whether the variable #x has reached the value given in FNs_1st_TMSRTE.

If the variable #x has not reached the value in FNs_1st_TMSRTE, in step S31 the playback apparatus checks whether the user has pressed any key aside from the "Play" key, and then returns to step S26. The playback apparatus hereafter repeats the processing in steps S26 to S31 until the variable #x reaches the value in FNs_1st_TMSRTE or until the user presses any key aside from the "Play" key.

When the user presses a key aside from the "Play" key, the processing in this flowchart ends and suitable processing for the pressed key is performed. When the pressed key is the "Stop" key, the playback procedure stops, while when the pressed key is the "Pause" key, the playback is paused.

{52-9_57-1}

On the other hand, when the variable #x reaches the value in FNs_1st_TMSRTE, the judgement "Yes" is made in step S30, and the processing proceeds to step S32 in FIG. 57. Since all of the AOB_FRAMEs included in the present AOB_ELEMENT will have been inputted into the descrambler 7 in the processing between step S26 to S30, in step S32 the variable #y is incremented to set the next AOB_ELEMENT as the data to be processed and the variable #x is initialized (#y←#y+1,#x←1).

After this, in step S33 the playback apparatus refers to the TKTMSRT and calculates the first address of the AOB_ELEMENT#y.

The playback apparatus then performs the procedure made up of steps S34 to S42. This procedure reads the AOB_FRAMEs included in an AOB_ELEMENT one after another, and so can be said to resemble the procedure made up of steps S24 to S31. The difference with the procedure made up of steps S24 to S31 is the condition by which the procedure made up of steps S24 to S31 ends is whether the variable #x has reached the value shown by "FNs_1st_TMSRTE", while the condition by which procedure made up of steps S34 to S42 ends is whether the variable #x has reached the value shown by "FNs_Middle_TMSRTE".

When the variable #x reaches the value shown by "FNs_Middle_TMSRTE", the loop procedure made up of steps S34 to S42 ends, the judgement "Yes" is given in step S41 and the processing advances to step S43. In step S43, the CPU 10 increments the variable #y and initializes the variable #x (#y←#y+1, #x←1). After this, in step S44 the variable y judges whether the variable #y has reached a value that is equal to one less than the TotalTMSRT_entry_Number in the TMSRT_Header in the TKI#z.

When the variable #y is lower than (TotalTMSRT_entry_Number−1), the AOB-ELEMENT#y is not the final AOB_ELEMENT, so that the processing returns from step S44 to step S32 and the loop procedure of step S32 to step S42 is performed. When the variable #y reaches (TotalTMSRT_entry_Number−1) the read procedure can be assumed to have proceeded as far as the penultimate AOB_ELEMENT, so that the judgement "Yes" is given in step S44 and the processing advances to step S45 in FIG. 58.

{52-9_57-2}

The procedure composed of steps S45 to S54 resembles the procedure composed of steps S33 to S42 in that each of the AOB_FRAMEs in the final AOB_ELEMENT are read.

The difference with the procedure composed of steps S33 to S42 is that while the loop procedure composed of steps S33 to S42 ends when it is judged in step S41 that the variable #x has reached the value in "FNs_Middle_TMSRTE", the loop procedure composed of steps S45 to S54 ends when it is judged in step S53 that the variable #x has reached the value in "FNs_Last_TMSRTE" and the variable play_data showing the size of the data that has hitherto been read has reached the value given as "SZ_DATA".

The procedure composed of steps S49 to S54 is repeated until the conditions in step S53 are satisfied, at which point the judgement "Yes" is given in step S53 and the processing advances to step S55. In step S55, the CPU 10 increments the variable #z (#z←#z+1) before the processing returns to step S21 where the CPU 10 waits for the next AOB file to accumulate in the double buffer 15. Once this happens, the processing advances to step S22 and the procedure composed of steps S22 to step S54 is repeated. This means that the TKI indicated by the DPL_TKIN of the next DPL_TK_SRP is specified and the AOB file corresponding to this TKI, which is to say, the AOB file with the same number as the TKI, is specified.

After this, the playback apparatus accesses the authentication region and specifies the FileKey, out of the FileKeys in the encryption key storing file, that has the same number as the TKI, before reading this FileKey and setting it in the descrambler 7. As a result, the AOB_FRAMEs included in the AOB file having the same number as the TKI are successively read and played back.

{52-9_57-3_59} Updating of the Playback Time Code

Figure 59A:
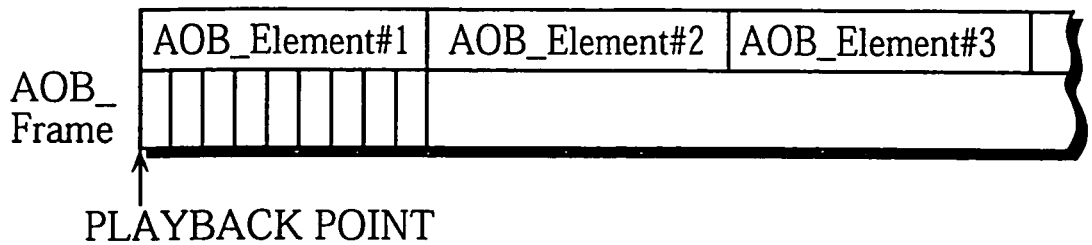
FIGS. 59A to 59D show how the playback time code displayed in the playback time code frame on the LCD panel 5 is updated in accordance with the updating of the variable Play_time.
Figure 59B:
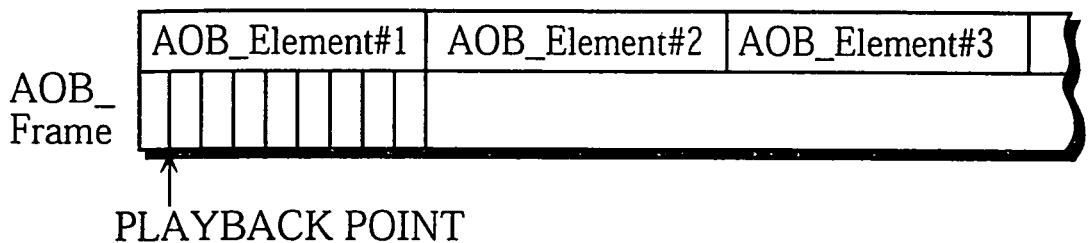
Figure 59C:
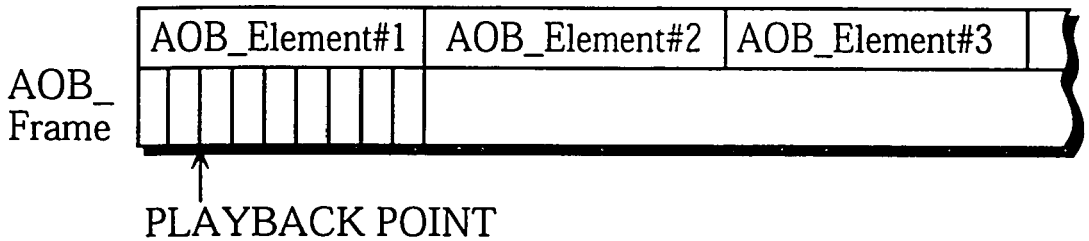
Figure 59D:
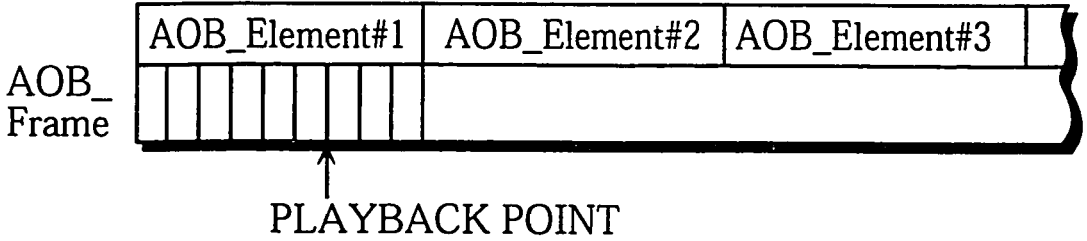

FIGS. 59A to 59D show how the playback time code displayed in the playback time code display frame of the LCD panel 5 is increased in accordance with the updating of the variable play_time. In FIG. 59A, the playback time code is "00:00:00.000", though when the playback of AOB_FRAME#1 ends, the playback period 20 msec of AOB_FRAME#1 is added to the playback time code to update it to "00:00:00.020", as shown in FIG. 59B. When the playback of AOB_FRAME#2 ends, the playback period 20 msec of AOB_FRAME#2 is added to the playback time code to update it to "00:00:00.040", as shown in FIG. 59C. In the same way, when the playback of AOB_FRAME#6 ends, the playback period 20 msec of AOB_FRAME#6 is added to the playback time code to update it to "00:00:00.120", as shown in FIG. 59D.

This completes the description of the AOB_FRAME output procedure.

In step S31 of the flowchart in FIG. 56, if the user presses a key aside from the "Play" key, the processing in this flowchart is terminated. The processing that accompanies a pressing of "Stop" or "Pause" key has already been described, though when the user presses one of the keys provided to have the playback apparatus perform special playback, the processing in this flowchart, or in the flowcharts shown in FIGS. 56, 57, or 58 is terminated and suitable processing for the pressed key is performed.

The following describes the procedure executed by the CPU 10 (1) when performing the forward search function in response to the user pressing the ">>" key and (2) when performing the time search function in response to the user operating the jog dial after pressing the "Pause" or "Stop" key.

{52-10_60} Forward Search Function

Figure 60A:
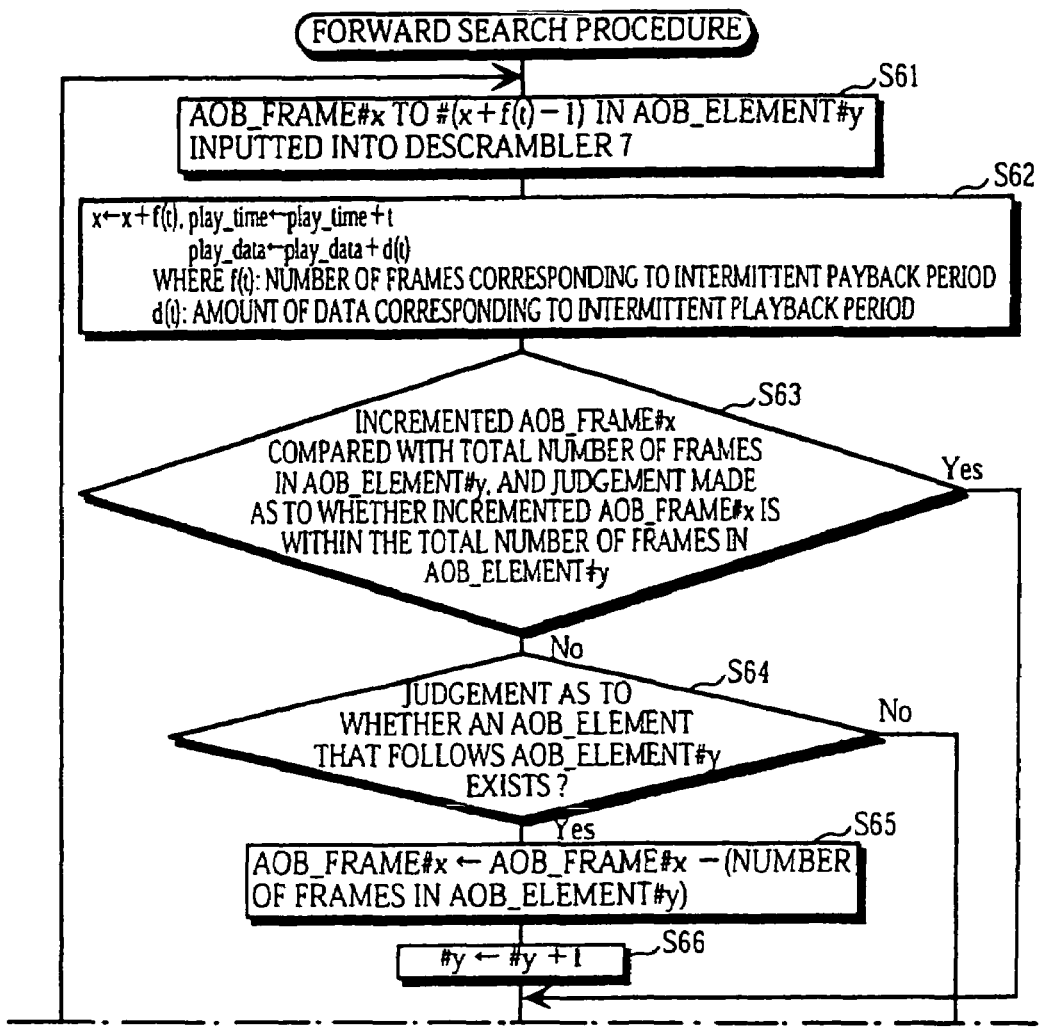
FIG. 60 is a flowchart shows the processing of the CPU 10 when the forward search function is used.
Figure 60B:
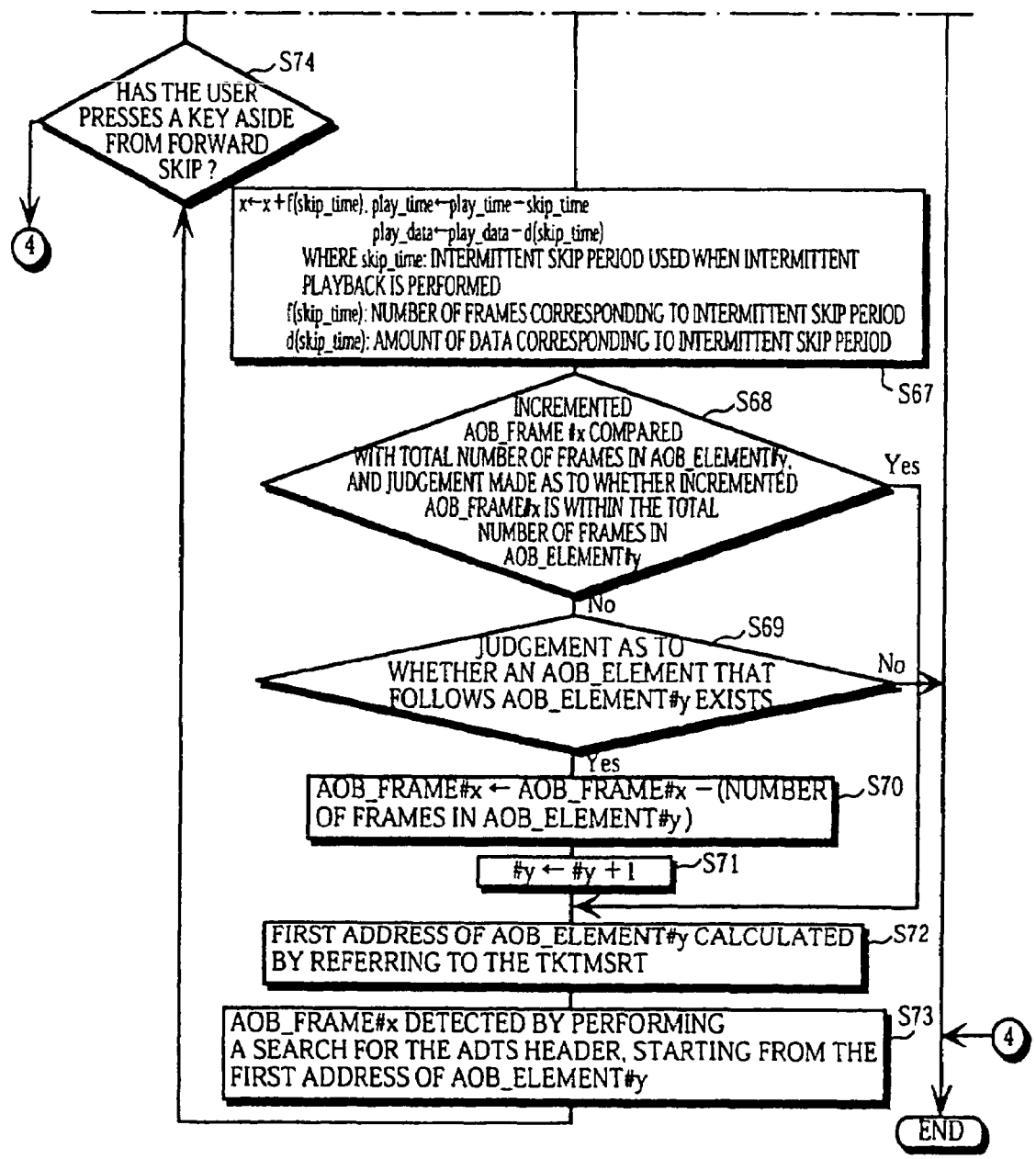

FIG. 60 is a flowchart showing the procedure executed by the CPU 10 when performing the forward search function. When the user presses the ">" key, the judgement "Yes" is given in step S31, step S42 or step S54 in the flowcharts in FIGS. 56, 57 and 58 and the CPU 10 performs the processing in the flowchart of FIG. 60.

In step S61, the AOB_FRAMEs #x to #(x+f(t)−1) are inputted into the descrambler 7. Here "t" represents the intermittent playback period, f(t) represents the number of frames corresponding to the intermittent playback period, and d(t) represents the amount of data corresponding to the intermittent playback period. In step S62, the variable play_time showing the playback elapsed time, and the variable play_data showing the playback data amount are respectively updated using intermittent playback period "t", the number of frames f(t) corresponding to intermittent playback period, and the amount of data d(t) corresponding to the intermittent playback period (x←x+f(t), play_time←play_time+t, play_data←play_data+d(t)). Note that the intermittent playback period will generally be 240 msec (equivalent to the playback period of twelve AOB_FRAMEs).

{52-10_60-1_61A,B}

Figure 61A:
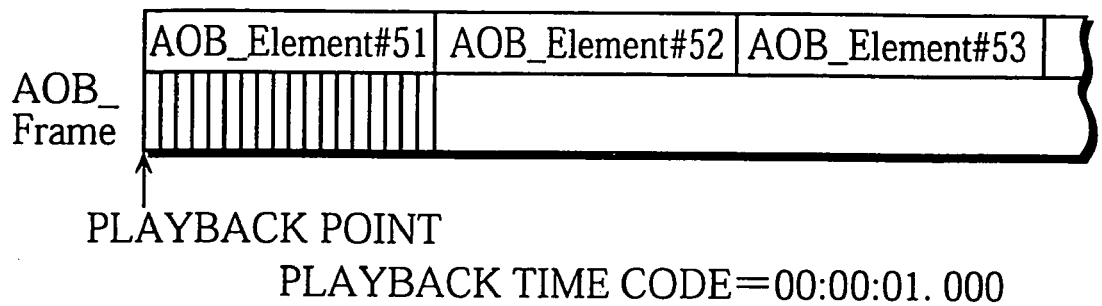
FIGS. 61A to 61D show how the playback time code is incremented when the forward search function is used.
Figure 61B:
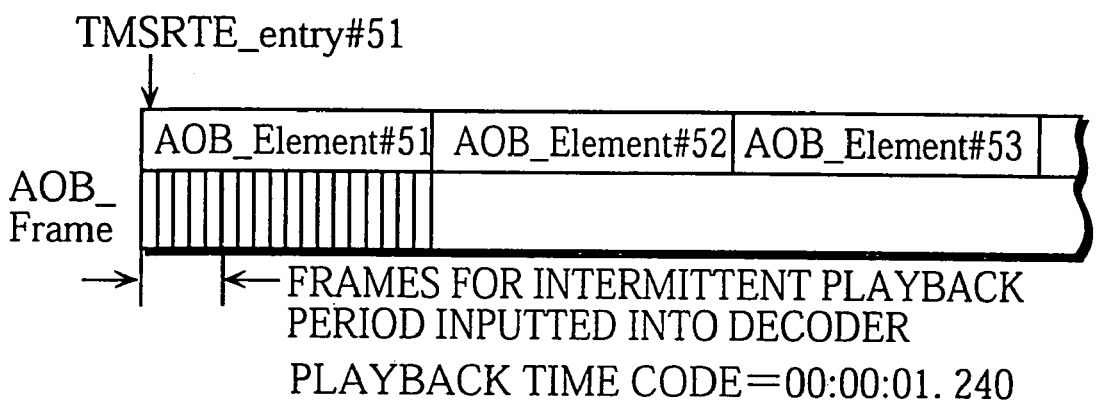

FIGS. 61A and 61B show the incrementing of the playback time code during a forward search operation. FIG. 61A shows the initial value of the playback time code, with the playback point being the AOB-FRAME#1 in AOB-ELEMENT#51.

The playback time code in this case is "00:00:01.000". When the first to twelve AOB_FRAMEs have been inputted into the descrambler 7 as the intermittent playback period, the playback period of twelve AOB_FRAMEs (i.e., 240 msec) is added to the playback time code so that the playback time code becomes "00:00:01.240", as shown in FIG. 61B.

{52-10_60-2}

After this updating, in step S63 the CPU 10 compares the incremented variable #x with the total number of frames in AOB_ELEMENT#y and judges whether the incremented variable #x is within the total number of frames in AOB_.ELEMENT#y.

As mentioned earlier, the number of frames in an AOB_ELEMENT positioned at the start of an AOB is "FNs_1st_TMSRTE", the number of frames in an AOB_ELEMENT positioned in a central part of an AOB is "FNs_Middle_TMSRTE" and the number of frames in an AOB_ELEMENT positioned at the end of an AOB is "FNs_Last_TMSRTE".

The CPU 10 performs the above judgement by comparing an appropriate one of these values with the variable #x. When the variable x is not within the present AOB_ELEMENT#y, the CPU 10 then judges in step S64 whether there is an AOB_ELEMENT that follows the AOB_ELEMENT#y.

When the AOB_ELEMENT#y is the final AOB_ELEMENT in an AOB_BLOCK, there will be no AOB_ELEMENT that follows the AOB_ELEMENT#y, so that the judgement "No" is given in step S64 and the processing in the present flowchart ends. Conversely, when an AOB_ELEMENT that follows the AOB_ELEMENT#y exists, in step S65 the variable #x is reduced by the number_of AOB_FRAMEs in the AOB_ELEMENT#y and in step S66 the variable#y is updated (#y←#y+1). As a result, the variable#x will now indicate the frame position of a frame in the next AOB_ELEMENT#y indicated by the updated variable #y. Conversely, when the variable #x indicates an AOB_FRAME that is present in the current AOB_ELEMENT (S63:Yes), the processing in steps S64-S66 is skipped and the processing advances to step S67.

{52-10_60-3}

After this, the variables #x, play_time, and play_data are updated in accordance with the intermittent skip period. The period "skip_time" that is equivalent to the intermittent skip period is two seconds, the number of frames that are equivalent to this skip_time is given as f(skip_time) and the amount of data that is equivalent to this skip_time is given as d(skip_time). In step S67, these values are used to update the variables #x, play_time, and play_data (#x←#x+f(skip_time), play_time←play_time+skip_time, and play_data←play_data+d(skip time)).

{52-10_60-4_61C}

Figure 61C:
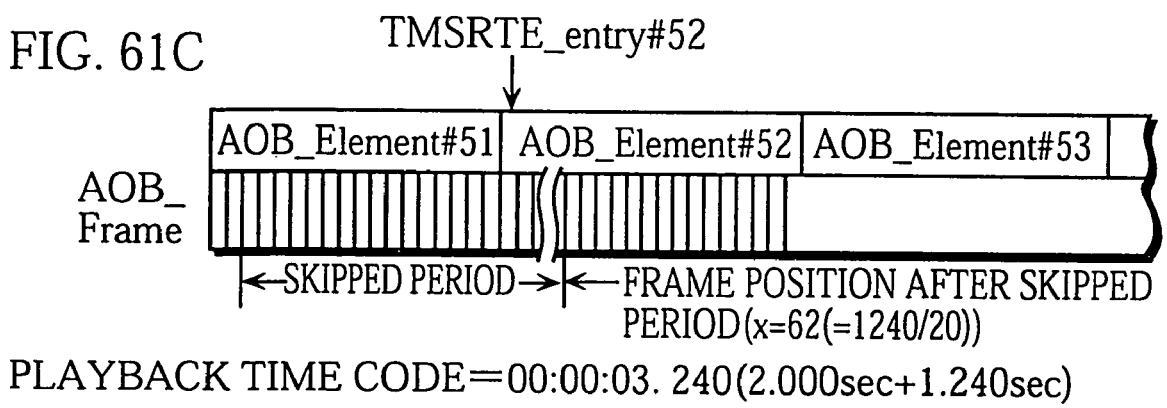

As shown in FIG. 61C, the intermittent skip period is added to the variable#x showing a frame position within the AOB_ELEMENT#51. When the updated variable #x exceeds the number of frames in AOB_ELEMENT#51, the variable #y is updated to indicate the next AOB_ELEMENT and the number of frames in the AOB_ELEMENT#51 is subtracted from the variable #x. As a result, the variable#x will now indicate a frame position within the AOB_ELEMENT#52 indicated by the updated variable #y. The value 2.000(=2sec) is then added to the present value "00:00:01.240" of the playback time code so that it becomes "00:00:03.240". The variable #x is updated by calculating (3240 msec-2000 msec)/ 20 msec) to give the value "62", and so indicates the AOB-FRAME#62 in the AOB_ELEMENT#52.

{52-10_60-5_61(d)}

Figure 61D:
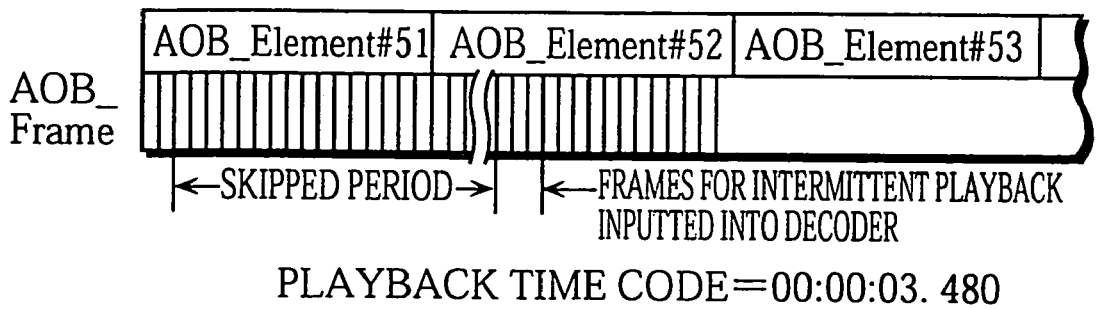

Once the AOB_FRAME#62 in the AOB_ELEMENT#52 has been inputted into the descrambler 7, the playback time code is updated as shown in FIG. 61D by adding "0.240" to the present value of "00:00:03.240" to give "00:00:03.480".

In step S67, the variables are updated in accordance with the intermittent skip time and then the processing in steps S68 to S71 are performed. This processing in steps S68 to S71 is the same as the processing in steps S63 to S66 and so updates the variable#x by a number of frames that is equivalent to the intermittent skip time "skip_time", before checking whether the variable#x still indicates an AOB_FRAME within the present AOB_ELEMENT#y. If not, the variable #y is updated so that the next AOB_ELEMENT is set as the AOB_ELEMENT#y and the variable#x is converted so as to indicate a frame position in this next AOB_ELEMENT.

Once the variables #x and #y have been in accordance with the intermittent playback time and intermittent skip time, in step S72 the CPU 10 refers to the TKTMSRT and calculates the start address for the AOB_ELEMENT#y. Then, in step S73, the CPU 10 starts to search for an ADTS header starting from the start address of the AOB_ELEMENT#y to detect the AOB_FRAME#x. In step S74, the CPU 10 judges whether the user has pressed any key aside from the forward search key. If not, the AOB_FRAMEs from the AOB_FRAME#x to the AOB_FRAME#x+f (t)-1 are inputted into the descrambler 7, and the processing in steps S62 to S73 is repeated.

The above procedure increments the variables #x and #y that indicate the AOB_FRAME#x and AOB-ELEMENT#y, and so advances the playback position. After this, if the user presses the "Play" key, the judgement "No" is given in FIG. 74 and the processing in the present flowchart ends.

{52-11} Execution of the Time Search Function

The following describes the processing performed when the time search function is used. First, the tracks in the Default_Playlist_Information are displayed and the user indicates a desired track. When this track has been indicated and the user has operated the jog dial, the playback time code is updated. If the user then presses the "Play" key, the playback time code at that point is used to set a value in the variable "Jmp_Entry" in seconds.

A judgement is then made as to whether the indicated track is composed of a plurality of AOBs or a single AOB. When the track is composed of a single AOB, the variables #y and #x are calculated so as to satisfy Equation 2. After this, a search for the AOB_FRAME#x is started from the address in the (y+2) th position in the TKTMSRT corresponding to this AOB. Once this AOB_FRAME#x has been found, playback starts from AOB_FRAME#x.

{52-12}

When the track is composed of a plurality of AOBs, the variables #n (indicating an AOB), #y and #x are calculated so as to satisfy Equation 3. After this, a search for the AOB_FRAME#x is started from the address in the (y+2)th position in the TKTMSRT corresponding to AOB#n. Once this AOB_FRAME#x has been found, playback starts from AOB_FRAME#x.

The following describes the case when playback is commenced from an arbitrary position with an AOB where the "FNs_1st_TMSRTE" in the BIT is "80 frames", "FNs_Middle_TMSRTE" in the BIT is "94 frames", and the "FNs_Last_TMSRTE" in the BIT is "50 frames".

{52-13_62A,B}

As one specific example of when the time search function is used, the following describes how the AOB_ELEMENT and frame position from which playback should start are specified when a playback time code is indicated using the jog dial.

Figure 62A:
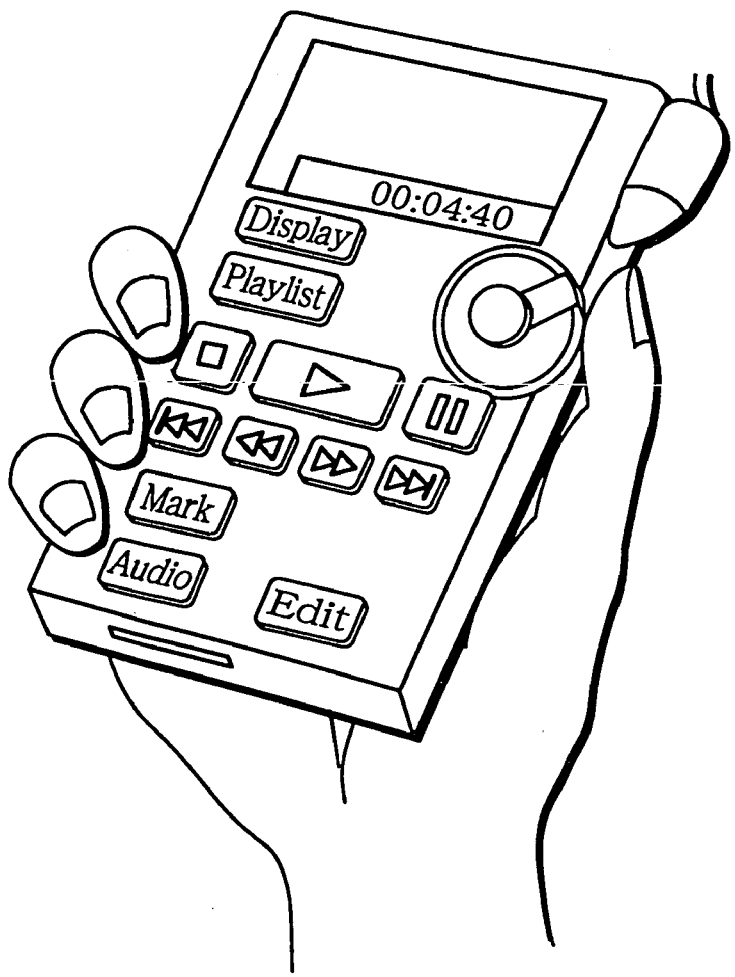
FIGS. 62A and 62B show specific examples of how the time search function is used.
Figure 62B:
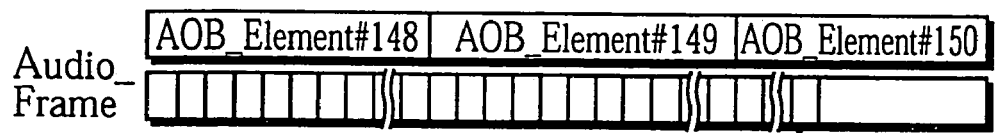

As shown in FIG. 62A, the user holds the playback apparatus in his/her hand and rotates the jog dial with his/her right thumb to indicate the playback time code "00:04:40.000(=280sec)". When the BIT in the TKI for this AOB is as shown in FIG. 62B, Equation 2 is used as follows $$280 \text{ sec} = (\text{FNs\_1st\_TMSRTE} + (\text{FNs\_Middle\_TMSRTE} * y) + x) * 20 \text{ msec}$$

$$= (80 + (94 * 148) + 8) * 20 \text{ msec}$$

so that the Equation 2 is satisfied for the values y=148 and x=8.

Since y=148, the entry address of the AOB_ELEMENT#150 (=148+2) is obtained from the TKTMSRT. Playback from the indicated playback time code 00:04:40.000 (=280.00sec) can then be performed by starting the playback at the eighth AOB_FRAME from this entry address.

{52-14_63_64_65}

Figure 64:
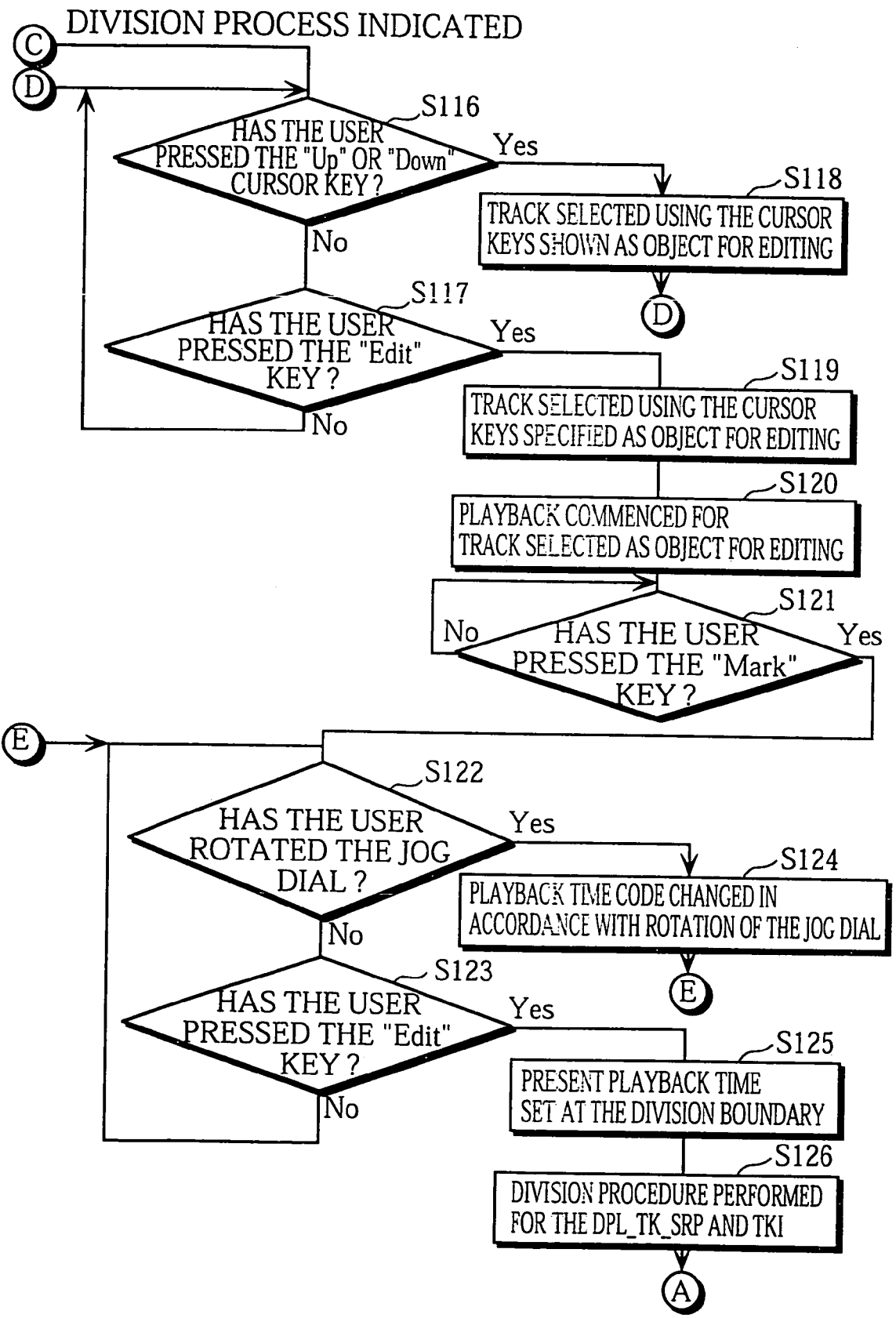
FIG. 64 is a flowchart showing the processing in the editing control program.

This completes the explanation of the processing of the CPU 10 in response to the user pressing the "Play" key. The following describes the editing control program stored in the ROM 4. This editing control program is executed when the user presses the "Edit" key, and contains the procedures shown in FIGS. 63, 64, and 65. The following describes the processing in this program with the flowcharts shown in these drawings.

{52-14_63-1} Editing Control Program

When the user presses the "Edit" key, an interactive screen is displayed in step S101 in FIG. 63 to ask the user which of the three fundamental editing operations "deletion", "division" and "combining" is to be performed. In step S102, the CPU 10 judges what operation has been made by the user in response to the interactive screen. In the present example, it is assumed that the "|<<" and ">>|" keys on the key panel are also used as indicating "Up" and "Down" cursor operations, (i.e., these keys are used as "Up" and "Down" cursor keys). When the user indicates a "deletion" operation, the processing proceeds to the loop procedure composed of steps S103 and S104.

In step S103, the CPU 10 judges whether the user has pressed the "|<<" or ">>|" key. In step S104, the CPU 10 judges whether the user has pressed the "Edit" key. When the user has pressed the "|<<" or ">>|" key, the processing advances from step S103 to S105, where the indicated track is set as the track to be edited. On the other hand, when the user has pressed the "Edit" key, the indicated track is set as a track to be deleted. The processing shown in FIG. 44 is executed, so that the TKI_BLK_ATR of each TKI for the indicated track is set at "Unused" to delete the indicated track.

{52-14_63-2} Combining Process When the user selects the combining process, the processing proceeds from step S102 to the loop procedure composed of steps S107 to S109. In the loop procedure composed of steps S107 to S109, the playback apparatus receives user inputs via the "|<<", ">>|", and "Edit" keys. When the user presses the "|<<" or ">>|" key, the processing advances from step S107 to step S110 where the indicated track is highlighted on the display. When the user presses the "Edit" key, the judgement "Yes" is given in step S108 and the processing advances to step S111. In step S111, the currently indicated track is set as the first track to be used in this editing process and the processing returns to the loop procedure composed of steps S107 to S109.

When a second track has been selected for editing, the judgement "Yes" is given in step S109, and the processing advances to step S112. In step S112, the CPU 110 refers to the BITs in the TKIs of the former and the latter tracks and judges what kind of AOBs (Type1 or Type2) are present at the respective start and end of each of these tracks and tracks on either side of these tracks, if present.

After identifying the type of each relevant AOB, in step S113 the CPU 10 judges whether the arrangement of AOBs matches a certain pattern. When the arrangement of AOBs matches one of the four patterns shown in FIG. 32A to 32D where it is clear that three Type2 AOBs will not be present consecutively after the combining, the former and latter tracks are combined into a single track in step S115.

In the other words, the operation shown in FIG. 46 is performed for the TKI and DPL_TK_SRP corresponding to these AOBs. By rewriting the TKI_BLK_ATRs in the TKIs, the plurality of tracks selected for editing are combined into a single track. When the arrangement of AOBs does not match any of the patterns in FIGS. 32A to 32D, meansing that there will be three or more Type2 AOBs after the combining, the CPU 10 judges that the combined track may cause a buffer underflow and so terminates the combining process.

{52-14_64-1} Track Division Process
When the user indicates that a track is to be divided, the processing advances from step S102 to the loop procedure composed of steps S116 to S117. In the loop procedure composed of steps S116 to S117, the playback apparatus receives user inputs via the "|<<", ">>|", and "Edit" keys.

When the user presses the "|<<" or ">>|" key, the processing advances from step S116 to step S118 where the indicated track is set as the track to be edited. When the user presses the "Edit" key, the judgement "Yes" is given in step S117 and the processing advances to step S119.

In step S119, the indicated track is determined as the track to be edited and the processing advances to step S120 where the playback of this track is commenced. In step S121, the playback apparatus receives a user input via the "Mark" key.

When the user presses the "Mark" key, the playback of the track is paused and the processing advances to the loop procedure composed of steps S122 and S123. In step S122, the playback apparatus receives user operations made via the jog dial. When the user rotates the jog dial, the playback time code is updated in step S124 in accordance with the rotation of the jog dial.

After this, the loop procedure composed of steps S122 and S123 is repeated. If the user presses the "Edit" key, the processing proceeds from step S123 to step S125, where the playback time code displayed when the user pressed the "Edit" key is set as the division boundary. Note that an "Undo" function may be provided for this setting of the division boundary to allow the user to invalidate the selected division boundary.

After this, the processing explained with reference to FIG. 47 is executed in step S126 to update the DPLI and TKI so as to divide the selected track.

Figure 65:
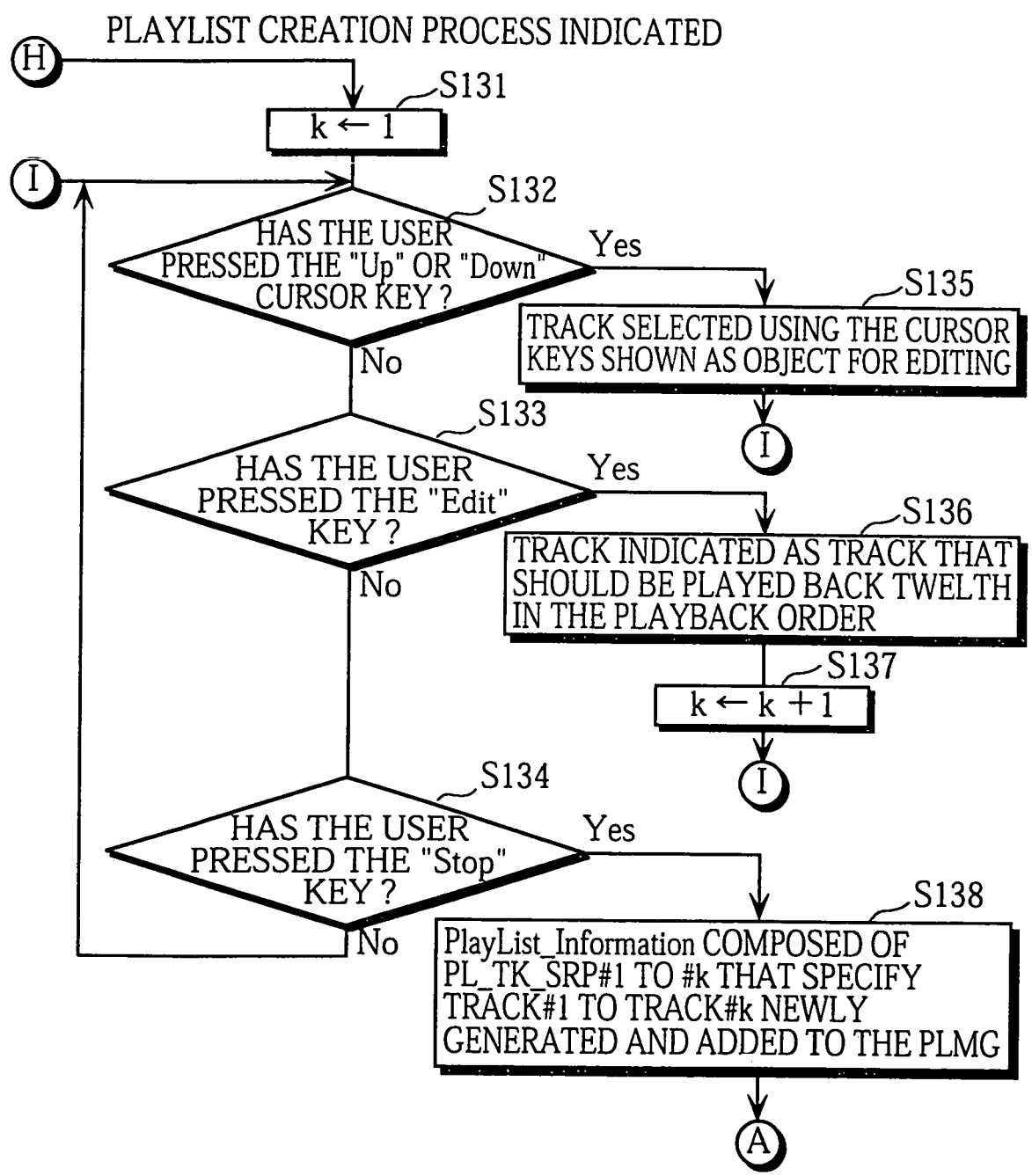
FIG. 65 is a flowchart showing the processing in the editing control program.

{52-14_65-1} Process Setting a Playlist
When the user chooses to set a Playlist, the processing switches to the procedure shown by the flowchart in FIG. 65. In this flowchart, the variable k given in this flowchart is used to indicate the position of a track in the playback order given by the Playlist that is being edited. The flowchart in FIG. 65 starts with this variable k being initialized to "1" in step S131, before the processing advances to the loop procedure composed of steps S132 to S134.

In the loop procedure composed of steps S132 to S134, the playback apparatus receives user operations made via the "|<<", ">>|", "Edit", and "Stop" keys. When the user presses the "|<<" or ">>|" key, the processing advances from step S132 to step S135 where a new track is indicated in accordance with the pressing of the "|<<" or ">>|" key. If the user presses the "Edit" key, the judgement "Yes" is given in step S133 and the processing advances to step S136.

In step S136, the track indicated when the user presses the "Edit" key is selected as the kth track in the playback order. After this, in step S137 the variable k is incremented and the processing returns to the loop procedure composed of steps S132 to S134. This procedure is repeated so that the second, third and fourth tracks are successively selected. If the user presses the "Stop" key have specified several tracks that are to be played back in the specified order as a new Playlist, the processing advances from step S134 to step S138 where a PLI composed of PL_TK_SRPs that specify the TKIs corresponding to these tracks is generated.

Figure 66:
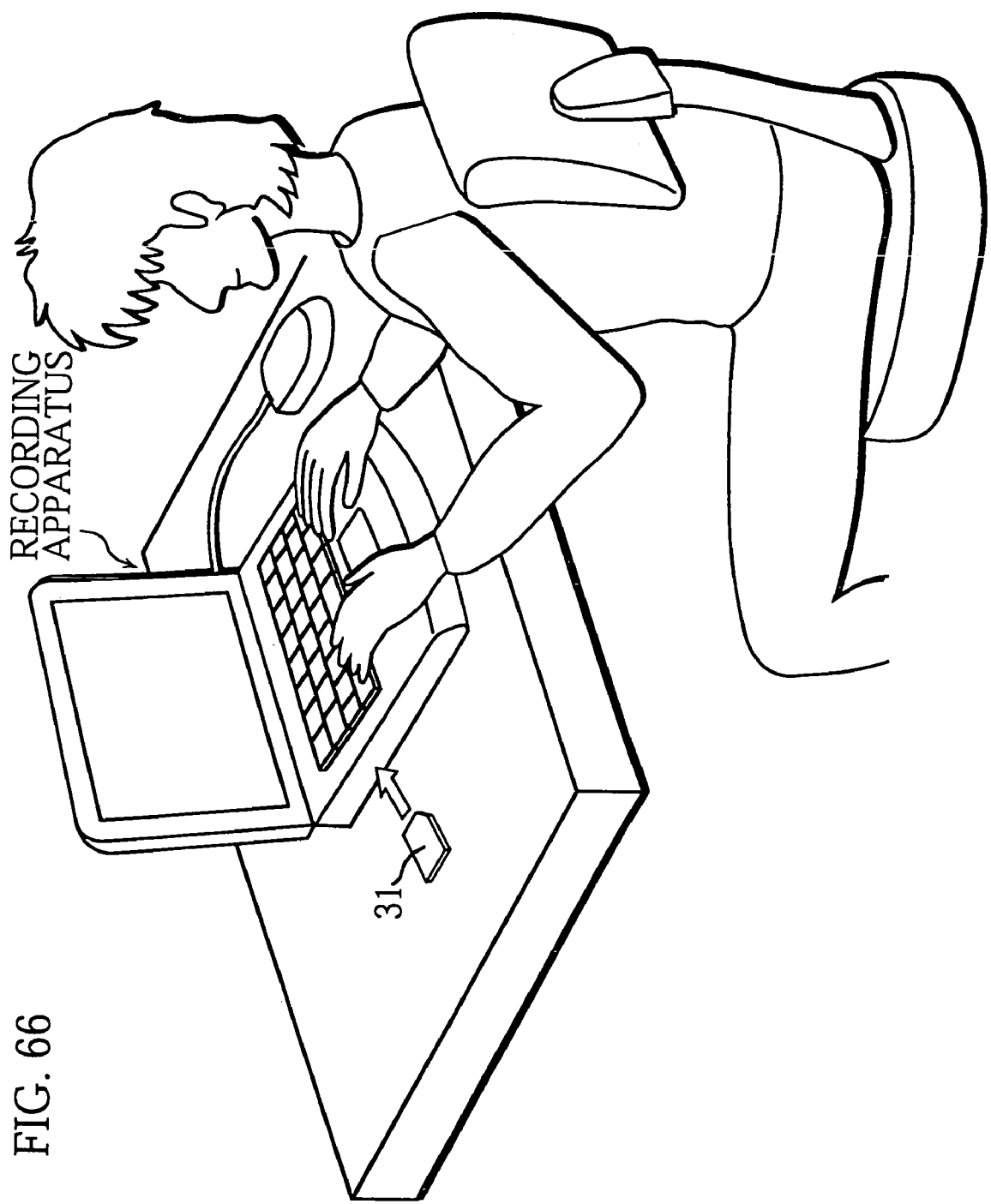
FIG. 66 shows one example of a recording apparatus for recording data onto the flash memory card 31.

{66-1} Recording Apparatus
The following describes one example of a recording apparatus for the flash memory card 31. FIG. 66 shows one example of a recording apparatus. This recording apparatus can be connected to the Internet, and is a standard personal computer that can perform reception when an encrypted SD-Audio directory is sent via communication lines to the recording apparatus by an electronic music distribution service, or when an audio data transport stream is sent via communication lines to the recording apparatus by an electronic music distribution service.

Figure 67:
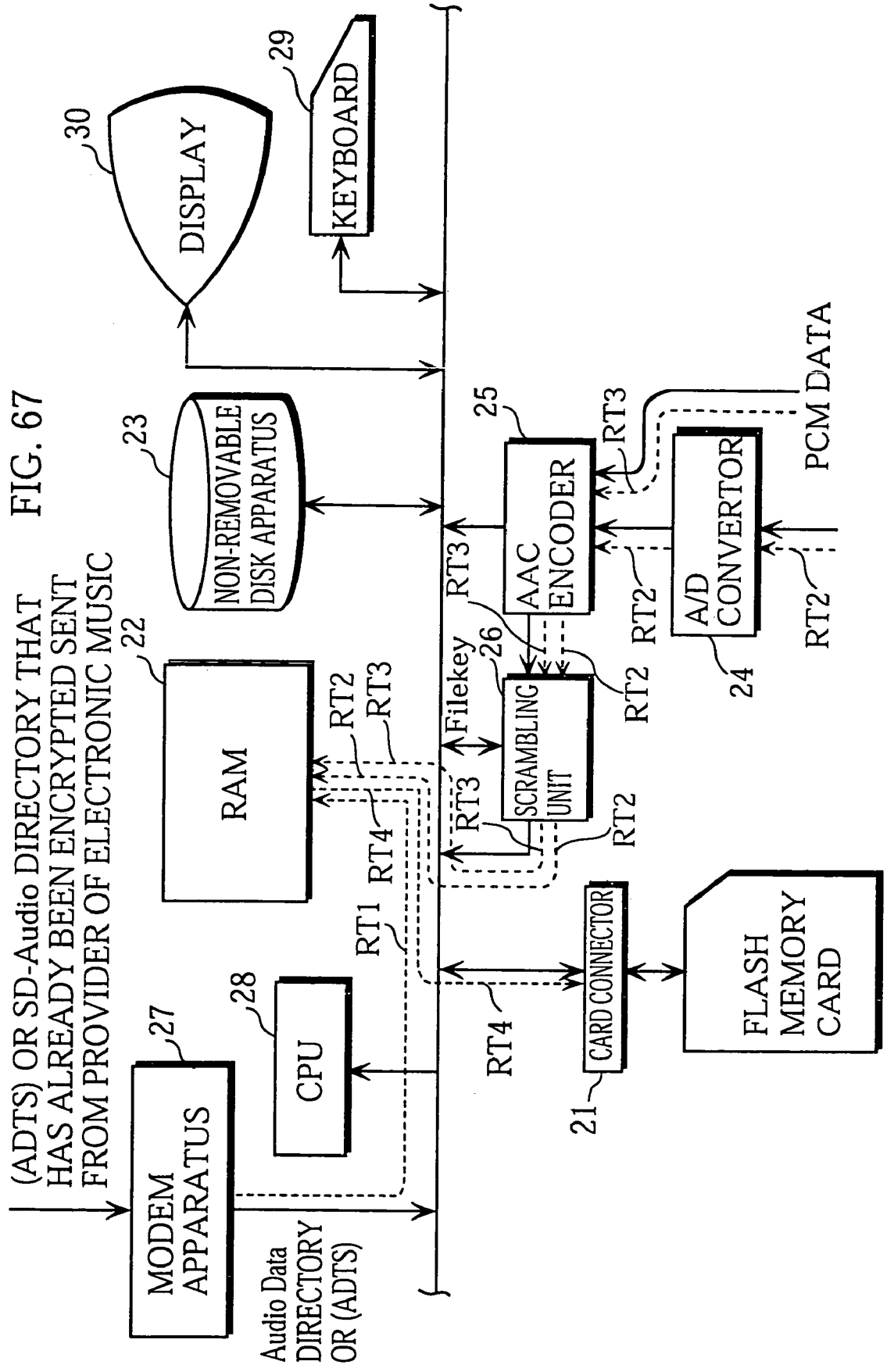
FIG. 67 shows the hardware configuration of the recording apparatus.

{67-1} Hardware Composition of the Recording Apparatus
FIG. 67 shows the hardware composition of the present recording apparatus.

As shown in FIG. 67, the recording apparatus includes a card connector 21 for connecting the recording apparatus to the flash memory card 31, a RAM 22, a non-removable disk apparatus 23 for storing a recording control program that performs overall control over the recording apparatus, an A/D converter 24 that A/D converts audio inputted via a microphone to produce PCM data, an ACC encoder 25 for encoding the PCM data in units of a fixed time and assigning ADTS headers to produce AOB_FRAMEs, a scrambling unit 26 for encrypting the AOB_FRAMEs using a different FileKey for each AOB_BLOCK, a modem apparatus 27 for receiving an audio data transport stream when an encrypted SD-Audio directory is sent via communication lines to the recording apparatus by an electronic music distribution service, or when an audio data transport stream is sent via communication lines to the recording apparatus by an electronic music distribution service, a CPU 28 for performing overall control over the recording apparatus, a keyboard 29 for receiving inputs made by the user, and a display 30.

{67-2} Input Circuits RT1 to RT4

When an encrypted SD-Audio directory, which is to be written in the data region and the authentication region, is sent via communication lines to the recording apparatus by an electronic music distribution service, the recording apparatus can write the encrypted SD-Audio directory into the data region and authentication region of the flash memory card 31 as soon as the encrypted SD-Audio directory has been properly received.

However, (1) when an audio data transport stream that is not in the form of SD-Audio directory is sent to the recording apparatus by an electronic music distribution service, (2) when data is inputted into the recording apparatus in PCM format, or (3) when analog audio is recorded by the recording apparatus, the recording apparatus uses the following four input routes to write an audio data transport stream onto the flash memory card 31.

As shown in FIG. 67, the four input routes RT1, RT2, RT3, and RT4 are used to input an audio data transport stream when an audio data transport stream is stored in the flash memory card 31.

{67-3} Input Route RT1

The input route RT1 is used when an encrypted SD-Audio directory is sent via communication lines to the recording apparatus by an electronic music distribution service, or when an audio data transport stream is sent via communication lines to the recording apparatus by an electronic music distribution service. In this case, the AOB_FRAMEs included in the transport stream are encrypted so that a different FileKey is used for the AOB_FRAMEs in different AOBs. Since there is no need to encrypt or encode an encrypted transport stream, the SD-Audio directory or audio data transport stream can be stored directly into the RAM 22 in its encrypted state.

{67-4} Input Route RT2

Input route RT2 is used when audio is inputted via a microphone. In this case, the audio inputted via the microphone is subjected to A/D conversion by the A/D converter 24 to produce PCM Data. The PCM data is then encoded by the AAC encoder 25 and assigned ADTS headers to produce AOB_FRAMEs. After this, the scrambling unit 26 encrypts the AOB_FRAMEs using a different FileKey for each AOB_FRAMEs in different AOB_FILEs to produce encrypted audio data. After this, the encrypted audio data is stored in the RAM 22.

{67-5} Input Route RT3

Input route RT3 is used when PCM data read from a CD is inputted into the recording apparatus. Since data is inputted in PCM format, the data can be inputted as it is into the AAC encoder 25. This PCM data is encoded by the ACC encoder 25 and assigned ADTS headers to produce AOB_FRAMEs.

After this, the scrambling unit 26 encrypts the AOB_FRAMEs using a different FileKey for the AOB_FRAMEs in different AOBs to produce encrypted audio data. After this, the encrypted audio data is stored in the RAM 22.

{67-6} Input Route RT4 The input route RT4 is used when a transport stream inputted via one of the three input routes RT1, RT2, and RT3 is written into the flash memory card 31.

This storing of audio data is accompanied by the generation of TKIs and Default_Playlist_Information. In the same way as the playback apparatus, the main functioning of the recording apparatus is stored in the ROM. This is to say, a recording program that includes the characteristic processing of the recording apparatus, which is to say, the recording of AOBs, the TrackManager, and the PlaylistManager, is stored in the non-removable disk apparatus 23.

{67-7_68} Processing of the Recording Apparatus

Figure 68:
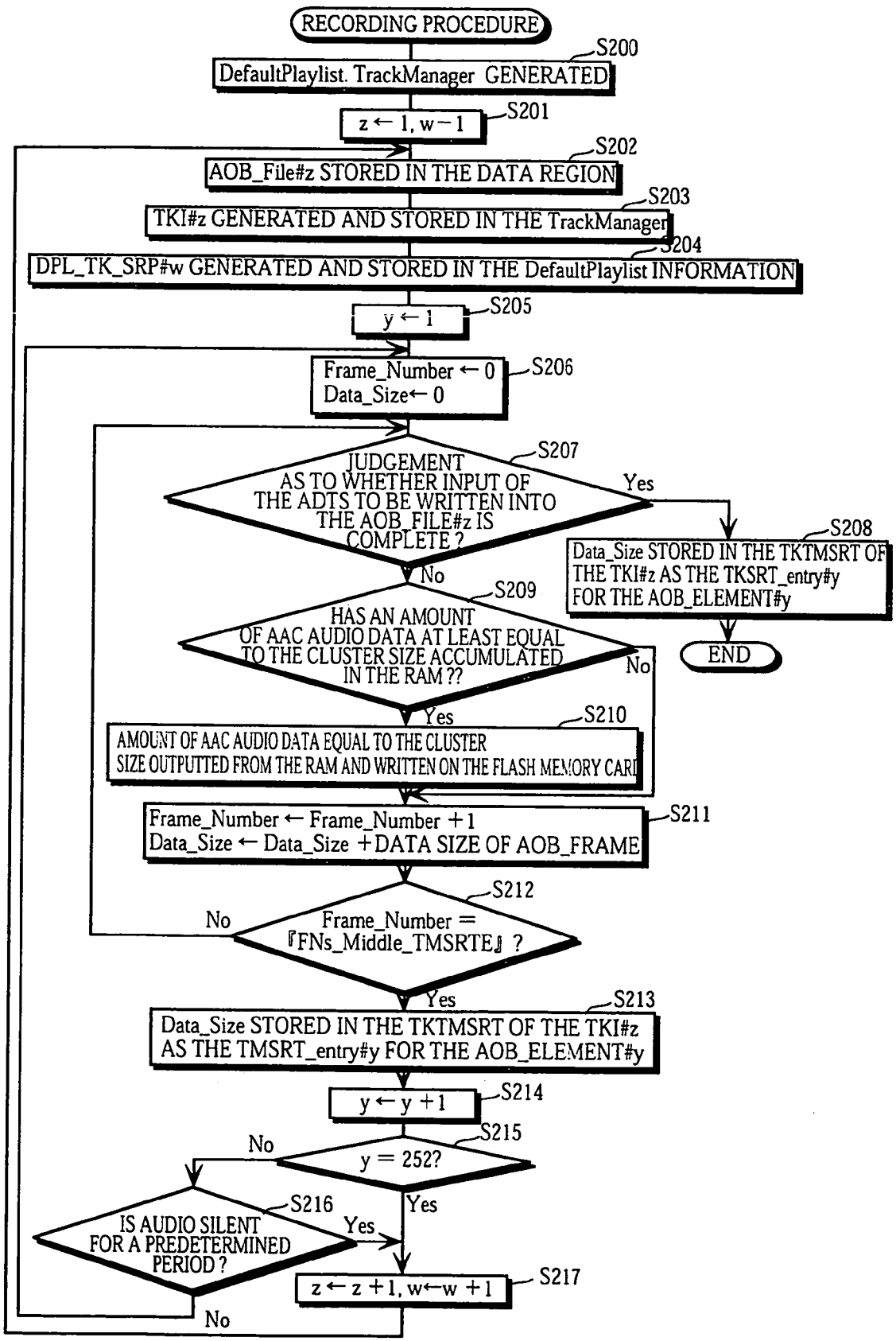
FIG. 68 is a flowchart showing the processing during recording.

The following describes the processing in the recording procedure that writes a transport stream in the flash memory card 31 via the input routes RT1, RT2, RT3 and RT4, with reference to the flowchart in FIG. 68 that shows this processing.

The variables "Frame_Number" and "Data_Size" used in this flowchart are as follows. The variable Frame_Number is used to manage the total number of AOB_FRAMEs that have already been recorded in an AOB_FILE. The variable Data_Size is used to manage the data size of the AOB_FRAMEs that have already been recorded in the AOB_FILE.

The processing in this flowchart starts in step S200 with the CPU 28 generating the DefaultPlaylist and the TrackManager. In step S201, the CPU 28 initializes the variable #z (z←1). In step S202, the CPU 28 generates the AOB_FILE#z and stores it in the data region of the flash memory card 31. At this point, the filename, filename extension, and first cluster number for the AOB_FILE#z will be set in a directory entry in the SD_Audio Directory in the data region. After this, in step S203, the CPU 28 generates TKI#z and stores it in the TrackManager. In step S204, the CPU 28 generates the DPL_TK_SRP#w and stores it in the Default_Playlist_Information. After this, in step S205 the CPU 28 initializes the variable#y (#y←1) and in step S206, the CPU 28 initializes the Frame_Number and Data_Size (Frame_Number←0, Data←Size 0).

In step S207, the CPU 28 judges whether the input of the audio data transport stream that should be written in the AOB_FILE# has ended. When the input of an audio data transport stream that has been encoded by the AAC encoder 25 and encrypted by the scrambling unit 26 into the RAM 22 continues and it is necessary to continue the writing of cluster data, the CPU 28 gives the judgement "No" in step S207 and the processing advances to step S209.

In step S209, the CPU judges whether the amount of AAC audio data that has accumulated in the RAM 22 is at least equal to the cluster size. If so, the CPU 28 gives the judgement "Yes" and the processing advances to step S210 where an amount of AAC audio data equal to the cluster size is written into the flash memory card 31. The processing then advances to step S211.

When sufficient AAC audio data has not accumulated in the RAM 22, step S210 is skipped and the processing advances to step S211. In step S211, the CPU increments the Frame_Number (Frame_Number Frame_Number+1) and increases the value of the variable Data_Size by the data size of the AOB_FRAME.

After this updating, in step S212 the CPU 28 judges whether the value of Frame_Number has reached the number of frames that is set in "FNs_Middle_TMSRTE", the value of "FNs_Middle_TMSRTE" is set in accordance with the sampling frequency used when encoding the audio data transport stream. When the value of Frame_Number has reached the number of frames set in "FNs_Middle_TMSRTE", the CPU 28 gives the judgement "Yes" in step S212. If not, the CPU 28 gives the judgement "No" and the processing returns to step S207. The processing in steps S207 to S212 is therefore repeated until the judgement "Yes" is given in either step S207 or in step S212.

When the variable Frame_Number reaches the value of "FNs_Middle_TMSRTE", the CPU 28 gives the judgement "Yes" in step S212 and the processing advances from step S212 to step S213 where Data_Size is stored in the TKTMSRT of TKI#z as the TMSRT_entry#y for the AOB_ELEMENT#y. In step S214, the CPU 28 increments the variable #y (#y←#y+1) before checking in step S215 whether the variable#y has reached "252".

The value "252" is used since this is the maximum number of AOB_ELEMENTs that can be stored in a single AOB. If the variable #y is below 252, the processing advances to step S216, where the CPU 28 judges whether a silence of a predetermined length is present in the encoded audio, which is to say that the audio data has reached a gap present between tracks. When no such continuous silence is present, the processing composed of steps S206 to S215 is repeated. When the variable#y has reached the value 252, or a silence of a predetermined length is present in the encoded audio, the judgement "Yes" is given in one of steps S215 and S216 and the processing advances to step S217 where the variable#z is incremented (#z←#z+1).

After this, the processing in steps S202 to S216 is repeated for the incremented variable#z. By repeating this processing, the CPU 28 can have AOBs including a plurality of AOB_ELEMENTs recorded one after the other into the flash memory card 31.

When the transfer of an audio data transport stream by the AAC encoder 25, the scrambling unit 26, and the modem apparatus 27 is complete, this means that the input of the audio data transport stream to be written into the AOB_FILE#z will also be complete, so that the judgement "Yes" is given in step S207 and the processing advances to step S208. In step S208, the CPU 28 stores the value of the variable Data_Size in the TKTMSRT of the TKI#z as the TMSRT_Entry#y for the AOB_ELEMENT#y. After storing the audio data accumulated in the RAM 22 in the AOB file corresponding to the AOB#z, the processing in this flowchart ends.

The above processing results in an encrypted audio data transport stream being stored in the flash memory card 31. The following procedure is then used to store the FileKey required for decrypting this encrypted audio data transport stream in the authentication region.

When the audio data transport stream has been inputted via input route RT1, the AOB file(s), the file storing the TKMG, the file storing the PLMG, and the encryption key storing file storing a different FileKey for each AOB are sent to the recording apparatus by a provider of the electronic music distribution service. The CPU28 receives these files and writes the AOB file(s), the file storing the TKMG, and the file storing the PLMG into the user region of the flash memory card 31. On the other hand, the CPU 28 writes only the encryption key storing file storing a different FileKey for each AOB into the authentication region.

When the audio is inputted via the input route RT2 or RT3, the CPU 28 generates a different FileKey every time the encoding of a new AOB commences and sets the generated key in the scrambling unit 26. In addition to being used by the scrambling unit 26 to encrypt the present AOB, this FileKey is stored following the FileKey Entry in the encryption key storing file present in the authentication region.

With the present embodiment describes above, the files storing AOBs are encrypted using different encryption keys, so that if the encryption key used to encrypt one file is decoded and exposed, the exposed encryption key can only be used to decrypt a file storing one AOB, with such exposure having no effect on other AOBs that are stored in other files. This minimizes the damage caused when one encryption key is exposed.

Note that while the above description focuses on an example system that is thought to be the most effective embodiment of the present invention, the invention is not limited to this system. Various modifications are possible within the scope of the invention, with examples of the such being given as (a) to (e) below.

(a) The above embodiment describes a semiconductor memory (flash memory card) as the recording medium used, though the present invention can be applied to other media including optical discs, such as DVD-RAM, or a hard disk.

(b) In the above embodiment, the audio data was described as being in AAC format, though the present invention can also be applied to audio data in another format such as MP3 (MPEG1 Audio Layer 3), Dolby-AC3, or DTS (Digital Theater System).

(c) While the file storing the TKMG and the file storing the PLMG were described as being received from the provider of the electronic music distribution service in a complete form, the main information used to create the TKMG and PLMG can be transmitted together with the encryption key storing file that stores a different encryption key for each AOB. The recording apparatus may then process this information to obtain the TKMG and PLMG which it then records in the flash memory card.

(d) For ease of explanation, the recording apparatus and playback apparatus were described as being separate devices, though a portable playback apparatus can be equipped with the functioning of the recording apparatus and a recording apparatus in the form of a personal computer can be equipped with the functions of the playback apparatus Aside from the portable playback apparatus and personal computer recording apparatus, the functions of the playback apparatus and recording apparatus can also be provided to a communication device that is capable of downloading content from a network.

As one example, a mobile telephone capable of Internet access may be provided with the functions of the playback apparatus and recording apparatus described in the above embodiment. This mobile telephone may store contents downloaded via a wireless network in the flash memory card 31 in the same way as in the above embodiment. Also, while the recording apparatus described in the above embodiment is provided with the modem apparatus 27 for connecting to the Internet, any other device capable of connecting to the Internet, such as a terminal adapter for an ISDN line, may be provided instead.

(e) The procedures shown in the flowcharts shown in FIGS. 55 to 58, FIG. 60, FIG. 63 to FIG. 65, and FIG. 68 can be achieved by executable programs that may be distributed and sold having been recorded on a recording medium. This recording medium may be an IC card, an optical disc, a floppy disk, or the like, with the programs recorded on the recording medium being used having first been installed into standard computer hardware. By performing processing in accordance with such installed programs, standard computer hardware can perform the same functioning as the playback apparatus and recording apparatus described in the above embodiment.

(f) While the above embodiment describes the case where a plurality of AOBs and a plurality of FileKeys are stored on the flash memory card 31, only one AOB and one FileKey need be stored. Also, it is not essential for the AOBs to be encrypted, so that AOBs may be stored on the flash memory card 31 in ACC format.

Second Embodiment

The first embodiment only mentions the different storage regions in the flash memory card 31 and does not describe the internal hardware construction used. This second embodiment, however, describes the hardware construction of the flash memory card 31 in detail.

{69-1} Hardware Configuration of the Flash Memory Card 31

Figure 69:
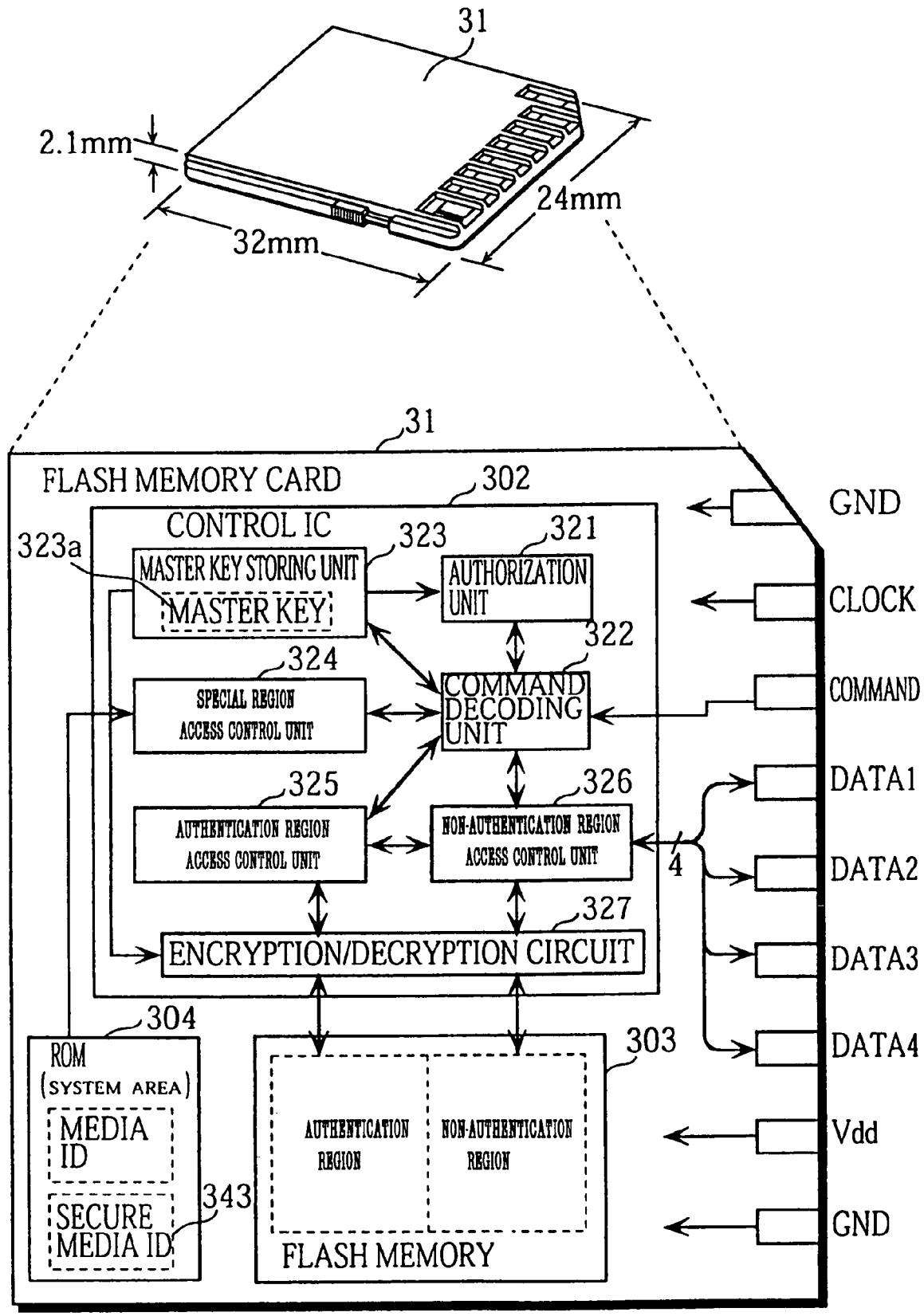
FIG. 69 shows the hardware construction of the flash memory card 31.

FIG. 69 shows the hardware construction of the flash memory card 31. As shown in FIG. 69, the flash memory card 31 includes three IC chips, namely the control IC 302, the flash memory 303, and the ROM 304.

The ROM 304 includes the special region described in the first embodiment and is used to store the media ID mentioned in the first embodiment, in addition to a secure media ID 343 that is produced by encrypting the secure media ID.

The control IC 302 is a control circuit composed of active elements (logic gates) and includes an authorization unit 321, a command decoding unit 322, a master key storing unit 323, a special region access control unit 324, an authentication region access control unit 325, a non-authentication region access control unit 326, and an encryption/decryption circuit 327.

The authorization unit 321 is a circuit that performs mutual authentication in challenge-response format with a device that tries to access the flash memory card 31. This authorization unit 321 includes a random number generator, an encrypter, and the like, and verifies that the device trying to access the flash memory card 31 is authentic by detecting whether the device includes the same encrypter as the authorization unit 321.

Here, mutual authentication in challenge-response format means that a first device sends challenge data to another device to check the authenticity of the other device The other device processes this challenge data in a predetermined way so as to prove its authenticity and sends the resulting data to the first device as response data. The first device compares the challenge data with the response data to judge whether the other device should be authenticated. Since this is mutual authentication, the processing is then repeated with the devices switching roles.

The command decoding unit 322 is a controller that includes a decoding circuit, a control circuit, and the like that interpret and execute a command (an instruction for the flash memory card 31) that has been inputted via the COMMAND pin. The command decoding unit 322 controls the components 321-327 in the control IC 302 in accordance with the type of inputted command.

The commands issued to the flash memory card 31 include commands that read, write, or delete data in the flashmemory 303. As examples of the commands related to the reading and writing of data, the commands "SecureRead address count" and "SecureWrite address count" access the authentication region, while the commands "Read address count" and "Write address count" access the non-authentication region. In these commands, the "address" is the number of the first sector to be accessed in the area subjected to the read (or write), while the "count" is the total number of sectors to be read (or written) In this case, a sector is the unit used for the reading and writing of data in the flash memory card 31, which is 512 bytes in the present example.

The master key storing unit 323 stores the master key 323*a* in an encrypted state in advance. The master key is the encryption key used to encrypt the media ID. When the flash memory card 31 is connected to a device, the master key 323*a* is passed over to the device in its encrypted form. The master key 323*a* is encrypted in a way that only allows decryption by a device that receives the master key using special key information (generally called a "device key").

The special region access control unit 324 is a circuit that reads the media ID stored in the ROM 304 that provides the special region. The media ID read by the special region access control unit 324 is passed over to a device connected to the flash memory card 31 which then encrypts the media ID using the master key obtained by decrypting the encrypted master key using the device key.

The authentication region access control unit 325 and the non-authentication region access control unit 326 are circuits that perform data reads and data writes for the authentication region and non-authentication region, respectively, in the flash memory 303. This authentication region access control unit 325 and non-authentication region access control unit 326 transfer data to and from an external device (such as the recording apparatus and playback apparatus described in the first embodiment).

Note that these access control units 325 and 326 each include an internal buffer capable of storing one block of data and perform input and output via the pins marked DATA1 to DATA4. In terms of logic, such input and output are performed in units of sectors, but when the content of the flash memory 303 is rewritten, data is inputted or outputted in block units (each block being 32 sectors (16 KB) in size). In more detail, when the data in one sector is rewritten, the appropriate block is read from the flash memory 303 and stored in the buffer in the appropriate access control unit, the block is deleted from the flash memory, the appropriate sector in the buffer memory is rewritten, and the block in the buffer memory is then written back into the flash memory 303.

The encryption/decryption circuit 327 performs encryption or decryption using the master key 323*a* stored in the master key storing unit 323 under the control of the authentication region access control unit 325 or the non-authentication region access control unit 326. When data is to be written into the flash memory 303, the encryption/decryption circuit 327 encrypts the data and writes it into the flash memory 303. Conversely, when data is to be read from the flash memory 303, the encryption/decryption circuit 327 decrypts the data. This encryption/decryption circuit 327 is provided to prevent users from performing unauthorized acts, such as dismantling the flash memory card 31 and directly analyzing the content of the flash memory 303 to obtain the passwords stored in the authentication region.

{69_70} Communication Sequence When Playing Back AOBs

Figure 70:
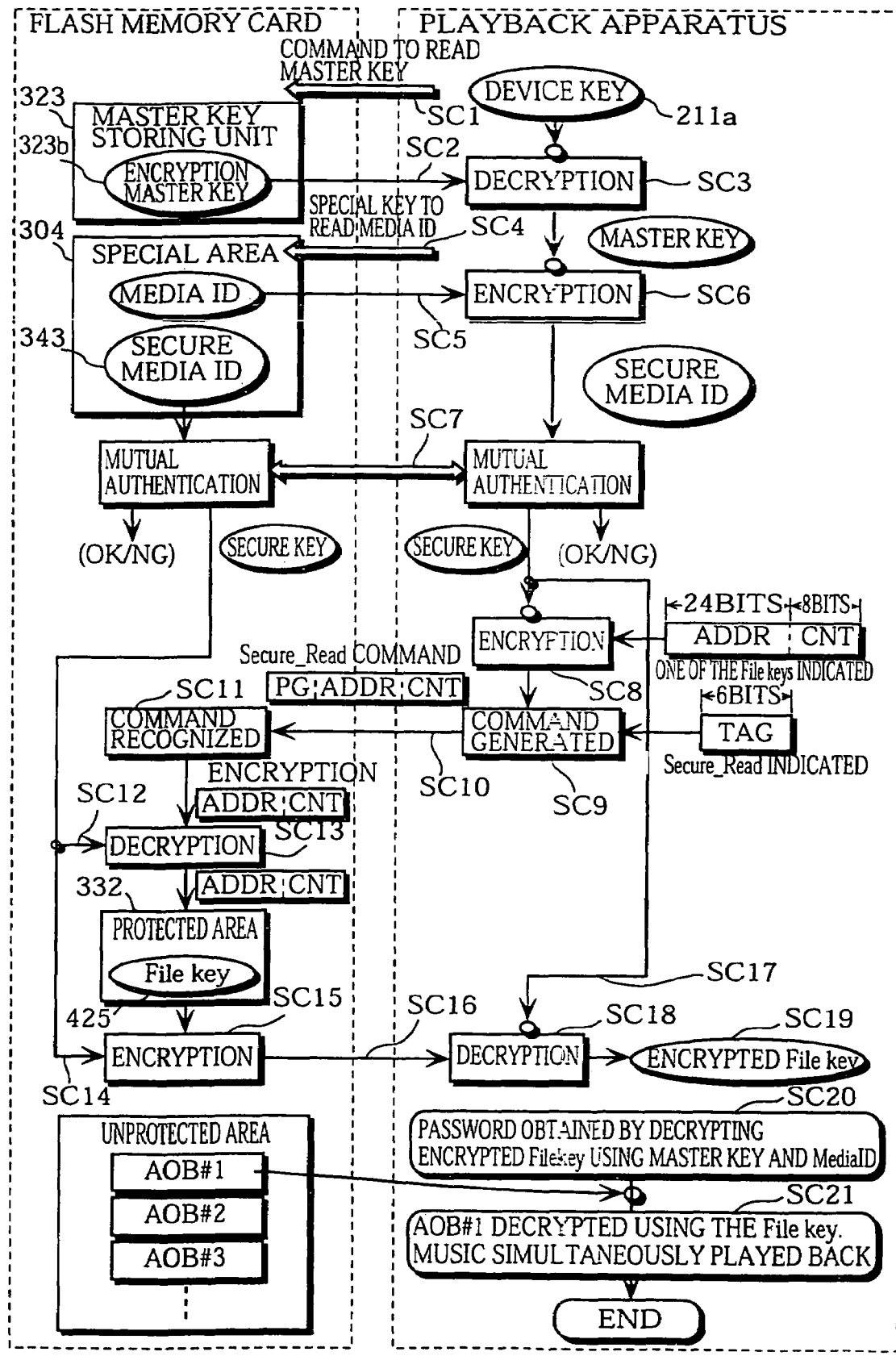
FIG. 70 shows the communication sequence used when a playback apparatus connected to the flash memory card 31 reads the encryption key FileKey and plays back AOBs.

FIG. 70 shows the communication sequence performed when a playback apparatus connected to the flash memory card 31 reads the encryption key FileKey and plays back an AOB.

The playback apparatus issues a command to read the master key to the flash memory card 31 (sc1). Once this command is issued, the command decoding unit 322 obtains the encrypted master key 323b that is stored in the master key storing unit 323 and passes it over to the playback apparatus (sc2).

The playback apparatus that receives the secure media ID uses the device key 211a that it stores itself to decrypt the secure media ID (sc3). The decryption algorithm used in the decrypting process corresponds to the encryption algorithm that was used when generating the encrypted master key 323b stored in the flash memory card 31, so that if the device key 211a used by the playback apparatus is a key whose use is expected (i.e., a proper key), the playback apparatus will be able to successfully obtain the master key by performing this decryption.

After receiving the master key, the playback apparatus issues a special command to the flash memory card 31 to read the media ID (sc4). The special region access control unit 324 obtains the media ID from the ROM 304 of the flash memory card 31 and passes it over to the playback apparatus (sc5). The encryption/decryption circuit 327 then encrypts the media ID using the master key obtained through the above decryption process (sc6). The algorithm used for this encryption is the same as the algorithm that was used to generate the secure media ID 343 stored in the flash memory card 31. As a result, a secure media ID that is the same as the secure media ID 343 of the flash memory card 31 is obtained.

The playback apparatus that has succeeded in obtaining a secure media ID then performs mutual authentication with the authorization unit 321 of the flashmemory card 31 (sc7) This process results in both the playback apparatus and the authorization unit 321 having (a) information (OK/NG) showing whether the other device was successfully authenticated and (b) a time-variant secure key whose content depends on the authentication result.

When the mutual authentication has succeeded, the playback apparatus generates a command for accessing the authentication region of the flash memory card 31. As one example, when data is to be read from the authentication region, the playback apparatus encrypts the parameters (i.e., a 24-bit address "address" and an eight-bit data length "count") of the "SecureRead address count" command using the secure key (sc8), and links these parameters with the tag of this command (i.e., a 6-bit code showing that this command is a "SecureRead") to produce an encrypted command (sc9), which the playback apparatus sends to the flash memory card 31 (sc10).

On receiving this encrypted command, the flash memory card 31 identifies the type of command from the tag (sc11) In the present example, the flash memory card 31 identifies that the command is a "SecureRead" command for a read from the authentication region.

When a read command has been identified, the encryption/decryption circuit 327 decrypts the parameters included in the command using the secure key (sc12) obtained during the mutual authentication (sc13).

The algorithm used to decrypt the parameters corresponds to the encryption algorithm that was used by the playback apparatus when generating the encrypted command, so that when mutual authentication succeeded, which is to say, when the secure key in the flash memory card 31 matches the secure key in the playback apparatus, the parameters obtained by this decrypting will be the parameters used by the playback apparatus.

On receiving a command including valid parameters, the authentication region access control unit 325 accesses the sectors specified by the valid parameters and reads the encryption key FileKey stored in these sectors from the authentication region. The encryption/decryption circuit 327 encrypts the encryption key FileKey stored in the file "AOBSA1.KEY" in the authentication region (sc15) using the secure key (sc14) obtained during the mutual authentication. After this, the authentication region access control unit 325 sends the encryption key FileKey stored in the file "AOBSA1.KEY" in the authentication region to the playback apparatus (sc16).

The playback apparatus decrypts (sc18) the encryption key FileKey it has received using the secure key (sc17) obtained during the mutual authentication. The decryption algorithm used here corresponds to the algorithm that was used by the flash memory card 31 to encrypt the encryption key FileKey, so that the original encryption key FileKey can be obtained. After this, the obtained encryption key FileKey is decrypted using the master key 323b and the media ID to obtain the encryption key FileKey (sc20).

Once the encryption key FileKey has been obtained and an AOB corresponding to this encryption key FileKey has been read from the non-authentication region (sc21), the AOB is decrypted using this encryption key FileKey and music is simultaneously played back.

[69_70_71] Detailed Communication Sequence During Mutual Authentication

Figure 71:
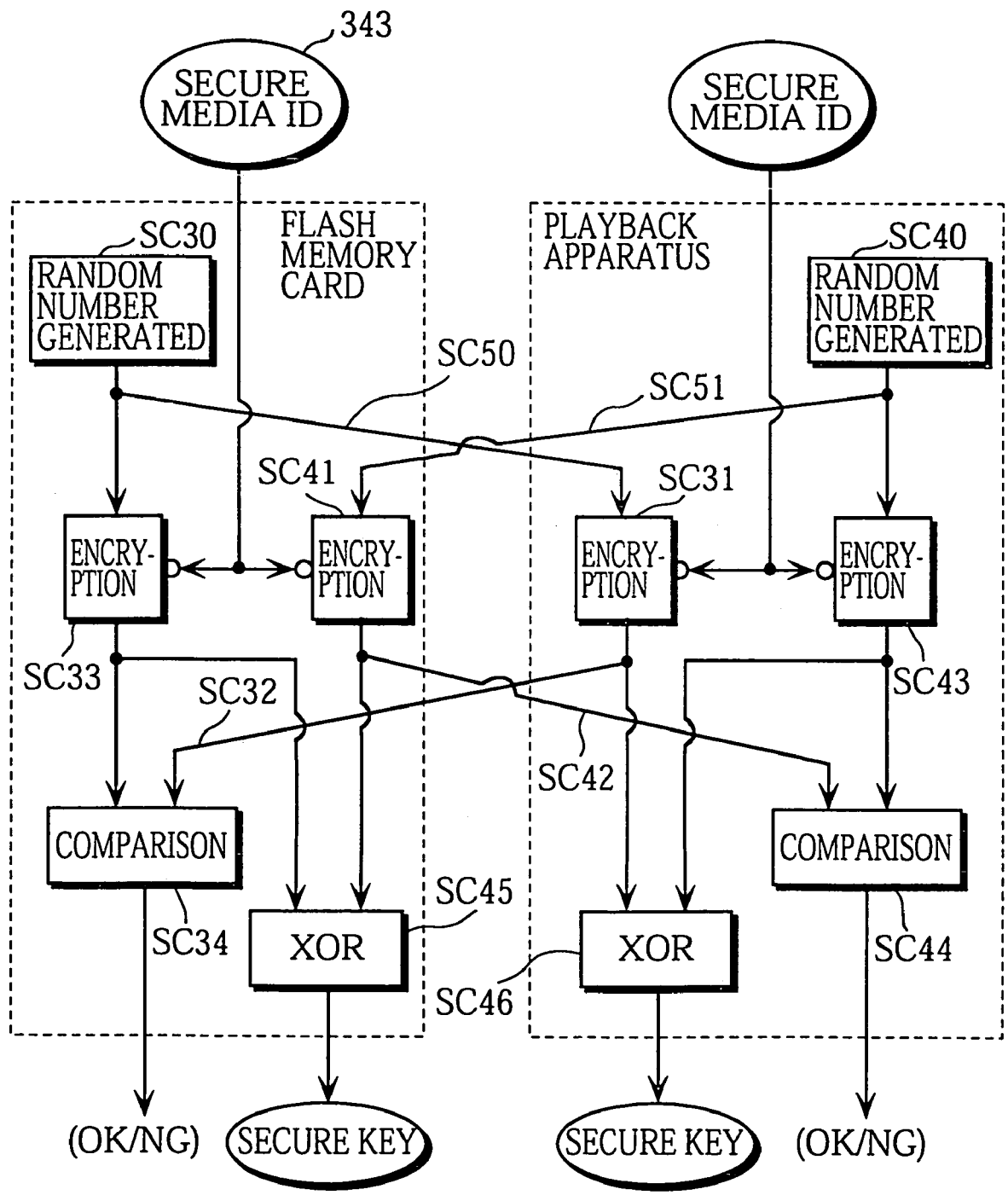
FIG. 71 shows the details of the communication sequence used when mutual authentication is performed in FIG. 70.

FIG. 71 shows the communication sequence used during the mutual authentication shown in FIG. 70 in detail. In this example, the flash memory card 31 and the playback apparatus perform mutual authentication in challenge-response format.

The authorization unit 321 in the flash memory card 31 generates a random number to test the authenticity of the playback apparatus (sc30) and sends this random number to the playback apparatus as challenge data (sc50). In order to prove its own authenticity, the playback apparatus encrypts the challenge data (sc31) and sends the result to the authorization unit 321 in the flash memory card 31 as response data (sc32). The authorization unit 321 in the flash memory card 31 encrypts the random number it sent as the challenge data (sc33) and compares this encrypted random number with the response data (sc34).

When the encrypted random number and the response data match, the playback apparatus will be authenticated (OK), and the flash memory card 31 will hereafter accept access commands for the authentication region received from the playback apparatus. On the other hand, when the encrypted random number and the response data do not match, the playback apparatus will not be authenticated, and the flash memory card 31 will hereafter reject any access commands for the authentication region received from the playback apparatus.

The same authentication procedure is performed by the playback apparatus to verify that the flash memory card 31 is authentic.

In other words, the playback apparatus generates a random number (sc40) and sends this random number to the authorization unit 321 in the flash memory card 31 as challenge data (sc51). In order to prove the authenticity of the flash memory card 31, the authorization unit 321 encrypts the challenge data (sc41) and sends the result to the playback apparatus as response data (sc42).

The playback apparatus encrypts the random number it sent as the challenge data (sc43) and compares this encrypted random number with the response data (sc44). When the encrypted random number and the response data match, the flash memory card 31 will be authenticated (OK), and the playback apparatus will hereafter try to access the authentication region of the flash memory card 31. On the other hand, when the encrypted random number and the response data do not match, the flash memory card 31 will not be authenticated (NG), and the playback apparatus will not try to access the authentication region of the flash memory card 31.

When that the flash memory card 31 and playback apparatus are authentic, the same encryption algorithm will be used by both sides in the mutual authentication. The flash memory card 31 and playback apparatus both take a logical exclusive OR of the two encrypted random numbers (i.e., the encrypted random number sent to the other side as challenge data and random number encrypted to check the received response data) used in the mutual authentication processes (sc45, sc46) set the result of the XOR as a secure key which is used when accessing the authentication region of the flash memory card 31. In this way, the same secure key will be set in the flash memory card 31 and playback apparatus only when the mutual authentication has succeeded. Since a secure key that is time-variant (i.e., used for this session only) can be shared in this way, the successful execution of the mutual authentication procedure is set as the condition for accessing the authentication region.

As one alternative, each side may produce the secure key by taking a logical XOR of the encrypted challenge data produced by this side, response data received from the other side, and the secure media ID.

The above embodiments have data that relates to the protection of copyrights stored in the authentication region and other data stored in the non-authentication region. This enables the realization of a semiconductor memory card capable of simultaneously storing both digital productions whose copyrights need to be protected and digital productions subject to no such restrictions.

Although the present invention has been fully described by way of example with reference to accompanying drawing, it is to be noted that various changes and modifications will be apparent to those skilled in the art. Therefore, unless such changes and modifications depart from scope of the present invention, they should be constructed as being included therein.

What is claimed is:

1. A semiconductor memory card comprising:
    a protected area; and
    an unprotected area,
    wherein the protected area (i) stores an encryption key sequence comprising a plurality of encryption keys arranged into a predetermined order, and (ii) is only accessible by a device that is connected to the semiconductor memory card if a mutual authentication between the device and the semiconductor memory card is successful,
    wherein the unprotected area stores a plurality of encrypted audio objects and a plurality of pieces of management information,
    wherein each encrypted audio object includes unique identification information,
    wherein each respective encryption key of the plurality of encryption keys is (i) in one-to-one correspondence with a respective encrypted audio object of the plurality of encrypted audio objects based on the unique identification information of the respective encrypted audio object, and (ii) accessible by the device to decrypt the respective encrypted audio object that is in one-to-one correspondence with the respective encryption key,
    wherein each respective piece of management information of the plurality of pieces of management information is (i) in one-to-one correspondence with a respective encrypted audio object of the plurality of encrypted audio objects based on the unique identification information of the respective encrypted audio object, and (ii) includes a corresponding time search map and corresponding attribute information,
    wherein the time search map of each respective piece of management information includes a plurality of pieces of entry information identifying internal positions of the respective encrypted audio object that is in one-to-one correspondence with the respective piece of management information, the pieces of entry information identifying the internal positions of the respective encrypted audio object at predetermined intervals of an equal duration,
    wherein the piece of attribute information of each respective piece of management information shows that the respective encrypted audio object that is in one-to-one correspondence with the respective piece of management information is one of (a) an entire audio track, (b) a first part of an audio track, (c) a middle part of an audio track, and (d) an end part of an audio track, and
    wherein a length of each respective encrypted audio object is restricted such that a number of pieces of entry information of the respective piece of management information identifying the internal positions at intervals of a same duration does not exceed a predetermined number.

2. A reading device configured to connect to a semiconductor memory card comprising a protected area and an unprotected area, wherein the protected area (i) stores an encryption key sequence comprising a plurality of encryption keys arranged into a predetermined order, and (ii) is only accessible by the reading device connected thereto if a mutual authentication between the reading device and the semiconductor memory card is successful, wherein the unprotected area stores a plurality of encrypted audio objects and a plurality of pieces of management information, wherein each encrypted audio object includes unique identification information, wherein each respective encryption key of the plurality of encryption keys is (i) in one-to-one correspondence with a respective encrypted audio object of the plurality of encrypted audio objects based on the unique identification information of the respective encrypted audio object, and (ii) accessible by the reading device to decrypt the respective encrypted audio object that is in one-to-one correspondence with the respective encryption key, wherein each respective piece of management information of the plurality of pieces of management information is (i) in one-to-one correspondence with a respective encrypted audio object of the plurality of encrypted audio objects based on the unique identification information of the respective encrypted audio object, and (ii) includes a corresponding time search map and corresponding attribute information, wherein the time search map of each respective piece of management information includes a plurality of pieces of entry information identifying internal positions of the respective encrypted audio object that is in one-to-one correspondence with the respective piece of management information, the pieces of entry information identifying the internal positions of the respective encrypted audio object at predetermined intervals of an equal duration, wherein the piece of attribute information of each respective piece of management information shows that the respective encrypted audio object that is in one-to-one correspondence with the respective piece of management information is one of (a) an entire audio track, (b) a first part of an audio track, (c)

a middle part of an audio track, and (d) an end part of an audio track, and wherein a length of each respective encrypted audio object is restricted such that a number of pieces of entry information of the respective piece of management information identifying the internal positions at intervals of a same duration does not exceed a predetermined number, the reading device comprising:
  a memory;
  a first reading unit for reading, from the unprotected area of the semiconductor memory card into the memory of the reading device, an encrypted audio object of the plurality of encrypted audio objects and the respective piece of management information that is in one-to-one correspondence with the read encrypted audio object;
  an authentication unit for allowing access to the protected area of the semiconductor memory card only if the mutual authentication with the semiconductor memory card is successful;
  a second reading unit for reading, from the protected area of the semiconductor memory card, an encryption key that is in one-to-one correspondence with the read encrypted audio object that is read by the first reading unit;
  a decrypting unit for decrypting the read encrypted audio object using the read encryption key that is read by the second reading unit;
  a playback unit for playing back the decrypted audio object according to one of standard playback and intermittent playback; and
  a control unit for controlling, when the playback unit finishes playing back the decrypted audio object, the first reading unit to read, into the memory of the reading device, a piece of management information that is in one-to-one correspondence with an encrypted audio object of the plurality of encrypted audio objects that is to be played back next,
  wherein the intermittent playback is a mode where (i) omission of valid data equivalent to a first period and (ii) playback of valid data equivalent to a second period, are repeated, and wherein the playback unit specifies an address of an internal position, from which playback after a skip is to start, with reference to a time search map read into the memory of the reading device.

3. A recording device configured to connect to a semiconductor memory card comprising a protected area and an unprotected area, wherein the protected area (i) stores an encryption key sequence comprising a plurality of encryption keys arranged into a predetermined order, and (ii) is only accessible by the recording device connected thereto if a mutual authentication between the recording device and the semiconductor memory card is successful, wherein the unprotected area stores a plurality of encrypted audio objects and a plurality of pieces of management information, wherein each encrypted audio object includes unique identification information, wherein each respective encryption key of the plurality of encryption keys is (i) in one-to-one correspondence with a respective encrypted audio object of the plurality of encrypted audio objects based on the unique identification information of the respective encrypted audio object, and (ii) accessible by the recording device to decrypt the respective encrypted audio object that is in one-to-one correspondence with the respective encryption key, wherein each respective piece of management information of the plurality of pieces of management information is (i) in one-to-one correspondence with a respective encrypted audio object of the plurality of encrypted audio objects based on the unique identification information of the respective encrypted audio object, and (ii) includes a corresponding time search map and corresponding attribute information, wherein the time search map of each respective piece of management information includes a plurality of pieces of entry information identifying internal positions of the respective encrypted audio object that is in one-to-one correspondence with the respective piece of management information, the pieces of entry information identifying the internal positions of the respective encrypted audio object at predetermined intervals of an equal duration, wherein the piece of attribute information of each respective piece of management information shows that the respective encrypted audio object that is in one-to-one correspondence with the respective piece of management information is one of (a) an entire audio track, (b) a first part of an audio track, (c) a middle part of an audio track, and (d) an end part of an audio track, and wherein a length of each respective encrypted audio object is restricted such that a number of pieces of entry information of the respective piece of management information identifying the internal positions at intervals of a same duration does not exceed a predetermined number, the recording device comprising:
  an authentication unit for performing the mutual authentication with the semiconductor memory card and for allowing an access to the protected area of the semiconductor memory card only if the mutual authentication is successful;
  an encoder for sequentially encoding externally received input signals to generate audio frames;
  a generating unit for, when the encoder generates a predetermined number of audio frames, generating a piece of entry information showing a start position of the generated audio frames;
  an encrypting unit for encrypting the generated audio frames using an encryption key;
  a first writing unit for, when the generating unit generates a predetermined number of pieces of entry information, writing the audio frames generated by the encoder into the unprotected area of the semiconductor memory card, as one encrypted audio object together with management information; and
  a second writing unit for writing the encryption key used by the encrypting unit into the protected area of the semiconductor memory card if the mutual authentication by the authentication unit is successful.

4. A reading method of using a device having a memory and reading data from a semiconductor memory card comprising a protected area and an unprotected area, wherein the protected area (i) stores an encryption key sequence comprising a plurality of encryption keys arranged into a predetermined order, and (ii) is only accessible by the device connected to the semiconductor memory card if a mutual authentication between the device and the semiconductor memory card is successful, wherein the unprotected area stores a plurality of encrypted audio objects and a plurality of pieces of management information, wherein each encrypted audio object includes unique identification information, wherein each respective encryption key of the plurality of encryption keys is (i) in one-to-one correspondence with a respective encrypted audio object of the plurality of encrypted audio objects based on the unique identification information of the respective encrypted audio object, and (ii) accessible by the device to decrypt the respective encrypted audio object that is in one-to-one correspondence with the respective encryption key, wherein each respective piece of management information of the plurality of pieces of management information is (i) in one-to-one correspondence with a respective encrypted audio object of the plurality of encrypted audio objects based on the unique identification information of the respective encrypted audio object, and (ii) includes a corresponding time search map and corresponding attribute information, wherein the time search map of each respective piece of management information includes a plurality of pieces of entry information identifying internal positions of the respective encrypted audio object that is in one-to-one correspondence with the respective piece of management information, the pieces of entry information identifying the internal positions of the respective encrypted audio object at predetermined intervals of an equal duration, wherein the piece of attribute information of each respective piece of management information shows that the respective encrypted audio object that is in one-to-one correspondence with the respective piece of management information is one of (a) an entire audio track, (b) a first part of an audio track, (c) a middle part of an audio track, and (d) an end part of an audio track, and wherein a length of each respective encrypted audio object is restricted such that a number of pieces of entry information of the respective piece of management information identifying the internal positions at intervals of a same duration does not exceed a predetermined number, the reading method comprising:

reading, from the unprotected area of the semiconductor memory card into the memory of the device, an encrypted audio object of the plurality of encrypted audio objects and the respective piece of management information that is in one-to-one correspondence with the read encrypted audio object;

allowing access to the protected area of the semiconductor memory card only if the mutual authentication with the semiconductor memory card connected to the device is successful;

reading, from the protected area of the semiconductor memory card, an encryption key that is in one-to-one correspondence with the read encrypted audio object;

decrypting the read encrypted audio object using the read encryption key;

playing back the decrypted audio object according to one of standard playback and intermittent playback; and controlling, when the playing back of the decrypted audio object is finished, the device to read into the memory, a piece of management information that is in one-to-one correspondence with an encrypted audio object of the plurality of encrypted audio objects that is to be played back next, wherein the intermittent playback is a mode where (i) omission of valid data equivalent to a first period and (ii) playback of valid data equivalent to a second period, are repeated, and wherein, in the playing back of the decrypted audio object, an address of an internal position, from which playback after a skip is to start is specified, with reference to a time search map read into the memory.

5. A recording method of using a device and recording read data onto a semiconductor memory card comprising a protected area and an unprotected area, wherein the protected area (i) stores an encryption key sequence comprising a plurality of encryption keys arranged into a predetermined order, and (ii) is only accessible by the device connected to the semiconductor memory card if a mutual authentication between the device and the semiconductor memory card is successful, wherein the unprotected area stores a plurality of encrypted audio objects and a plurality of pieces of management information, wherein each encrypted audio object includes unique identification information, wherein each respective encryption key of the plurality of encryption keys is (i) in one-to-one correspondence with a respective encrypted audio object of the plurality of encrypted audio objects based on the unique identification information of the respective encrypted audio object, and (ii) accessible by the device to decrypt the respective encrypted audio object that is in one-to-one correspondence with the respective encryption key, wherein each respective piece of management information of the plurality of pieces of management information is (i) in one-to-one correspondence with a respective encrypted audio object of the plurality of encrypted audio objects based on the unique identification information of the respective encrypted audio object, and (ii) includes a corresponding time search map and corresponding attribute information, wherein the time search map of each respective piece of management information includes a plurality of pieces of entry information identifying internal positions of the respective encrypted audio object that is in one-to-one correspondence with the respective piece of management information, the pieces of entry information identifying the internal positions of the respective encrypted audio object at predetermined intervals of an equal duration, wherein the piece of attribute information of each respective piece of management information shows that the respective audio object that is in one-to-one correspondence with the respective piece of management information is one of (a) an entire audio track, (b) a first part of an audio track, (c) a middle part of an audio track, and (d) an end part of an audio track, and wherein of length of each respective encrypted audio object is restricted such that a number of pieces of entry information of the respective piece of management information identifying the internal positions at intervals of a same duration does not exceed a predetermined number, the recording method comprising:

mutually authenticating the device and the semiconductor memory card and allowing access to the protected area of the semiconductor memory card only if the mutual authentication with the semiconductor memory card connected to the device is successful;

sequentially encoding externally received input signals to generate audio frames;

generating, when a predetermined number of audio frames are generated by the sequential encoding of the externally received input signals, a piece of entry information showing a start position of the generated audio frames;

encrypting the generated audio frames using an encryption key;

writing, when a predetermined number of pieces of entry information are generated by the generating of the piece of entry information, the audio frames generated by the sequential encoding of the externally received input signals into the unprotected area of the semiconductor memory card, as one encrypted audio object together with management information; and writing the encryption key used by the encrypting of the generated audio frames into the protected area of the semiconductor memory card if the mutual authenticating of the device and the semiconductor memory card is successful.

* * * * *

UNITED STATES PATENT AND TRADEMARK OFFICE
CERTIFICATE OF CORRECTION

PATENT NO. : 7,596,698 B2 Page 1 of 1
APPLICATION NO. : 10/984937
DATED : September 29, 2009
INVENTOR(S) : Teruto Hirota et al.

It is certified that error appears in the above-identified patent and that said Letters Patent is hereby corrected as shown below:

In the Claims

In column 63, claim 2, line 28, "standard playback and intermiftent playback" should read -- standard playback and intermittent playback --.

In column 63, claim 2, line 42, "after a skip is to staff, with reference" should read -- after a skip is to start, with reference --.

Signed and Sealed this

Sixteenth Day of February, 2010

David J. Kappos
*Director of the United States Patent and Trademark Office*